United States Patent [19]

Puri et al.

[11] 4,209,781

[45] Jun. 24, 1980

[54] MOS DIGITAL-TO-ANALOG CONVERTER EMPLOYING SCALED FIELD EFFECT DEVICES

[75] Inventors: Ajay K. Puri, Lubbock; Michael J. Caruso, Houston; Stanley M. Dennison, Houston; Jay Brown, Houston, all of Tex.

[73] Assignee: Texas Instruments Incorporated, Dallas, Tex.

[21] Appl. No.: 907,365

[22] Filed: May 19, 1978

[51] Int. Cl.[2] ............................................ H03K 13/02

[52] U.S. Cl. ............................ 340/347 DA; 179/1 A; 340/347 M

[58] Field of Search ................... 340/347 M, 347 DA; 307/254, 205; 179/1 A

[56] References Cited

U.S. PATENT DOCUMENTS

| | | | |
|---|---|---|---|
| 2,954,551 | 9/1960 | Doucette et al. ............ | 340/347 DA |
| 3,078,379 | 2/1963 | Plogstedt et al. .................... | 307/254 |
| 3,646,587 | 2/1972 | Shaffstall et al. ........... | 340/347 M X |

OTHER PUBLICATIONS

Hnatek, A User's Handbook of D/A and A/D Converters, John Wiley & Sons, 1976, pp. 184–186.

Dewitt et al., Transistor Electronics, McGraw–Hill Book Co., Inc., 1957, pp. 200–203.

*Primary Examiner*—Thomas J. Sloyan

*Attorney, Agent, or Firm*—Stephen S. Sadacca; Andrew J. Dillon; Mel Sharp

[57] ABSTRACT

A digital-to-analog driver capable of driving a speaker or other voice coil means and implementable using field effect semiconductor devices is disclosed. A plurality of switching field effect semiconductive constant current sources each having a control electrode and two current carrying electrodes are coupled in parallel at the current carrying electrodes thereof. Each switching field effect constant current sources preferably includes a field effect load device and a field effect switching device, the aforementioned control electrode preferably being the gate of the switching device. The respective width to length ratios of the active areas under the gates of the devices differ by a factor of two from each other. Therefore, the width to length ratio of the gates of a third one of the souces is twice the width to length ratio of the gates of a second one of the sources and four times the width to length ratio of the gates of a first one of the sources, and so forth. The gates of the switching devices receive the digital input signal and the resulting current flowing through the parallel coupled sources is a function of the magnitude of the digital signal applied to the gates of the switching devices. Preferably, the parallel coupled sources are coupled via a pair of switching devices to either side of a center tapped voice coil or speaker. Alternatively, embodiments using a center tapped transformer associated with the speaker and the embodiments not requiring a center tap are also disclosed.

4 Claims, 42 Drawing Figures

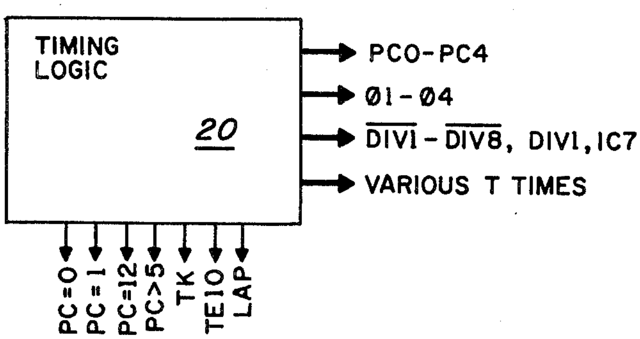
Fig. 4a
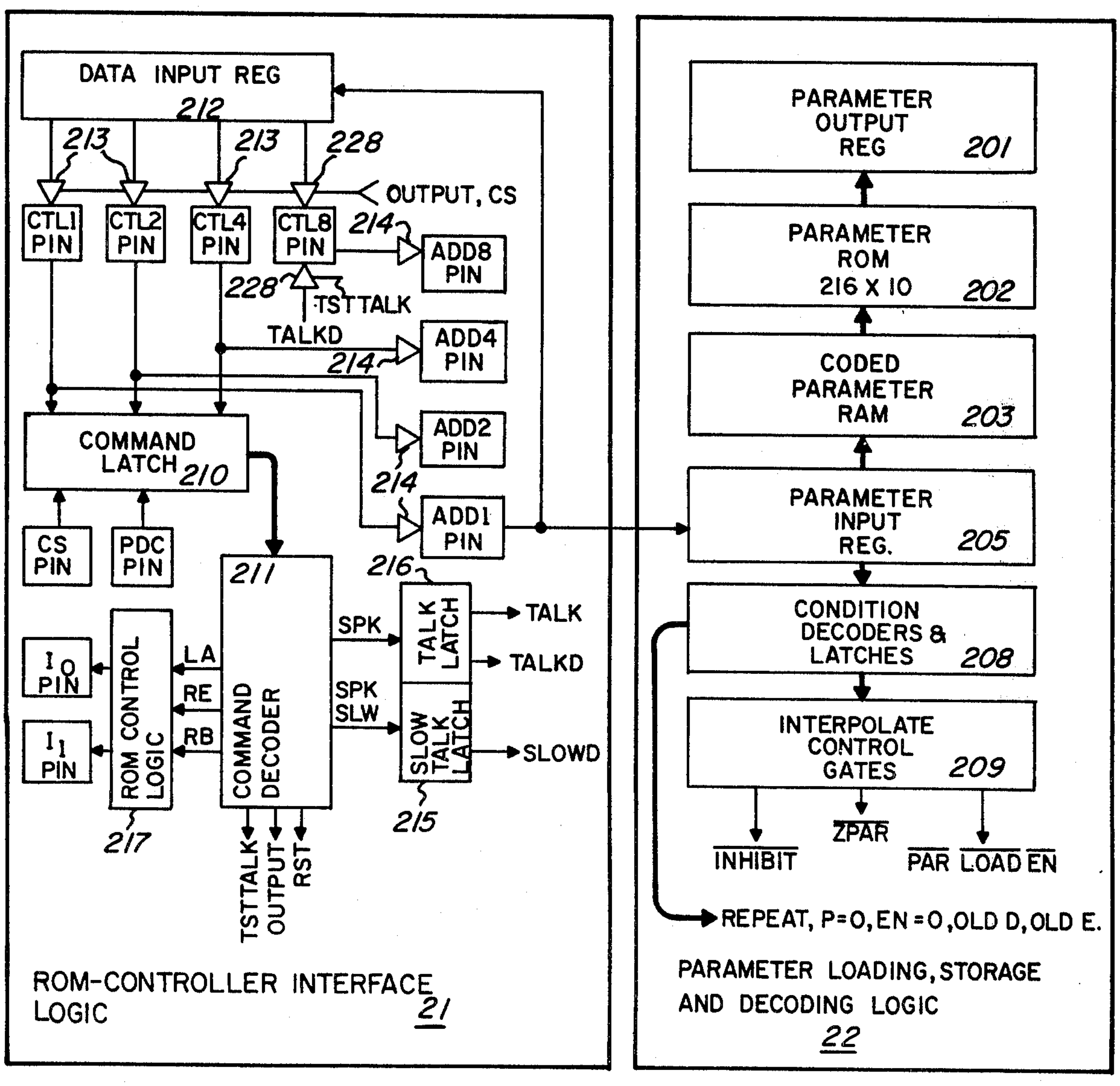

MOS DIGITAL-TO-ANALOG CONVERTER EMPLOYING SCALED FIELD EFFECT DEVICES

BACKGROUND OF THE INVENTION

This invention relates to digital-to-analog and more specifically to digital-to-analog drivers implementable in field effect transistor devices, the type which may be integrated in large scale semiconductor means, which drivers is capable of driving a speaker or other voice coil means.

Disclosed is a talking learning aid which utilizes several integrated circuits in the construction thereof. The integrated circuits are discussed in detail herein and include a speech synthesis chip, a controller chip and one or more Read-Only-Memory chips. The voice synthesizer chip includes a digital to analog drivers circuit which is capable of directly driving a small speaker or other voice coil means. Thus, this patent teaches not only the digital-to-analog drivers of this invention but also a preferred embodiment in which it is utilized. It will, of course, be appreciated by those skilled in the art that other embodiments may also be found for the disclosed digital-to-analog drivers circuit.

Preferably, when providing the aforementioned speech synthesis chip, the chip is implemented in standard field effect transistor large scale integration techniques, such as P-Channel MOS and preferably the digital-to-analog drivers is integratable on the same chip as the voice synthesizer. Preferably, to eliminate any need for an amplifier circuit, the digital-to-analog drivers circuit includes sufficient gain for directly driving a speaker or other voice coil means.

It was, therefore, one object of this invention that a digital-to-analog drivers be implemented in standard FET large scale integration techniques.

It was another object of this invention that the digital-to-analog drivers circuit be directly coupled to a speaker or other voice coil means, or at least, coupled to a speaker or other voice coil means without the need for additional amplification.

It was yet another object of this invention that the gain of the digital-to-analog driver be essentially insensitive to the threshold voltage of the semiconductor material.

The foregoing objects are achieved as is now described. A plurality of switching field effect semiconductive constant current sources, each of which has a control electrode and two current carrying electrodes, are connected in parallel at the current carrying electrodes thereof. Each constant current sources includes a field effect switching device and a field effect current source device, the gate of the switching device providing the aforementioned control electrode. The digital signal is applied to the gates of the switching devices and the width to length ratios of the active areas of these devices, as well as the current source devices, differ by a factor of two from each other. That is, a first one of the devices has a given width to length ratio while the width to length ratio of a second one of the devices is twice that of the first and the width to length ratio of a third one of the devices is twice that of the second and four times that of the first, and so forth. Preferably, one side of the sources is coupled to a first voltage potential. The other side, on the other hand, is connected via to switching transistors to the terminals of a speaker, other voice coil means or any other differential input device. The second voltage potential may be alternatively coupled via pair of switching transistors to the terminals of the voice coil or speaker or via a center tap associated with the speaker or voice coil means or other differential input device. Further, an embodiment using a center-tapped transformer is also disclosed. Preferably, the digital signal includes a sign bit and a plurality of magnitude bits, the plurality of magnitude bits being applied to the gates of the plurality of switching devices whereas the sign bit is applied in true and complemented form to the switching transistors.

BRIEF DESCRIPTION OF THE DRAWINGS

The novel features believed characteristic of the invention are set forth in the appended claims. The invention itself, however, as well as a preferred mode of use, further objects and advantages thereof, will be best understood by reference to the following detailed description of an illustrative embodiment when read in conjunction with the accompanying drawings, wherein:

FIGS. 4*a* and 4*b* form a composite block diagram (when placed side by side) of the speech synthesizer chip;

FIGS. 21*a* and 21*b* form a composite logic diagram of the X and Y address decoders and the array of memory cells;

FIGS. *23a–23d* depict embodiments of the voice coil connection.

GENERAL DESCRIPTION

Figure 1:
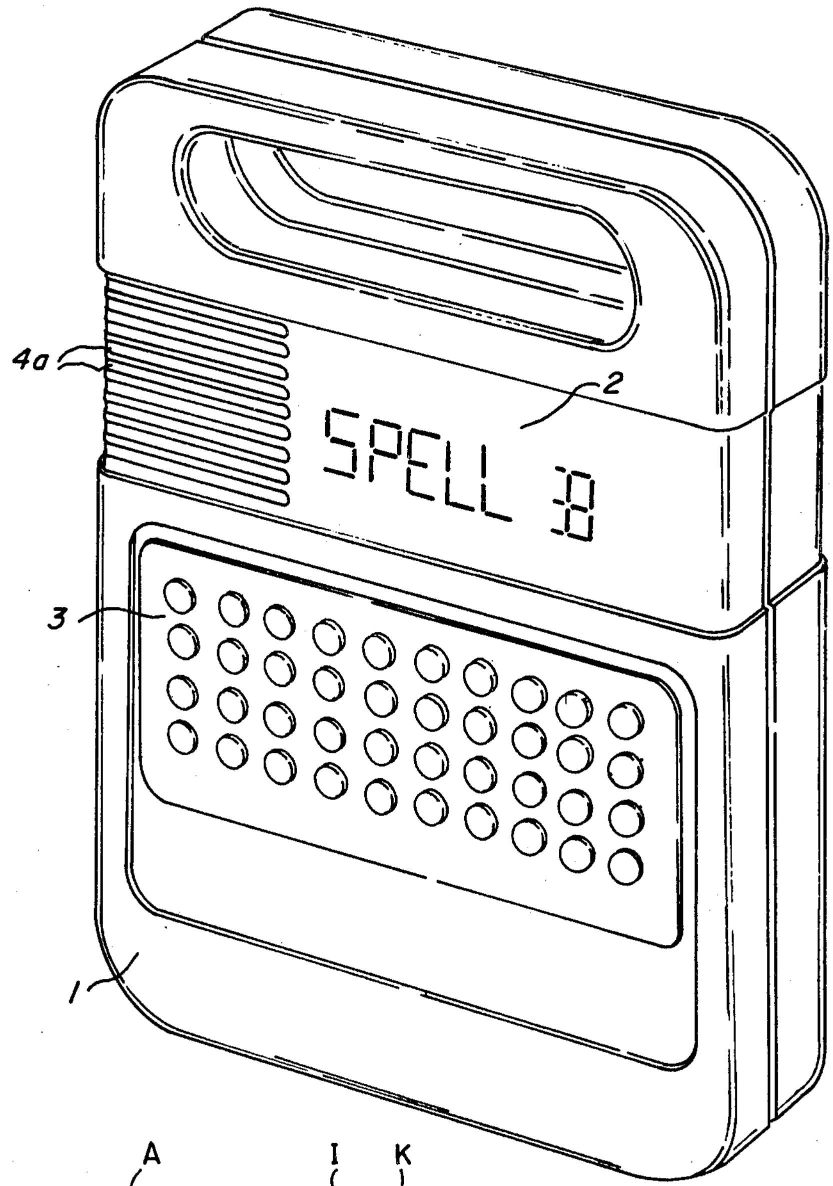
FIG. 1 is a front view of a talking learning aid.

FIG. 1 is a front view of a talking learning aid of the type which may embody the present invention. The learning aid includes a case 1 which encloses electronic circuits preferably implemented on integrated circuits (not shown in this figure). These circuits are coupled to a display 2, a keyboard 3 and a speaker 4 or other voice coil means (also not shown in FIG. 1). However, the openings *4a* are shown behind which speaker 4 is preferably mounted. The display is preferably of the vacuum fluorescent type in the embodiment to be described; however, it will be appreciated by those skilled in the art that other display means, such as arrays of light emitting diodes, liquid crystal devices, electrochromic devices, gas discharge devices or other displays means alternatively may be used if desired. Also, in this embodiment, as a matter of design choice, the display has eight character positions. The keyboard 3 of the learning aid of this embodiment has forty key switch positions, twenty-six of which are used to input the letters of the alphabet into the learning aid. Of the remaining fourteen key switch positions, five are utilized for mode keys (on/spelling mode, learn mode, word guesser game mode, code breaker mode and random letter mode), another five are used to control functions performed by the learning aid in its modes (enter, say again, replay, erase and go) and the remaining four are used for an apostrophe key, a blank space key, a word list select key and an off key. The words spoken by the learning aid, as well as the correct spelling of those words, are stored as digital information in one or more Read-Only-Memories.

The learning aid depicted in FIG. 1 may be battery powered or powered from a source of external electrical power, as desired. The case is preferably made from injection molded plastic and the keyboard switches may be provided by two 5 by 8 arrays of key switches of the type disclosed in U.S. Pat. No. 4,005,293, if desired. Of course, other types of case materials or switches alternatively may be used.

Having described the outward appearance of the learning aid, the modes in which the learning aid may operate will be first described followed by a description of the block diagrams and detailed logic diagrams of the various electronic circuits used to implement the learning aid of FIG. 1.

MODES OF OPERATION

The learning aid of this embodiment has five modes of operation which will be subsequently described. It will be evident to those skilled in the art, however, that these modes of operation may be modified, reduced in number or expanded in capability. As a matter of design choice, the present talking and learning aid is provided with the following modes of operation.

The first mode, the spelling mode, is automatically entered when the "on" key is depressed. In the spelling mode the learning aid randomly selects ten words from a selected word list and at a selected difficulty category within the selected word list. The word list may be changed by depressing the "word list select" key which is coupled to a software implemented flip flop circuit which flips each time the "word list select" key is depressed. The word list select flip flop then determines, as will be seen, which pair of read-only-memories from which the ten words will be randomly selected. Each word list preferably includes words arranged in four levels of difficulty. This embodiment of the learning automatically enters the least difficult level of difficulty. The fact that the least difficulty level has been selected is shown by displaying "SPELL A" in display 2. The level difficulty may be increased by depressing the B, C or D keys, and display 2 will show, in response, "SPELL B", "SPELL C" or "SPELL D", respectively. Having selected the word list and level difficulty, the "go" key is depressed upon which the learning aid commences to randomly select ten words and to say the word "spell" followed by the first randomly selected word. A dash, that being segment D in display 2 (FIG. 2), comes up in the left hand most character position. At this time the student may either (1) enter his or her spelling of the word and then depress the "enter" key or (2) depress the "say again" key. The student may also depress the "erase" key if he or she realizes that the spelling being inputted is incorrect before having depressed the "enter" key; the student may then again try to input the correct spelling. The "say again" key causes the word to be spoken by the learning aid again. In some embodiments a subsequent depression of the "say again" key may cause the selected word to be repeated once more, however, then at a slower rate. As the student enters his or her spelling of the word using the alphabet keys at keyboard 3, the inputted spelling appears at display 2 and the shifts from left to right as the letters are inputted. Following the depression the "enter" key, the learning aid compares the student's spelling with a correct spelling, which is stored in one of the Read-Only-Memories, and verbally indicates to the student whether the student spelling was correct or incorrect. The verbal response is also stored as digital information in a Read-Only-Memory. Of course, a visual response may likewise or alternatively be used, if desired. In this embodiment the student is given two opportunities to spell the word correctly and if the student has still failed to correctly spell the word, the learning aid then verbally (via speaker 4) and visually (via display 2) spells the word for the student and goes on to the next word from the group of ten randomly selected words.

At the end the test of the spelling of the ten randomly selected words, the learning aid then verbally and visually indicates the number of right and wrong answers. Further, in order to give the student additional reinforcement, the learning aid preferably gives a audible response which is a function of the correctness of the spellings. In this embodiment the learning aid plays a tune, the number of notes of which is a function of the correctness of the student's spellings for the group of selected words. The use of the "enter", "say again", "erase", and "go" function keys has just been described with reference to the spelling mode of operation. There is an additional function key, "replay", whose function has not yet been described. The "replay" key causes the learning aid to repeat the group of ten randomly selected words after the group has been completed or causes the learning aid to start over with the first word of the group of ten words if it is depressed during the progression through the group. Alternatively, at the end of a group of ten words, the student may depress the "go" which initiates the random selection of another group of ten words from the selected word list.

An exemplary set of spell mode problems is shown in Table I; exemplary key depressions, which a student might make during the exemplary set of problems, are listed along with the responses made by the learning aid at display 2 and speaker 4.

The learn mode is entered by depressing the "learn" key. In the learn mode, after the "go" key is depressed the learning aid randomly selects ten words from the selected word list at the selected difficulty level and then proceeds to display the first randomly selected word at display 2 and approximately one second later to speak "say it". Approximately two seconds thereafter the learning proceeds to pronounce the word shown in display 2. During this interval the student is given the opportunity to try to pronounce the word spelled at display 2; the learning aid then goes on to demonstrate how the word should be pronounced. After going through the ten randomly selected words the learning automatically returns to the aforementioned spell mode, but the ten words tested during the spell mode are the ten words previously presented during the learn mode. While in the learn mode the "say again", "erase", "repeat" and "enter" keys are invalid. The difficulty level is selected as in the spelling mode, but in the learn mode the learning aid displays the various levels as "SAY IT A", "SAY IT B", etc. Depressing the "go" key causes the learning aid to select another group of ten words in the learn mode. An exemplary set of learn mode problems are set forth in Table II.

The word guesser mode is entered by depressing the "word guesser" mode key. In the word guesser mode the learning aid randomly selected a word from the selected word list and displays dashes in a number of character positions at display 2, the number of character positions corresponding to the number of letters in the randomly selected word. Thus, if the learning aid randomly selects the word "course" for instance, then the dashes will appear in six of the eight character positions in display 2, starting with the left most position and proceeding to the right for six character positions. The dash is shown in the characters of the display by energizing the D segments in those character positions (see FIG. 2). The child may then proceed to enter his or her guesses of the letters in the randomly selected word by depressing the letter keys at keyboard 2. For a correct choice, the learning aid gives an audible response of four tones and shows every place the chosen letter occurs in the randomly selected word. Once letters have been correctly guessed, they remain in the display until the end of the game. For incorrect guesses the learning aid preferably makes no response, but may alternatively say something like "incorrect guess." In this embodiment the child is given six incorrect guesses. Upon the seventh incorrect guess the learning says "I win". On the other hand, if the child correctly guesses all the letters before making seven incorrect guesses the learning aid speaks "you win" and gives an audible response of four tones. Thus in the word guesser mode, the learning aid permits the child to play the traditional spelling game known as "hangman" either by himself or herself or along with other children. Exemplary word guesser problems are set forth in Table III.

The disclosed learning aid has another mode of operation known as "code breaker" which is entered by depressing the "code breaker" mode key. In this mode the child may enter any word of his or her choice and upon depressing the "enter key" the letters in the display are exchanged according to a predetermined code. Thus, in the code breaker mode the learning aid may be used to encode words selected by the child. Further in the code breaker mode the learning aid may be used to decode the encoded words by entering the encoded word and depressing the "enter key".

Another mode with which the learning aid may be provided is the "random letter" mode which is entered by depressing the "random letter" key. In the random letter mode the learning automatically displays in response to depression of the "go" key a randomly selected letter of the alphabet in the first character position of display 2. The letters of the alphabet occur in approximate proportion to as they occur in the English language; thus, the more commonly letters are displayed more frequently than uncommonly used letters. If the "go" key is again depressed then another randomly selected letter is displayed in the first character position and the previously selected letter moves right to the second character position and so forth in response to further depressions of the "random letter" key.

Figure 2:
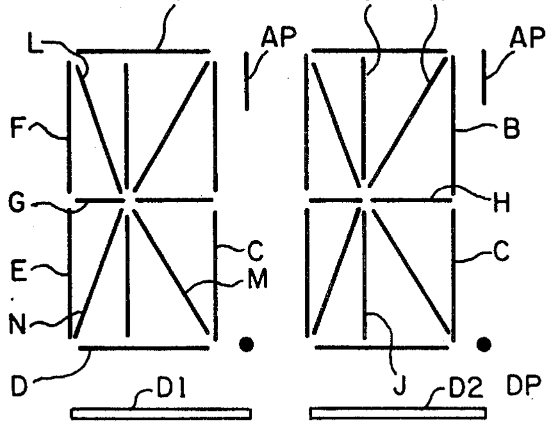
FIG. 2 depicts the segment details of the display.

Referring now to FIG. 2, there is shown a preferred arrangement of the segments of display 2. Display 2 preferably has eight character positions each of which is provided by a sixteen segment character has fourteen segments arranged somewhat like a "British flag" with an additional two segments for an apostrophe and a decimal point. In FIG. 2, segments a–n are arranged more or less in the shape of the "British flag" while segment ap provides apostrophe and segment dpt provides a decimal point. Segment conductors Sa through Sn, Sdp and Sap are respectively coupled to segments a through n, dpt and ap in the eight character positions of display 2. Also, for each character position, there is a common electrode, labeled as D1–D8. When display 2 is provided by a vacuum fluorescent display device, the segments electrodes are provided anodes in the vacuum fluorescent display device while each common electrode is preferably provided by a grid associated with each character position. By appropriately multiplexing signals on the segment conductors (Sa–Sn, Sdpt and Sap) with signals on the character common electrodes (D1–D8) the display may be caused to show the various letters of the alphabet, a period, and an apostrophe and various numerals. For instance, by appropriately energizing segment conductors A,B,C,E and F when character common electrode D1 is appropriately energized the letter A is actuated in the first character position of display 2. Further, by appropriate strobing segment conductors A,B,C,D,H,I and J when character common electrode D2 is appropriately energized, the letter B is caused to be actuated in the second character position of display 2. It should be evident to those skilled in the art that the other letters of the alphabet as well as the apostrophe, period and numerals may be formed by appropriate energization of appropriate segment conductors and common electrodes. In operation, the character common electrodes D1–D8 are sequentially energized with an appropriate voltage potential as selected segment conductors are energized to their appropriate voltage potential to produce a display of characters at display 2. Of course, the segment electrodes could alternatively be sequentially energized as the digit electrodes are selectively energized in producing a display at display 2.

BLOCK DIAGRAM OF THE LEARNING AID

Figure 3:
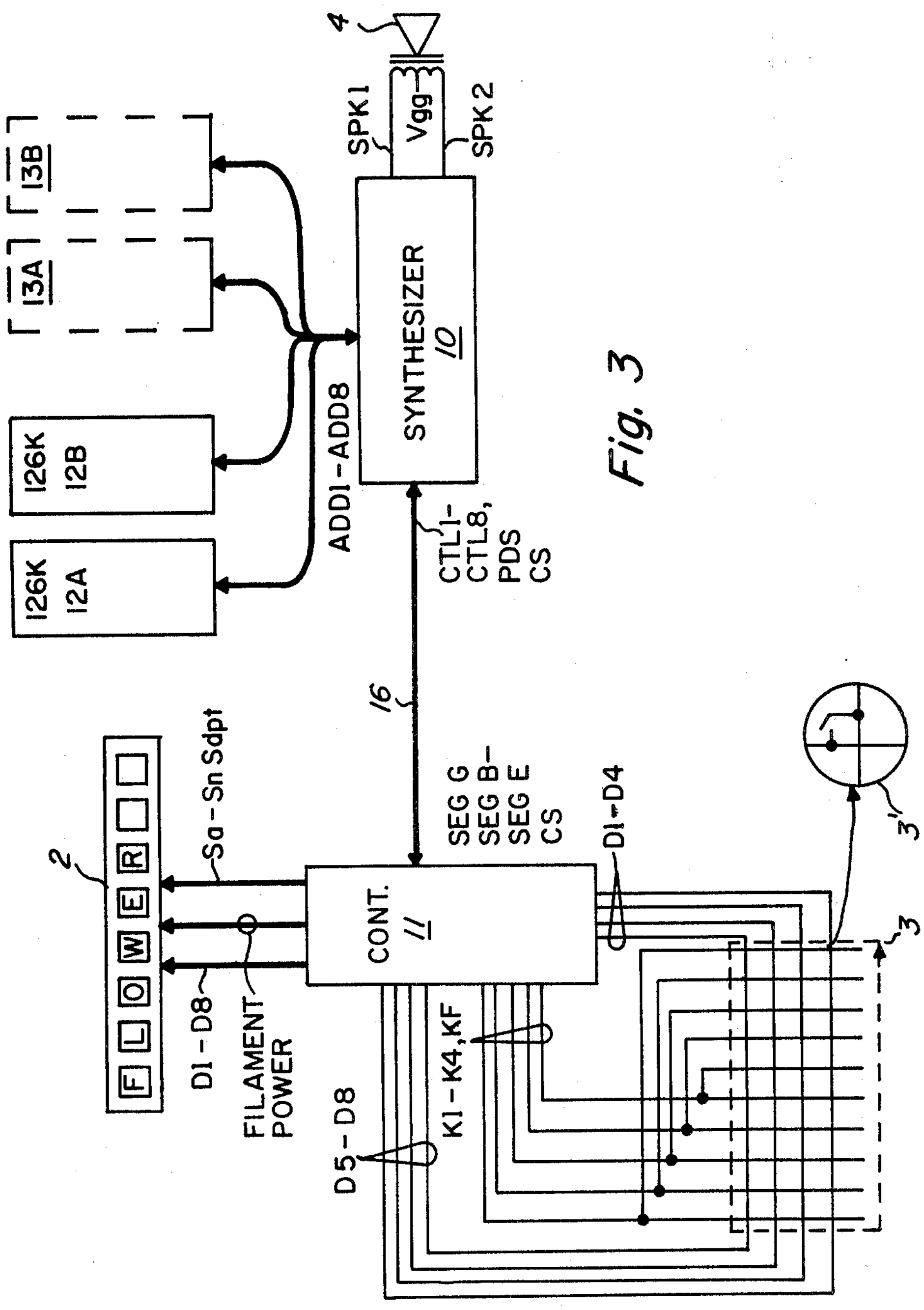
FIG. 3 is a block diagram of the major components preferably making up the learning aid.

FIG. 3 is a block diagram of the major components making up the disclosed embodiment of a speaking learning aid. The electronics of the disclosed learning aid may be divided into three major functional groups, one being a controller 11, another being a speech synthesizer 10, and another being a read-only-memory (ROM) 12. In the embodiment disclosed, these major electronic functional groups are each integrated on separate integrated circuit chips except for the ROM functional group which is integrated onto two integrated circuit chips. Thus, the speech synthesizer 10 is preferably implemented on a single integrated circuit denoted by the box labeled 10 in FIG. 3 while the controller is integrated on a separate integrated circuit denoted by a box 11 in FIG. 3. The word list for the learning aid is stored in the ROM functional group 12, which stores both the correct spellings of the words as well as frames of digital coding which are converted by speech synthesizer 10 to an electrical signal which drives speaker or other voice coil means 4. In the embodiment disclosed, ROM functional group 12 is preferably provided with 262,144 bits of storage. As a matter of design choice, the 262,144 20 bits of data is divided between two separate read-only-memory chips, represented in FIG. 3 at numerals 12*a* and 12*b*. The memory capacity of ROM functional group 12 is a design choice; however, using the data compression features which are subsequentially discussed with reference to FIG. 6, the 262,144 bits of read-only-memory may be used to store on the order of 250 words of spoken speech and their correct spellings as well as various tones, praise phrases and correction phases spoken by the learning aid.

As is discussed with reference to FIG. 1, the "word list select" key causes the learning aid to select words from another word list. In FIG. 3, the basic word list used with the learning aid is stored in ROMs 12*a* and 12*b* along with their spellings and appropriate phraseology which the learning aid speaks during its different modes of operation. The second word list, which may be selected by depressing the "word list select" key, is preferably stored in another pair of ROMs 13*a* and 13*b*. In FIG. 3 these are depicted by dashed lines because these read-only-memories are preferably plugged into the learning aid by a person using the system (of course, when children use the system it is preferable that an adult change the read-only-memories since children may not have the required manual dexterity) rather than normally packaged with the learning aid. In this manner many different "libraries" of word lists may be made available for use with the learning aid.

Of course, the number of chips on which the learning aid is implemented is a design choice and as large scale integration techniques are improved (using electron beam etching and other techniques), the number of integrated circuit chips may be reduced from four to as few as a single chip.

Synthesizer chip 10 is interconnected with the read-only-memories via data path 15 and is interconnected with controller 11 via data path 16. The controller 11, which may be provided by an appropriately programmed microprocessor type device, preferably actuates display 2 by providing segment information on segment conductors Sa–Sn, Sdpt and Sap along with character position information on connectors D1–D8. In the embodiment herein disclosed, controller 11 preferably also provides filament power to display 2 when a vacuum fluorescent device is used therefor. Of course, if a liquid crystal, electrochromographic, light emitting diode or gas discharge display were used such filament power would not be required. One technique for generating filament power on a controller chip is described in U.S. Patent Application Ser. No. 843,017 filed Oct. 17, 1977. Controller 11 also scans keyboard 3 for detecting key depressions thereat. Keyboard 3 has forty switch positions which are shown in representative form in FIG. 3, the switch locations occurring where the conductors cross within the dashed line at numeral 3 in FIG. 3. A switch closure causes the conductors shown as crossing in FIG. 3 to be coupled together. At numeral 3' the switch occurring at a crossing of conductors at numeral 3 is shown in detail. In addition to actuating display 2 and sensing key depression at keyboard 3, controller 11 also perform such functions as providing addresses for addressing ROMs 12*a* and 12*b* (via synthesizer 10), comparing the correct spellings from ROMs 12*a* or 12*b* with spellings inputted by a student at keyboard 3, and other such functions which will become apparent. Addresses from controller 11 are transmitted to ROMs 12*a*–12*b* by synthesizer 10 because, as will be seen, synthesizer 10 preferably is equipped with buffers capable of addressing a plurality of read-only-memories. Preferably, only one of the pairs of ROMs will output information in response to this addressing because of a chip select signal which is transmitted from synthesizer 10 to all the Read-Only-Memories. Controller 11, in this embodiment, transmits addresses to the ROMs via synthesizer 10 so that only synthesizer 10 output buffers need be sized to transmit addresses to a plurality of ROMs simultaneously. Of course, controller 11 output buffers could also be sized to transmit information to a plurality of read-only-memories simultaneously and thus in certain embodiments it may be desirable to also couple controller 11 directly to the ROMs.

As will be seen, synthesizer chip 10 synthesizes human speech or other sounds according to frames of data stored in ROMs 12*a*–12*b* or 13*a*–13*b*. The synthesizer 10 employs a digital lattice filter of the type described in U.S. Patent Application Ser. No. 807,461, filed June 17, 1977. U.S. Patent Application Ser. No. 807,461, since abandoned and continued in U.S. Patent Application Ser. No. 905,328, filed May 12, 1978, is hereby incorporated herein by reference. The following discussion of the speech synthesizer assumes that the reader has a basic understanding of the operation of the lattice filter described in U.S. Patent Application Ser. No. 807,461, since abandoned and continued in U.S. Patent Application Ser. No. 905,328, filed May 12, 1978; therefore, the reader is encouraged to read that patent before delving into the following detailed discussion of the speech synthesizer. As will also be seen, synthesizer 10 also includes a digital to analog (D to A) converter for converting the digital output from the lattice filter to analog signals for driving speaker 4 or other voice coil means with those analog signals. Synthesizer 10 also includes timing, control and data storage and data compression systems which will be subsequently described in detail.

SYNTHESIZER BLOCK DIAGRAM

Figure 4B:
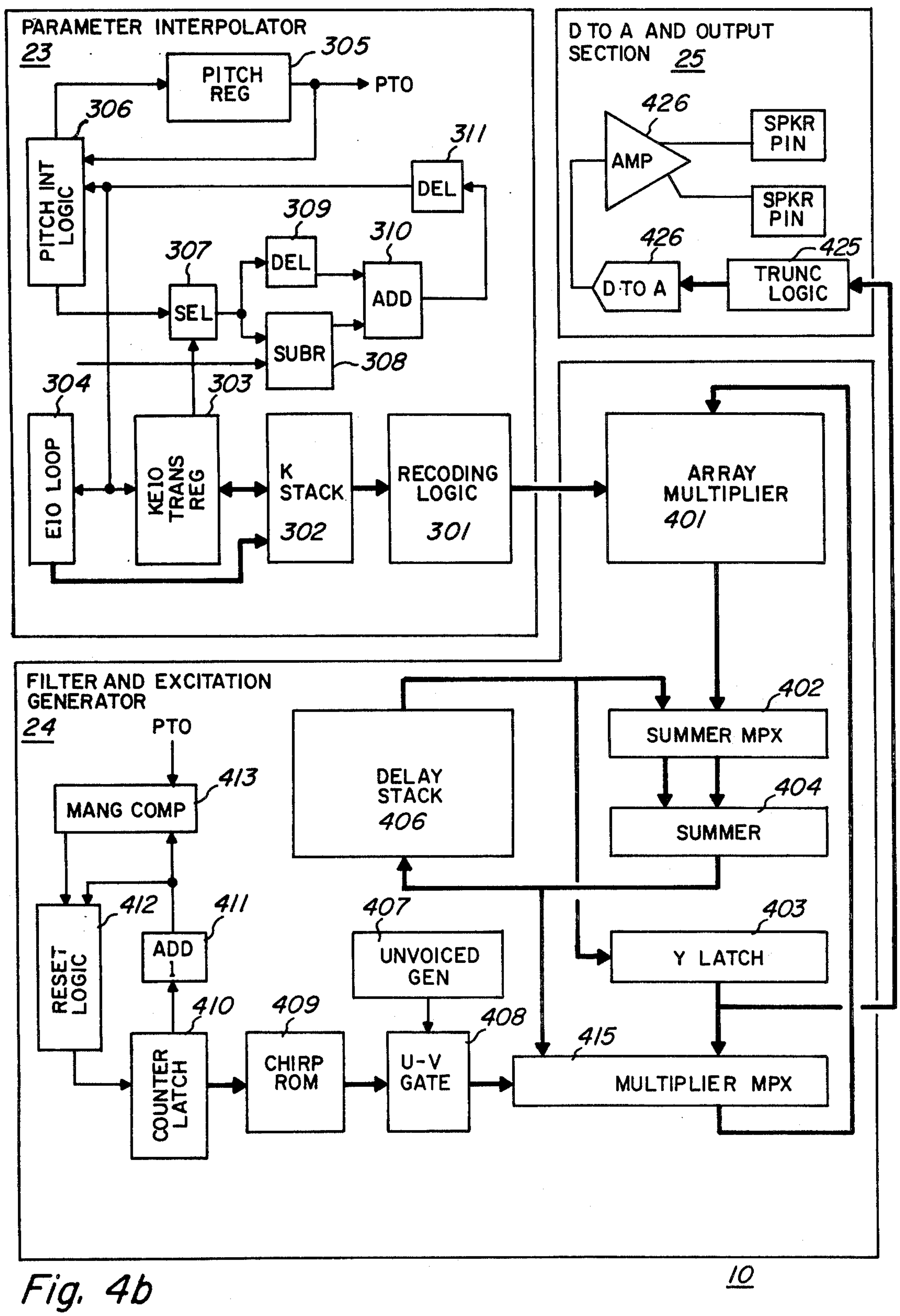

FIGS. 4*a* and 4*b* form a composite block diagram of the synthesizer 10. Synthesizer 10 is shown as having six major functional blocks, all but one of which are shown in greater detail in block diagram form in FIGS. 4*a* and 4*b*. The six major functional blocks are timing logic 20; ROM-Controller interface logic 21; parameter loading, storage and decoding logic 22; parameter interprelater 23; filter and excitation generator 24 and D to A and output section 25. Subsequentially, these major functional blocks will be described in detail with respect to FIGS. 5a–b, 6, 7a–b, 8a–c, 9a–b, 10a–d and 11a–b.

ROM/CONTROLLER INTERFACE LOGIC

Referring again to FIGS. 4a and 4b, ROM/Controller interface logic 21 couples synthesizer 10 to read-only-memories 12a and 12b and to controller 11. The control 1-8 (CTL1-CTL8), chip select (CS) and processor data clock (PDC) pins are coupled, in this embodiment, to the controller while the address 1-8 (ADD1-ADD8) and instruction 0-1 (I0-I1) pins are connected to ROMs 12a and 12b (as well as ROMs 13a-13b, if used). ROM/Controller interface logic 21 sends address information from controller 11 to the Read-Only-Memories 12a–12b and preferably returns digital information from the ROMs back to the controller 12; logic 21 also brings data back from the ROMs for use by synthesizer 10 and initiates speech. A Chip Select (CS) signal enables tristate buffers, such as buffers 213, and a three bit command latch 210. A Processor Data Clock (PDC) signal sets latch 210 to hold the data appearing at CTL1-CTL4 pins from the controller. Command latch 210 stores a three bit command from controller 11, which is decoded by command decoder 211. Command decoder 211 is responsive to eight commands which are: speak (SPK) or speak slowly (SPKSLOW) for causing the synthesizer to access data from the Read-Only-Memory and speak in response thereto either at a normal rate or at a slow rate; a reset (RST) command for resetting the synthesizer to zero; a test talk (TTALK) so that the controller can assertain whether or not the synthesizer is still speaking; a load address (LA) where four bits are received from the controller chip at the CTL1-CTL8 pins and transferred to the ROMs as an address digit via the ADD1-ADD8 pins and associated buffers 211; a read and branch (RB) command which causes the Read-Only-Memory to take the contents of the present and subsequent address and use that for a branch address; a read (RE) command which causes the Read-Only-Memory to output one bit of data on ADD1, which data shifts into a four bit data input register 212; and an output command which transfers four bits of data in the data input register 212 to controller 11 via buffers 213 and the CTL1-CTL8 pins. Once the synthesizer 10 has commenced speaking in response to a SPK or SPKSLOW command it continues speaking until ROM interface logic 21 encounters a RST command or an all ones gate 207 (see FIGS. 7a–7b) detects an "energy equal to fifteen" code and resets talk latch 216 in response thereto. As will be seen, an "energy equal to 15" code is used as the last frame of data in a plurality of frames of data for generating words, phases or sentences. The LA, RE and RB commands decoded by decoder 211 are re-encoded via ROM control logic 217 and transmitted to the read-only-memories via the instruction (I0-I1) pins.

The processor Data Clock (PDC) signal serves other purposes than just setting latch 210 with the data on CTL1-CTL4. It signals that an address is being transferred via CTL1-CTL8 after an LA or output command has been decoded or that the TTALK test is to be performed and outputted on pin CTL8. A pair of latches 218A and B (FIGS. 7a–7b) associated with decoder 211 disable decoder 211 when the aforementioned LA, TSTTALK and OUTPUT commands have been decoded and a subsequent PDC occurs so that the data then on pins CTL1-CTL8 is not decoded.

A TALK latch 216 is set in response to a decoded SPK or SPKSLW command and is reset: (1) during a power up clear (PUC) which automatically occurs whenever the synthesizer is energized; (2) by a decoded RST command or (3) by an "energy equals fifteen" code in a frame of speech data. The TALKD output is delayed output to permit all speech parameters to be inputed into the synthesizer before speech is attempted. The talk slow latch 215 is set in response to a decoded SPKSLOW command and reset in the same manner as latch 216. The SLOWD output is similarly a delayed output to permit all the parameters to be inputted into the synthesizer before speech is attempted.

PARAMETER LOADING, STORAGE AND DECODING LOGIC

The parameter loading, storage and decoding logic 22 includes a six bit long parameter input register 205 which receives serial data from the read-only-memory via pin ADD1 in response to a RE command outputted to the selected read-only-memory via the instruction pins. A coded parameter random access memory (RAM) 203 and condition decoders and latches 208 are connected to receive the data inputted into the parameter input register 205. As will be seen, each frame of speech data is inputted in three to six bit portions via parameter input register 205 to RAM 203 in a coded format where the frame is temporarily stored. Each of the coded parameters stored in RAM 203 are converted to a ten bit parameter by parameter ROM 202 and temporarily stored in a parameter output register 201.

As will be discussed with respect to FIG. 6, the frames of data may be either wholly are partially inputted into parameter input register 205, depending upon the length of the particular frame being inputted. Condition decoders and latches 208 are responsive to particular portions of the frame of data for setting repeat, pitch equal zero, energy equal zero, old pitch and old energy latches. The function of these latches will be discussed subsequently with respect to FIGS. 7a–7b. The condition decoders and latches 208 as well as various timing signals are used to control various interpolation control gates 209. Gates 209 generate an inhibit signal when interpolation is to be inhibited, a zero parameter signal when the parameter is to be zeroed and a parameter load enable signal which, among other things, permits data in parameter input register 205 to be loaded into the coded parameter RAM 203.

PARAMETER INTERPOLATER

The parameters in parameter output registers 201 are applied to the parameter interpolator functional block 23. The inputted K1–K10 speech parameters, including speech energy are stored in a K-stack 302 and E10 loop 304, while the pitch parameter is stored in a pitch register 305. The speech parameters and energy are applied via recoding logic 301 to array multiplier 401 in the filter and excitation generator 24. As will be seen, however, when a new parameter is loaded into parameter output register 201 it is not immediately inserted into K-stack 302 or E10 loop 304 or register 305 but rather the corresponding value in K-stack 302, E10 loop 304 or register 305 goes through eight interpolation cycles during which a portion of the difference between the present value in the K-stack, E10 loop 305 or register 305 and the target value of that parameter in parameter output register 201 is added to the present value in K-stack 203, E10 loop 304 or register 305.

Essentially the same logic circuits are used to perform the interpolation of pitch, energy and the K1–K10 speech parameters. The target value from the parameter output register 201 is applied along with the present value of the corresponding parameter to a subtractor 308. A selector 307 selects either the present pitch from pitch logic 306 or present energy or K coefficient data from KE10 transfer register 303, according to which parameter is currently in parameter output register 201, and applies the same to subtractor 308 and a delay circuit 309. As will be seen, delay circuit 309 may provide anywhere between zero delay to three bits of delay. The output of delay circuit 309 as well as the output of subtractor 308 is supplied to an adder 310 whose output is applied to a delay circuit 311. When the delay associated with delay circuit 309 is zero the target value of the particular parameter in parameter output register 201 is effectively inserted into K-stack 302, E10 loop 304 or pitch register 305, as is appropriate. The delay in delay circuit 311 is three to zero bits, being three bits when the delay in the delay circuit 309 is zero bits, whereby the total delay through selector, 307 delay, 309 and 311, adder 310 and subtractor 308 is constant. By controlling the delays in delay circuit 309 and 311, either all, ½, ¼ or ⅛ of the difference outputted from subtractor 308 (that being the difference between the target value and the present value) is added back into the present value of the parameter. By controlling the delays in the fashion set forth in Table IV, a relatively smooth eight step parameter interpolation is accomplished.

U.S. Patent application Ser. No. 807,461, since abandoned and continued in U.S. Patent Application Ser. No. 905,328, filed May 12, 1978 discusses with reference to FIG. 7 thereof a speech synthesis filter wherein speech coefficients K1-K9 are stored in the K-stack continuously, until they are updated, while the K10 coefficient and the speech energy (referred to by the letter A in U.S. Patent Application Ser. No. 807,461), since abandoned and continued in U.S. Patent Application Ser. No. 905,328, filed May 12, 1978, are periodically exchanged. In parameter interpolator 23, speech coefficients K1–K9 are likewise stored in stack 302, until they are updated, whereas the energy parameter and the K10 coefficient effectively exchange places in K-stack 302 during a twenty time period cycle of operations in the filter and excitation generator 24. To accomplish this function, E10 loop 304 stores both the energy parameter and the $K_{10}$ coefficient and alternately inputs the same into the appropriate location in K-stack 302. KE10 transfer register 303 is either loaded with the K10 or energy parameter from E10 loop 304 or the appropriate K1-K9 speech coefficient from K-stack 302 for interpolation by logics 307-311.

As will be seen, recoding logic 301 preferably performs a Booth's algorithm on the data from K-stack 302, before such data is applied to array multiplier 401. Recoding logic 301 thereby permits the size of the array multiplier 401 to be reduced compared to the array multiplier described in U.S. Patent Application Ser. No. 807,461, since abandoned and continued in U.S. Patent Application Ser. No. 905,328, filed May 12, 1978.

FILTER AND EXCITATION GENERATOR

The filter excitation generator 24 includes the array multiplier 401 whose output is connected to a summer multiplexer 402. The output of summer multiplexer 402 is coupled to the input of summer 404 whose output is coupled to a delay stack 406 and multiplier multiplexer 405. The output of the delay stack is applied as an input to summer multiplexer 402 and to Y latch 403. The output of Y latch 403 is coupled to an input of multiplier multiplexer 405 along with truncation logic 501. The output of multiplier multiplexer 405 is applied as an input to array multiplier 401. As will be seen filter and excitation generator 24 make use of the lattice filter described in U.S. Patent Application Ser. No. 807,461, since abandoned and continued in U.S. Patent Application Ser. No. 905,328, filed May 12, 1978. Various minor interconnections are not shown in FIG. 4*b* for sake of clarity, but which will be described with reference to FIGS. 10*a*, 10*b*, 11*a* and 11*b*. The arrangement of the foregoing elements generally agrees with the arrangement shown in FIG. 7 of U.S. Patent Application Ser. No. 807,461, since abandoned and continued in U.S. Patent Application Ser. No. 905,328, filed May 12, 1978; thus array multiplier 401 corresponds to element 30′, summer multiplexer 402 corresponds to elements 37*b*′, 37*c*′ and 37*d*′, gates 414 (FIGS. 11*a* and 11*b*) correspond to element 33′, delay stack 406 corresponds to elements 34′ and 35′, Y latch 403 corresponds to element 36′ and multiplier multiplexer 405 corresponds to elements 38*a*′, 38*b*′, 38*c*′ and 38*d*′.

The voice excitation data is supplied from unvoiced/voice gate 408. As will be subsequently described in greater detail, the parameters inserted into parameter input gate 205 are supplied in a compressed data format. According to the data compression scheme used, when the coded pitch parameter is equal zero in input register 205, it is interpreted as an unvoiced condition by condition decoders and latches 208. Gate 408 responds by supplying randomized data from unvoiced generator 407 as the excitation input on line 414. When the coded pitch parameter is of some other value, however, it is decoded by parameter ROM 202, loaded into parameter output register 201 and eventually inserted into pitch register 305, either directly or by the interpolation scheme previously described. Based on the period indicated by the number in pitch register 305, voiced excitation is derived from chirp ROM 409. As discussed in U.S. Patent Application Ser. No. 807,461, since abandoned and continued in U.S. Patent Application Ser. No. 905,328, filed May 12, 1978, the voiced excitation signal may be an impulse function or some other repeating function such as a repeating chirp function. In this embodiment, a chirp has been selected as this tends to reduce the "fuzziness" from the speech generated (because it apparently more closely models the action of the vocal cards than does a impulse function) which chirp is repetitively generated by chirp ROM 409. Chirp ROM 409 is addressed by counter latch 410, whose address is incremented in an add one circuit 411. The address in counter latch 410 continues to increment in add one circuit 411, recirculating via reset logic 412 until magnitude comparator 413, which compares the magnitude of the address being outputted from add one circuit 411 and the contents of the pitch register 305, indicates that the value in counter latch 410 then compares with or exceeds the value in pitch register 305, at which time reset logic 412 zeroes the address in counter 410. Beginning at address zero and extending through approximately fifty addresses is the chirp function in chirp ROM 409. Counter latch 410 and chirp ROM 409 are set up so that addresses larger than fifty do not cause any portion of the chirp function to be outputted from chirp ROM 409 to UV gate 408. In this manner the chirp function is repetitively generated on a pitch related period during voiced speech.

SYSTEM TIMING

Figure 5:
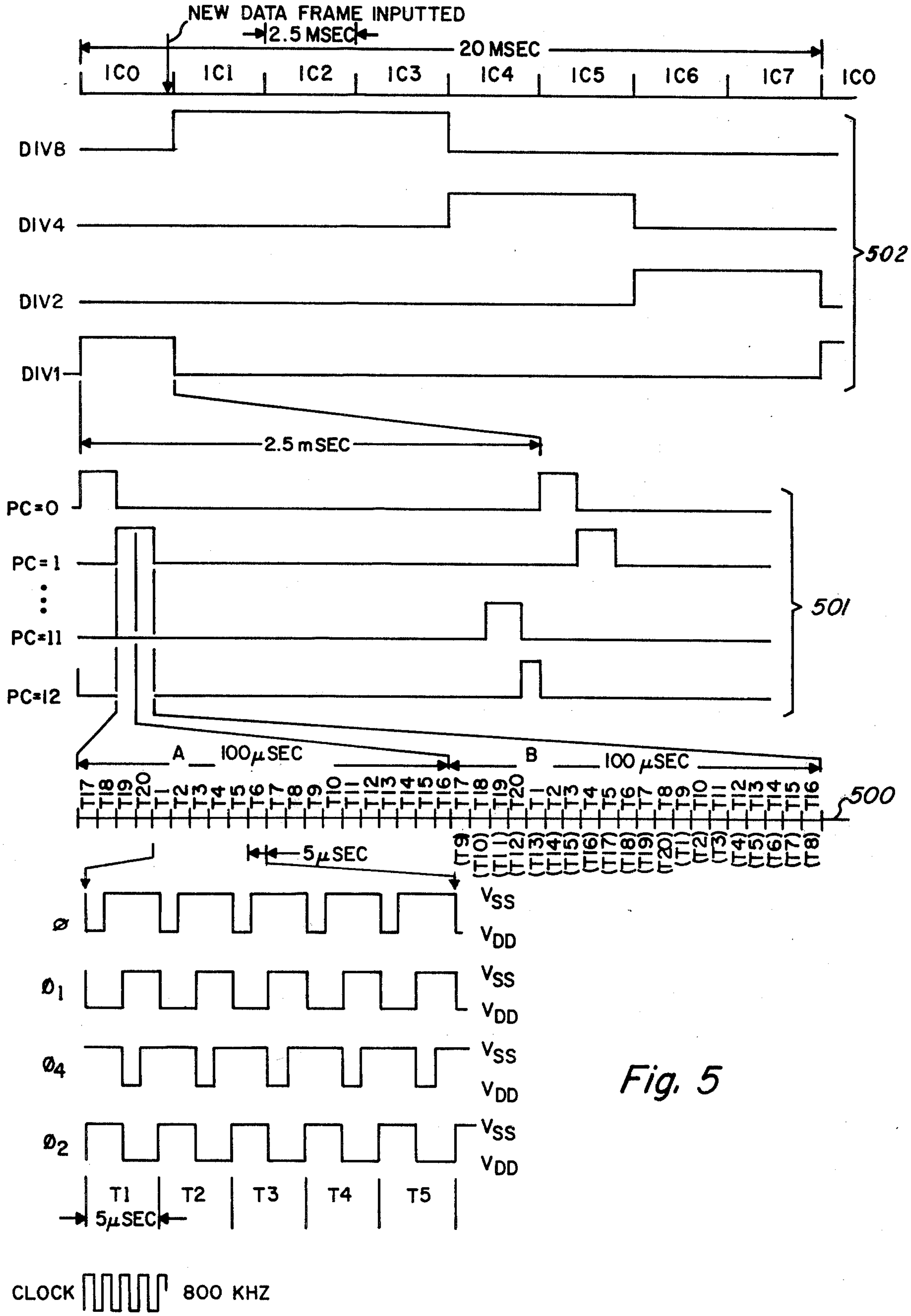
FIG. 5 is a timing diagram of various timing signals preferably used on the synthesizer.

FIG. 5 depicts the timing relationships between the occurrences of the various timing signals generated on synthesizer chip 10. Also depicted are the timing relationships with respect to the time new frames of data are inputted to synthesizer chip 10, the timing relationship with respect to the interpolations performed on the inputted parameters, the timing relations with respect to the foregoing with the time periods of the lattice filter and the relationship of all the foregoing to the basic clock signals.

The synthesizer is preferably implemented using precharged, conditional discharge type logics and therefore FIG. 5 shows clocks Φ1–Φ4 which may be appropriately used with such precharge-conditional discharge logic. There are two main clock phases (Φ1 and Φ2) and two precharge clock phases (Φ3 and Φ4). Phase Φ3 goes low during the first half of phase Φ1 and serves as a precharge therefor. Phase Φ4 goes low during the first half of phase Φ2 and serves as a precharge therefore. A set of clocks Φ1–Φ4 required to clock one bit of data and thus correspond to one time period.

The time periods are labeled T1–T20 and each preferably has a time period on the order of five microseconds. Selecting a time period on the order of five microseconds permits, as will be seen, data to be outputted from the digital filter at a ten kilohertz rate (i.e., at a 100 microsecond period) which provides for a frequency response of five kilohertz in the D to A output section 25 (FIG. 4*b*). It will be appreciated by those skilled in the art, however, that depending on the frequency response which is desired and depending upon the number of Kn speech coefficients used, and also depending upon the type of logics used, that the periods or frequencies of the clocks and clock phases shown in FIG. 5 may be substantially altered, if desired.

As is explained in U.S. Patent Application Ser. No. 807,461, since abandoned and continued in U.S. Patent Application Ser. No. 905,328, filed May 12, 1978, one cycle time of the lattice filter in filter excitation generator 24, preferably comprises twenty time periods, T1–T20. For reasons not important here, the numbering of these time periods differs between this application and U.S. Patent Application Ser. No. 807,461, since abandoned and continued in U.S. Patent Application Ser. No. 905,328, filed May 12, 1978. To facilitate the reader's understanding of the differences in the numbering of the time periods, both numbering schemes are shown at the time period time line 500 in FIG. 5. At time line 500, the time periods, T1–T20 which are not enclosed in parenthesis identify the time periods according to the convention used in this application. On the other hand, the time periods convention used in U.S. Patent Application Ser. No. 807,461, since abandoned and continued in U.S. Patent Application Ser. No. 905,328, filed May 12, 1978. Thus, time period T17 is equivalent to time period (T9).

At numeral 501 is depicted the parameter count (PC) timing signals. In this embodiment there are thirteen PC signals, PC=0 through PC=12. The first twelve of these, PC=0 through PC=11 correspond to times when the energy, pitch, and K1–K10 parameters, respectively, are available in parameter output register 201. Each of the first twelve PC's comprise two cycles, which are labeled A and B. Each such cycle starts at time period T17 and continues to the following T17. During each PC the target value from the parameter output register 201 is interpolated with the existing value in K-stack 302 in parameter interpolator 23. During the A cycle, the parameter being interpolated is withdrawn from the K-stack 302, E10 loop 304 or register 305, as appropriate, during an appropriate time period. During the B cycle the newly interpolated value is reinserted in the K-stack (or E10 loop or pitch register). The thirteenth PC, PC=12, is provided for timing purposes so that all twelve parameters are interpolated once each during a 2.5 milliseconds interpolation period.

As was discussed with respect to the parameter interpolator 23 of FIG. 4*b* and Table IV, eight interpolations are performed for each inputting of a new frame of data from ROMs **12*a*–*b* into synthesizer 10. This is seen at number 502 of FIG. 5 where timing signals DIV 1, DIV 2, DIV 4 and DIV8 are shown. These timing signals occur during specific interpolation counts (IC) as shown. There are eight such interpolation counts, IC0–IC7. New data is inputted from the ROMs 12*a*–*b* into the synthesizer during IC0. These new target values of the parameters are then used during the next eight interpolation counts, IC1 throught IC0; the existing parameters in the pitch register 305 K-stack 302 and E10 loop 304 are interpolated once during each interpolation count. At the last interpolation count, IC0, the present value of the parameters in the pitch register 305, K-stack 302 and E10 loop 304 finally attain the target values previously inputted toward the last IC0 and thus new target values may then again be inputted as a new frame of data. Inasmuch as each interpolation count has a period of 2.5 milliseconds, the period at which new data frames are inputted to the synthesizer chip is 20 microseconds or equivalent to a frequency of 50 hertz. The DIV 8 signal corresponds to those interpolation counts in which one-eighth of the difference produced by subtractor 308 is added to the present values in adder 310 whereas during DIV 4 one-fourth of the difference is added in, and so on. Thus, during DIV 2, ½ of the difference from subtractor 308 is added to the present value of the parameter in adder 310 and lastly during DIV 1 the total difference is added in adder 310**. As has been previously mentioned, the effect of this interpolation scheme can be seen in Table IV.

PARAMETER DATA COMPRESSION

It has been previously mentioned that new parameters are inputted to the speech synthesizer at a 50 hertz rate. It will be subsequently seen that in parameter interpolator and excitation generator 24 (FIG. 4*b*) the pitch data, energy data and K1--Kn parameters are stored and utilized as ten bit digital binary numbers. If each of these twelve parameters were updated with a ten bit binary number at a fifty hertz rate from an external source, such as ROMs 12*a* and 12*b*, this would require a 12×10×50 or 6,000 hertz bit rate. Using the data compression techniques which will be explained, reduce this bit rate required for synthesizer 10 to on the order of 1,000 to 1,200 bits per second. And more importantly ,it has been found that the speech compression schemes herein disclosed do not appreciably degrade the quality of speech generated thereby in comparison to using the data uncompressed.

Figure 6:
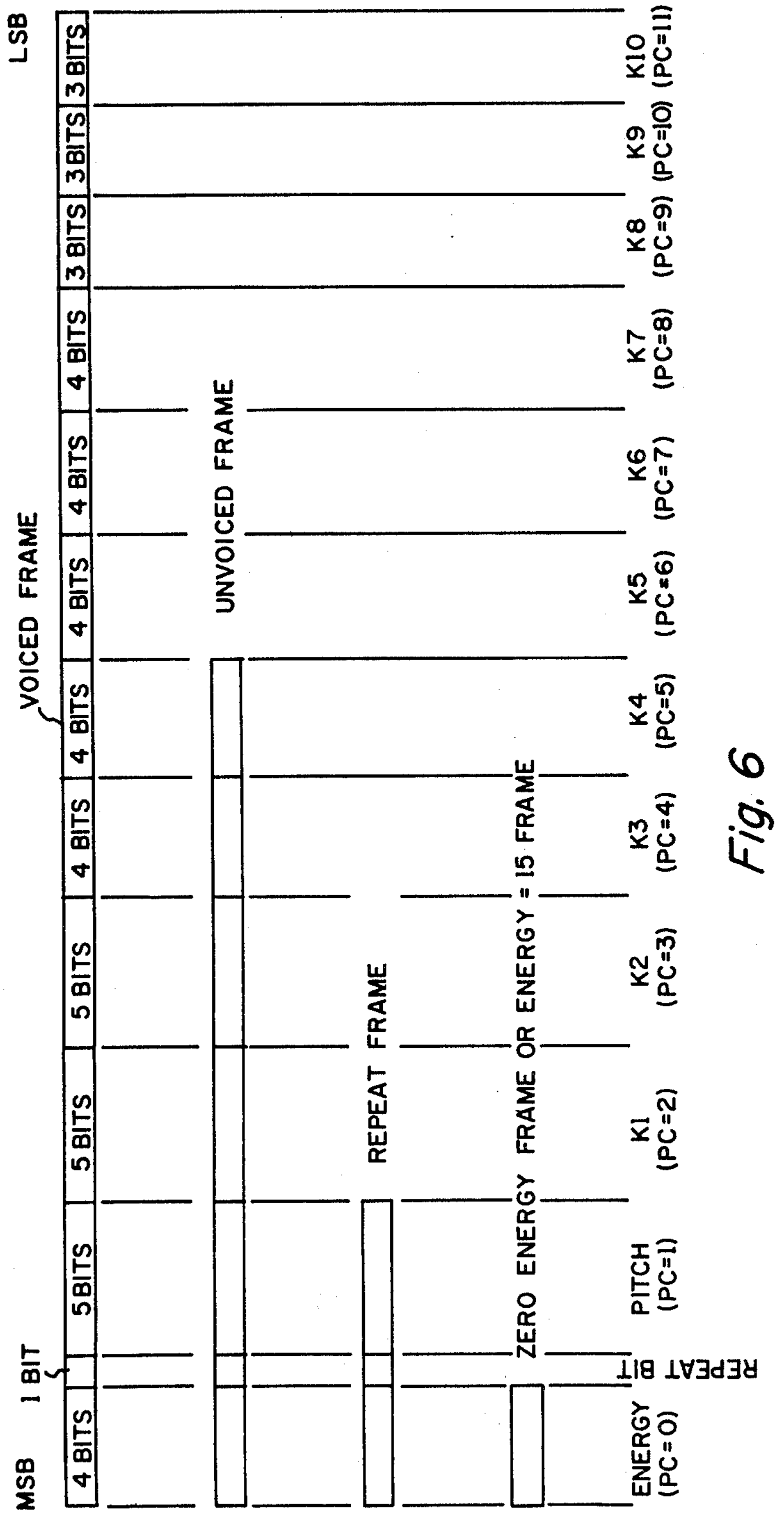
FIG. 6 pictorially shows the data compression scheme preferably used to reduce the data rate required by the synthesizer.

The data compression scheme used is pictorially shown in FIG. 6. Referring now to FIG. 6, it can be seen that there is pictorially shown four different lengths of frames of data. One, labeled voiced frame, has a length of 49 bits while another entitled unvoiced frame, has a length of 28 bits while still another called "repeat frame" has a length of ten bits and stll another which may be alternatively called zero energy frame or energy equals fifteen frame has the length of but four bits. The "voiced frame" supplies four bits of data for a coded energy parameter as well as coded four bits for each of five speech parameters K3 through K7. Five bits of data are reserved for each of three coded parameters, pitch, K1 and K2. Additionally, three bits of data are provided for each of three coded speech parameters K8–K10 and finally another bit is reserved for a repeat bit.

In lieu of inputting ten bits of binary data for each of the parameters, a coded parameter is inputted which is converted to a ten bit parameter by addressing parameter ROM 202 with the coded parameter. Thus, coefficient K1, for example, may have any one of thirty-two different values, according to the five bit code for K1, each one of the thirty-two values being a ten bit numerical coefficient stored in parameter ROM 202. Thus, the actual values of coefficients K1 and K2 may have one of thirty-two different values while the actual values of coefficients K3 through K7 may be one of sixteen different values and the values of coefficients K8 through K9 may be one of eight different values. The coded pitch parameter is five bits long and therefore may have up to thirty-two different values. However, only thirty-one of these reflect actual pitch values, a pitch code of 00000 being used to signify an unvoiced frame of data. The coded energy parameter is four bits long and therefore would normally have sixteen available ten bit values; however, a coded energy parameter equal to 0000 indicates a silent frame such as occur as pauses in and between words, sentences and the like. A coded energy parameter equal to 1111 (energy equals fifteen), on the other hand, is used to signify the end of a segment of spoken speech, thereby indicating that the synthesizer is to stop speaking. Thus, of the sixteen codes available for the coded energy parameter, fourteen are used to signify different ten bit speech energy levels.

Coded coefficients K1 and K2 have more bits than coded coefficients K3–K7 which in turn have more bits than coded coefficients K8 through K10 because coefficient K1 has a greater effect on speech than K2 which has a greater effect on speech than K3 and so forth through the lower order coefficients. Thus given the greater significance of coefficients K1 and K2 than coefficients K8 through K10, for example, more bits are used in coded format to define coefficients K1 and K2 than K3–K7 or K8–K10.

Also it has been found that voiced speech data needs more coefficients to correctly model speech than does unvoiced speech and therefore when unvoiced frames are encountered, coefficients K5 through K10 are not updated, but rather are merely zeroed. The synthesizer realizes when an unvoiced frame is being outputted because the uncoded pitch parameter is equal to 00000.

It has also been found that during speech there often occur instances wherein the parameters do not significantly change during a twenty millisecond period; particularly, the K1-K10 coefficients will often remain nearly unchanged. Thus, a repeat frame is used wherein new energy and new pitch are inputted to the synthesizer, however, the K1–K10 coefficients previously inputted remain unchanged. The synthesizer recognizes the ten bit repeat frame because the repeat bit between energy and pitch then comes up whereas it is normally off. As previously mentioned, there occur pauses between speech or at the end of speech which are preferably indicated to the synthesizer; such pauses are indicated by a coded energy frame equal to zero, at which time the synthesizer recognizes that only four bits are to be sampled for that frame. Similarly, only four bits are sampled when an "energy equals fifteen". Using coded values for the speech in lieu of actual values, alone would reduce the data rate to 48×50 or 2400 bits per second. By additionally using variable frame lengths, as shown in FIG. 6, the data rate may be further reduced to on the order of one thousand to twelve hundred bits per second, depending on the speaker and on the material spoken.

The effect of this data compression scheme can be seen from Table V where the coding for the word "HELP" is shown. Each line represents a new frame of data. As can be seen, the first part of the word "HELP", "HEL", is mainly voiced while the "P" is unvoiced. Also note the pause between "HEL" and "P" and the advantages of using the repeat bit. Table VI sets forth the encoded and decoded speech parameter. The 3, 4 or 5 bit code appears as a hexadecimal number in the left-hand column, while the various decoded parameter values are shown as ten bit, two's complement numbers expressed as hexadecimal numbers in tabular form under the various parameters. The decoded speech parameter are stored in ROM 203. The repeat bit is shown in Table V between the pitch and K parameters for sake of clarity; preferably, according to the embodiment of FIG. 6, the repeat bit occurs just before the most significant bit (MSB) of the pitch parameter.

SYNTHESIZER LOGIC DIAGRAMS

The various portions of the speech synthesizer of FIGS. 4*a* and 4*b* will now be described with reference to FIGS. 7*a* through 14*b* which, depict, in detail, the logic circuits implemented on a semiconductor chip, for example, to form the synthesizer 10. The following discussion, with reference to the aforementioned drawings, refers to logic signals available at many points in the circuit. It is to be remembered that in P channel MOS devices a logical zero corresponds to a negative voltage, that is, Vdd, while a logical one refers to a zero voltage, that is, Vss. It should be further remembered that P-channel MOS transistors depicted in the aforementioned figures are conductive when a logical zero, that is, a negative voltage, is applied at their respective gates. When a logic signal is referred to which is unbarred, that is, has no bar across the top of it, the logic signal is to be interpreted as "TRUE" logic; that is, a binary one indicates the presence of the signal (Vss) whereas a binary zero indicates the lack of the signal (Vdd). Logic signal names including a bar across the top thereof are "FALSE" logic; that is, a binary zero (Vdd voltage) indicates the presence of the signal whereas a binary one (Vss voltage) indicates that the signal is not present. It should also be understood that a numeral three in clocked gates indicates that phase Φ3 is used as a precharge whereas a four in a clocked gate indicates that phase Φ4 is used as a precharge clock. An "S" in the gate indicates that the gate is statistically operated.

TIMING LOGIC DIAGRAM

Figure 7A:
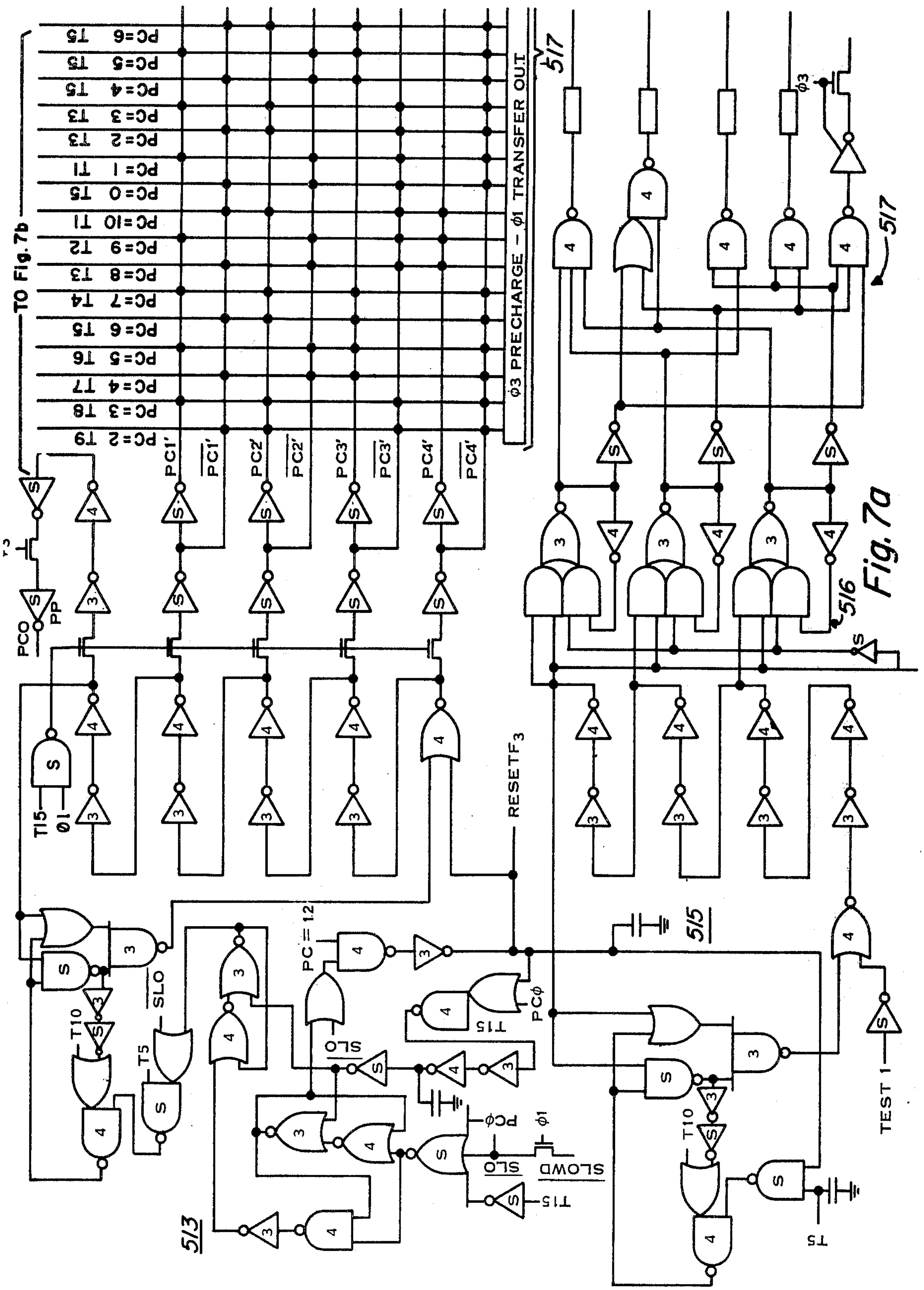
FIGS. 7*a* and 7*b* form a composite logic diagram of the synthesizer's timing circuits.
Figure 7A:
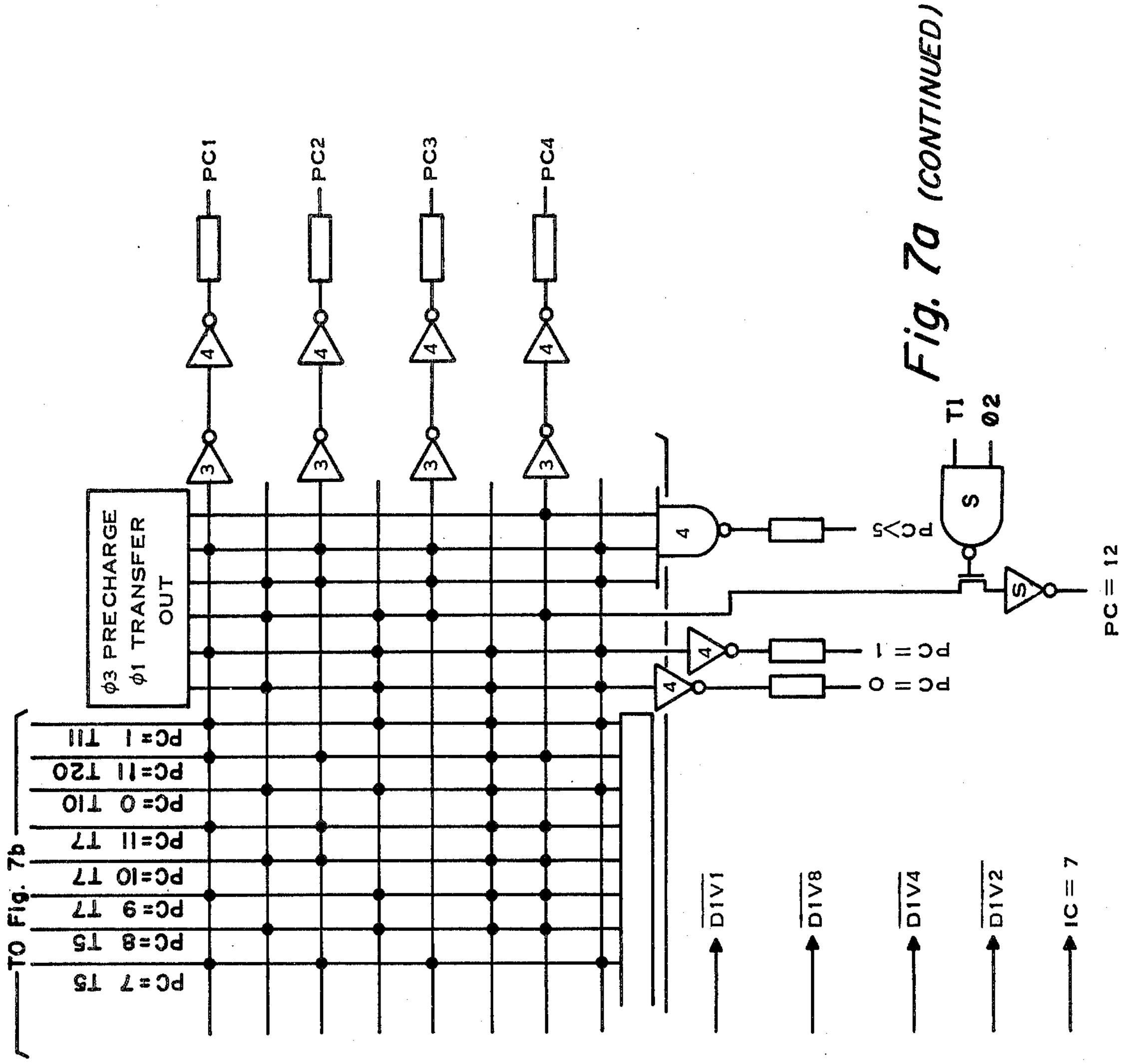
Figure 7B:
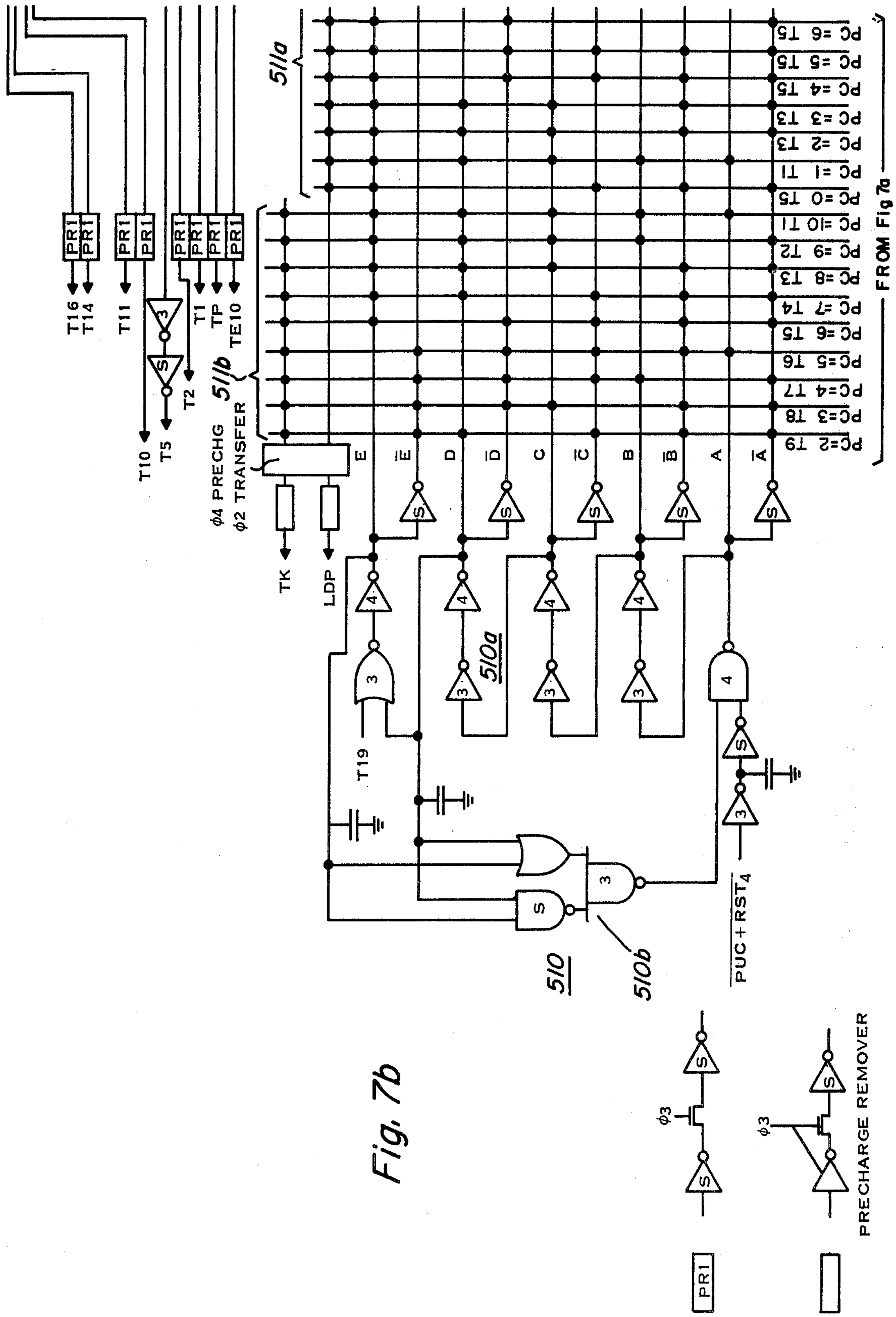
Figure 7B:
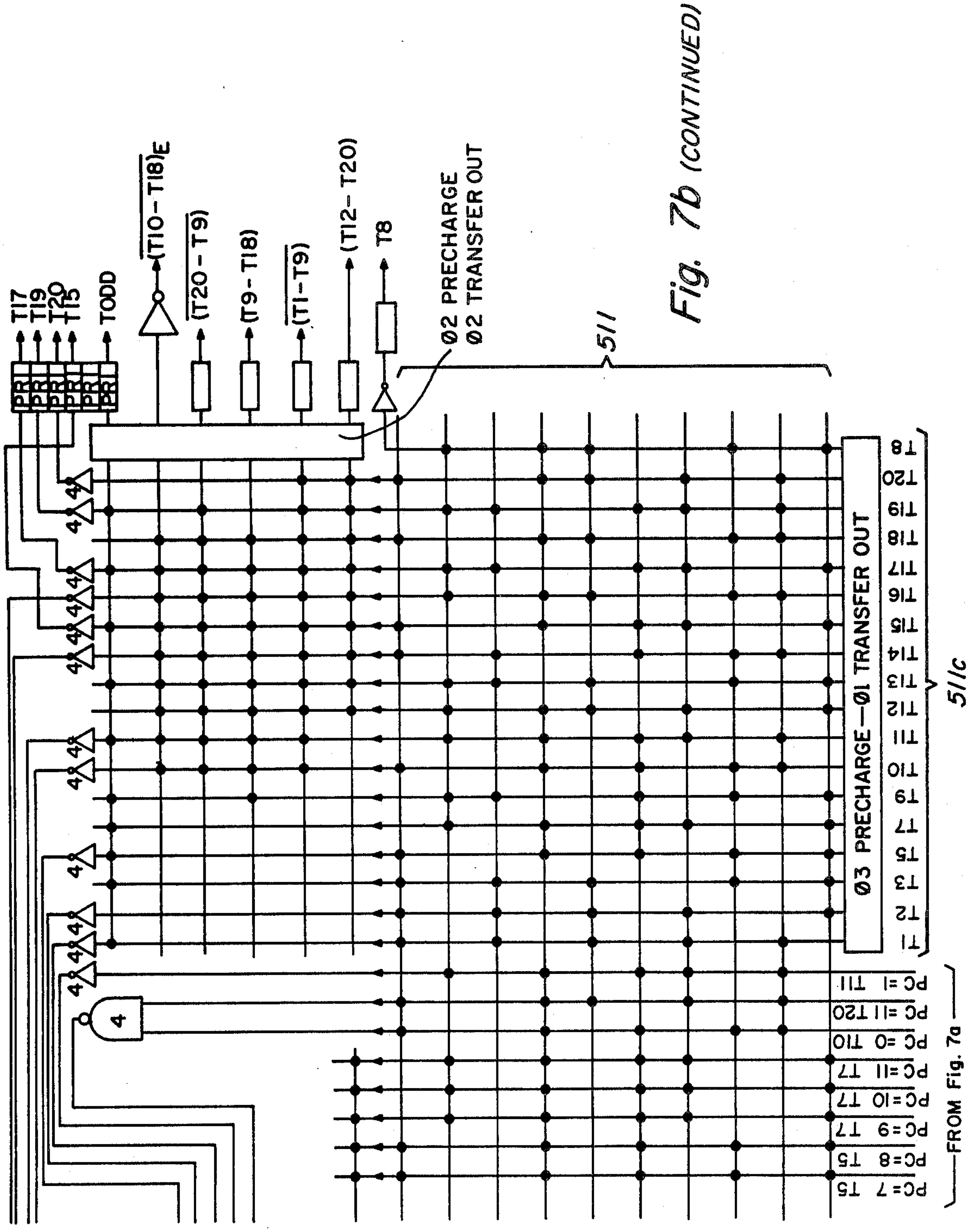

Referring now to FIGS. 7*a* and 7*b*, they form a composite, detailed logic diagram of the timing logic for synthesizer 10. Counter 510 is a pseudorandom shift counter including a shift register 510*a* and feed back logic 510*b*. The counter 510 counts into pseudorandom fashion and the TRUE and FALSE outputs from shift register 510*a* are supplied to the input section 511 of a timing PLA. The various T time periods decoded by the timing PLA are indicated adjacent to the output lines thereof. Section 511*c* of the timing PLA is applied to an output timing PLA 512 generating various combinations and sequences of time period signals, such as T odd, $\overline{T10}$–$\overline{T18}$, and so forth. Sections 511*a* and 511*b* of timing PLA 511 will be described subsequently.

The parameter count in which the synthesizer is operating is maintained by a parameter counter 513. Parameter counter 513 includes an add one circuit and circuits which are responsive to SLOW and SLOW D. In SLOW, the parameter counter repeats the A cycle of the parameter count twice (for a total of three A cycles) before entering the B cycle. That is, the period of the parameter count doubles so that the parameters applied to the lattice filter are updated and interpolated at half the normal rate. To assure that the inputted parameters are interpolated only once during each parameter count during SLOW speaking operations each parameter count comprises three A cycles followed by one B cycle. It should be recalled that during the A cycle the interpolation is begun and during the B cycle the interpolated results are reinserted back into either K-stack 302, E10 loop 304 or pitch register 305, as appropriate. Thus, merely repeating the A cycle has no affect other than to recalculate the same value of a speech parameter but since it is only reinserted once back into either K-stack 302, E10 loop 304 or pitch register 305 only the results of the interpolation immediately before the B cycle are retained.

Inasmuch as parameter counter 513 includes an add one circuit, the results outputted therefrom, PC1–PC4, represent in binary form, the particular parameter count in which the synthesizer is operating. Output PC0 indicates in which cycle, A or B, the parameter count is. The parameter counter outputs PC1–PC4 are decoded by timing PLA 514. The particular decimal value of the parameter count is decoded by timing PLA 514 which is shown in adjacent to the timing PLA 514 with nomenclature such as PC=0, PC=7 and so forth. The relationship between the particular parameters and the value of PC is set forth in FIG. 6. Output portions 511*a* and 511*b* of timing PLA 511 are also interconnected with outputs from timing PLA 514 whereby the Transfer K (TK) signal goes high during T9 of PC=2 or T8 of PC=3 or T7 of PC=4 and so forth through T1 of PC=10. Similarly, a LOAD Parameter (LDP) timing signal goes high during T5 of PC=0 or T1 of PC=1 or T3 of PC=2 and so forth through T7 of PC=11. As will be seen, signal TK is used in controlling the transfer of data from output register 201 to subtractor 308, which transfer occurs at different T times according to the particular parameter count the parameter counter 513 is in to assure that the appropriate parameter is being outputted from KE10 transfer register 303. Signal LDP is, as will be seen, used in combination with the parameter input register to control the number of bits which are inputted therein according to the number of bits associated with the parameter than being loaded according to the number of bits in each coded parameter as defined in FIG. 6.

Interpolation counter 515 includes a shift register and an add one circuit for binary counting the particular interpolation cycle in which the synthesizer 10 is operating. The relationship between the particular interpolation count in which the synthesizer is operating and the DIV1, DIV2, DIV4 and DIV8 timing signals derived therefrom is explained in detail with reference to FIG. 6 and therefore additional discussion here would be superfluous. It will be noted, however, that interpolation counter 515 includes a three bit latch 516 which is loaded at TI. The output of three bit latch 516 is decoded by gates 517 for producing the aforementioned DIV1 through DIV8 timing signals. Interpolation counter 515 is responsive to a signal RESETF from parameter counter 513 for permitting interpolation counter 515 to increment only after PC=12 has occurred.

ROM/CONTROLLER INTERFACE LOGIC DIAGRAM

Figure 8A:
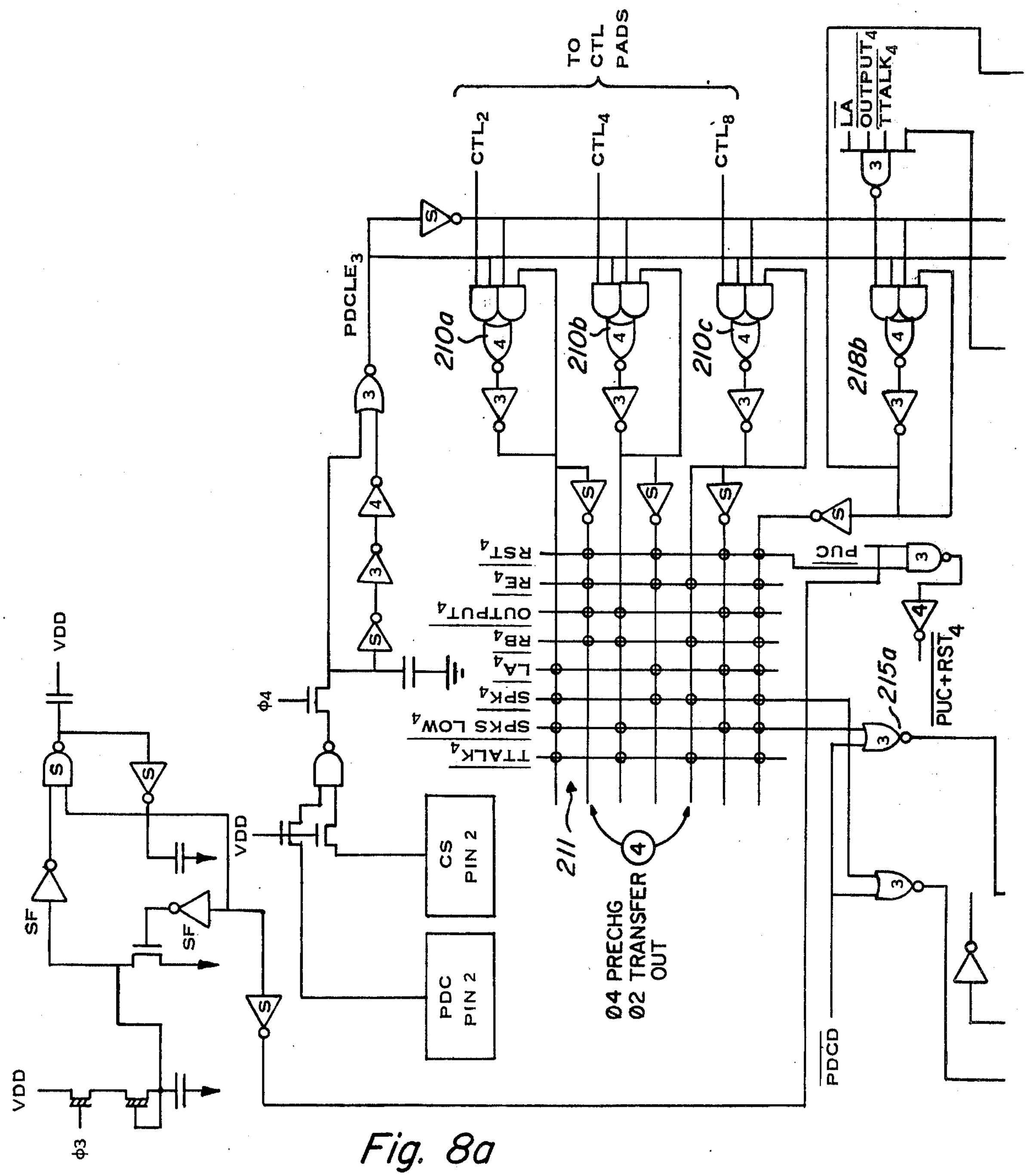
FIGS. 8*a,* 8*b* and 8*c* form a composite logic diagram of the synthesizer's ROM/Controller interface logics.
Figure 8A:
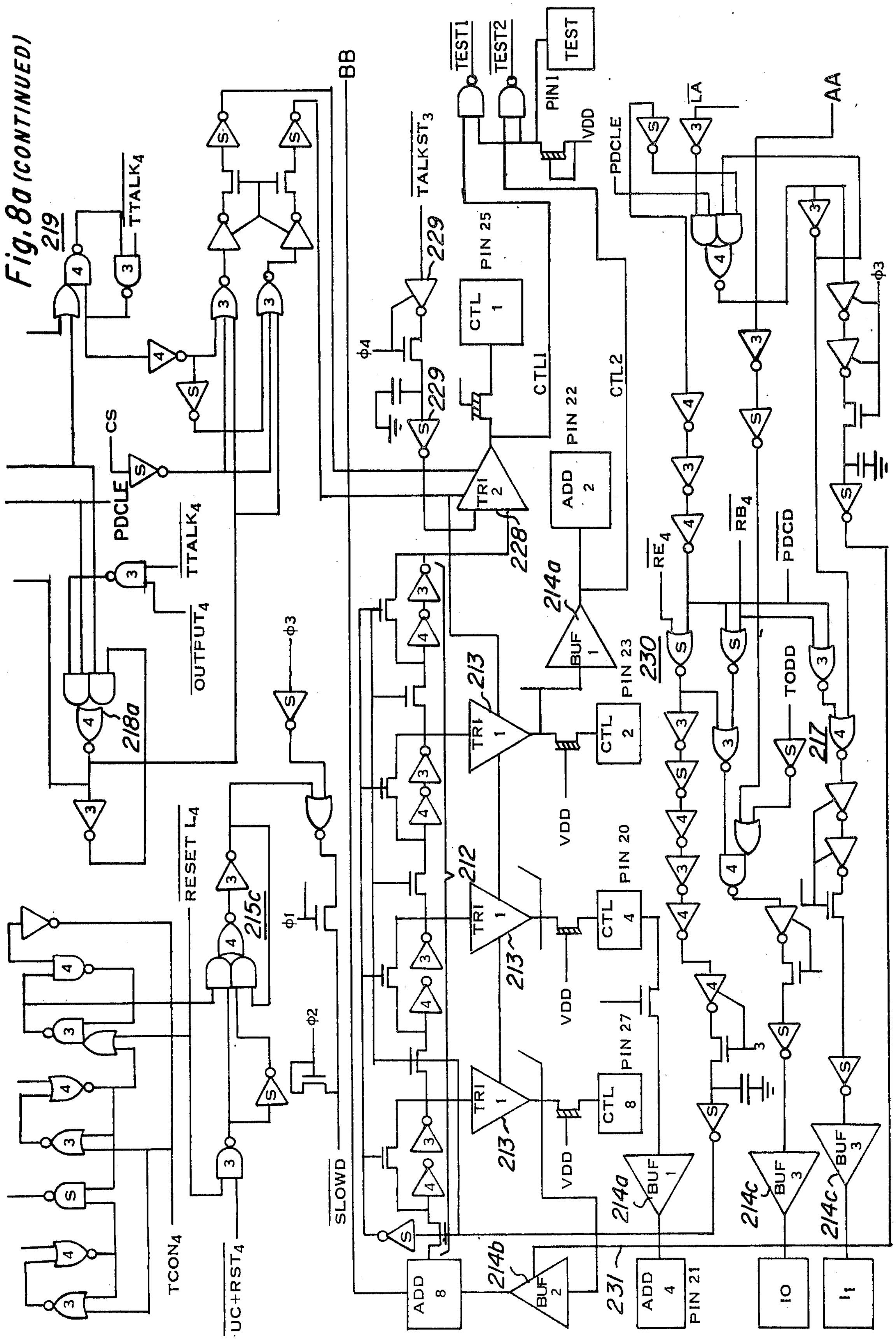
Figure 8B:
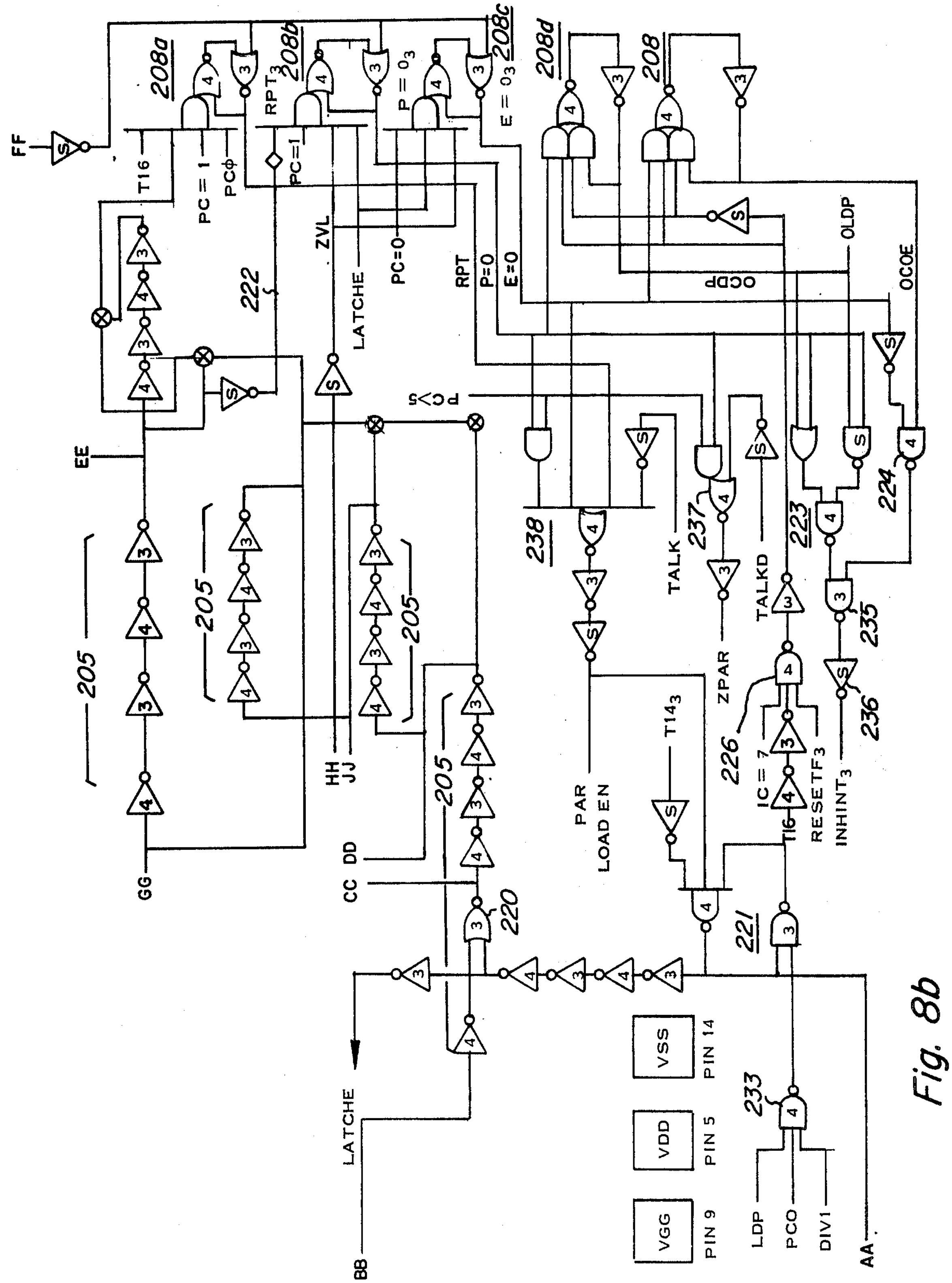
Figure 8B:
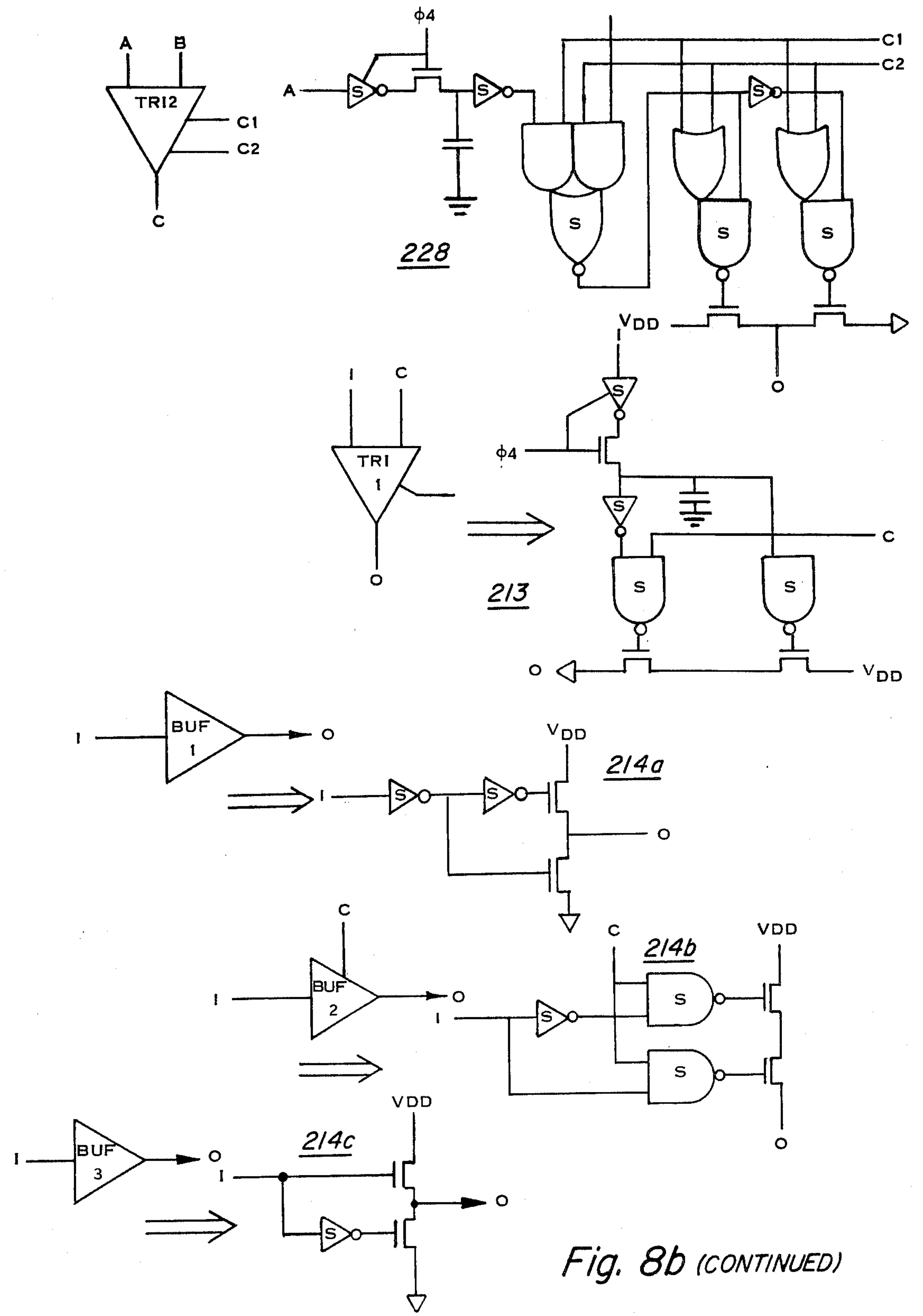
Figure 8C:
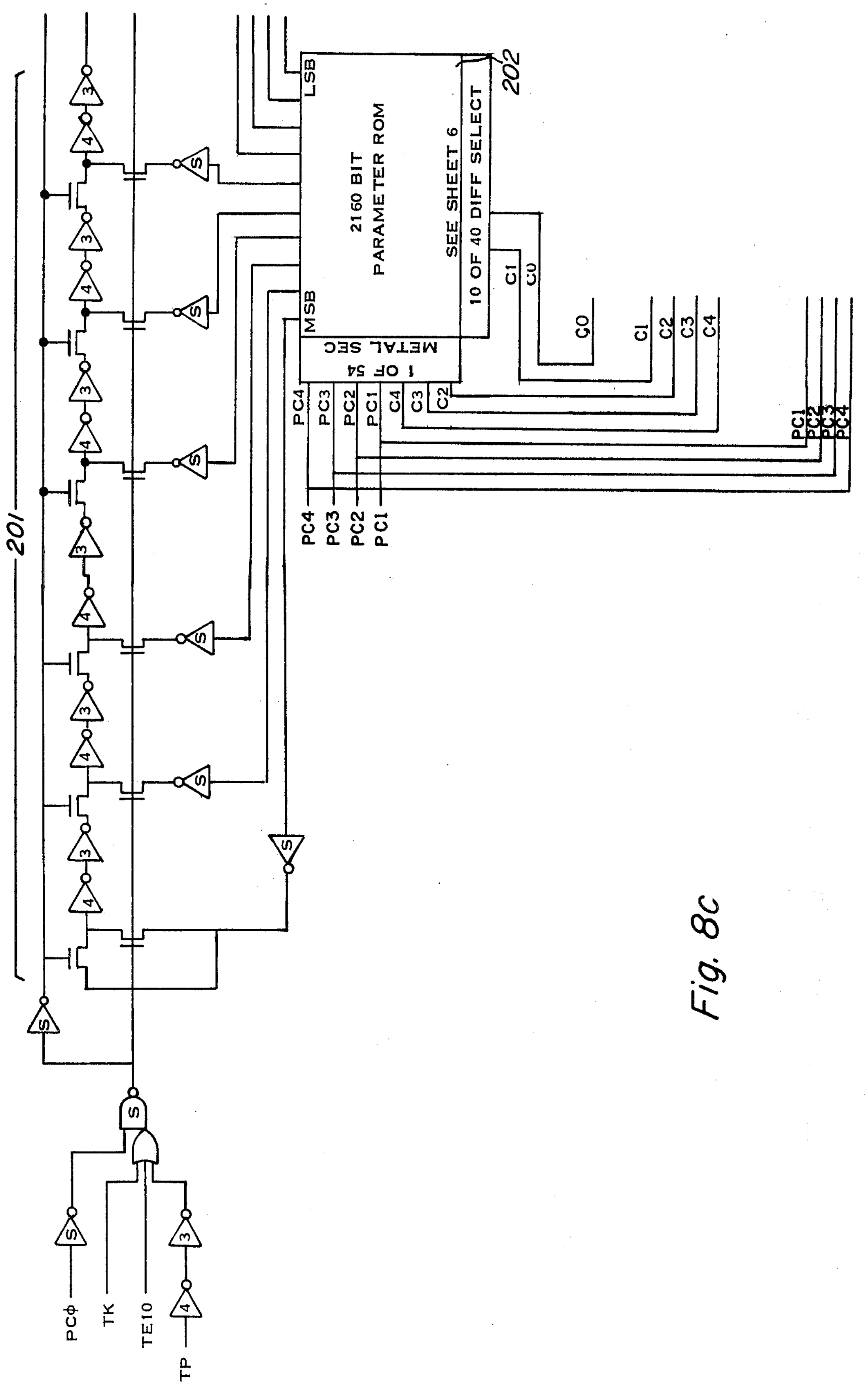
Figure 8C:
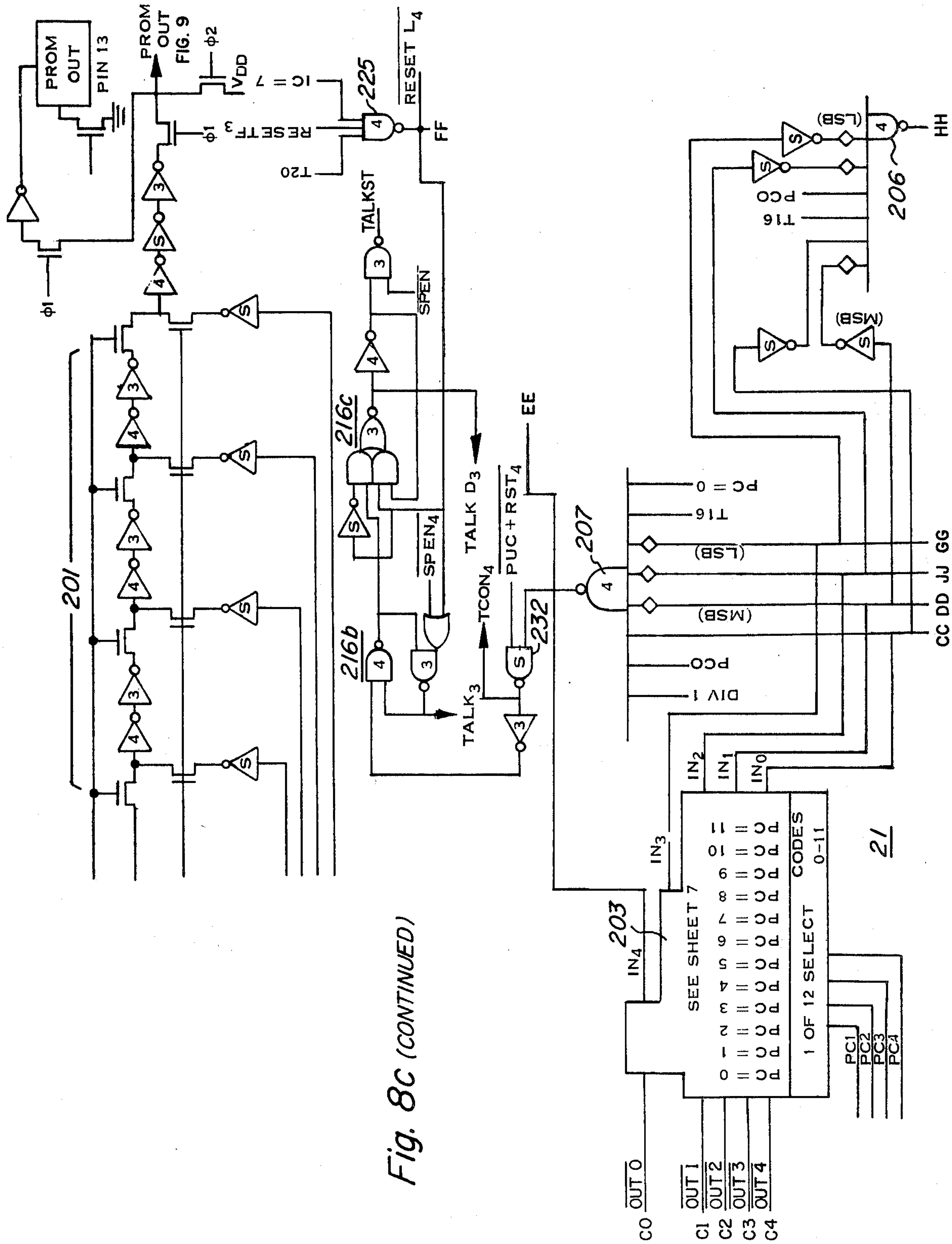

Turning now to FIGS. 8*a*, 8*b* and 8*c*, which form a composite diagram, there is shown a detailed logic diagram of ROM/Controller interface logic 21. Parameter input register 205 is coupled, at its input to address pin ADD8. Register 205 is a size bit shift register, most of the stages of which are two bits long. The stages are two bits long in this embodiment inasmuch as ROMs 12*a* and *b* output, as will be seen, data at half the rate at which data is normally clocked in synthesizer 10. At the input of parameter input register 205 is a parameter input control gate 220 which is responsive to the state of a latch 221. Latch 221 is set in response to LDP, PC0 and DIV1 all being a logical one. It is reset at T14 and in response to parameter load enable from gate 238 being a logical zero. Thus, latch 221 permits gate 220 to load data only during the A portion (as controlled by PC0) of the appropriate parameter count and at an appropriate T time (as controlled by LDP) of IC0 (as controlled by DIV1) provided parameter load enable is at a logical one. Latch 221 is reset by T14 after the data has been inputted into parameter register 205.

The coded data in parameter input register 205 is applied on lines IN0–IN4 to coded parameter RAM 203, which is addressed by PC1–PC4 to indicate which coded parameter is then being stored. The contents of register 205 is tested by all one's gate 207, all zeroes gate 206 and repeat latch 208*a*. As can be seen, gate 206 tests for all zeroes in the four least significant bits of register 205 whereas gate 207 tests for all ones in those bits. Gate 207 is also responsive to PC0, DIV1, T16 and PC=0 so that the zero condition is only tested during the time that the coded energy parameter is being loaded into parameter RAM 203. The repeat bit occurs in this embodiment immediately in front of the coded pitch parameter; therefore, it is tested during the A cycle of PC=1. Pitch latch 208*b* is set in response to all zeroes in the coded pitch parameter and is therefore responsive to not only gate 206 but also the most significant bit of the pitch data on line 222 as well as PC=1. Pitch latch 208*b* is set whenever the loaded coded pitch parameter is a 00000 indicating that the speech is to be unvoiced.

Energy=0 latch 208*c* is responsive to the output of gate 206 and PC=0 for testing whether all zeroes have been inputted as the coded energy parameter and is set in response thereto. Old pitch latch 208*d* stores the output of the pitch=0 latch 208*b* from the prior frame of speech data while old energy latch 208*e* stores the output of energy=0 latch 208*c* from the prior frame of speech data. The contents of old pitch latch 208*d* and pitch=0 latch 208*b* are compared in comparison gates 223 for the purpose of generating an INHIBIT signal. As will be seen, the INHIBIT signal inhibits interpolations and this is desirable during changes from voiced to unvoiced or unvoiced to voiced speech so that the new speech parameters are automatically inserted into K-stack 302, E10 loop 304 and pitch register 305 as opposed to being more slowly interpolated into those memory elements. Also, the contents of old energy latch 208*e* and energy=0 latch 208*c* is tested by NAND gate 224 for inhibiting interpolation for a transition from a non-speaking frame to a speaking frame of data. The outputs of NAND gate 224 and gates 223 are coupled to a NAND gate 235 whose output is inverted to INHIBIT by an inverter 236. Latches 208*a*–208*c* are reset by gate 225 and latches 208*d* and 208*e* are reset by gate 226. When the excitation signal is unvoiced, the K5–K10 coefficients are set to zero, as aforementioned. This is accomplished, in part, by the action of gate 237 which generates a ZPAR signal when pitch is equal to zero and when the parameter counter is greater than five, as indicated by PC 5 from PLA 514.

Also shown in FIGS. 8*a–c* is a command latch 210 which comprises three latches 210*a*, *b*, and *c* which latch in the data at CTL2,4 and 8 in response to a processor data clock (PDC) signal in conjunction with a chip select (CS) signal. The contents of command latch 210 is decoded by command decoder 211 unless disabled by latches 218*a* and 218*b*. As previously mentioned, these latches are responsive to decoded LA, output and TTALK commands for disabling decoder 211 from decoding what ever data happens to be on the CTL2–CTL8 pins when subsequent PDC signals are received in conjunction with the LA, output and TTALK commands. A decoded TTALK command set TTALK latch 219. The output of TTALK latch 219, which is reset by a Processor Data Clock Leading Edge (PDCLE) signal or by an output from latch 218*b*, controls along with the output of latch 218*a* NOR gates 227*a* and *b*. The output of NOR gate 227*a* is a logical one if TTALK latch 219 is set, thereby coupling pins CTL1 to the talk latch via tristate buffer 228 and inverters 229. Tristate latch 228 is shown in detail on the right side of FIGS. 8*a–c*. NOR gate 227*b*, on the other hand, outputs a logical one if an output code has been detected, setting latch 228*a* and thereby connecting pins CTL1 to the most significant bit of data input register 212.

Data is shifted into data input register 212 from address pin 8 in response to a decoded read command by logics 230. RE, RB and LA instructions are outputted to ROM via instruction pins $I_0$–$I_1$ from ROM control logic 217 via buffers 214*c*. The contents of data input register 212 is outputted to CTL1–CTL4 pins via buffers 213 and to the aforementioned CTL1 pin via buffer 228 when NOR gate 227*b* inputs a logical one. CTL1–CTL4 pins are connected to address pins ADD-1–ADD4 via buffers 214*a* and CTL8 pin is connected to ADD8 pin 8 via a control buffer 214*b* which is disabled when addresses are being loaded on the ADD1–ADD8 pins by the signal on line 231.

The Talk latch 216 shown in FIGS. 8*a–c* preferably comprises, three latches 216*a*, 216*b* and 216*c*. Latch 216*a* is set in response to a decoded SPK command and generates, in response thereto, a speak enable (SPEN) signal. As will be seen, SPEN is also generated in response to a decoded SPKSLOW command by latch 215*a*. Latch 216*b* is set in response to speak enable during IC7 as controlled by gate 225. Latches 216*a* and 216*b* are reset in response to (1) a decoded reset command, (2) an energy equals fifteen code or (3) on a power-up clear by gate 232. Talk delayed latch 216*c* is set with the contents of latch 216*b* at the following IC7 and retains that data through eight interpolation counts. As was previously mentioned, the talk delayed latch permits the speech synthesizer to continue producing speech data for eight interpolation cycles after a coded energy=0 condition has been detected setting latch 208*c*. Likewise, slow talk latch 215 is implemented with latches 215*a*, 215*b* and 215*c*. Latch 215*a* enables the speek enable signal while latches 215*b* and 215*c* enable the production of the SLOWD signal in much the same manner as latches 216*b* 216*d* 216*c* enable the production of the TALKD signal.

Considering now, briefly, the timing interactions for inputting data into parameter input register 205, it will be recalled that this is controlled chiefly by a control gate 220 in response to the state of a parameter input latch 221. Of course, the state of the latch is controlled by the LDP signal applied to gate 233. The PC0 and DIV1 signals applied to gate 233 to assure that the parameters are loaded during the A cycle of a particular parameter count during IC0. The particlar parameter and the parameter T-Time within the parameter count is controlled by LDP according to the portion 511*a* of timing PLA 511 (FIGS. 7*a* and 7*b*). The first parameter inputted (Energy) is four bits long and therefore LDP is initiated during time period T5 (as can be seen in FIGS. 7*a* and 7*b*). During parameter count 1, the repeat bit and pitch bits are inputted, this being six bits which are inputted according to LDP which comes up at time period T1. Of course, there four times periods difference between T1 and T5 but only two bits difference in the length of the inputted information. This occurs because it takes two time periods to input each bit into parameter input register 205 (which has two stages per each inputted bit) due to the fact that ROMs 12*a*–12*b* are preferably clocked at half the rate at that which synthesizer 10 is clocked. By clocking the ROM chips at half the rate, that the synthesizer 10 chip is clocked simplifies the addressing of the read-only-memories in the aforesaid ROM chips and yet, as can be seen, data is supplied to the synthesizer 10 in plenty of time for performing numerical operations thereon. Thus, in section 511*a* of timing PLA 511, LDP comes up at T1 when the corresponding parameter count indicates that a six bit parameter is to be inputted, comes up at T3 when the corresponding parameter count indicates that a five bit parameter is to be inputted, comes up at T5 when the correspondng parameter count indicates that a four bit parameter is to be inputted and comes up at time period T7 when the corresponding parameter count (EG parameter counts 9, 10, and 11) which correspond to a three bit coded parameter. ROMS 12*a–b* are signaled that the addressed parameter ROM is to output information when signaled via $I_0$ instruction pin, ROM control logic 217 and line 234 which provides information to ROM control logic 217 from latch 221.

PARAMETER INTERPOLATOR LOGIC DIAGRAM

Figure 9A:
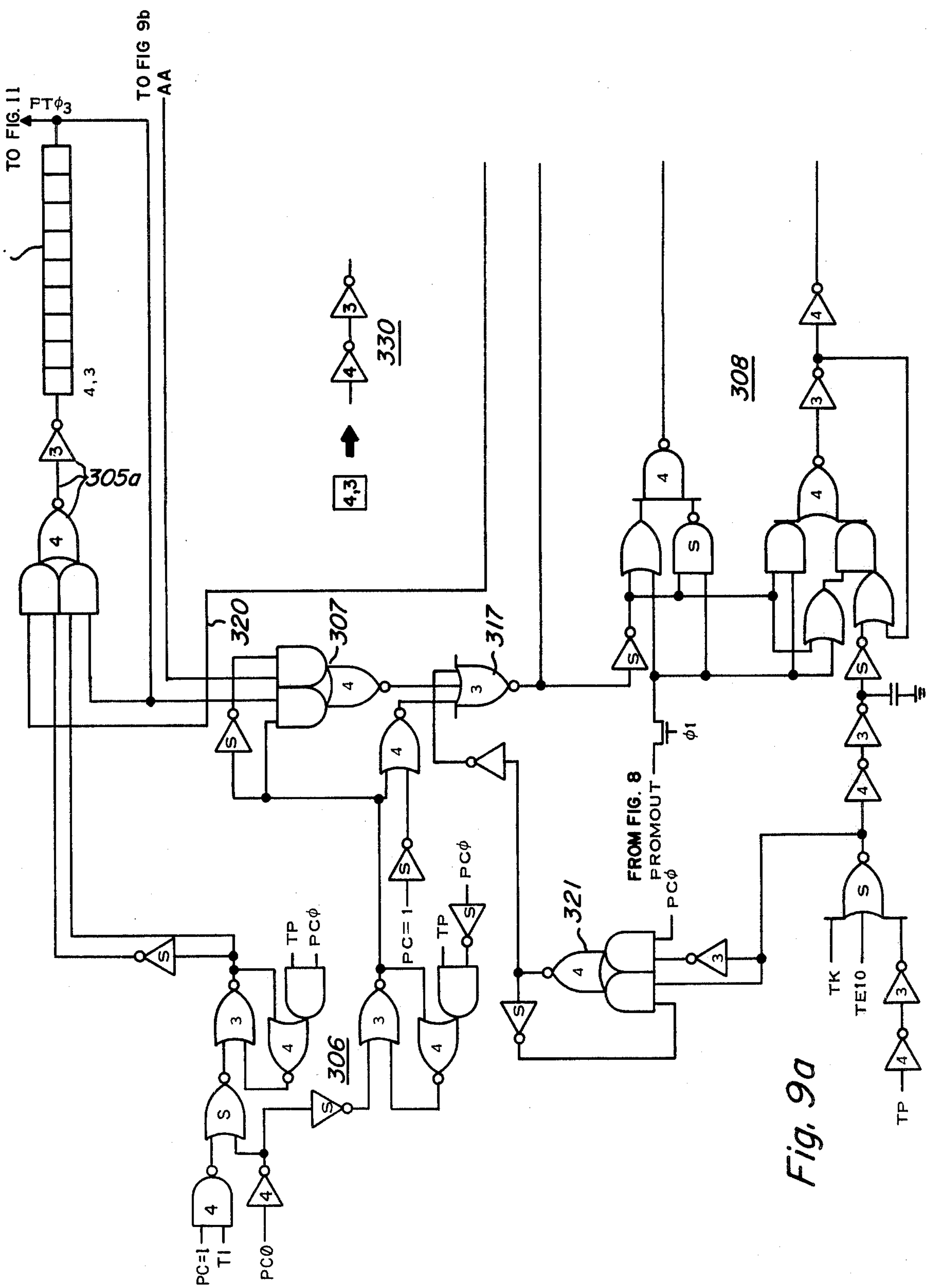
FIGS. 9*a* and 9*b* form a composite logic diagram of the iterpolator logics.
Figure 9A:
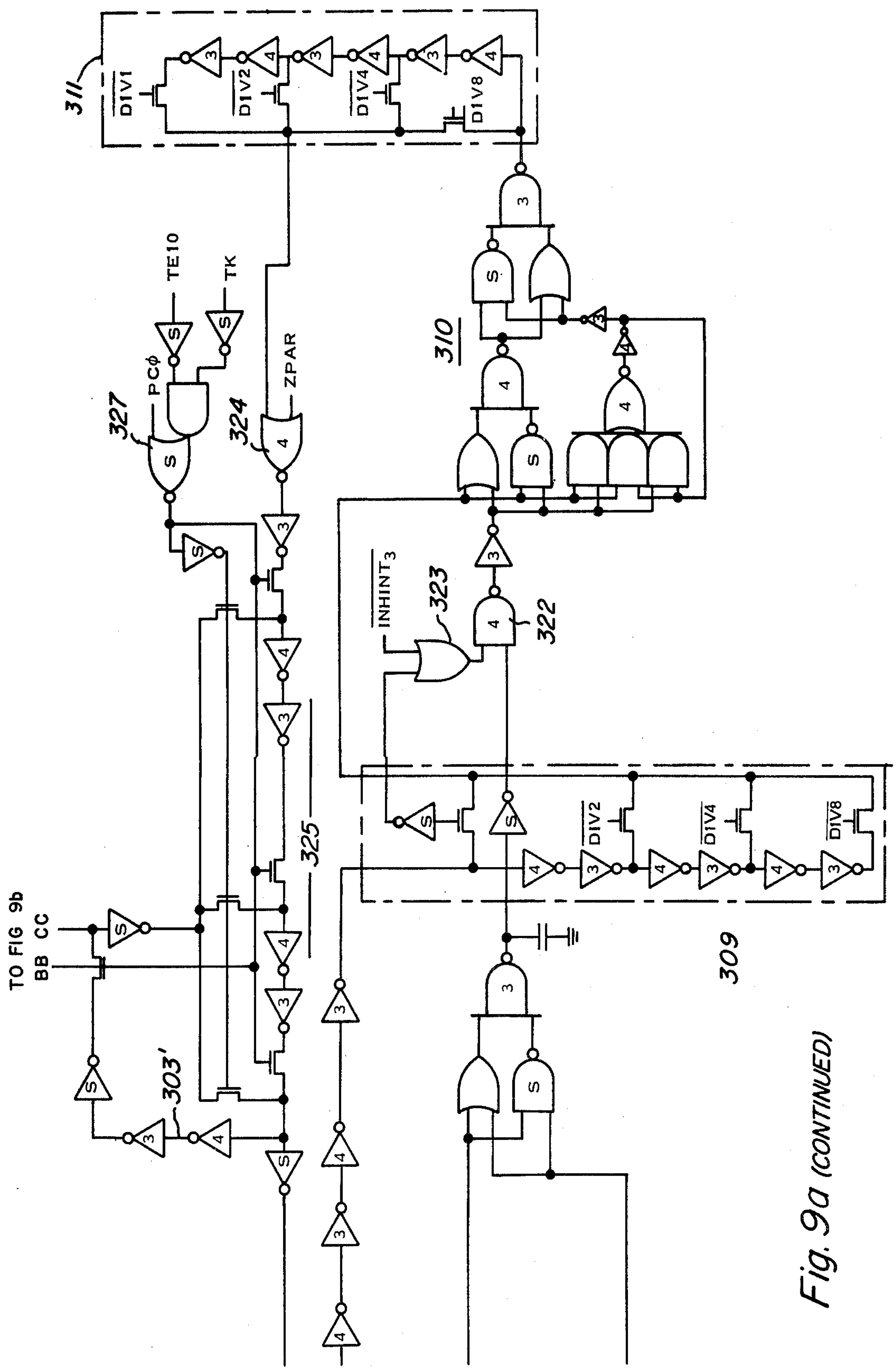
Figure 9B:
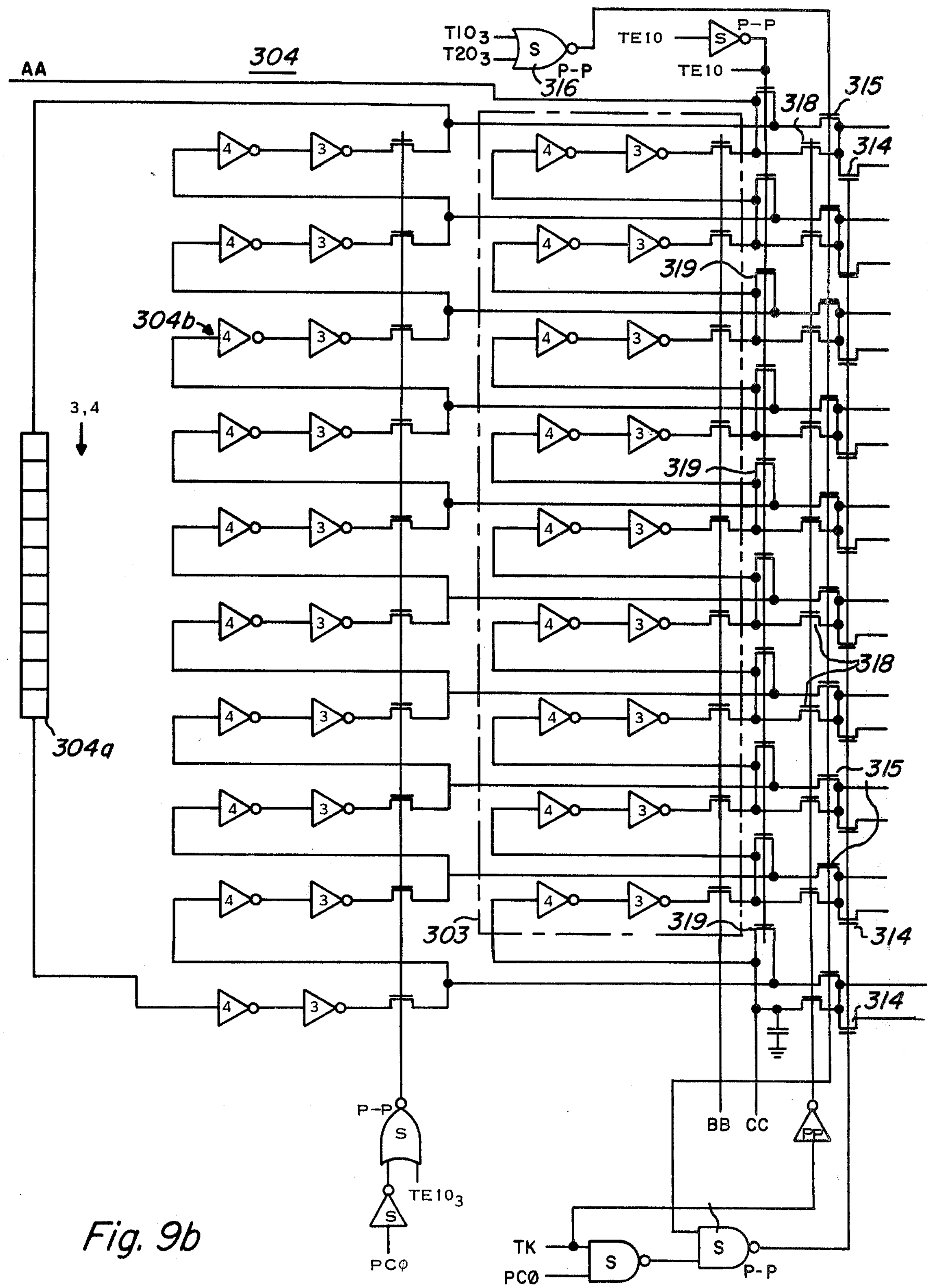
Figure 9B:
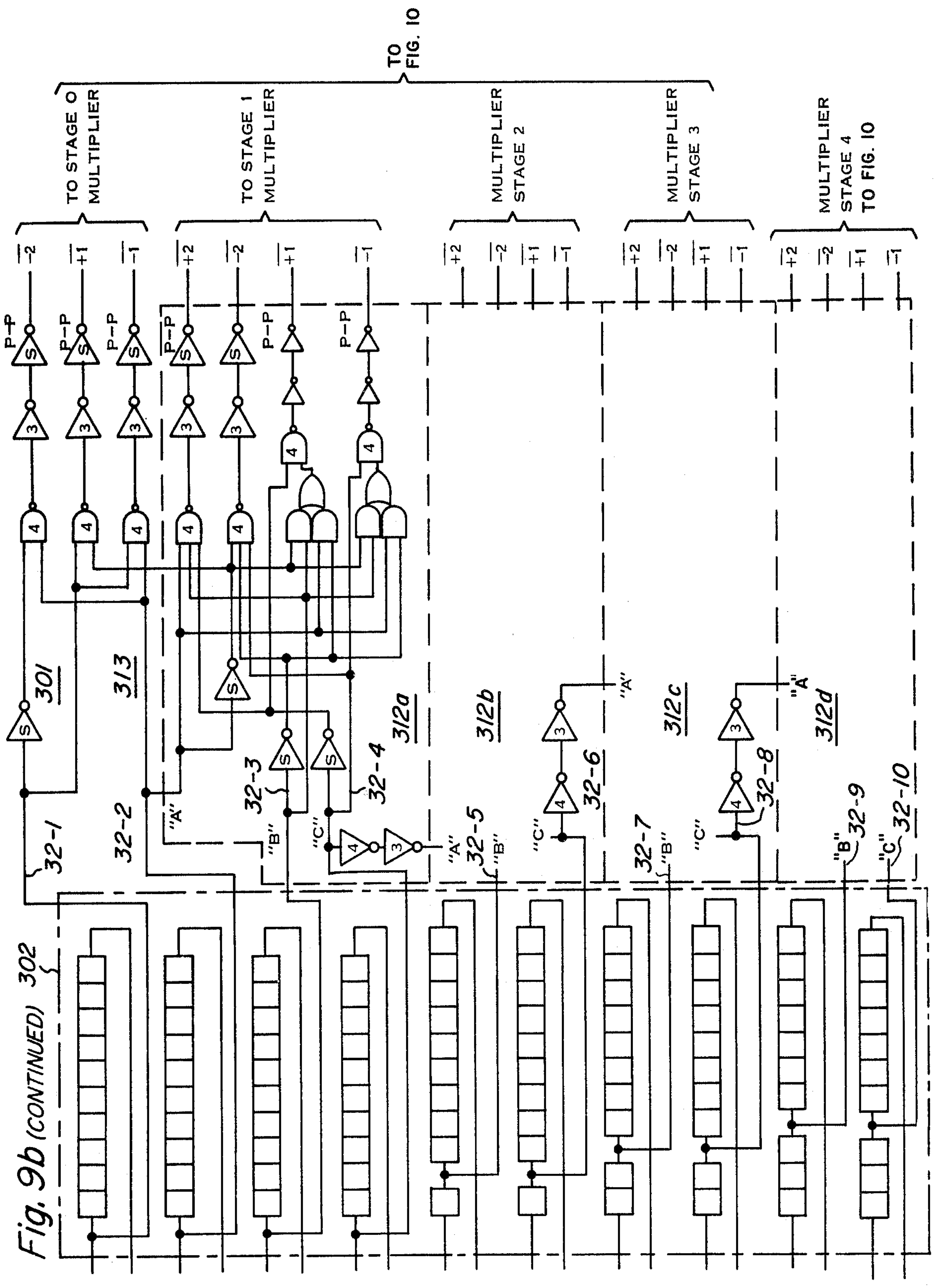

Referring now to FIGS. 9*a* and 9*b*, which form a composite diagram the parameter interpolator logic 23 is shown in detail. K-stack 203 comprises ten registers each of which store ten bits of information. Each small square represents one bit of storage, according to the convention depicted at numeral 330. The contents of each shift register is arranged to recirculate via recirculation gates 314 under control of a recirculation control gate 315. K-stack 302 stores speech coefficients K1–K9 and temporarily stores coefficient K10 or the energy parameter generally in accordance with the speech synthesis apparatus of FIG. 7 of U.S. Patent Application Ser. No. 807,461, since abandoned and continued in U.S. Patent Application Ser. No. 905,328, filed May 12, 1978. The data outputted from K-stack 302 to recoding logic 30 at various time periods is shown in Table VII. In Table III of U.S. Patent Application Ser. No. 807,461 since abandoned and continued in U.S. Patent Application Ser. No. 905,328, filed May 12, 1978, is shown the data outputted from the K-stack of FIG. 7 thereof. Table VII of this patent differs from Table III of the aforementioned patent because of (1) recoding logic 301 receives the same coefficient on lines 32-1 through 32-4, on lines 32-5 and 32-6, on lines 32-7 and 32-8 and on lines 32-9 and 32-10 because, as will be seen, recoding logic 301 responds to two bits of information for each bit which was responded to be the array multiplier of the aforementioned U.S. Patent; (2) because of the difference in time period nomenclature as was previously explained with reference to FIG. 5; and (3) because of the time delay associated with the recoding logic 301.

Figure 10A:
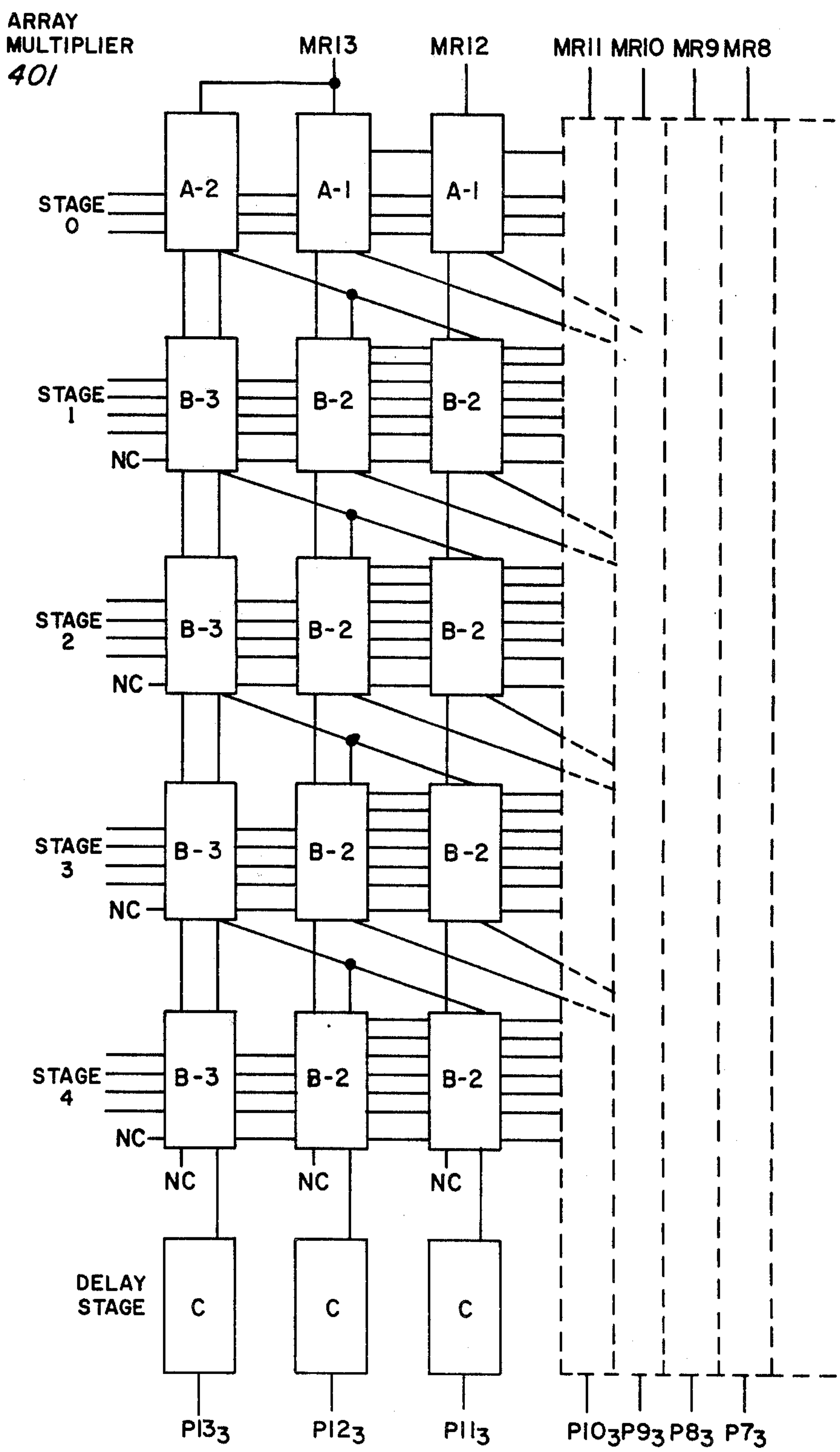
FIGS. 10*a*–10*b* form a composite logic diagram of the array multiplier.
Figure 10A:
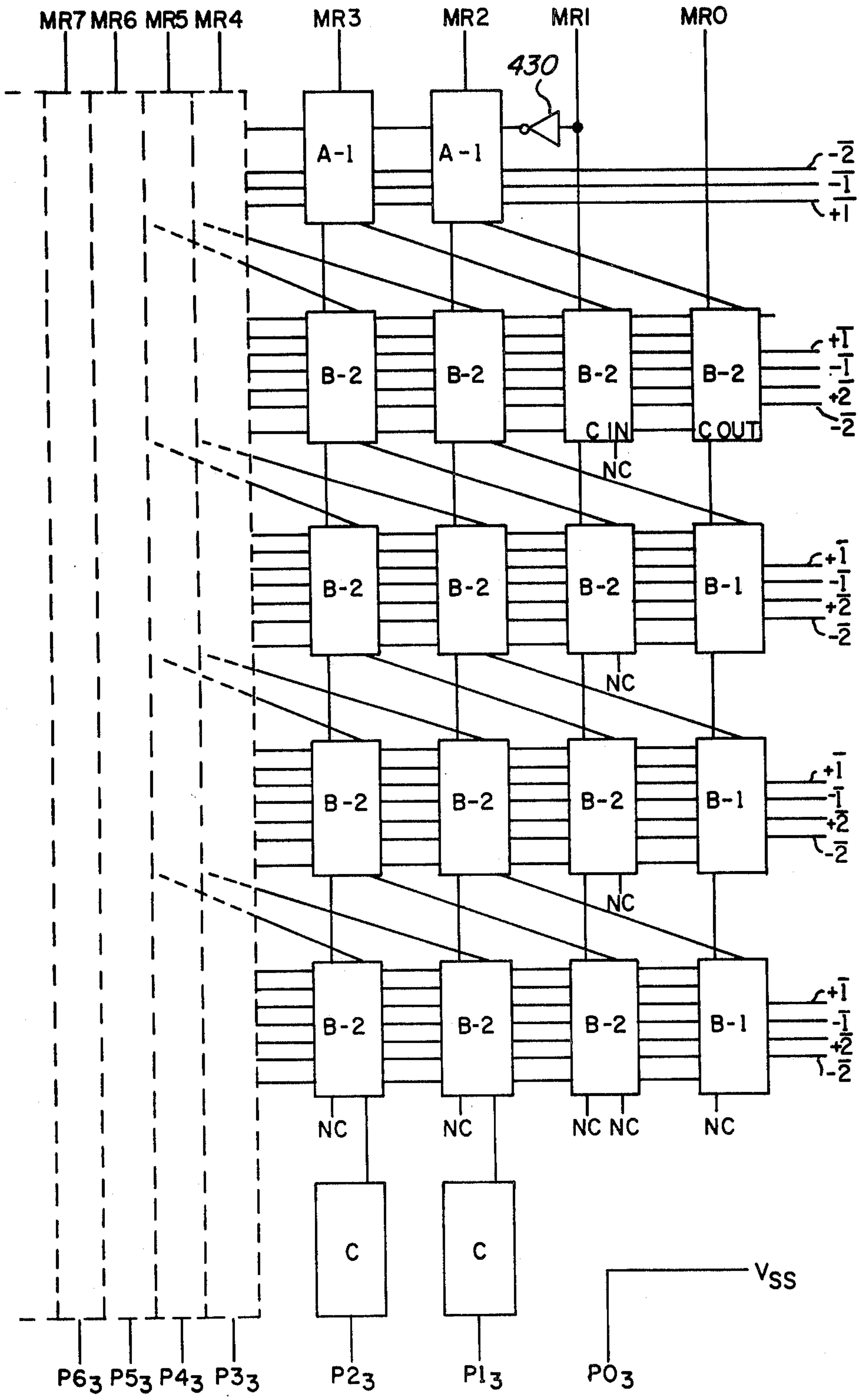
Figure 10B:
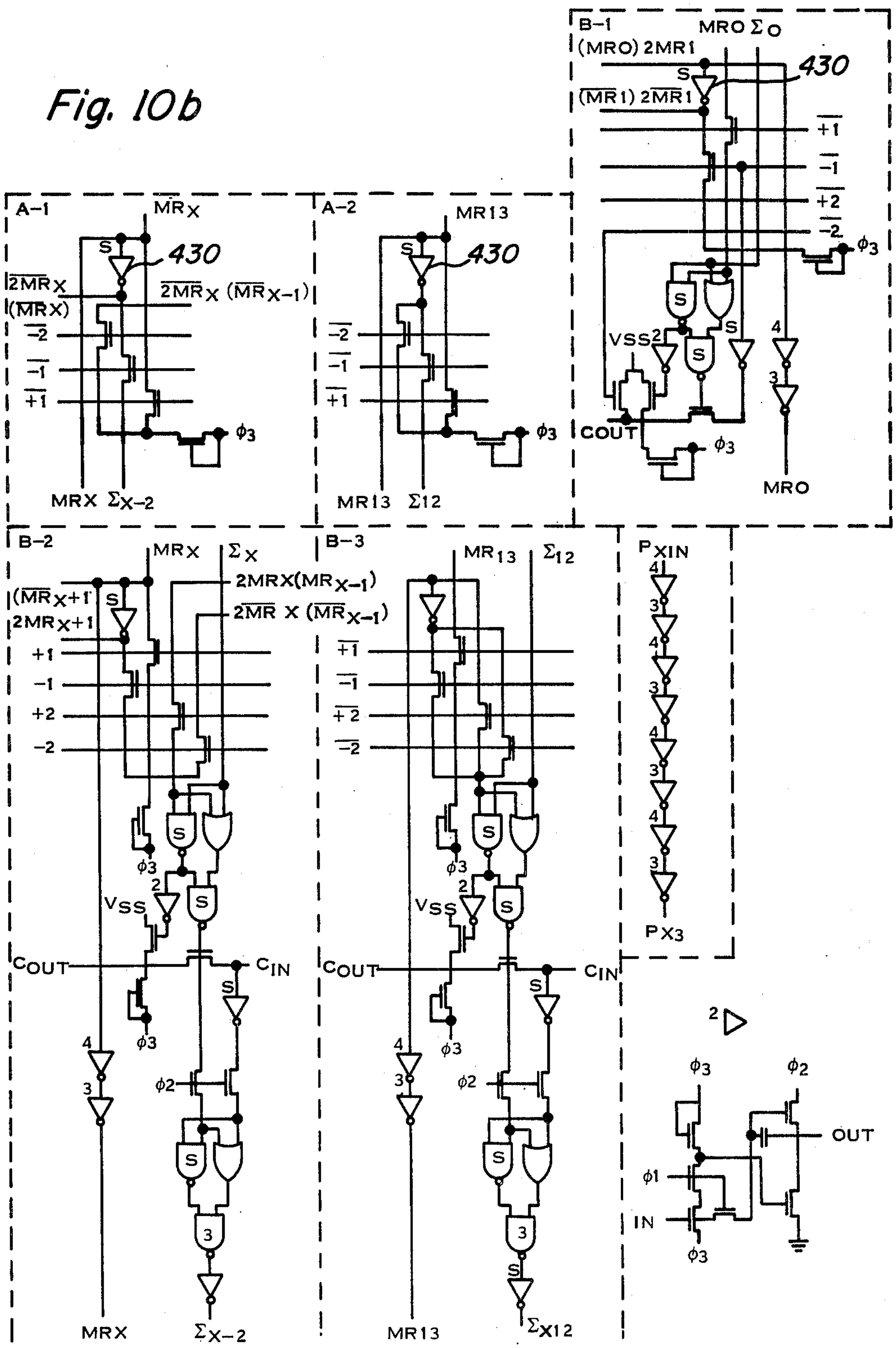

Recoding logic 301 couples K-stack 302 to array multiplier 401 (FIGS. 10*a* and 10*b*). Recoding logic 301 inlcludes four identical recoding stages 312*a*–312*d*, only one of which, 312*a*, is shown in detail. The first stage of the recoding logic, 313, differs from stages 312*a*–312*d* basically because there is, of course, no carry, such as occurs on input A in stages 312*a*–312*d*, from a lower order stage. Recoding logic outputs $\overline{+2}$, $\overline{-2}$, $\overline{+1}$ and $\overline{-1}$ to each stage of a five stage array multiplier 401, except for stage zero which receives only $\overline{-2}$, $\overline{+1}$ and $\overline{-1}$ outputs. Effectively recoding logic 301 permits array multiplier to process, in each stage thereof, two bits in lieu of one bit of information, using Booth's algorithm. Booth's algorithm is explained in "Theory and Application of Digital Signal Processing", published by Prentice-Hall 1975, at pp. 517–18.

The K10 coefficient and energy are stored in E10 loop 304. E10 loop preferably comprises a twenty stage serial shift register; ten stages 304*a* of E10 loop 304 are preferably coupled in series and another ten stages 304*b* which are also coupled in series but also have parallel outputs and inputs to K-stack 302. The appropriate parameter, either energy or the K10 coefficient, is transferred from E10 loop 304 to K-stack 302 via gates 315 which are responsive to a NOR gate 316 for transferring the energy parameter from E10 loop 304 to K-stack 302 at time period T10 and transferring coefficient K10 from E10 loop 304 to K-stack 302 at time period T20. NOR gate 306 also controls recirculation control gate 315 for inhibiting recirculation in K-stack 302 when data is being transferred KE10 transfer register 303 facilitates the transferring of energy or the K1-K10 speech coefficients which are stored in E10 loop 304 or K-stack 302 to adder 308 and delay circuit 309 via selector 307. Register 303 has nine stages provided by paired inverters and a tenth stage being effectively provided by selector 307 and gate 317 for facilitating the transfer of ten bits of information either from E10 loop 304 or K-stack 302. Data is transferred from K-stack 302 to register 303 via transfer gates 318 which are controlled by a Transfer K (TK) signal generated by decoder portion 511*b* of timing PLA 511 (FIGS. 7*a* and 7*b*). Since the particular parameter to be interpolated and thus shifted into register 303 depends upon the particular parameter count in which the synthesizer is operating and since the particular parameter available to be outputted from K-stack 302 is a function of particular time period the synthesizer is operating in, the TK signal comes up at T9 for the pitch parameter, T8 for the K1 parameter, T7 for the K2 parameter and so forth, as is shown in FIGS. 7*a* and 7*b*. The energy parameter or the K10 coefficient is clocked out of E10 loop 304 into register 303 via gates 319 in response to a TE10 signal generated by a timing PLA 511. After each interpolation, that is during the B cycle, data is transferred from register 303 into (1) K-stack 302 via gates 318 under control of signal TK, at which time recirculation gates 314 are turned off by gate 315, or (2) E10 loop 304 via gates 319.

A ten bit pitch parameter is stored in a pitch register 305 which includes a nine stage shift register as well as recirculation elements 305*a* which provide another bit of storage. The pitch parameter normally recirculates in register 305 via gate 305*a* except when a newly interpolated pitch parameter is being provided on line 320, as controlled by pitch interpolation control logics 306. The output of pitch 305 (PTO) or the output from register 303 is applied by selector 307 to gate 317. Selector 307 is also controlled by logics 306 for normally coupling the output of register 303 to gate 317 except when the pitch is to be interpolated. Logics 306 are responsive for outputting pitch to adder 308 and delay 309 during the A cycle of PC=1 and for returning the interpolated pitch value on line 320 on the B cycle of PC=1 to register 305. Gate 317 is responsive to a latch 321 for only providing pitch, energy or coefficient information to adder 308 and delay circuit 309 during the interpolation. Since the data is serially clocked, the information may be started to be clocked during an A portion and PCO may switch to a logical one sometime during the transferring of the information from register 303 or 305 to adder 308 or delay circuit 309, and therefore, gate 317 is controlled by an A cycle latch 321, which latch is set with PC0 at the time a transfer coefficient (TK) transfer E10 (TE10) or transfer pitch (TP) signal is generated by timing PLA 511.

The output of gate 317 is applied to adder 308 and delay circuit 309. The delay in delay circuit 309 depends on the state of DIV1-DIV8 signals generated by interpolation counter 515 (FIGS. 7*a* and 7*b*). Since the data exits gate 317 least significant bit first, by delaying the data in delay circuit 309 a selective amount, and applying the output to adder 310 along with the output of subtractor 308, the more delay there is in circuit 309, the smaller the effective magnitude of the difference from substractor 308 which is subsequently added back in by adder 310. Delay circuit 311 couples adder 310 back into register 303 and 305. Both delay circuits 309 and 303 can insert up to three bits of delay and when adder 309 is at its maximum delay 311 is at its minimum delay and visa-versa. A NAND gate 322 couples the output of subtractor 308 to the input of adder 310. Gate 322 is responsive to the output of an OR gate 323 which is in turn responsive to INHIBIT from inverted 236 (FIGS. 8*a–c*). Gates 322 and 323 act to zero the output from subtractor 308 when the INHIBIT signal comes up unless the interpolation counter is at IC0 in which case the present values in K-stack 302, E10 loop 304 and P register 305 are fully interpolated to their new traget values in a one step interpolation. When an unvoiced frame (FIG. 6) is supplied to the speech synthesis chip, coefficients K5-K10 are set to zero by the action of gate 324 which couples delay circuit 311 to shift register 325 whose output is then coupled to gates 305*a* and 303'. Gate 324 is responsive to the zero parameter (ZPAR) signal generated by gate 237 (FIGS. 8*a–c*).

Gate 326 disables shifting in the 304*b* portion of E10 loop 304 when a newly interpolated value of energy or K10 is being inputted into portion 304*b* from register 303. Gate 327 controls the transfer gates coupling the stages of register 303, which stages are inhibited from serially shifting data therebetween when TK or TE10 goes high during the A cycle, that is, when register 303 is to be receiving is to be receiving data from either K-stack 302 or E10 loop 304 as controlled by transfer by transfer gates 318 or 319, respectively. The output of gates 327 is also connected to various stages of shift register 325 and to a gate coupling 303' with register 303. Whereby up top the three bits which may trail the ten most significant bits after an interpolation operation may be zeroed.

ARRAY MULTIPLIER LOGIC DIAGRAM

FIGS. 10*a* and 10*b* form a composite logic diagram of array multiplier 401. Array multipliers are somtimes referred to as Pipeline Multipliers. For example, see "Pipeline Multiplier" by Granville E. Ott, published by the University of Missouri.

Array multiplier 401 has five stages, stage 0 through stage 4, and a delay stage. The delay stage is used in array multiplier 41 to give it the same equivalent delay as the array multiplier shown in U.S. Pat. Application Ser. No. 807,461, since abandoned and continued in U.S. Pat. Application Ser. No. 905,328, filed May 12, 1978. The input to array multiplier 401 is provided by signals $MR_0$–$MR_{13}$, from multipler multiplexer 405. $MR_{13}$ is the most significant bit while $MR_0$ is the least significant bit. Another input to array multiplier are the aforementioned +2, −2, +1 and −1 outputs from recording logic 301 (FIGS. 8*a–c*). The output from array multiplier 401, $P_{13}$–$P_0$, is applied to summer multiplexer 402. The least significant bit thereof, P0, is in this embodiment always made a logical one because doing so establishes the mean of the truncation error as zero instead of $-\frac{1}{2}$ LSB which value would result from a simple truncation of a two's complement number.

Array multiplier 401 is shown by a plurality of box elements labeled A-1, A-2, B-1, B-2, B-3 or B-C. The specific logic elements making up these box elements are shown on the right-hand side of composite FIGS. 10*a*–10*b* in lieu of repetitively showing these elements and making up a logic diagram of FIG. 401, for simplicity sake. The A-1 and A-2 block elements make up stage zero of the array multiplier and thus are each responsive to the $\overline{-2}$, $\overline{+1}$ and $\overline{-1}$ signals outputted from decoder 313 and are further responsive to MR2–MR13. When multiplies occur in array multiplier 401, the most significant bit is always maintained in the left most column elements while the partial sums are continuously shifted toward the right. Inasmuch as each stage of array mutiplier 401 operates on two binary bits, the partial sums, labeled Σn, are shifted to the data inputs to the first stage. Also, since each block in array multiplier 401 is responsive to two bits of information from K-stack 302 received via recoding logic 301, each block is also responsive to two bits from multiplier multiplexer 405, which bits are inverted by inverters 430, which bits are also supplied in true logic to the B type blocks.

FILTER AND EXCITATION GENERATOR LOGIC DIAGRAM

Figure 11A:
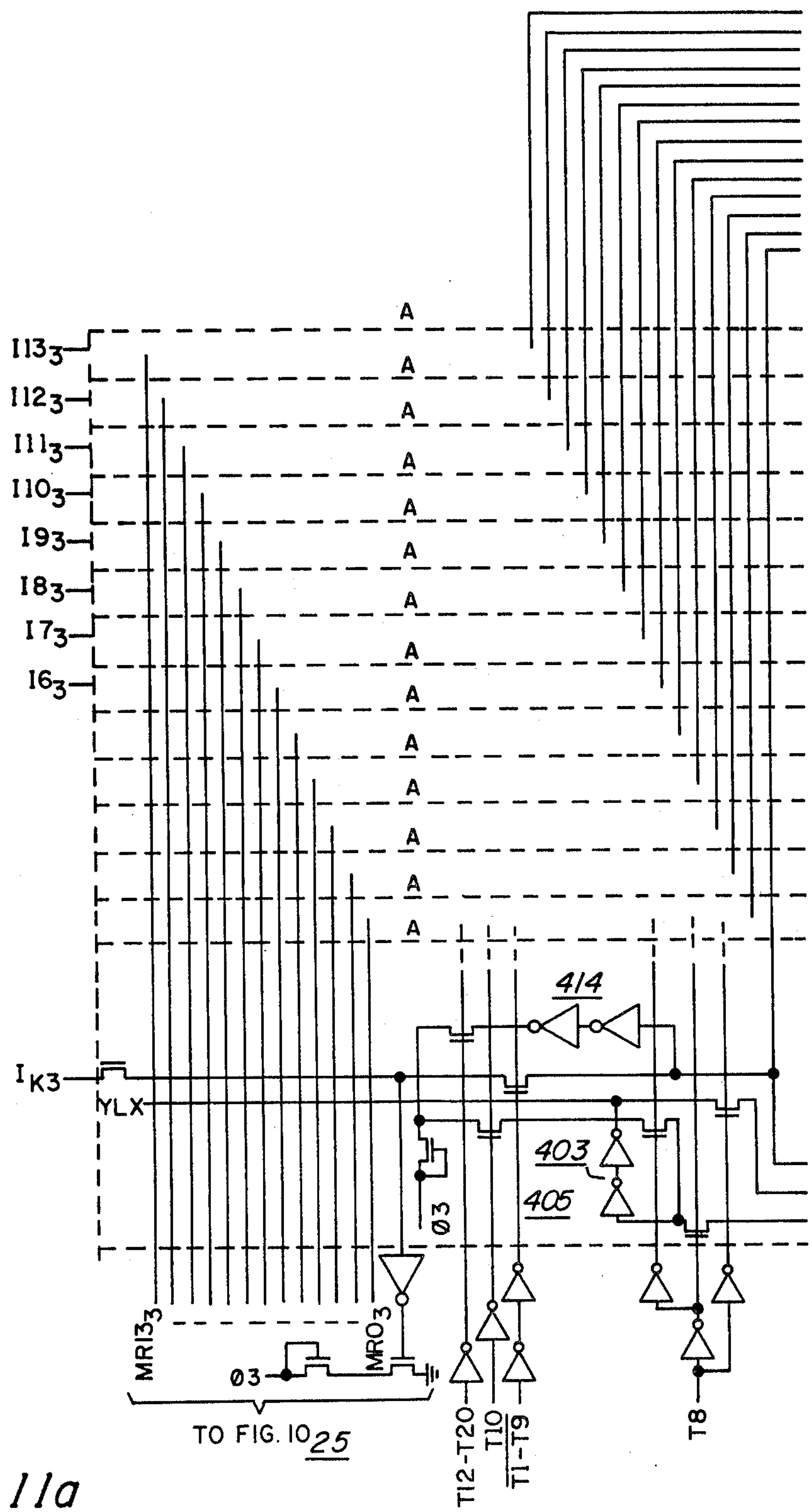
FIGS. 11*a* and 11*b* form a composite logic diagram of the speech synthesizer's lattice filter and excitation generator.
Figure 11A:
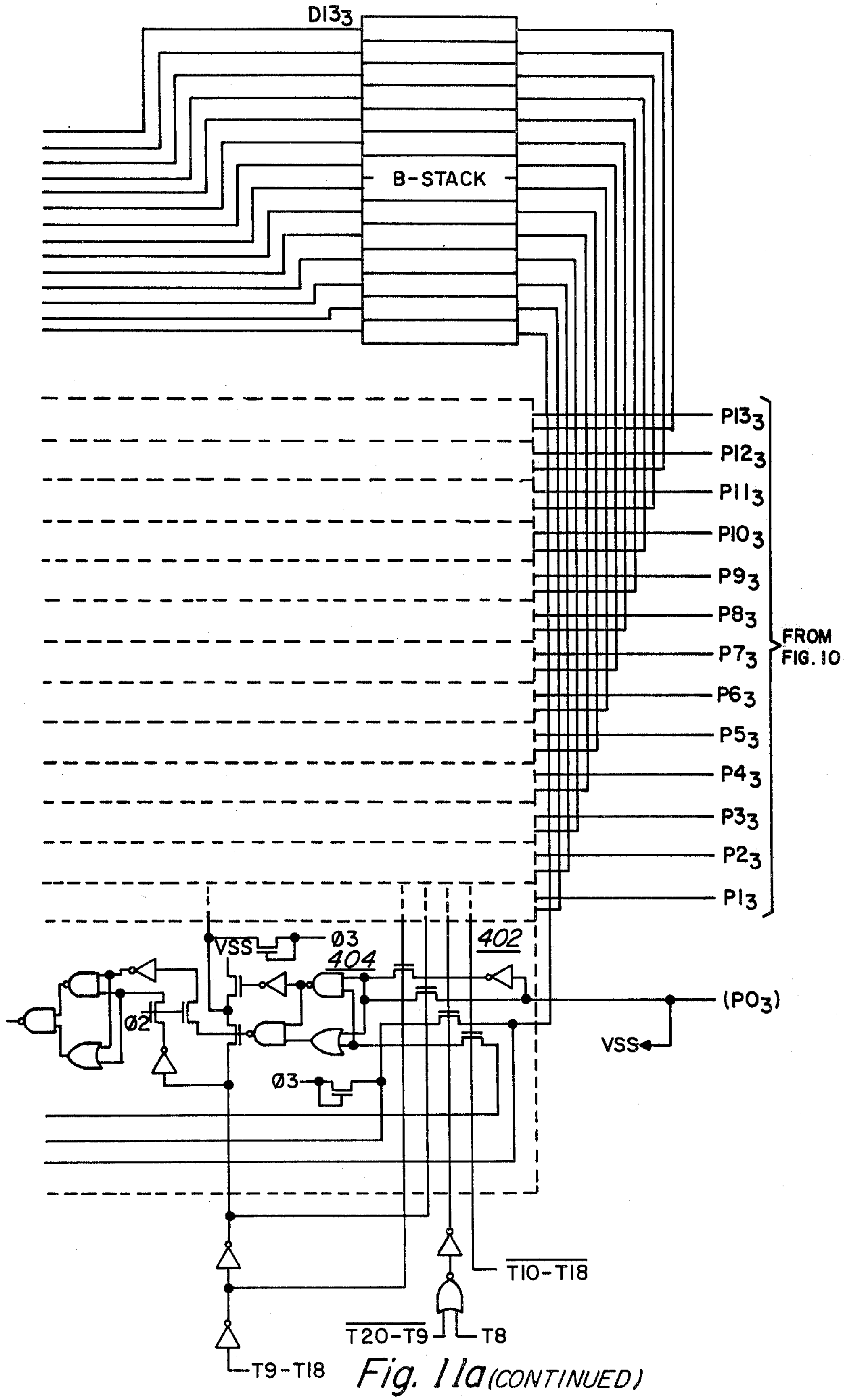
Figure 11B:
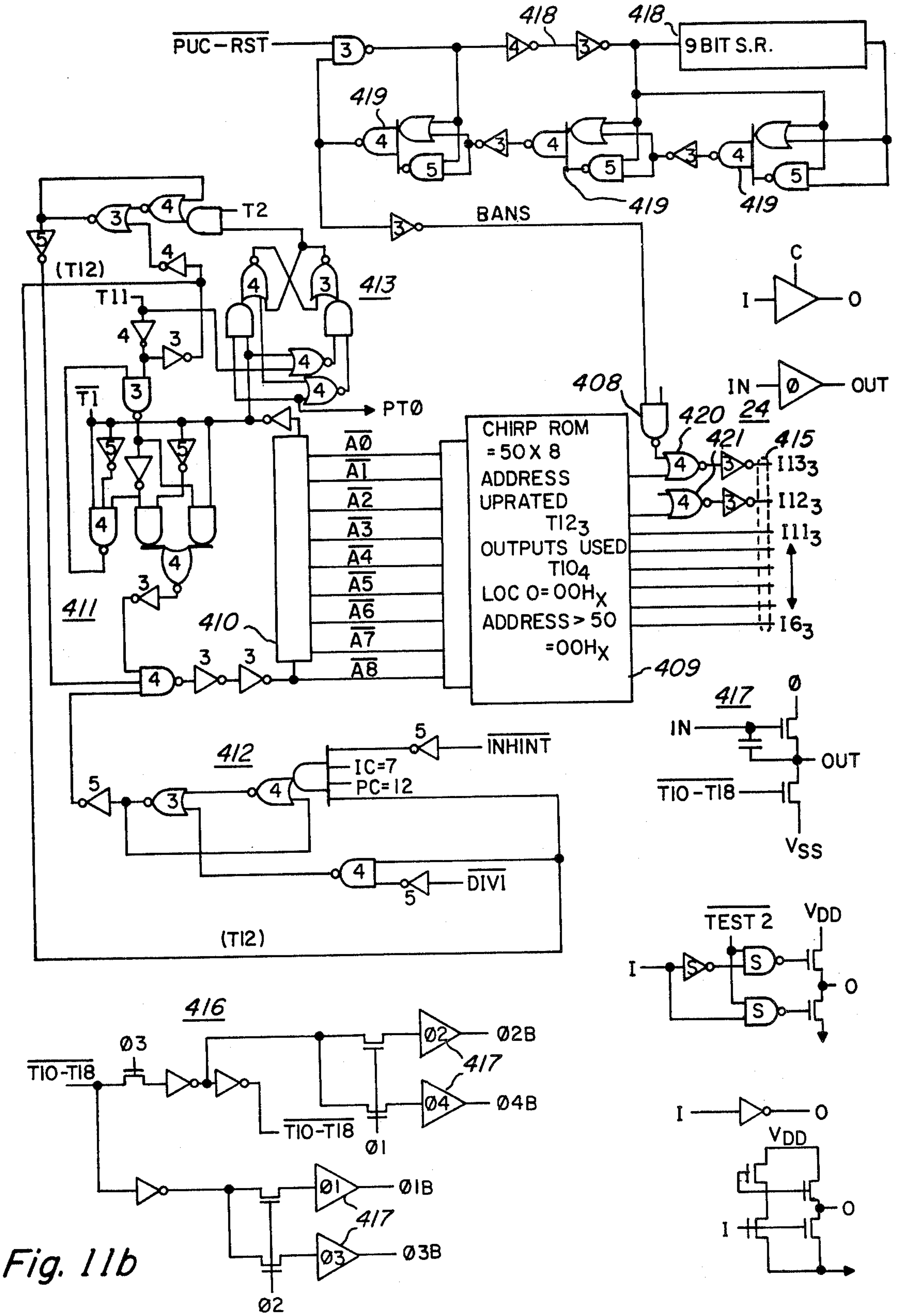
Figure 11B:
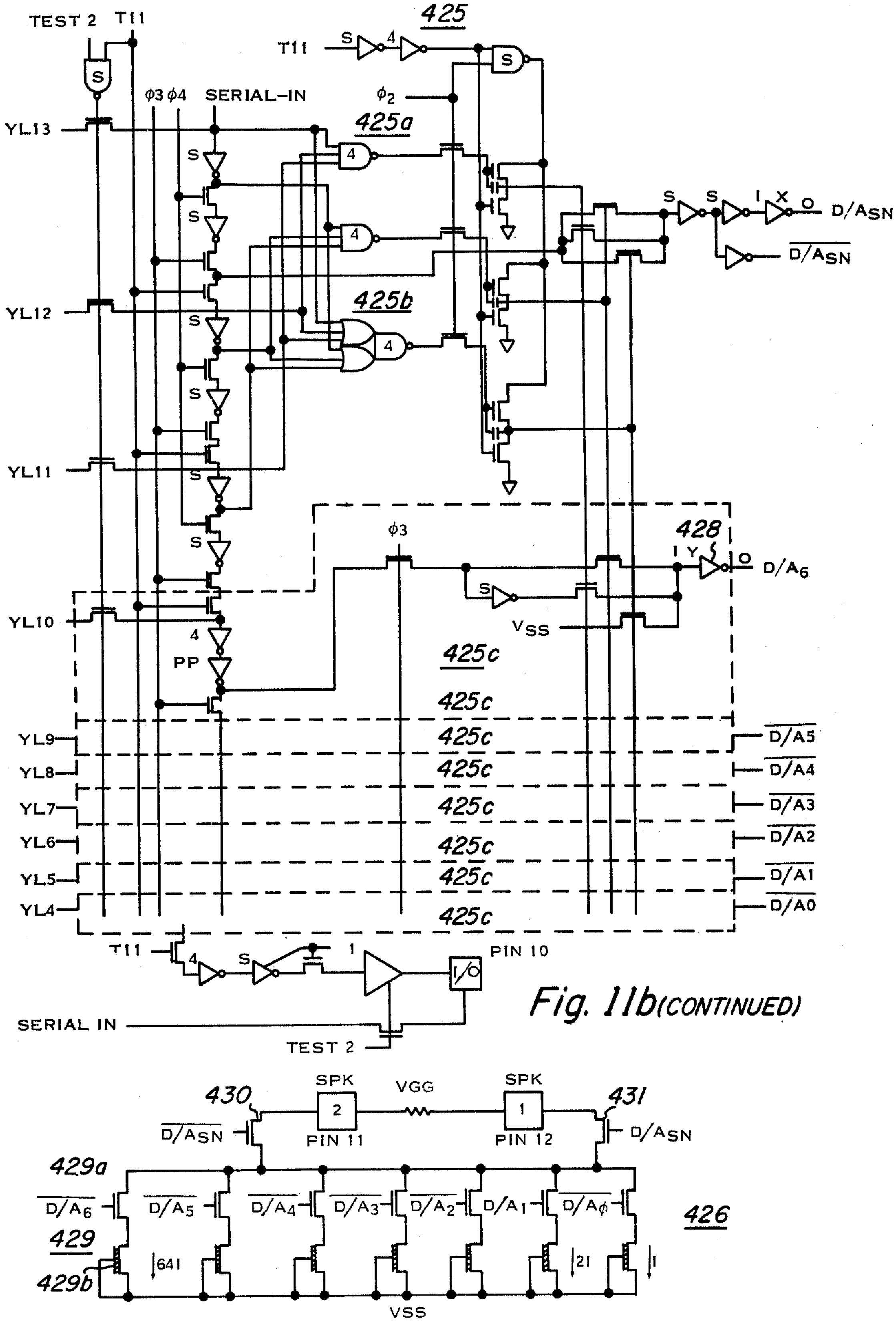

FIGS. 11*a*–11*b* form a composite, detailed logic diagram of lattice filter and excitation generator 24 (other than array multiplier 401) and output section 25. In filter and excitation generator 24 is a summer 404 which is connected to receive at one input thereof either the true or inverted output of array multiplier 401 (see FIGS. 10*a* and 10*b*) on lines PO–P13 via summer multiplexer 402. The other input of adder 404 is connected via summer multiplexer 402 to receive either the output of adder 404 (atT10–T18), the output of delay stock 406 on lines 440–453 at T20–T7 and T9), the output of Y-latch 403 (at T8) or a logical zero from Φ3 precharge gate 420 (at T19 when no conditional discharge is applied to this input). The reasons these signals are applied at these times can be seen from FIG. 8 of the aforementioned U.S. Pat. Application Ser. No. 807,461, since abandoned and continued in U.S. Pat. Application Ser. No. 905,328, filed May 12, 1978; it is to be remembered of coures, that the time period designations differs as discussed with reference to FIG. 5 hereof.

The output of adder 404 is applied to delay stack 406, multiplier multiplexer 405, one period delay gates 414 and summer multiplexer 402. Multiplier multiplexer 405 includes a one period delay gates 414 which are generally equivalent to one period delay 34' of FIG. 7 in U.S. Pat. Application Ser. No. 807,641, since abandoned and continued in U.S. Pat. application Ser. No. 905,328, filed May 12, 1978. Y-latch 403 is connected to receive the output of delay stack 406. Multiplier Multiplexer 405 selectively applies the output from Y-latch 403, one period delay gates 414, or the excitation signal on bus 415 to the input MR0–MR13 of array multiplier 401. The inputs D0–D13 to delay stack 406 are derived from the outputs of adders 404. The logics for summer multiplier 402, adder 404, Y-latch 403, multiplier multiplexer 405 and one period delay circuit 414 are only shown in detail for the least significant bit as enclosed by dotted line reference A. The thirteen most significant bits in the lattice filter also are provided by logics such as those enclosed by the reference A line, which logics are denoted by long rectangular phantom line boxes labeled "A". The logics for each parallel bit being processed in the lattice filter are not shown in detail for sake of clarity. The portions of the lattics filter handling bits more significant than the least significant bit differ from the logic shown for elements 402, 403, 404, and 414 only with respect to the interconnections made with truncation logics 501 and bus 415 which connects to UV gate 408 and chirp ROM 409. In this respect, the output from UV gate 408 and chirp ROM 409 is only applied to inputs I13–I6 and therefore the input labeled $I_r$ within the reference A phantom line is not needed for the six least significant bits in the lattice filter. Similarly, the output from the Y-latch 403 is only applied for the ten most significant bits, $YL_{13}$ through $YL_4$, and therefore the connection labeled YLx within the reference line is not required for the four least significant bits in the lattice filter.

Delay stack 406 comprises 14 nine bit long shift registers, each stage of which comprise inverters clocked on Φ4 and Φ3 clocks. As is discussed is U.S. Pat. Application Ser. No. 807,461, since abandoned and continued in U.S. Pat. Application Ser. No. 905,328, filed May 12, 1978, the delay stack 406 which generally corresponds to shift register 35' of FIG. 7 of the aforementioned patent, is only shifted on certain time periods. This is accomplished by logics 416 whereby Φ1B–Φ4B clocks are generated fromT10–T18 timing signal from PLA 512 (FIGS. *7a* and *7b*). The clock buffers 417 in circuit 416 are also shown in detail in FIGS. 11*a* and 11*b*.

Delay stack 406 is nine bits long whereas shift register 35' in FIG. 7 of U.S. Pat. Application Ser. No. 807,461, since abandoned and continued in U.S. Pat. Application Ser. No. 905,328, filed May 12, 1978, was eight bits long; this difference occurs because the input to delay stack 406 is shown as being connected from the output of adder 404 as opposed to the output of one period delay circuit 414. Of course, the input to delay stack 406 could be connected from the outputs of one period delay circuit 414 and the timing associated therewith modified to correspond with the shown in U.S. Pat. Application Ser. No. 807,461, since abandoned and continued in U.S. Pat. Application Ser. No. 905,328, filed May 12, 1978.

The data handled in delay stack 406, array multiplier 401, adder 402, summer multiplexer 402, Y-latch 403, and multiplier multiplexer 405 is preferably handled in two's complement notation.

Unvoiced generator 407 is a random noise generator comprising a shift register 418 with a feedback term supplied by feedback logics 419 for generating pseudo-random terms in shift register 418. An output is taken therefrom and is applied to UV gate 408 which is also responsive to OLDP from latch 208*d* (FIGS. 8*a* and 8*b*). Old pitch latch 208*d* controls gate 408 because pitch=0 latch 208*b* changes state immediately when the new speech parameters are inputted to register 205. However, since this occurs during interpolation count IC0 and since, during an unvoiced condition the new values are not interpolated into K-stack 302, E10 loop 304 and pitch reigister 305 until the following IC0, the speech excitation value cannot change from a periodic excitation from chirp R0M 409 to a random excitation from unvoiced generator 407 until eight interpolation cycles have occurred. Gate 420 nors the output of gate 408 into the most significant bit of the excitation signal, $I_{13}$, thereby effectively causing the sign bit to randomly change during unvoiced speech. Gate 421 effectively forces the most significant bit of the excitation signal, $I_{12}$, to a logical one during unvoiced speech conditions. Thus the combined effect to gates 408, 420 and 421 is to cause a randomly changing sign to be associated with a steady decimal equivalent value of 0.5 to be applied to the lattice filter and Filtering Excitation Generator 24.

Figure 14A:
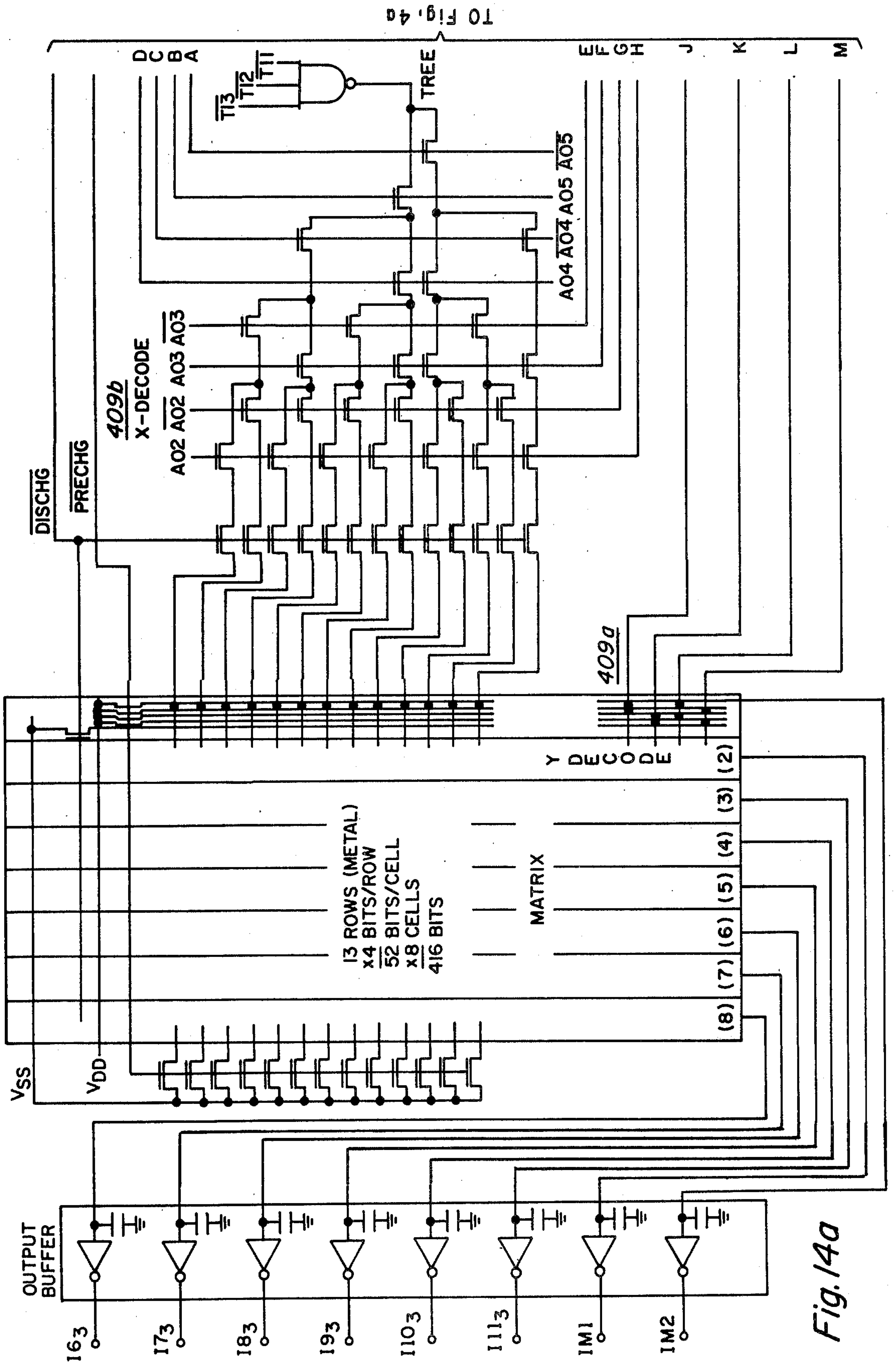
FIGS. 14*a*–14*b* form a composite diagram of the chirp ROM.
Figure 14B:
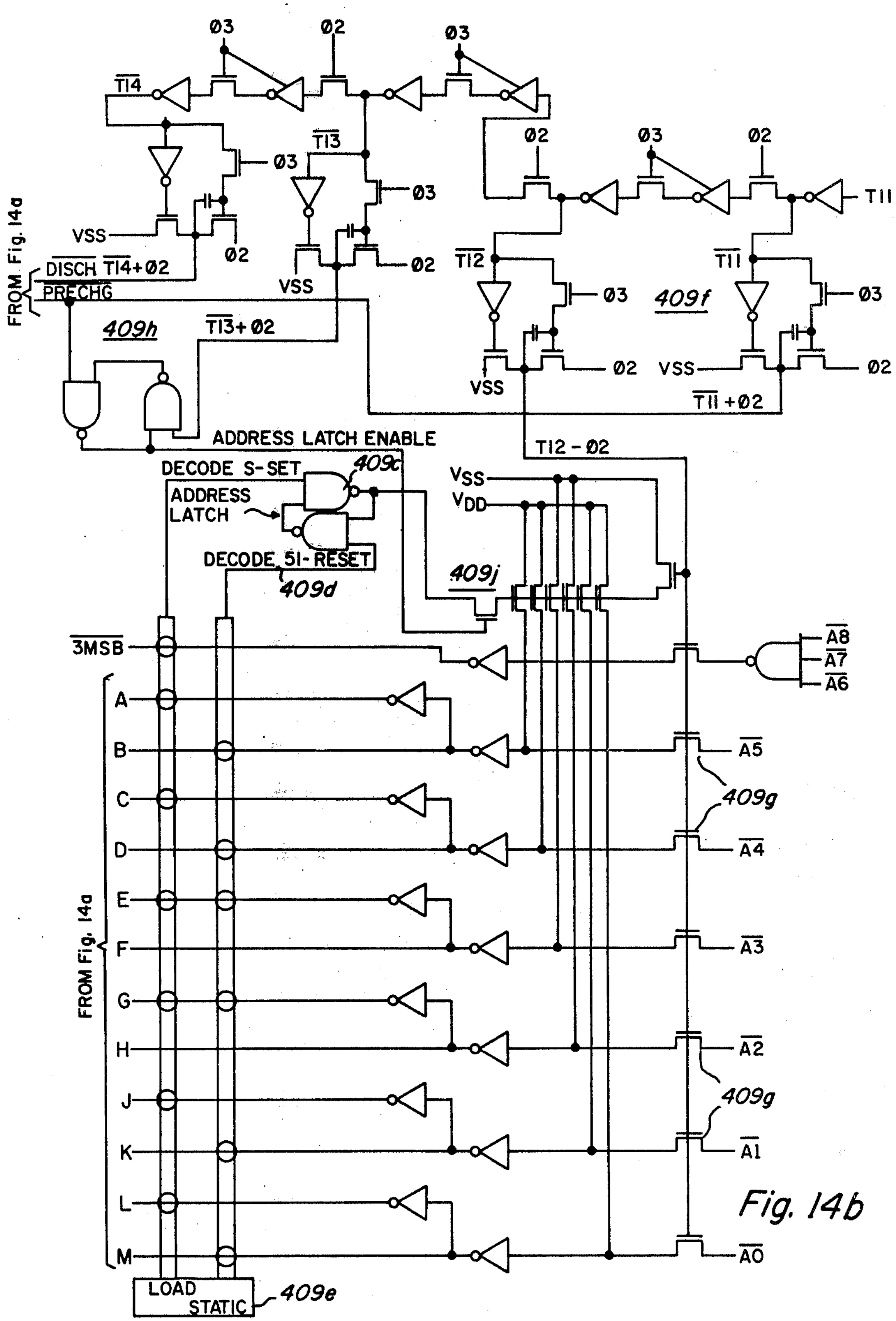

During voiced speech, chirp R0M 409 provides an eight bit output on lines $I_6$–$I_{13}$ to the lattice filter. This output comprises forty-one successively changing values which, when graphed, represent a chirp function. The contents of R0M 409 are listed in Table VIII; R0M 404 is set up to invert its outputs and thus the data is stored therein in complemented format. The chirp function value and the complemented value stored in the chirp R0M are expressed in two's complement hexadecimal notation. R0M 409 is addressed by an eight bit register 410 whose conents are normally updated during each cycle through the lattice filter by add one circuit 411. The output of register 410 is compared with the contents of pitch register 305 in a magnitude comparitor 403 for zeroing the contents of 410 when the contents of register 410 become equal to or greater than the contents of register 305. R0M 409, which is shown in greater detail in FIGS. 14*a*–14*b*, is arranged so that addresses greater than 110010 cause all zeroes to be outputted on lines $I_{13}$–$I_6$ to multiplier multiplexer 405.

Zeros are also stored in address locations 14–51. Thus, the chirp may be expanded to occupy up to address location fifty, if desired.

RANDOM ACCESS MEMORY LOGIC DIAGRAM

Figures 12A, 12B:
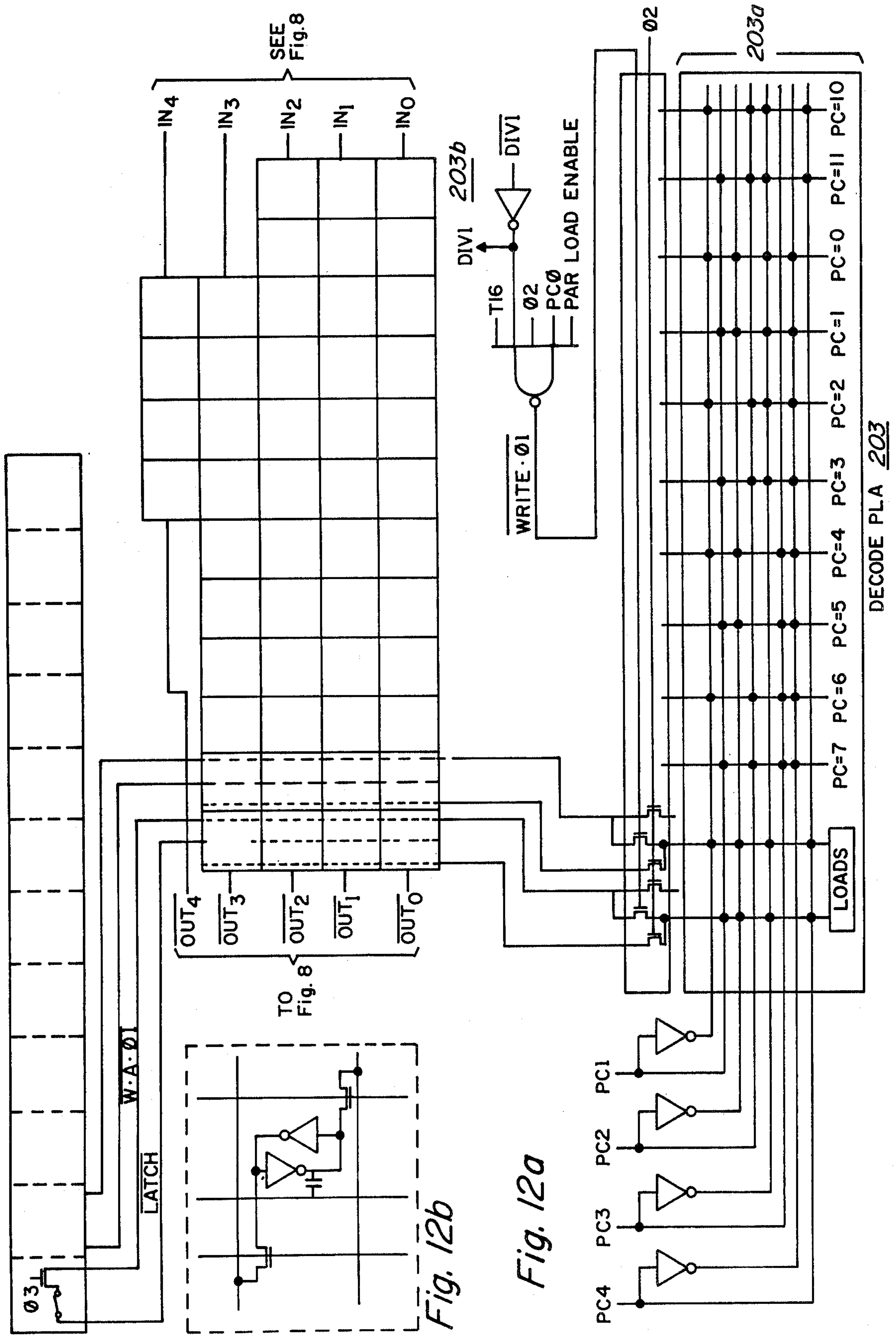
FIGS. 12*a* and 12*b* are schematic diagrams of the parameter RAM.

Referring now to FIGS. 12*a*–12*b*, there is shown a composite detailed logic diagram of RAM 203. RAM 203 is addressed by address on PC1–PC4, which address is decoded in a PLA 203*a* and defines which coded parameter is to be inputted into RAM 203. RAM 203 stores the twelve decoded parameters, the parameters having bit lengths varing between three bits and five bits according to the decoding scheme described with reference to FIG. 6. Each cell, reference B, of RAM 203 is shown in greater detail in FIG. 12*b*. Read/-Write control logic 203*b* is responsive to T1, DIV1, PC0 and parameter load enable for writing into the RAM 203 during the A cycle of each parameter count during interpolation count zero when enabled by parameter load enable from logics 238 (FIG. 8*a–c*). Data is inputted to RAM 203 on lines IN0–IN4 from register 205 as shown in FIGS. 8*a* and 8*b* and data is outputted on lines OUT1–OUT5 to ROM 202 as is shown in the aforementioned figures.

PARAMETER READ-ONLY-MEMORY LOGIC DIAGRAM

Figure 13A:
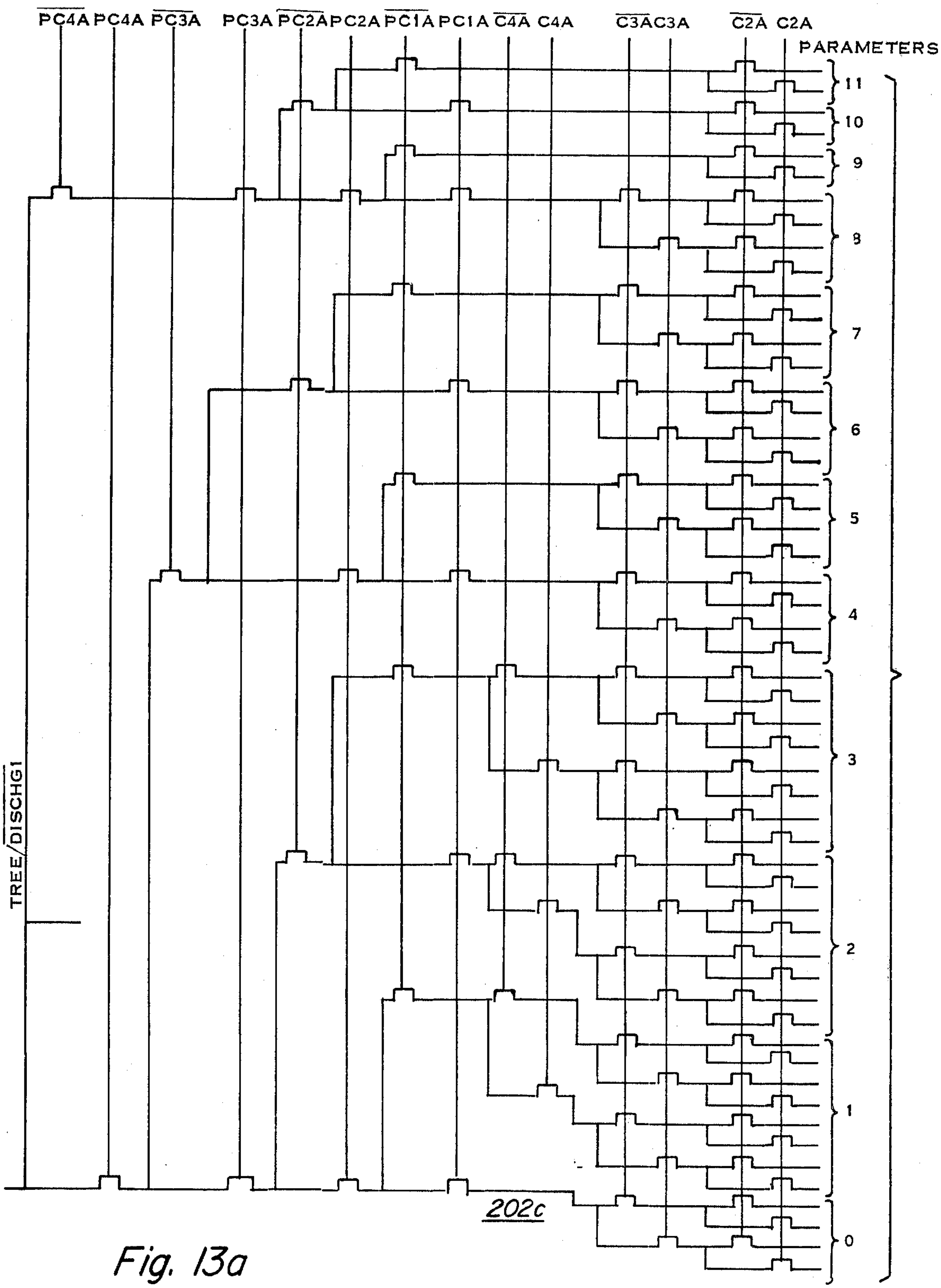
FIGS. 13*a* and 13*b* are schematic diagrams of the parameter ROM.

In FIGS. 13*a*–*13b*, there is shown a logic diagram of ROM 202. ROM 202 is preferably a virtual ground ROM of the type disclosed in U.S. Pat. No. 3,934,233. Address information from RAM 202 and from parameter counter 513 are applied to address buffers 202*b* which are shown in detail at reference A. The NOR gates 202*a* used in address buffers 202*b* are shown in detail at reference B. The outputs of the address buffers 202*b* are applied to an X-decoder 202*c* or to a Y-decoder 202*d*. The ROM is divided into ten sections labeled reference C, one of which is shown in greater detail. The outline for output line from each of the sections is applied to register 202 via inverters as shown in FIGS. 8*a* and 8*b*. X-decoder selects one of fifty-four X-decode lines while Y-decoder 202*d* test for the presence or nonpresence of a transistor cell between an adjacent pair of diffusion lines, as is explained in greater detail in the aforementioned U.S. Pat. No. 3,934,233. The data preferably stored in ROM 202 of this embodiment is listed in Table VI.

CHIRP READ-ONLY-MEMORY LOGIC DIAGRAM

FIGS. 14*a*–14*b* form a composite diagram of chirp ROM 409. ROM 409 is addressed via address lines $\overline{A_0}$–$\overline{A_8}$ from register 410 (FIGS. 11*a*–11*b*) and output information on lines $I_6$–$I_{11}$ to multiplier multiplexer 405 and lines $I_{M1}$ and $I_{M2}$ to gates 421 and 420, all which are shown in FIGS. 11*a* and 11*b*. As was previously discussed with reference to FIGS. 11*a* and 11*b*, chirp ROM outputs all zeros after a predetermined count is reached in register 410, which, in this case is the count equivalent to a decimal 51. ROM 409 includes a Y-decoder 409*a* which is responsive to the address on lines A0 and A1 (and $A_0$ and $A_1$ ) in an X-decoder 409*b* which is responsive to the address on lines $\overline{A_2}$ through $\overline{A_5}$ (and $A_2$–$A_5$).

ROM 409 also includes a latch 409*c* which is set when decimal 51 is detected on lines $\overline{A_0}$–$\overline{A_5}$ according to line 409*c* from a decoder 409*e*. Decoder 409*e* also decodes a logical zero on lines $\overline{A_0}$–$\overline{A_8}$ for resetting latch 409c. ROM 409 includes timing logics 409f which permit data to be clocked in via gates 409g at time period T12. At this time decoder 409e checks to determine whether either a decimal 0 or decimal 51 is occurring on address lines $\overline{A_0}$–$\overline{A_8}$. If either condition occur, latch 409c, which is a static latch, is caused to flip.

An address latch 409h is set at time period T13 and reset at time period T11. Latch 409h permits latch 409c to force a decimal 51 onto lines $\overline{A_0}$–$\overline{A_5}$ when latch 409c is set. Thus, for addresses greater than 51 address register 410, the address is first sampled at time period T12 to determine whether it has been reset to zero by reset logic 412 (FIGS. 12a–12b) for the purpose of resetting latch 409c and if the address has not been reset to zero then whatever address has been inputted on lines $\overline{A_0}$–$\overline{A_8}$ is written over by logics 409j at T13. Of course, at location 51 in ROM 409 will be stored all zeros on the output lines 16-I11, IM1 and IM2. Thus by means of logics 409c, 409h and 409j address of a preselected value, in this case a decimal 51, are merely tested to determine whether a reset has occurred but are not permitted to address the array of ROM cells via decoders 409a and 409b. Addresses between a decimal 0 and 50 address the ROM normally via decoders 409a and 409b. The ROM matrix is preferably of the virtual ground type described in U.S. Pat. No. 3,934,233. As aforementioned, the contents of ROM 409 are listed in Table VIII. The chirp function is located at addresses 00–40 while zeros are located at addresses 41–51.

TRUNCATION LOGIC AND DIGITAL-TO-ANALOG CONVERTER OR DRIVER

Turning again to FIGS. 11a and 11b, the truncation logic 425 and Digital-to-Analog (D/A) driver is shown in detail. Truncation logic 425 includes circuitry for converting the two's complement data on $YL_{13}$–$YL_4$ to sign magnitude data. Logics 425a test the MSB from Y-latch 403 on line $YL_{13}$ for the purpose of generating a sign bit and for controlling the two's complement to sign magnitude conversion accomplished by logics 425c. The sign bit is applied in true and false logic on lines D/Asn and $\overline{D/Asn}$ to D/A converter 426.

Logics 425c convert the two's complement data from Y-latches 403 in lines $YL_{10}$–$YL_4$ to simple magnitude notation on lines $\overline{D/A_6}$–$\overline{D/A_0}$. Only the logics 425c associated with YL10 are shown in detail for sake of simplicity.

Logics 425b sample the $YL_{12}$ and $YL_{11}$ bits from the Y-latches 403 and perform a magnitude truncation function thereon by forcing outputs $\overline{D/A_6}$ through $\overline{D/A_0}$ to a logical zero (i.e., a value of one if the outputs were in true logic) wherever either $YL_{12}$ or $YL_{11}$ is a logical one and $YL_{13}$ is a logical zero, indicating that the value is positive or either $YL_{12}$ or $YL_{11}$ is a logical zero and $YL_{13}$ is a logical one, indicating that the value is negative (and complemented, of course). Whenever one of these conditions occurs, a logical zero appears on line 427 and Vss is thereby coupled to the output buffer 428 in each of logics 425c. The magnitude function effectively truncates the more significant bits on $YL_{11}$ and $YL_{12}$. It is realized that this is somewhat unorthodox truncation, since normally the less significant bits are truncated in most other circuits where truncation occurs. However, in this circuit, large positive or negative values are effectively clipped. More important digital speech information, which has smaller magnitudes, is effectively amplified by a factor of four by this truncation scheme.

The outputs $\overline{D/A_6}$–$\overline{D/A_0}$, along with $\overline{D/Asn}$ and D/Asn, are coupled to D/A driver 426. D/A driver 426 preferably has seven MOS devices 429 coupled to the seven lines $\overline{D/A_6}$ through $\overline{D/A_0}$ from truncation logics 425. Each device 429 preferably includes a MOS switching transistor whose gate is coupled to one of the lines $\overline{D/A_6}$–$\overline{D/A_0}$ and a series connected constant current load transistor 429b. Devices 429 are arranged, by controlling their length to width ratios, to act as current sources, the device 429 coupled to $\overline{D/A_6}$ sourcing twice as much current (when on) as the device 429 coupled to $\overline{D/A_5}$. Likewise, the devices 429 coupled to $\overline{D/A_5}$ is capable of sourcing twice as much current as the device 429 coupled to $\overline{D/A_4}$. This two to one current sourcing capability similarly applies to the remaining devices 429 coupled to the remaining lines $\overline{D/A_3}$–$\overline{D/A_0}$. Thus, device 429 coupled to $\overline{D/A_1}$, is likewise capable of sourcing twice as much current as the device 429 coupled to $\overline{D/A_2}$. All devices 429 are connected in parallel, one side of which are preferably coupled to Vss and the other side is preferably coupled to either side of the speaker 4 via transistors 430 and 431. Transistor 430 is controlled by $\overline{D/Asn}$ which is applied to its gates; transistor 431 is turned off and on in response to $\overline{D/Asn}$. Thus, either transistor 430 or 431 is on depending on the state of the sign bit, $\overline{D/Asn}$. The voice coil of speaker 4 preferably has a 100 ohm impedance and has a center tap connected to Vgg. Thus, the signals on lines $\overline{D/A_6}$–$\overline{D/A_0}$ control the magnitude of current flow through the voice coil while the signals on lines $\overline{D/Asn}$ and $\overline{D/Asn}$ control the direction of that flow.

Alternatively to using a center-tapped 100 ohm voice coil, a more conventional eight ohm speaker may be used along with a transformer having a 100 ohm center-tapped primary (connected to Vgg and transistors 430 and 431) and an eight ohm secondary (connected to the speaker's terminals).

It should now be appreciated by those skilled in the art that D/A converter 426 not only converts digital sign magnitude information on lines $\overline{D/A_6}$–$\overline{D/A_0}$ and D/Asn–$\overline{D/Asn}$ to an analog signal, but has effectively amplified this analog signal to sufficient levels to permit a speaker to be driven directly from the MOS synthesis chip 10 (or via the aforementioned transformer, if desired). Of course, those skilled in the art will appreciate that simple D/A drivers, such as that disclosed here, will find use in other applications involving differential input devices or amplifiers.

The active area under the gates of devices 429 preferably are as follows: (1) the switching device 429b connected to $\overline{D/A_0}$ is 0.55 mils in width by 0.4 mils in length while its load device 429a is 3.85 mils in width by 0.4 mils in length (the remaining switching devices 429b as well as their load devices all preferably have lengths of 0.4 mils, so the length dimensions are no longer called out); (2) at $\overline{D/A_1}$ the switching device 429b is 1.1 mils while its load device is 7.7 mils; (3) for $\overline{D/A_2}$ device 429b is 2.2 mils while device 429a is 15.35 mils; at $\overline{D/A_3}$ device 429b is preferably 4.4 mils in width while its device 429a is 30.75 mils; then at $\overline{D/A_4}$ device 429b is 8.8 mils while device 429a is 61.5 mils in width; for $\overline{D/A_5}$ device 429b is preferably 17.6 mils in width and its load device is 123 mils in width; and for $\overline{D/A_6}$ switching device 429b is preferably 35.2 mils in width while its load device 429a is preferably 246 mils in width. It can be seen, of course, that these devices 429 follow the aforesaid two to one geometric sizing of their respective gate width to length ratios. Of course, the aforementioned lengths and widths are merely exemplary sizes for the gates of these devices and those skilled in that art may desire to size their devices differently, but generally in accordance with the aforesaid two-to-one relationship.

Figure 23A:
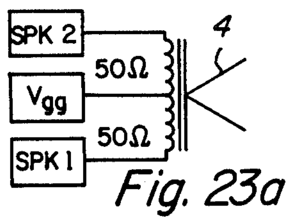
Figure 23B:
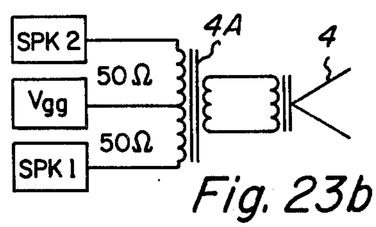
Figure 23C:
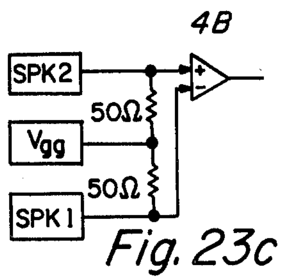

FIGS. 23A–23C show different loads coupled to the output terminals SPK1 and SPK2. Numeral 4A is directed to the center-tapped transformer while numeral 4B is directed to a differential input devices, such as may be driven by driver 426. Of course, other load impedances may be selected, as a matter of design choice, by using other sizes of devices **429*a* and 429*b***.

Figure 23D:
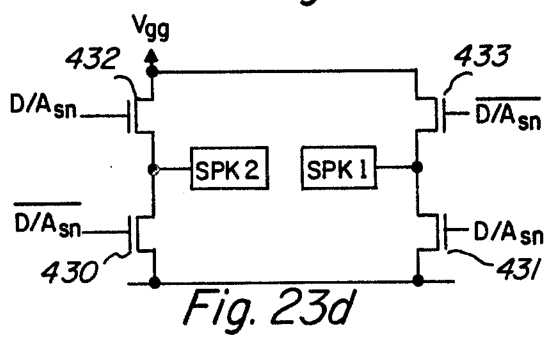

FIG. 23*d* shows an output which eliminates any need for a center-tapped load, by the addition of transistors 432 and 433.

THE SPEECH SYNTHESIZER CHIP

Figure 22:
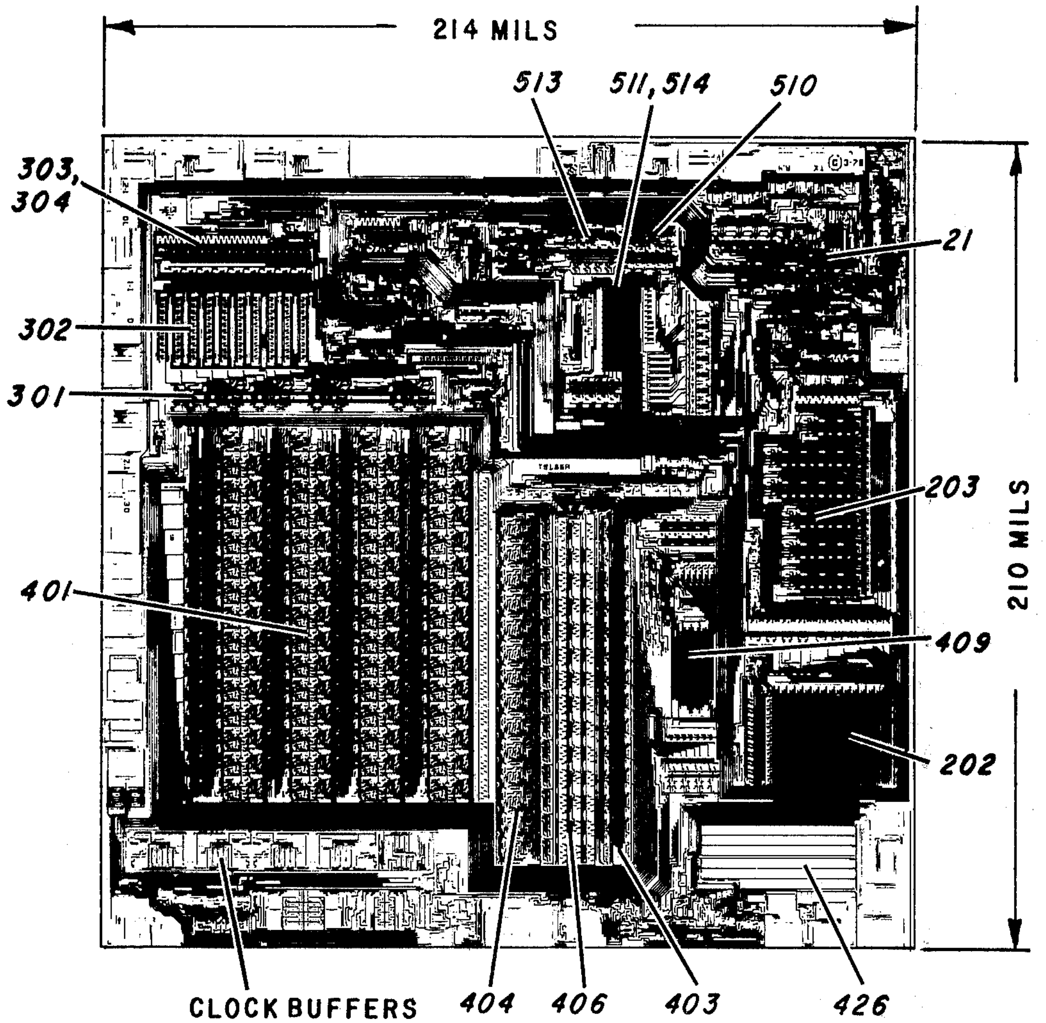
FIG. 22 is a plan view of the synthesizer chip herein described, showing the metal mask or metal pattern, enlarged about fifty times.

In FIG. 22 a greatly enlarged plan view of a semiconductor chip which contains the entire system of FIGS. **4*a* and 4*b*** is illustrated. The chip is only about two hundred fifteen mils (about 0.215 inches) on a side. In the example shown, the chip is manufactured by the P-channel metal gate process using the following design rules: metal line width 0.25 mil; metal line spacing 0.25 mil; diffusion line width 0.15 mil; and diffusion line spacing 0.30 mil. Of course, as design rules are tightened with the advent of electron beam mask production or slice writing, and other techniques, it will be possible to further reduce the size of the synthesizer chip. The size of the synthesizer chip can, of course also be reduced by not taking advantage of some of the features preferably used on the synthesizer chip.

The total active area of speech synthesizer chip 10 is approximately 45,000 square mils.

It will also be appreciated by those skilled in the art, that other MOS manufacturing techniques, such as N-channel, complementary MOS (CMOS) or silicon gate processes may alternatively be used.

The various parts of the system are labeled with the same reference numerals previously used in this description.

CONTROLLER LOGIC DIAGRAMS

The controller used in the learning aid is preferably a microprocessor of the type described in U.S. Pat. No. 4,074,355, with modifications which are subsequently described. U.S. Pat. No. 4,074,355 is hereby incorporated herein by reference. It is to be understood, of course, that other microprocessors, as well as future microprocessors, may well find use in applications such as the speaking learning aid described herein.

The microprocessor of U.S. Pat. No. 4,074,355 is an improved version of an earlier microprocessor described in U.S. Pat. No. 3,991,305. One of the improvements concerned the elimination of digit driver devices so that arrays of light emitting diodes (LED's ) forming a display could be driven directly from the microprocessor. As a matter of design choice, the display used with this learning aid is preferably a vacuum fluorescent (VF) display device. Those skilled in the art will appreciate that when LED's are directly driven, the display segments are preferably sequentially actuated while the display's common character position electrodes are selectively actuated according to information in a display register or memory. When VF displays are utilized, on the other hand, the common character position electrodes are preferably sequentially actuated while the segments are selectively actuated according to information in the display register or memory. Thus, the microprocessor of U.S. Pat. No. 4,074,355 is preferably altered to utilize digit scan similar to that used in U.S. Pat. No. 3,991,305.

The microprocessor of U.S. Pat. No. 4,074,355 is a four bit processor and to process alphanumeric information, additional bits are required. By using six bits, which can represent $2^6$ or 64 unique codes, the twenty-six characters of the alphabet, ten numerals as well as several special characters can be handled with ease. In lieu of converting the microprocessor of U.S. Pat. No. 4,074,355 directly to a six bit processor, it was accomplished indirectly by software pairing the four bit words into eight bit bytes and transmitting six of those bits to the display decoder.

Referring now to FIGS. **15*a*–15*b*, which form a composite block diagram of the microprocessor preferably used in the learning aid, it should be appreciated that this block diagram generally corresponds with the block diagram of FIGS. 7*a* and 7*b* of U.S. Pat. No. 4,074,355; several modifications to provide the aforementioned features of six bit operation and VF display compatability are also shown. The numbering shown in FIGS. 15*a* and 15*b*** generally agrees with that of U.S. Pat. No. 4,074,355. The modifications will now be described in detail.

Figure 13B:
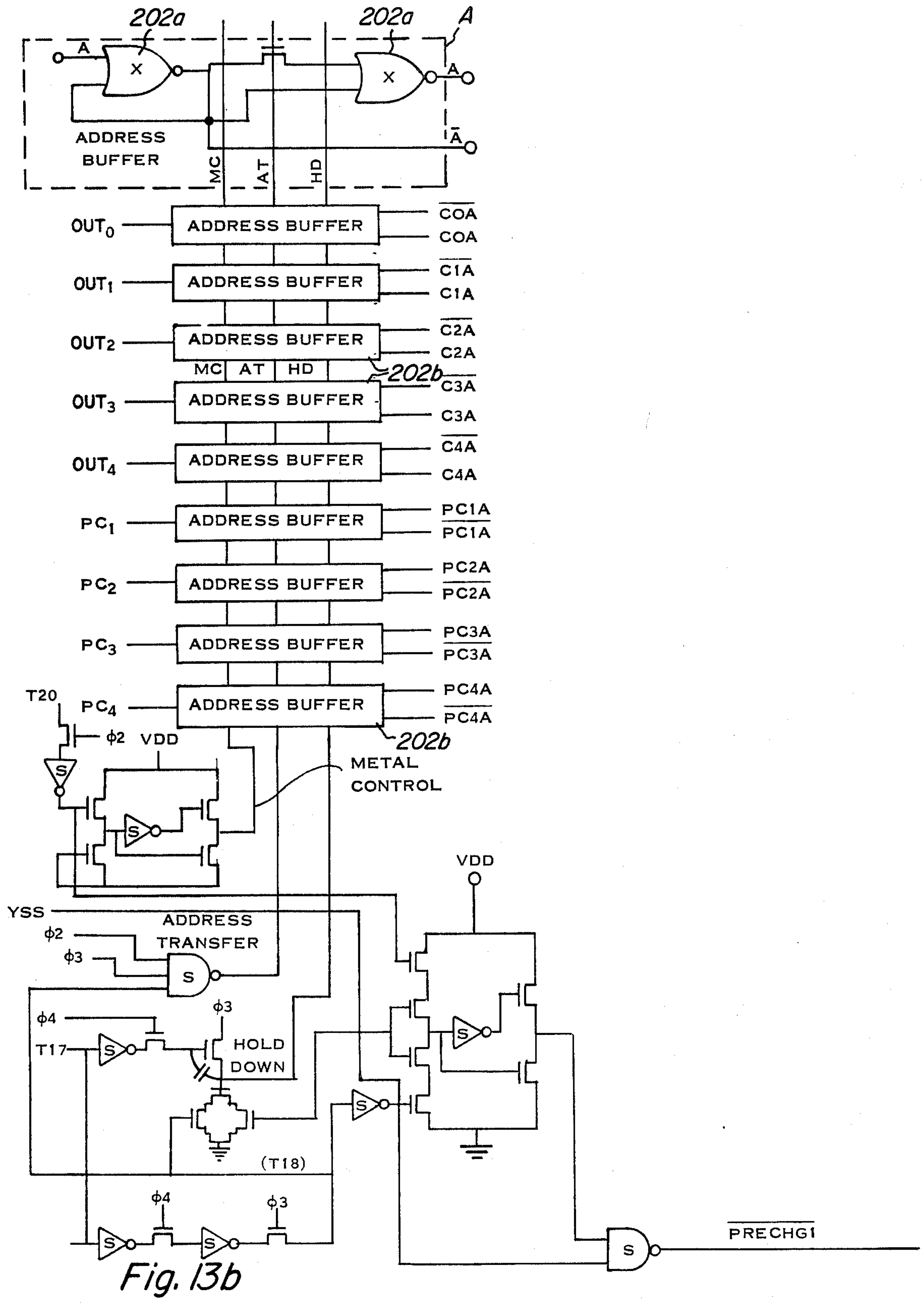
Figure 13B:
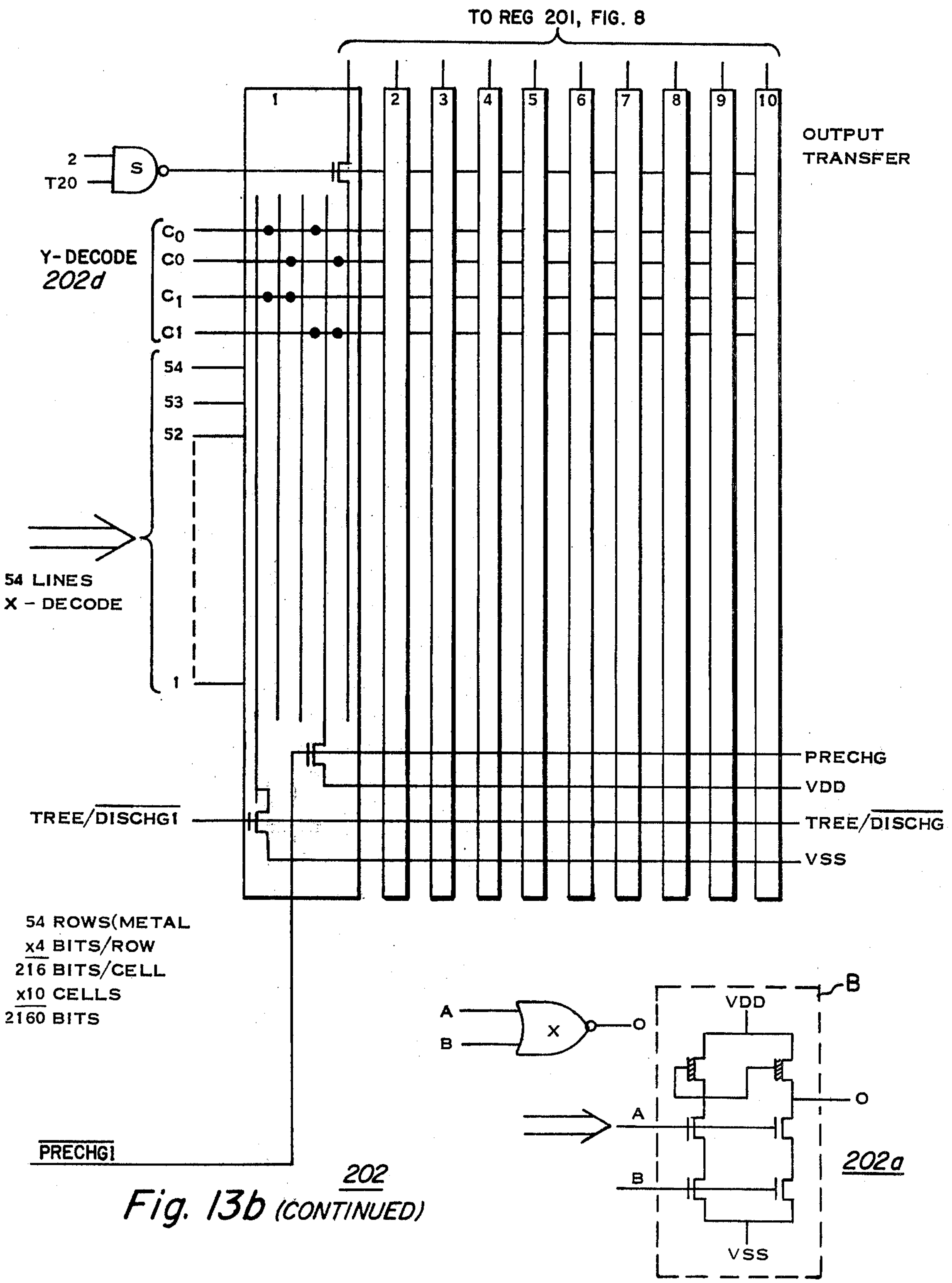
Figure 16A:
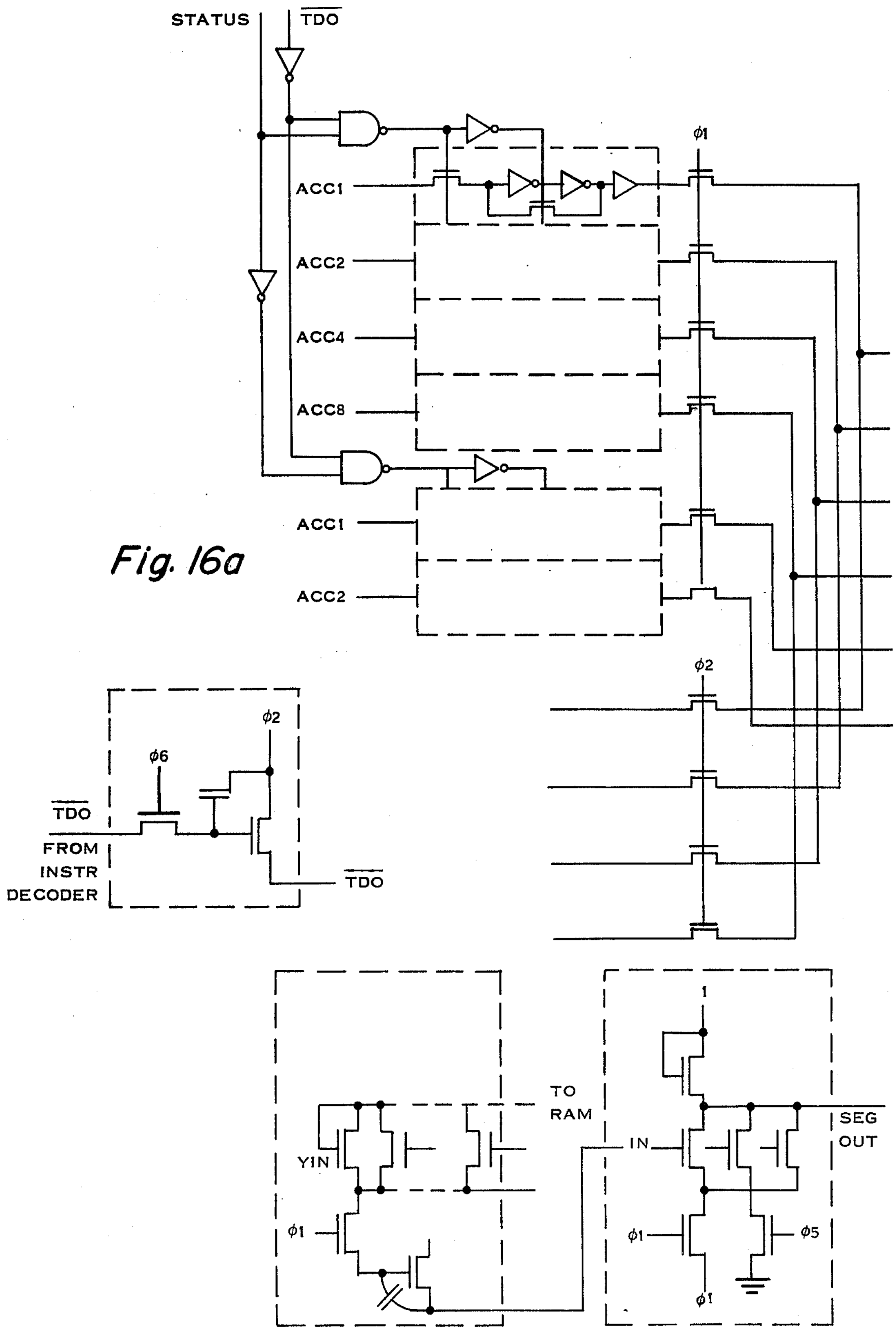
FIGS. 16*a* and 16*b* form a composite logic diagram of the segment decoder of the microprocessor.
Figure 16B:
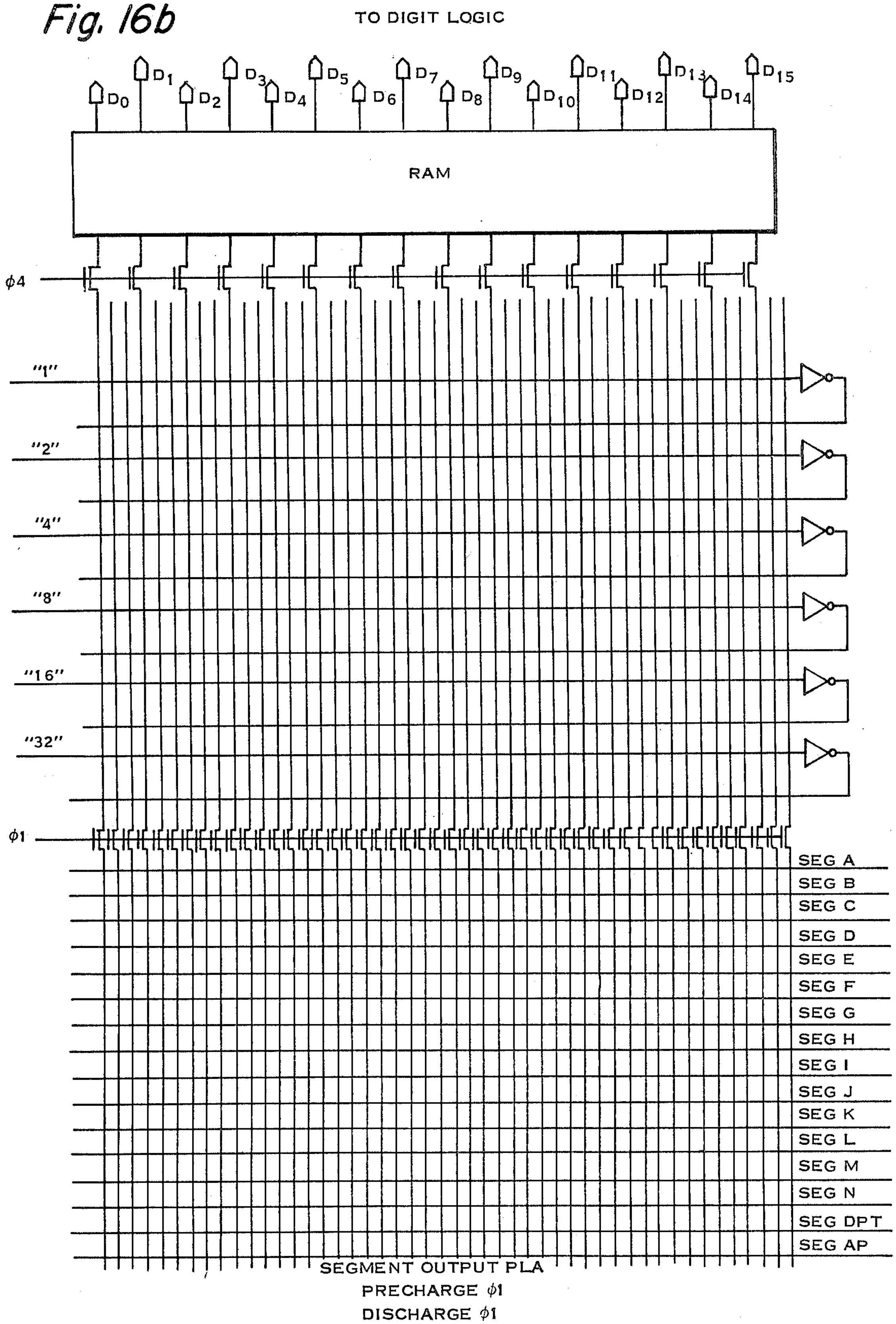
Figure 16B:
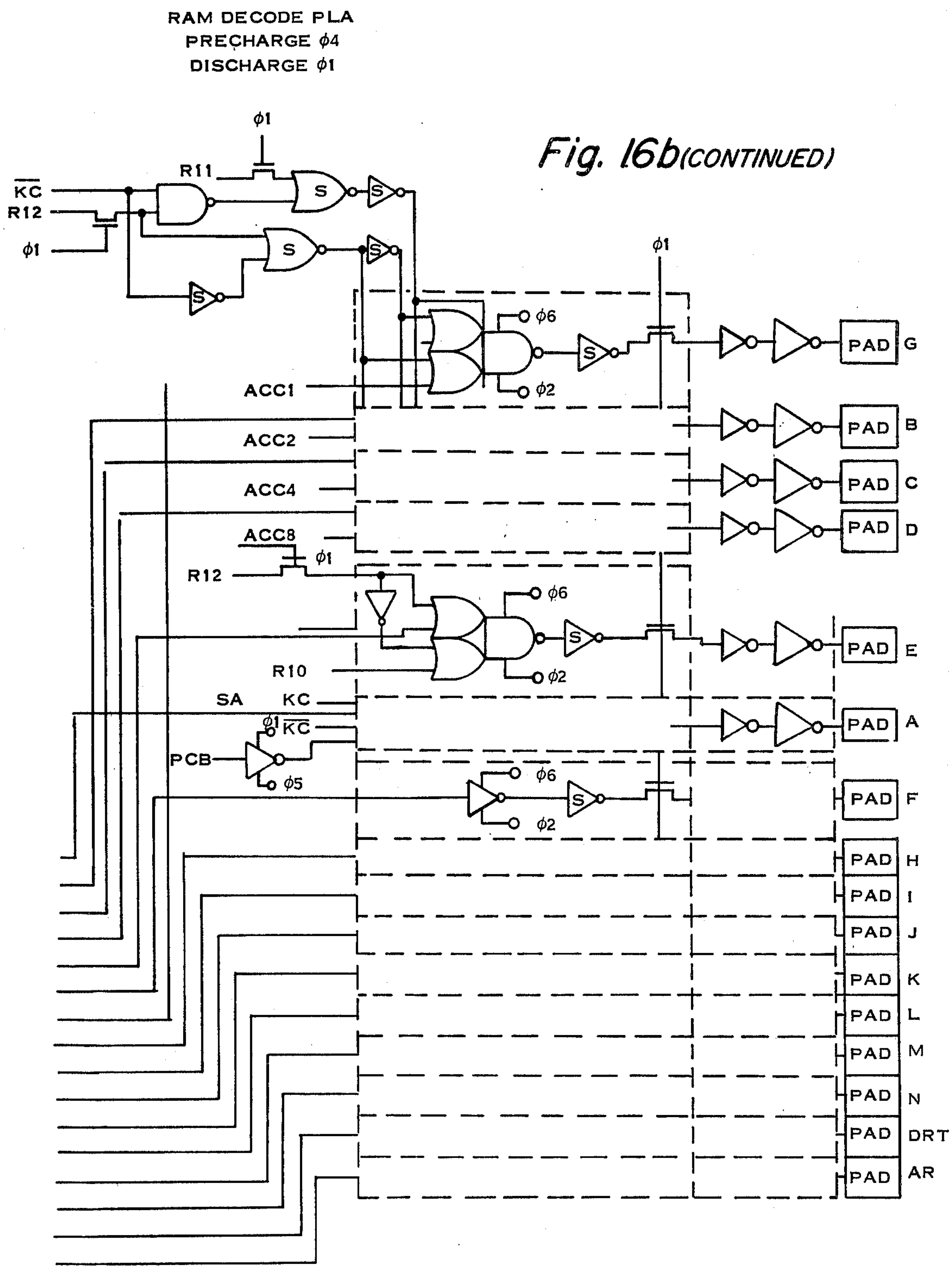

Referring now to the composite diagram formed by FIGS. **16*a*–16*b* which replace FIG. 13 of U.S. Pat. No. 4,074,355, there can be seen the segment decoder and RAM address decoder 33–1 which decodes RAMY for addressing RAM 31 of ACC1–ACC8 for decoding segment information. Decoder 33–1 generally corresponds to decoder 33 in the aforementioned U.S. patent. The segment information is re-encoded into particular segment line information in output section 32–2 and outputted on bus 90 to segment drivers 91. Six bits of data from the processor's four bit accumulator 77 are decoded in decoder 33–1 as is now described. First, four bits on bus 86 are latched into accumulator latches 87–1 through 87–8 on a TDO (Transfer Data Out) instruction when status is a logical one. Then, two bits on bus 86 (from lines 86–1 and 86–2) are latched into accumulator latches 87–16 and 86–32, respectively, on another TD0 instruction when status is a logical zero. Then the six bits in latches 87–1 through 87–32 is decoded in decoder 33–1. Segment drivers 91 may preferably be of one of three types, 91A, 91B or 91C as shown on FIGS. 16*a*–16*b*. The 91A type drivers permits the data on ACC1–ACC8 to be communicated externally via pins SEG G, SEG B, SEG C and SEG D. The 91B type driver coupled to pin SEG E permits the contents of digit register 94–10 to be communicated externally when digit register 94–12 is set. The 91B** type driver coupled to pin SEG A permits the contents of the program counter to be outputted during test operations.

Figure 17:
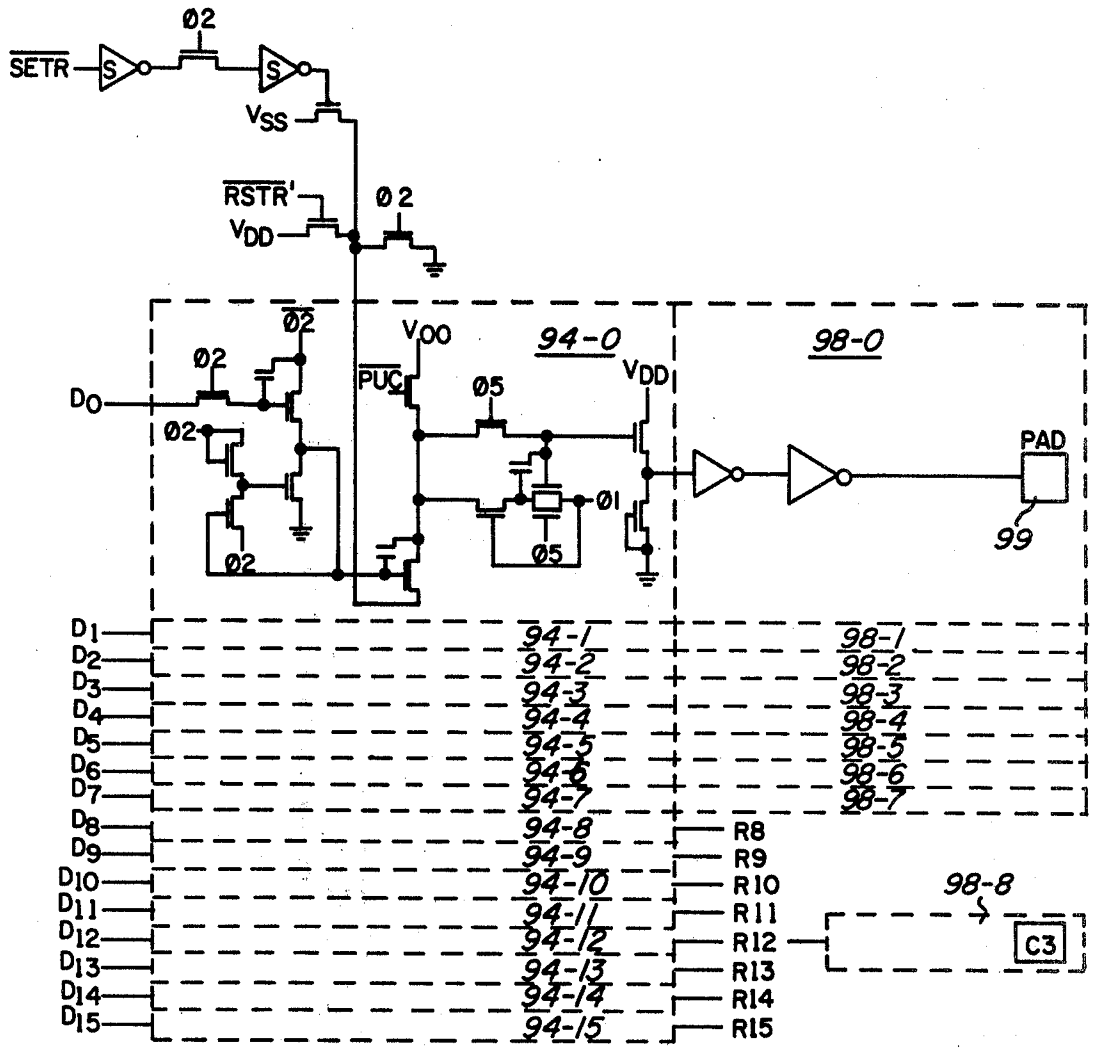
FIG. 17 depicts the digit output buffers and digit registers of the microprocessor.

The digit buffers registers and TD0 latches of FIG. 14 of U.S. Pat. No. 4,074,355 are also preferably replaced with the digit buffers registers of FIG. 17 herein inasmuch as (1) the DDIG signal is no longer used and (2) the digit latches (elements 97 in U.S. Pat. No. 4,074,355) are no longer used. For simplicity's sake, only one of the digit output buffer registers 94 is shown in detail. Further, since in this embodiment of the learning aid, display 2 preferably has eight character positions, eight output buffers 98–0 through 98–7 connect $D_0$–$D_7$ to the common electrodes of disply 2 via registers 94–0 through 94–7 are shown in FIG. 17. An additional output buffer 98–8 communicates the contents of registers 94–12, which is the chip select signal, to synthesizer 10.

Figure 18:
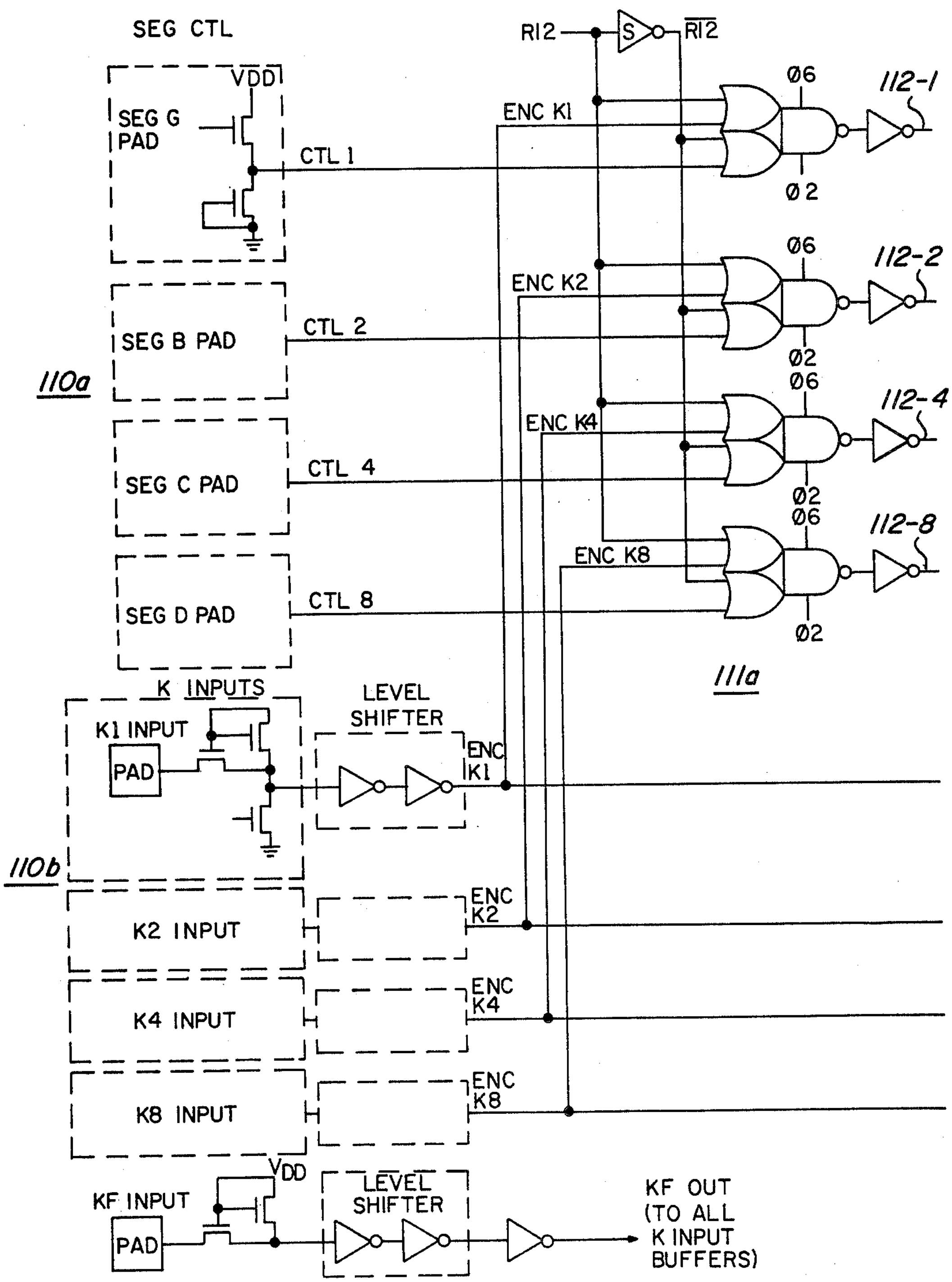
FIG. 18 depicts the KB selector circuit of the microprocessor.

To facilitate bi-directional communication with synthesizer 10, the microprocessor of U.S. Pat. No. 4,074,355 is preferably modified to permit bi-directional communication on pins SEG G, SEG B, SEG C and SEG D. Thus, in FIG. 18, these SEG pins are coupled to the normal K lines, 112–1 through 112–8, via an input selector 111*a* for inputting information when digit registers 94–12 (R12) is set. Further, these pins are also coupled to ACC1–ACC8 via segment drivers 91A when digit registers 94–12 (R12) and 94–11 (R11) are set for outputting information in accumulator 77.

Thus, when digit latch 94–12 (which communicates the chip select signal externally) is set, SEG E is coupled to R10 (digit registers 94–10) for communicating the PDC signal to synthesizer 10. Also, ACC1–ACC8 is outputted on SEG G and SEG B-SEG D, during the time R12 is and R11 are set. When R11 is a logical 0, i.e., is reset, segment drivers 91A are turned off and data may be read into CKB circuit 113 for receiving data from ROMs 12*a*–*12b* via synthesizer 10, for instance, FIG. 18 replaces the keyboard circuit 111 shown in FIG. 22 of U.S. Pat. No. 4,064,554.

Preferably, pins SEG G and SEG B-SEG D are coupled to CTL1–CTL8 pins of synthesizer 10, while pin SEG E is coupled to the PDC pin of synthesizer 10.

Figure 15A:
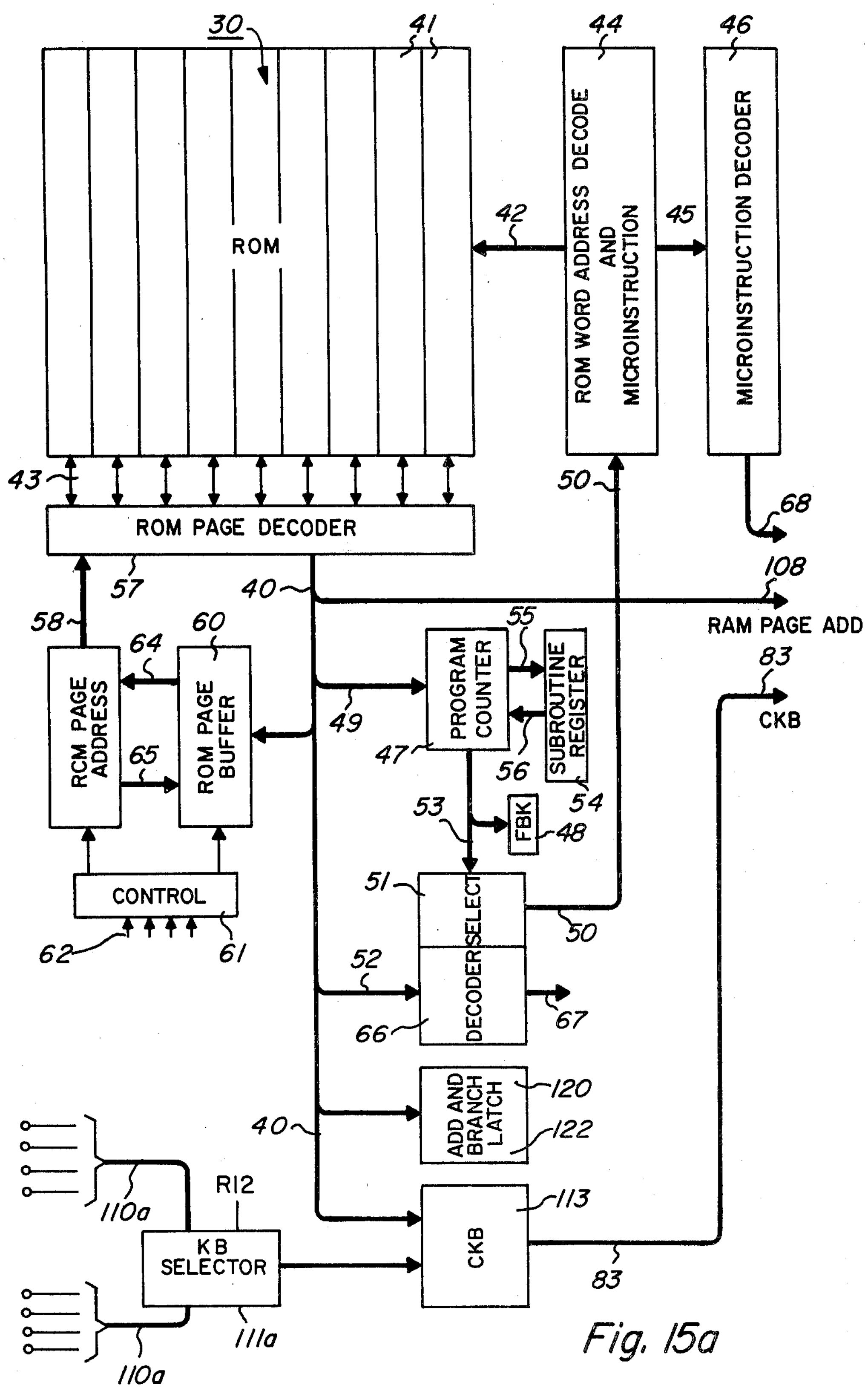
FIGS. 15*a*–15*b* form a composite block diagram of a microprocessor which may be utilized as the controller.
Figure 15B:
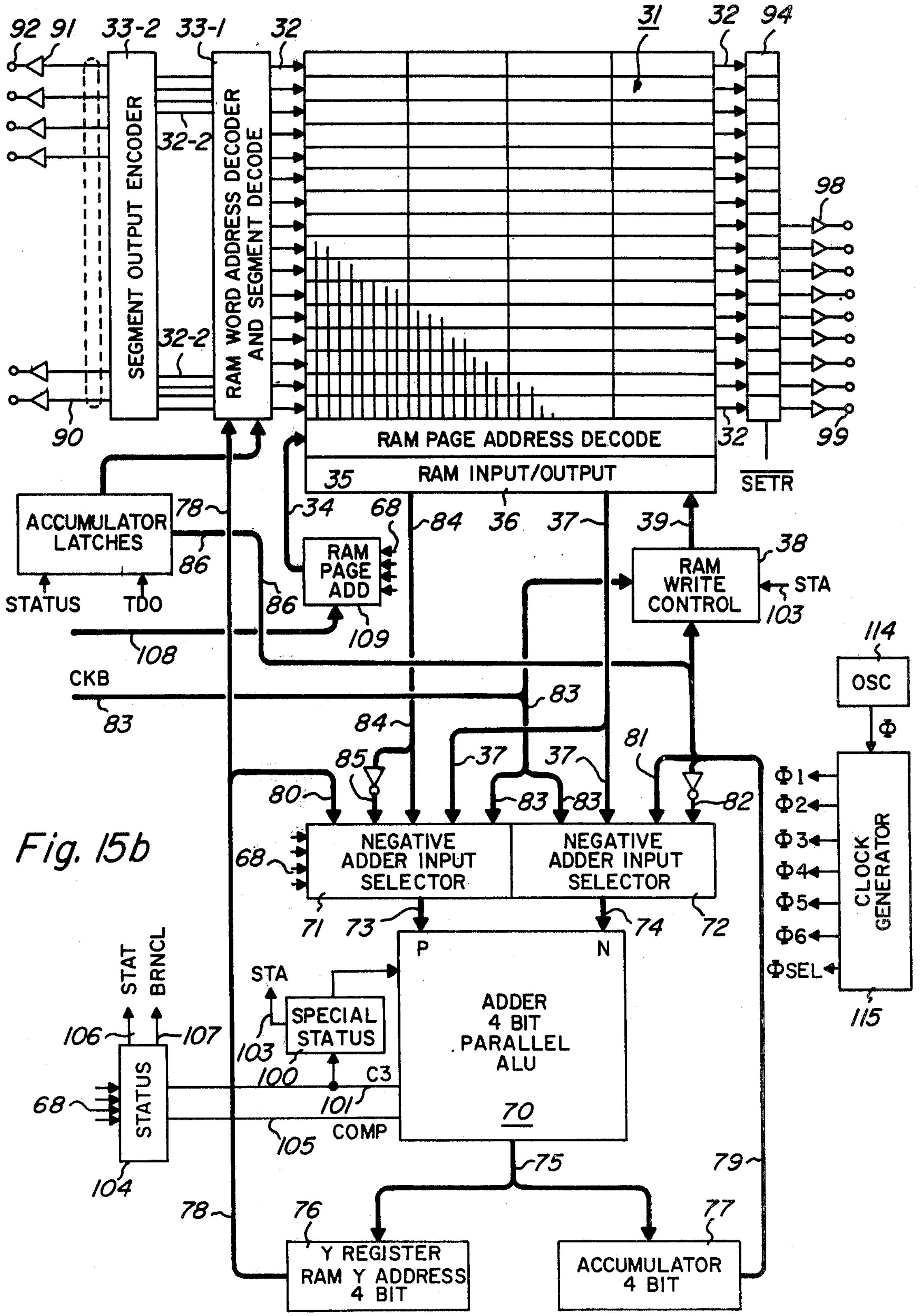

In Table IX (which comprises Tables 0 through IX-15) is listed the set of instructions which may be stored in the main Read-Only-Memory 30 of FIGS. 15*a*–*15b* to provide controller 11. Referring now to Table IX, there are several columns of data which are, reading from left to right: PC (Program Counter), INST (Instruction), BRLN (Branch Line), Line and Source Statement (which includes Name, Title and Comments). In U.S. Pat. No. 4,074,355, it can be seen that main Read-Only-Memory 30 is addressed with a seven bit address in program counter 47 and a four bit address in a buffer 60. The address in buffer 60 is referred to as a page address in the main Read-Only-Memory. The instructions listed on Table IX-0 correspond to page zero in the microprocessor while the instructions listed in Table IX-1 are those on page one and so forth through to the instructions in Table IX-15 which are stored on page fifteen in the microprocessor.

The program counter 47 of the aforementioned microprocessor is comprised of a feedback shift register and therefore counts in a pseudorandom fashion, thus the addresses in the left-hand column of Table IX, which are expressed as a hexadecimal number, exhibit such pseudorandomness. If the instruction starting at page zero were read out sequentially from the starting position in the program counter (00) then the instructions would be read out in the order shown in Table IX. In the "Line" column is listed a sequentially increasing decimal number associated with each source statement and its instruction and program counter address as well as those lines in which only comments appear. The line number starts at line 55 merely for reasons of convenience not important here. When an instruction requiring either a branch or call is to be performed, the address to which the program counter will jump and the page number to which the buffer will jump, if required, is reflected by the binary code comprising the instruction or instructions performing the branch or call. For sake of convenience, however, the branch line column indicates the line number in Table IX to which the branch or call will be made. For example, the instruction on line 59 (page 0, Program Counter Address OF) is a branch instruction, with a branch address of 1010111 (57 in hexadecimal). To facilitate finding the 57 address in the program counter, the branch line column directs the reader to line 80, where the 57 address is located.

READ-ONLY-MEMORY LOGIC DIAGRAMS

Figure 19:
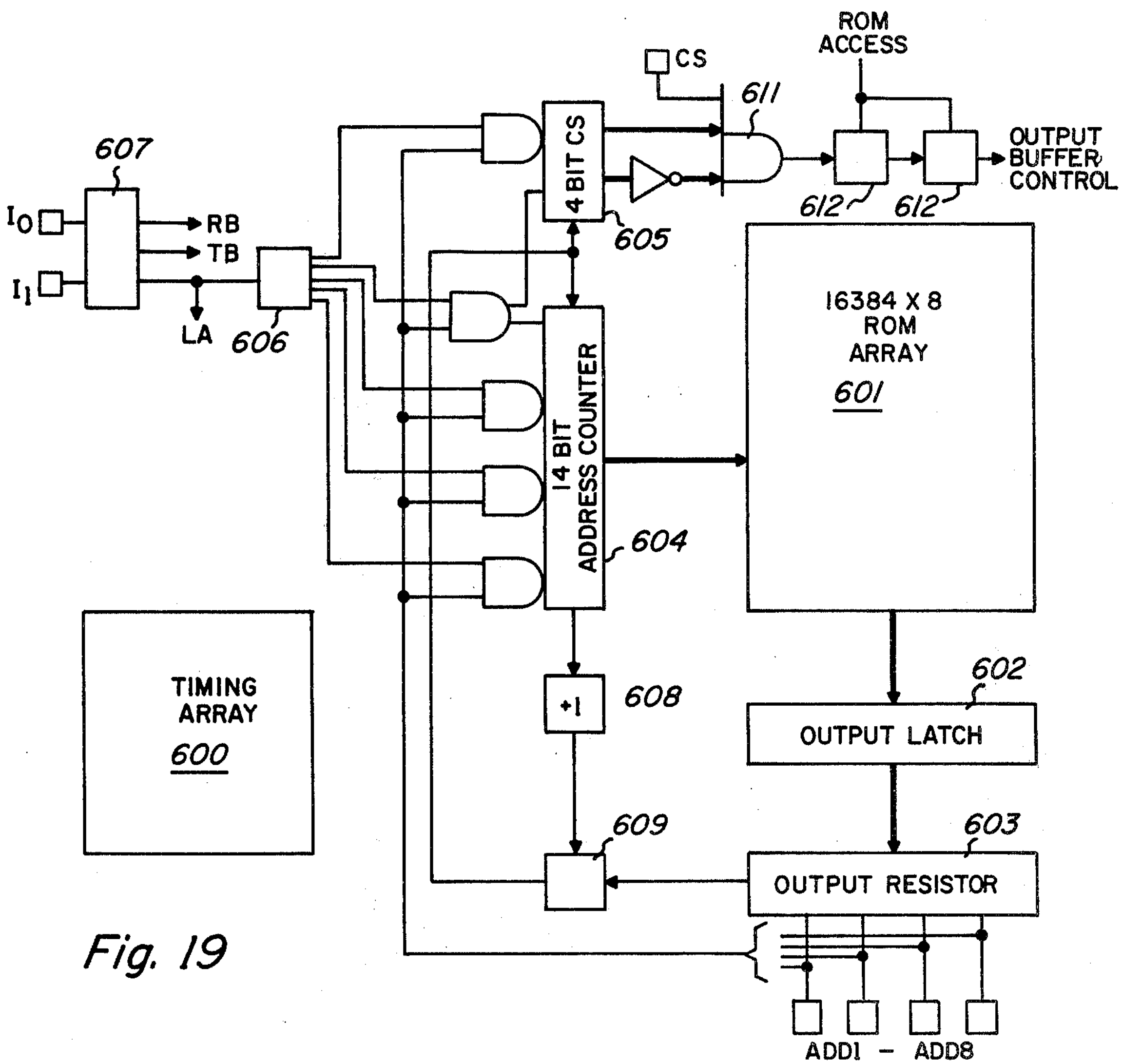
FIG. 19 is a block diagram of ROM's 12*a,* 12*b,* 13*a* or 13*b;*
Figure 20A:
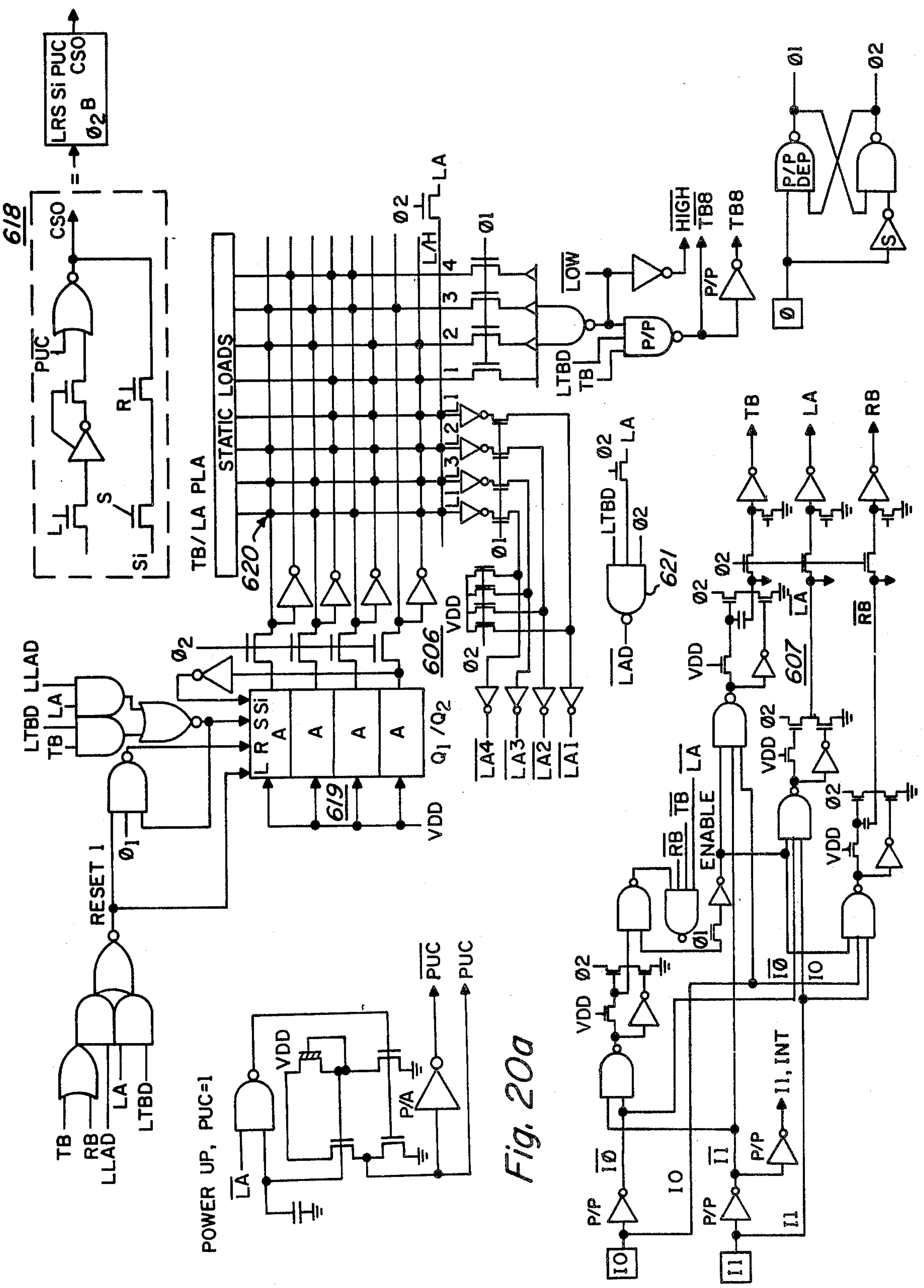
FIGS. 20*a*–20*e* form a composite logic diagram of the control logic for ROMs 12*a,* 12*b,* 13*a* or 13*b;*
Figure 20B:
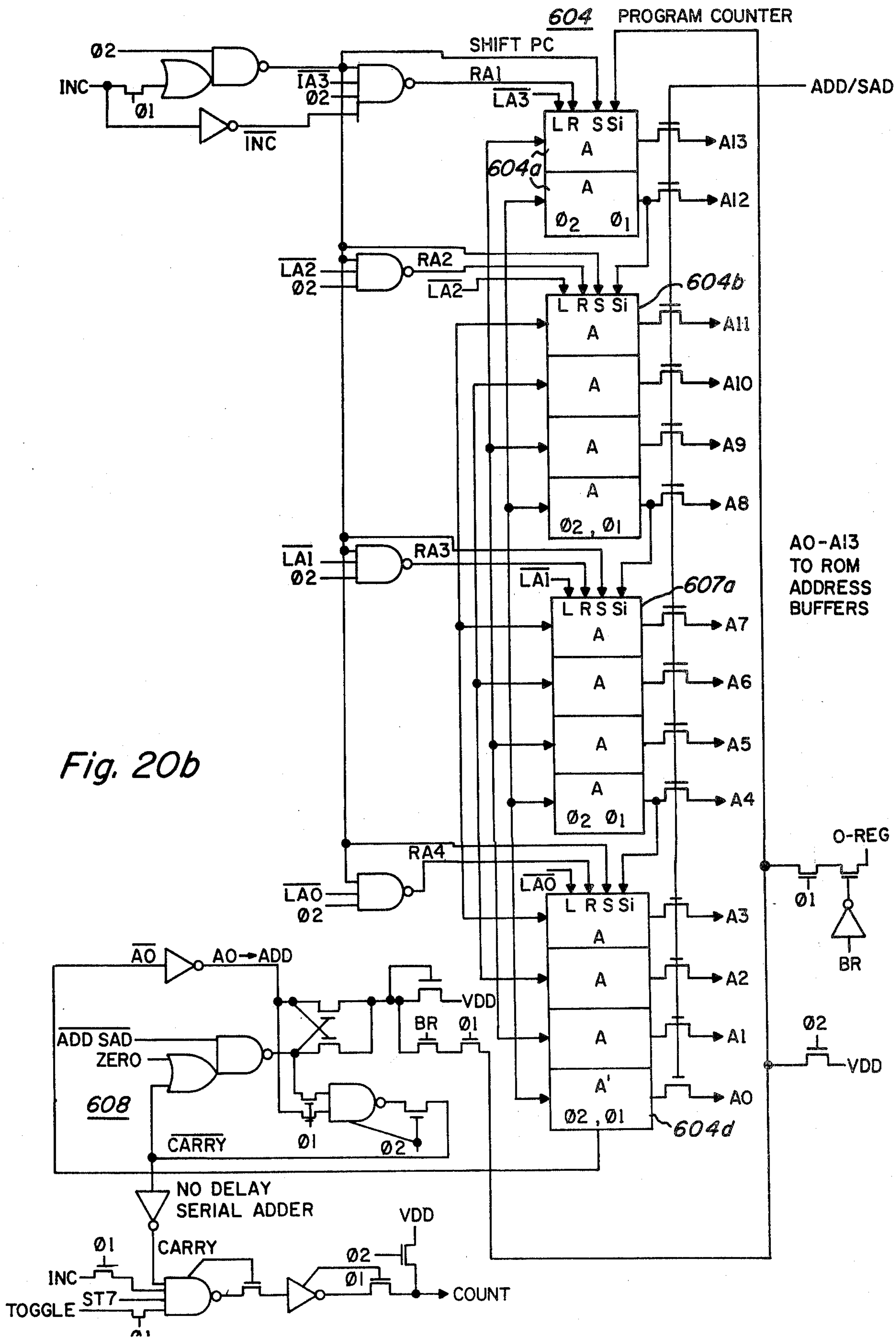
Figure 20C:
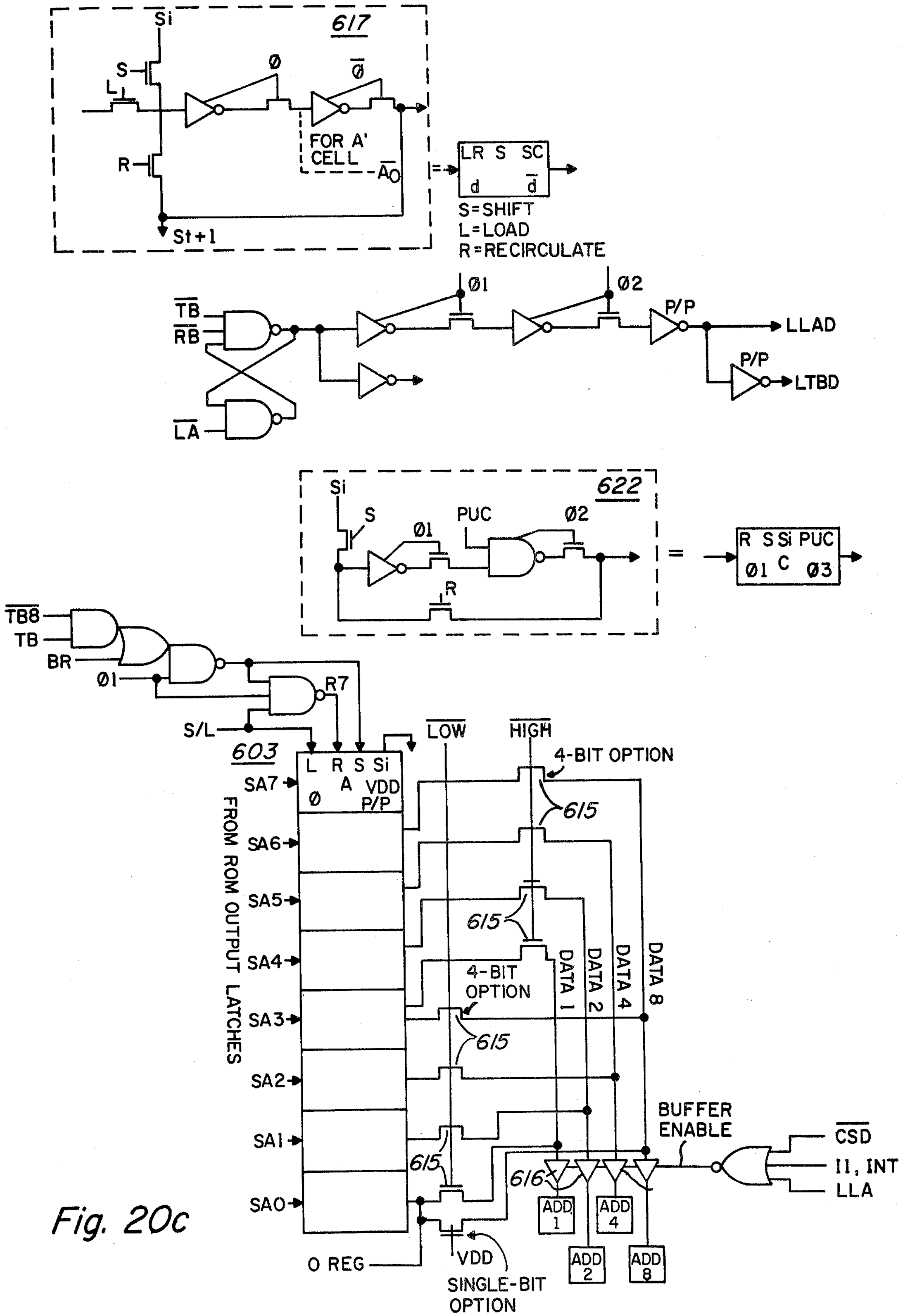
Figure 20D:
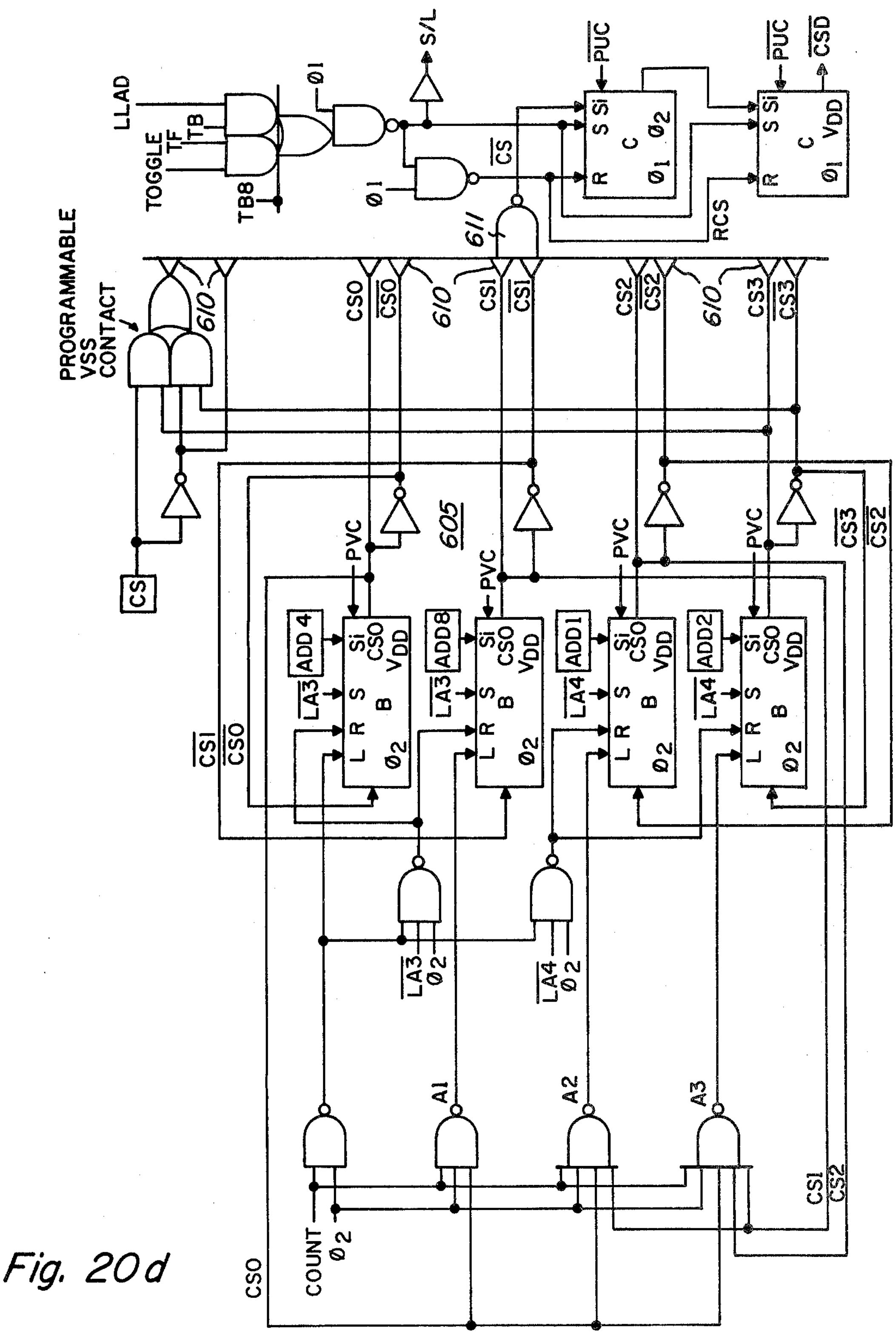
Figure 20E:
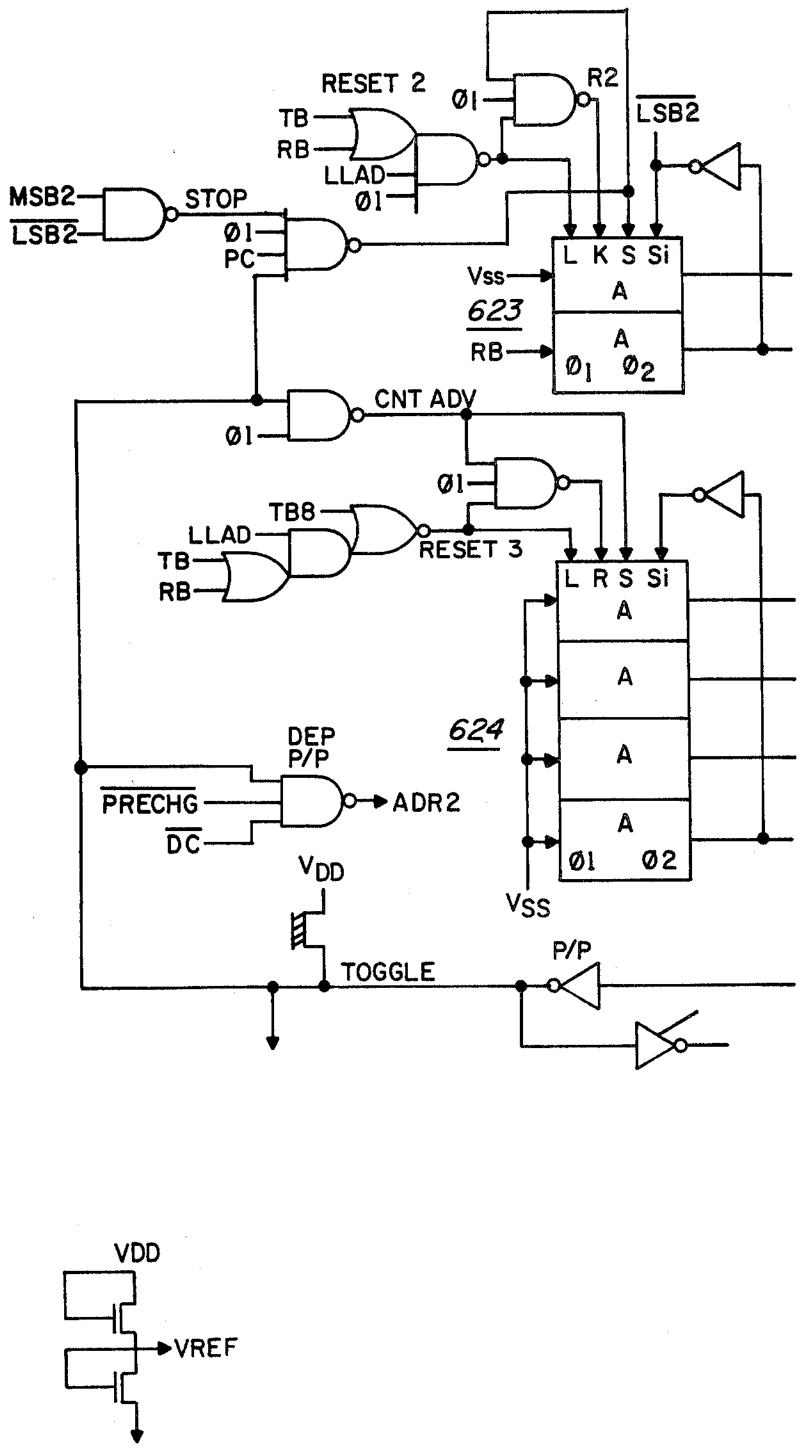
Figure 20:
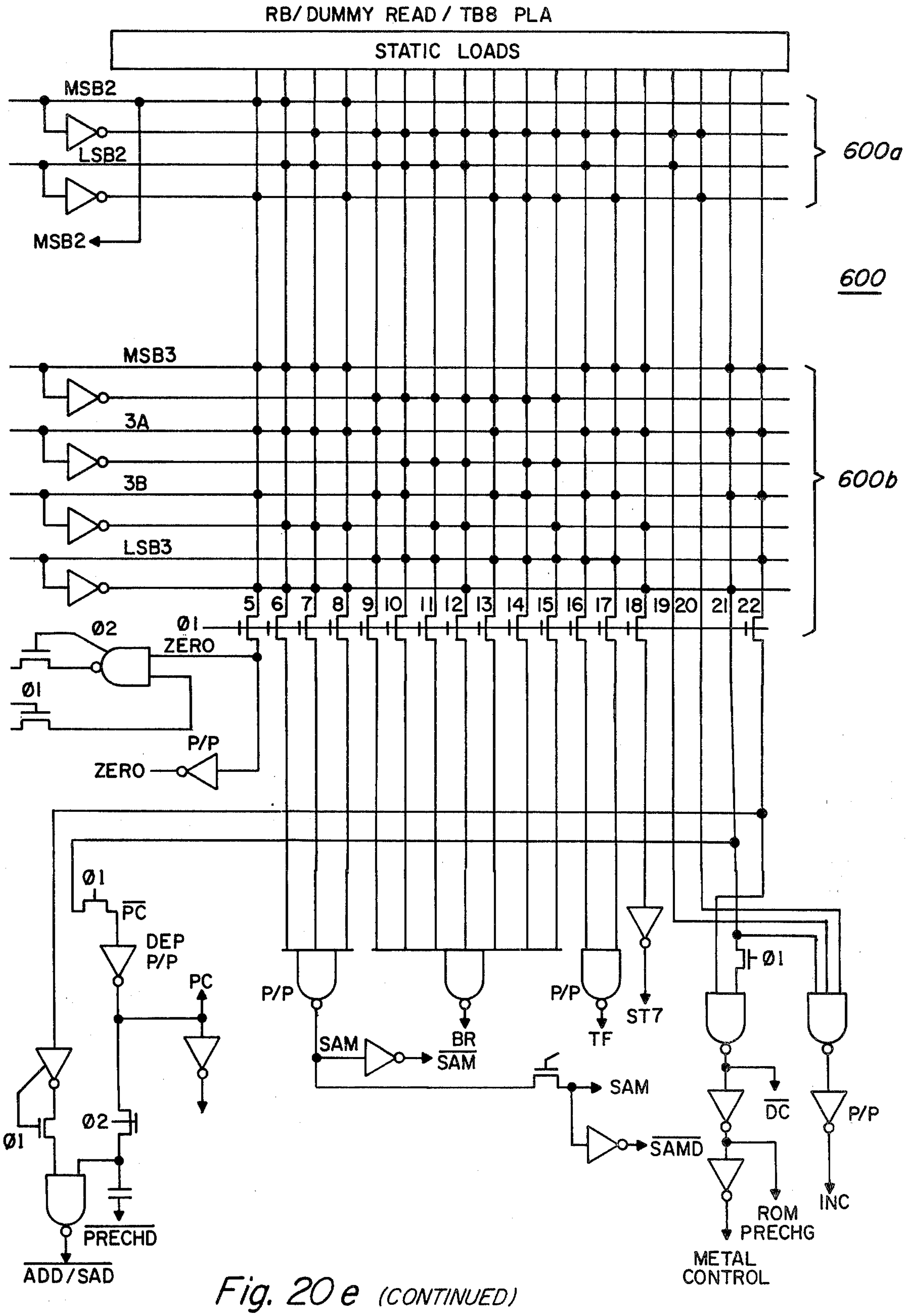

Read-Only-Memories 12*a* or 12*b* or 13*a* or 13*b* are shown in FIGS. 19, 20*a*, 20*b*, 21*a* and 21*b*. FIG. 19 is a block diagram of any one of these ROMs. FIGS. 20*a* and 20*b* form a composite logic diagram of the control logic for the ROMs while FIGS. 20*a* and 20*b* form a composite logic diagram of the X and Y address decoders and pictorially show the array of memory cells.

Referring now to FIG. 19, the RAM array 601 is arranged with eight output lines, one output line from each section of 16,384 bits. The eight output lines from ROM array 601 are connected via an output latch 502 to an eight bit output register 603. The output register 603 is interconnected with pins ADD1–ADD8 and arranged either to communicate the four high or low order bits from output register 603 via the four pins ADD1–ADD8 or alternatively to communicate the bit serially from output register 603 via pin ADD1. The particular alternative used may be selective according to mask programmable gates.

ROM array 601 is addressed via a 14 bit address counter 604. The address counter 604 has associated therewith a four bit chip select counter 605. Addresses in address counter 604 and chip select counter 605 are loaded four bits at a time from pins ADD1–ADD8 in response to a decoded Load Address (LA) command. The first LA command loads the four least significant bits in address counter 604 (bits $A_0$–$A_3$), and subsequent LA commands load the higher order bits, ($A_4$–$A_7$, $A_8$–$A_{11}$ and $A_{12}$–$A_{13}$). During the fourth LA cycle the $A_{12}$ and $A_{13}$ bits are loaded at the same time the CS0 and CS1 bits in chip select counter 605 are loaded. Upon the fifth LA command the two most significant bits in chip select counter 605 are loaded from ADD1 and ADD2. A counter 606 counts consecutively received LA commands for indicating where the four bits on ADD-1–ADD8 are to be inputted into counters 604 and/or 605.

Commands are sent to the ROM chip via $I_0$ and $I_1$ pins to a decoder 607 which outputs the LA command a TB (transfer bit) and a RB (read and branch) command.

Address register 604 and chip select register 605 have an add-one circuit 608 associated therewith for incrementing the address contained herein. When a carry occurs outside the fourteen bit number stored in address register 604 the carry is carried into shift select register 605 which may enable the chip select function is not previously enabled or disable the chip select function if previously enabled, for example. Alternatively, the eight bit contents of output register 603 may be loaded into address register 604 by means of selector 609 in response to an RB command. During an RB command, the first byte read out of array 601 is used as the lower order eight bits while the next successive byte is used for the higher order six bits in counter 604.

The output of chip select register 605 is applied via programmable connectors 610 to gate 611 for comparing the contents of chip select counter 605 with a preselected code entered by the programming of connectors 610. Gate 611 is also responsive to a chip select signal on the chip select pin for permitting the chip select feature to be based on either the contents of the four bit chip select register 605 and/or the state of the chip select bit on the CS pin. The output of gate 611 is applied to two delay circuits 612, the output of which controls the output buffers associated with outputting information from output register 603 to pins ADD1–ADD8. The delay imposed by delay circuits 612 effect the two byte delay in this embodiment, because the address information inputted on pins ADD1–ADD8 leads the data outputted in response thereto by the time to require to access ROM array 601. The CS pin is preferably used in the embodiment of the learning aid disclosed herein.

A timing PLA 600 is used for timing the control signals outputted to ROM array 601 as well as the timing of other control signals.

Referring now to the composite drawing formed by FIGS. 20*a* and 20*b*, output register 603 is formed by eight "A" bit latches, an exemplary one of which is shown at 617. The output of register 603 is connected in parallel via a four bit path controlled on $\overline{\text{LOW}}$ or $\overline{\text{HIGH}}$ signals to output buffers 616 for ADD1–ADD4 and 616*a* for ADD8. Buffers 616 and 616*a* are shown in detail on FIGS. 21*a*–21*b*.

Gates 615 which control the transferring of the parallel outputs from register 603 via in response to $\overline{\text{LOW}}$ and $\overline{\text{HIGH}}$ are preferably mask level programmable gates which are preferably not programmed when this chip is used with the learning aid described herein. Rather the data in register 603 is communicated serially via programmable gate 614 to buffer 616*a* and pin ADD8. The bits outputted to ADD1–ADD8 in response to a HIGH signal are driven from the third through sixth bits in register 603 rather that the fourth through seventh bits inasmuch as a serial shift will normally be accomplished between a $\overline{\text{LOW}}$ and $\overline{\text{HIGH}}$ signal.

Address register 604 comprises fourteen of the bit latches shown at 617. The address in address 604 on lines $A_0$–$A_{13}$ is communicated to the ROM X and Y address buffers shown on FIG. 21*a*–21*b*. Register 604 is divided into four sections 601*a*–601*d*, the 601*d* section loading four bits from ADD1–ADD8 in response an $\overline{\text{LAO}}$ signal, the 601*c* section loading four bits from ADD1–ADD8 in response to an $\overline{\text{LA1}}$ signal and likewise for section 601*b* in response to an $\overline{\text{LA2}}$ signal. Section 601*a* is two bits in length and loads the ADD1 and ADD2 bits in response to an $\overline{\text{LA2}}$ signal. The chip select register 605 comprise four B type bit latches of the type shown at 618. The low order bits, CS0 and CS1 are loaded from ADD4 and ADD8 in response to an $\overline{\text{LA3}}$ signal while the high order bits CS2 and CS3 are loaded from ADD1 and ADD2 on an $\overline{\text{LA4}}$ signal. The $\overline{\text{LA0}}$–$\overline{\text{LA4}}$ signals are generated by counter 606. Counter 606 includes a four bit register 619 comprised of four A bit latches 617. The output of the four bit counter 619 is applied to a PLA 620 for decoding the $\overline{\text{LA1}}$–$\overline{\text{LA4}}$ signals. The $\overline{\text{LA0}}$ signal is generated by a NAND gate 621. As can be seen, the $\overline{\text{LA0}}$ signal comes up in response to an LA signal being decoded immediately after a TB signal. The gate 621 looks for a logical one on the LA signal and a logical one on an LTBD (latched transer bit delay) signal from latch 622. Decoder 607 decode the $I_0$ and $I_1$ signals applied to pins $I_0$ and $I_1$ for decoding the TB, LA and RB control signals. The signals on the $I_0$ and $I_1$ pins are set out in Table X. Latch circuit 622 is responsive to LA, RB and TB for indicating whether the previously received instruction was either an LA or a TB or RB command.

In addition to counting successive LA commands, four bit counter 609 and PLA 620 are used to count successive TB commands. This is done because in this embodiment each TB command transfers one bit from register 603 on pin ADD8 to the synthesizer chip 10 and output register 603 is loaded once each eight successive TB commands. Thus, PLA 620 also generates a TB8 command for initiating a ROM array addressing sequence. The timing sequence of counter 619 and PLA 620 are set forth in Table XI. Of course, the $\overline{\text{LA1}}$–$\overline{\text{LA4}}$ signal is only generated responsive to successive LA commands while the TB8 signals only generate in response to successive TB commands.

Figure 21A:
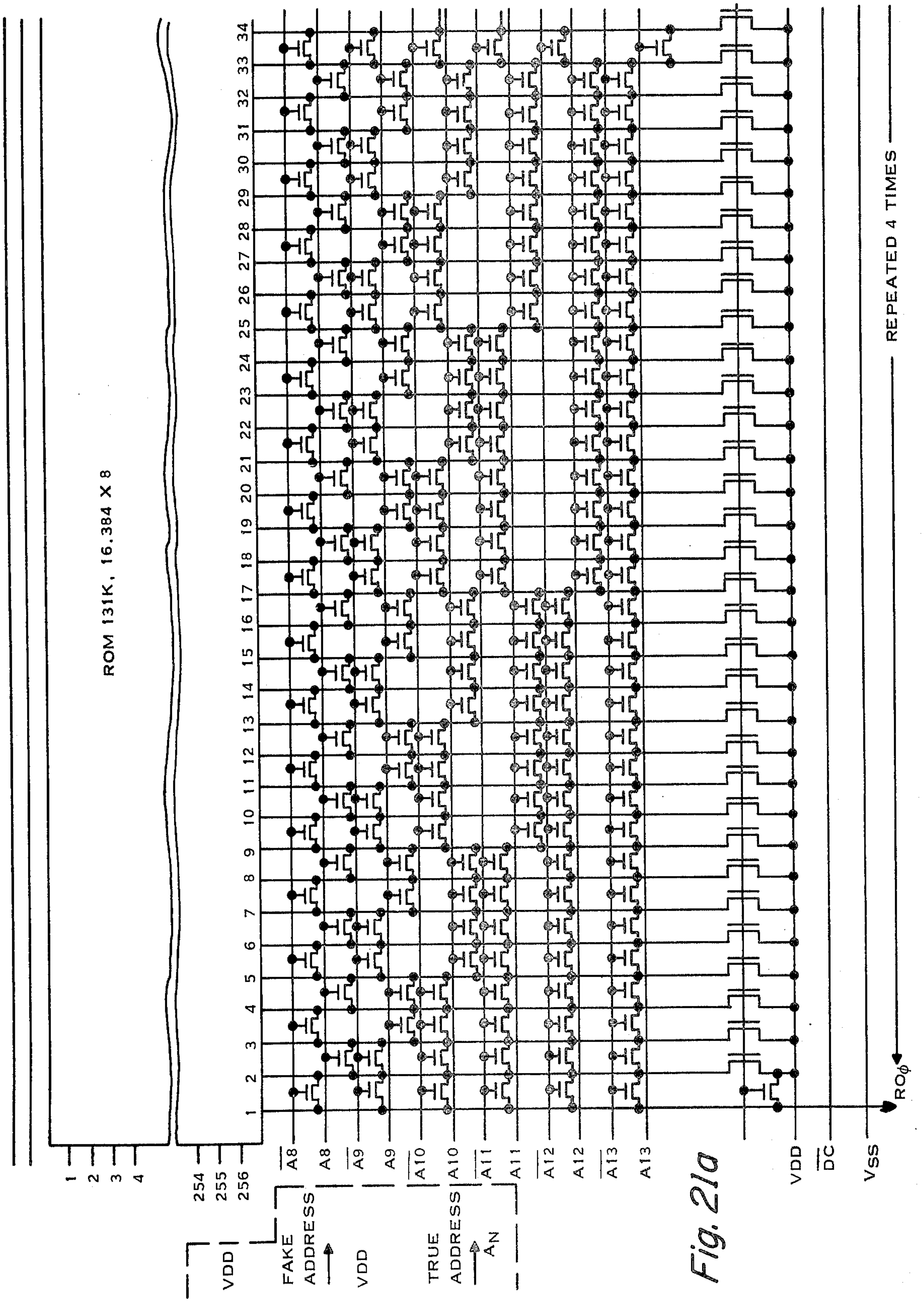
Figure 21A:
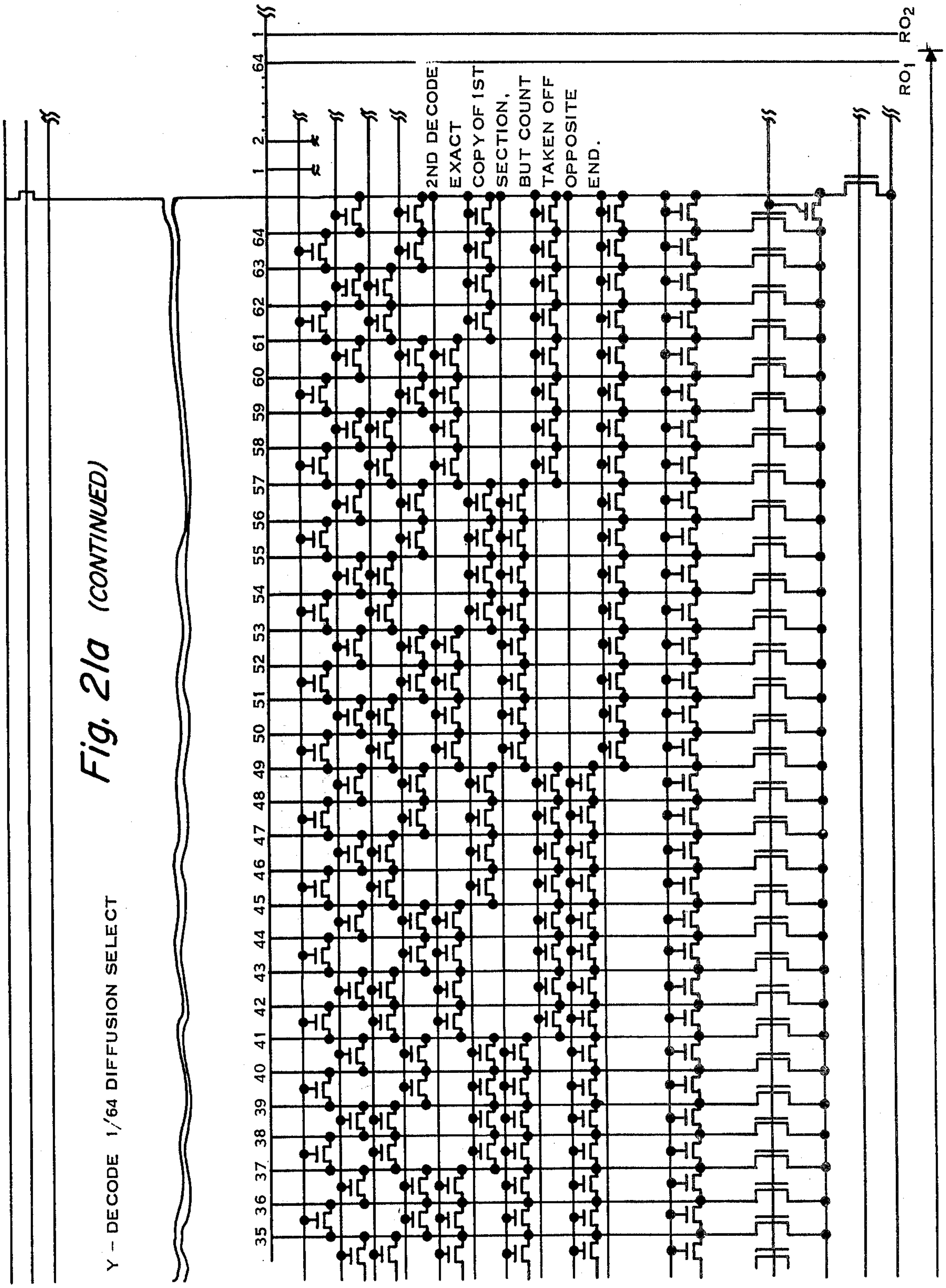

Add-one circuits 608 increments the number in program counter 604 in response to a TB command or an RB command. Since two successive bytes are used as a new address during an RB cycle, the card address and the present address incremented by one must be taken to generate these two bytes. The output of add-one circuit 608 is applied via selector 609 for communicating the results of the incrementation back to the input of counter 604. Selector 609 permits the bits in output register 603 to be communicated to program counter 604 during an RB cycle as controlled by signal BR from array 600. Add-one circuit 608 is also coupled via COUNT to chip select counter 605 for incrementing the number stored therein whenever a CARRY would occur outside the fourteen bits stored in program counter 604. The output of chip select counter 605 is applied via programmable gate 610 to gate 611. The signal on the CS pin may also be applied to gate 611 or compared with the contents of CS3. Thus, gate 611 can test for either (1) the state of the CS signal, (2) a specific count in counter 605 or (3) a comparison between the state on the chip select and the state of CS3 or (4) some combination of the foregoing, as may be controlled by those knowledgeable in the art according to how programmable links 610 are programmed during chip manufacture. The output of gate 611 is applied via two bit latches of the C type, which are shown at 622. Timing array 600 controls the timing of ROM sequencing during RB and TB sequences. Array 600 includes PLA sections 600*a* and 600*b* and counters 623 and 624. Counter 623 is a two bit counter comprising two A type bit latches shown at 617. Counter 63 counts the number of times a ROM access is required to carry out a particular instruction. For instance, a TB command requires one ROM access while an RB command requires three ROM accesses. Counter 624, which comprises four "A" type bit latches of the type shown at 617, counts through the ROM timing sequence for generating various control signals used in accessing ROM array 601. The timing sequence for a TB command is shown in Table XI which depicts the states in counter 623 and 624 in the signals generated in response thereto. A similar timing sequence for an RB command is shown in Table XIII. The various signals generated by PLA 600*a* and 600*b* will now be briefly described. The BR signal controls the transfer of two serial bits from the output register 603 to the program counter 604. The TF signal controls the transfer of eight bits from the sense amp latch 602 (FIG. 21–21*b*) to output register 603 on lines SA0–SA7. INC controls the serial incrementing of the program counter, two bits for each INC signal generated. PC is the precharge signal for the ROM array and normally exists for approximately ten microseconds. The DC signal discharges the ROM 601 array and preferably lasts for approximately ten microseconds for each DC signal. This particular ROM array uses approximately seventy microseconds to discharge and thus seven DC signals are preferably generated during each addressing sequence. SAM gates the data outputted from the ROM into the sense amp latch 602 while SAD gates the address lines by gating the address from the program counter into the ROM address buffers 625 (FIGS. 21a–21b).

ALTERNATIVE EMBODIMENTS

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

TABLE I

THE FOLLOWING SEQUENCE IS AN EXAMPLE OF THE LEARNING AID IN THE SPELLING MODE.

| KEY | DISPLAY | SPEAKER |
|---|---|---|
| COMPUSPELL | | 4 RANDOM TONES |
| | SPELL A | |
| B | SPELL B | B |
| C | SPELL C | C |
| D | SPELL D | D |
| P | SPELL D | P |
| A | SPELL A | A |
| GO | — | SPELL DO AS IN DO NOT |
| D | D- | D |
| O | DO- | O |
| ENTER | DO | THAT IS CORRECT, NOW SPELL |
| | — | WAS |
| W | W- | W |
| U | WU- | U |
| S | WUS- | S |
| ERASE | — | |
| W | W- | W |
| A | WA- | A |
| S | WAS- | S |
| ENTER | WAS | THAT IS RIGHT, NEXT SPELL |
| | — | ANY |
| A | A- | A |
| N | AN- | N |
| I | ANI- | I |
| ENTER | ANI | TRY AGAIN, |
| | — | ANY |
| | — | |
| REPEAT | — | ANY |
| REPEAT | — | ANY (½SPEED) |
| E | E- | E |
| N | EN- | N |
| Y | ENY- | Y |
| ENTER | ENY | THAT IS INCORRECT, THE CORRECT SPELLING OF ANY IS |
| | A | A |
| | AN | N |
| | ANY | Y |
| | ANY | ANY NOW TRY |
| | — | FULL |
| F | F- | F |
| U | FU- | U |
| L | FUL- | L |
| L | FULL | L |
| | FULL | THAT IS CORRECT, TRY SHOE MEANING FOOTWEAR |
| | — | |
| S | S- | S |
| H | SH- | H |
| O | SHO- | O |
| E | SHOE- | E |
| ENTER | SHOE | YOUR ARE CORRECT, SPELL COMB |
| C | C- | C |
| O | CO- | O |
| M | COM- | M |
| E | COME- | E |
| ENTER | COME | TRY AGAIN, |
| | — | COMB |
| C | C- | |
| O | CO- | |

TABLE I-continued

THE FOLLOWING SEQUENCE IS AN EXAMPLE OF THE LEARNING AID IN THE SPELLING MODE.

| KEY | DISPLAY | SPEAKER |
|---|---|---|
| M | COM- | |
| B | COMB- | |
| ENTER | COMB | YOU ARE CORRECT, NOW SPELL FOUR AS IN |
| | — | THE NUMBER |
| F | F- | F |
| O | FO- | O |
| U | FOU- | U |
| R | FOUR- | R |
| ENTER | FOUR | THAT IS CORRECT, |
| | — | NEXT SPELL WHO |
| W | W- | W |
| H | WH- | H |
| O | WHO- | O |
| ENTER | WHO | YOU ARE RIGHT, |
| | — | NOW TRY SOUP |
| S | S- | S |
| O | SO- | O |
| U | SOU- | U |
| P | SOUP- | P |
| ENTER | SOUP | THAT IS RIGHT, |
| | — | TRY MOST |
| M | M- | M |
| O | MO- | O |
| S | MOS- | S |
| T | MOST- | T |
| ENTER | MOST | YOU ARE CORRECT |
| | +8 −2 | 4 TONES |
| | +8 −2 | 4 TONES |
| | +8 −2 | HERE IS YOUR SCORE, EIGHT CORRECT, TWO DID NOT COMPUTE. |

TABLE II

LEARN MODE

| KEY | DISPLAY | SPEAKER |
|---|---|---|
| | BUSY | (1 SECOND PAUSE) SAY IT (2 SECOND PAUSE) BUSY |
| | MANY | (1 SECOND PAUSE) SAY IT (2 SECOND PAUSE) MANY |
| | CARRY | (1 SECOND PAUSE) SAY IT (2 SECOND PAUSE) CARRY |
| | YOUR | (1 SECOND PAUSE) SAY IT (2 SECOND PAUSE) YOUR |
| | WILD | (1 SECOND PAUSE) SAY IT (2 SECOND PAUSE) WILD |
| | LOVE | (1 SECOND PAUSE) SAY IT (2 SECOND PAUSE) LOVE |
| REPEAT<br>REPEAT<br>REPEAT<br>REPEAT } IGNORED | BUSH | (1 SECOND PAUSE) SAY IT (2 SECOND PAUSE) BUSH |
| | EARN | (1 SECOND PAUSE) SAY IT (2 SECOND PAUSE) EARN |
| | — | SPELL MANY |
| M | M- | M |
| A | MA- | A |
| N | MAN- | N |
| Y | MANY- | Y |
| ENTER | MANY | YOU ARE CORRECT, |
| | — | NOW SPELL EARN |

THE LEARNING AID CONTINUES THROUGH THE REMAINING 9 WORDS AS IN THE SPELLING MODE.

TABLE III

IN THE WORD GUESSER MODE THE LEARNING AID RANDOMLY SELECTS A WORD FROM LEVEL C OR D AND DISPLAYS DASHES TO REPRESENT THE NUMBER OF LETTERS IN THE CHOSEN WORD. THE USER TRIES TO GUESS THE WORD. THE USER MUST COMPLETE THE WORD BEFORE MAKING SEVEN INCORRECT GUESSES. THE FOLLOWING IS AN EXAMPLE OF THE FUNCTION OF THE LEARNING AID IN THE SPELLING MODE.

| KEY | DISPLAY | SPEAKER |
|---|---|---|
| HANGMAN | | 4 TONES |
| A | | |
| E | E E E | 4 TONES |
| I | E E E | |
| O | E E O E | 4 TONES |
| U | E E O E | |
| B | E E O E | |
| C | E E O E | |
| D | E E O E | |
| F | E E O E | |
| | EVERYONE | 4 TONES, I WIN |
| A | | |
| E | E | 4 TONES |
| I | E | |
| O | O E | 4 TONES |
| U | OU E | 4 TONES |
| B | OU E | |
| C | COU E | 4 TONES |
| R | COUR E | 4 TONES |
| S | COURSE | 4 TONES |
| | COURSE | 4 TONES, YOU WIN |

TABLE IV

The synthesizer 10 includes interpolation logics to accomplish a nearly linear interpolation of all twelve speech parameters at eight points within each frame, that is, once each 2.5 msec. The parameters are interpolated one at a time as selected by the parameter counter. The interpolation logics calculate a new value of a parameter from its present value (i.e. the value currently stored in the K-stack, pitch register or E-10 loop) and the targer value stored in encoded form in RAM 203 (and decoded by ROM 202). The value computed by each interpolation is listed below.

Where $P_i$ is the present value of the parameter,
$P_{i+l}$ is the new parameter value
$P_t$ is the target value
$N_i$ is an integer determined by the interpolation counter The values of $N_i$ for specific interpolation counts and the values $\frac{P_i - P_o}{P_t - P_o}$ ($P_o$ is initial parameter value) are as follows:

| INTERPOLATION COUNT | $N_i$ | $\frac{P_i - P_o}{P_t - P_o}$ |
|---|---|---|
| 1 | 8 | 0.125 |
| 2 | 8 | 0.234 |
| 3 | 8 | 0.330 |
| 4 | 4 | 0.498 |
| 5 | 4 | 0.623 |
| 6 | 2 | 0.717 |
| 7 | 2 | 0.859 |
| 0 | 1 | 1.000 |

TABLE V

```
"HELP "
0 0 0 0
0 1 0 0 0 0 0 0 0 0 1 0 0 1 1 0 1 1 1 0 1 0 0 1 0 1 1 1
0 1 1 1 0 0 0 0 0 1                                                                              }
1 1 0 1 1 0 0 1 0 0 1 0 0 0 0 1 0 1 0 0 1 0 0 0 0 1 1 0 0 1 1 1 1 0 0 0 1 0 1 0 1 0 0 1 0 1 0 1 0  }
1 1 0 1 1 0 0 1 1 1                                                                              }
1 1 1 0 1 0 0 1 1 1                                                                              }
1 1 0 1 1 0 1 0 0 0 0 1 1 0 1 0 1 1 1 1 1 0 1 0 1 0 1 0 1 0 0 1 0 1 1 1 1 0 0 0 1 0 0 1 0 1 1 0 1  }
1 1 0 1 1 0 1 0 0 0 0 1 1 1 0 0 1 0 1 1 1 0 0 0 1 1 0 0 1 1 0 1 1 0 0 0 0 1 0 0 1 0 0 0 1 1 1 0 1  } HEL
1 1 0 1 1 0 0 1 1 0 1 0 0 0 1 0 1 0 1 0 0 1 1 0 1 0 0 1 1 1 1 1 1 0 1 1 0 1 0 1 0 1 0 0 0 0 1 1 0  }
1 0 1 1 1 0 0 1 0 1                                                                              }
1 0 1 0 1 0 0 1 0 0 0 1 1 0 1 0 0 1 1 1 1 0 0 0 1 1 0 0 1 1 1 1 0 1 1 1 0 0 1 0 0 0 1 0 1 0 1 1 0  }
1 0 0 1 1 0 0 0 0 1                                                                              }
1 0 0 1 0 1 1 1 0 1                                                                              }
1 0 0 0 0 1 1 0 1 1
0 0 1 0 0 1 1 1 0 0 0 0 1 0 1 0 0 1 0 1 1 1 0 1 1 0 0 1 1 1 1 0 0 1 0 1 0 1 1 1 0 0 1 0 1 1 0 1 1
0 0 0 0
0 0 0 0
0 0 0 0
0 1 1 1 0 0 0 0 0 0 1 0 1 0 0 0 1 0 1 1 1 0 1 1 1 0 0 0   }
0 1 1 1 0 0 0 0 0 0 1 0 0 0 1 0 1 0 1 1 1 0 1 1 0 1 1 0   }
0 1 0 1 0 0 0 0 0 1                                       } P
0 0 1 1 0 0 0 0 0 0 1 0 0 1 1 0 0 1 1 1 1 0 1 0 0 1 1 0   }
0 0 1 0 0 0 0 0 0 0 1 0 0 1 0 0 0 1 0 1 1 0 1 1 0 1 0 1   }
0 0 0 0
1 1 1 1

ENERGY  PITCH  REPEAT  K1  K2  K3  K4  K5  K6  K7  K8  K9  K10
```

TABLE VI

| CODE | DECODED PARAMETERS E | P | K1 | K2 | K3 | K4 | K5 | K6 | K7 | K8 | K9 | K10 |
|---|---|---|---|---|---|---|---|---|---|---|---|---|
| 00 | 000 | 000 | 208 | 2A3 | 273 | 28F | 2C1 | 2DE | 2DD | 326 | 31F | 34D |
| 01 | 000 | 029 | 20F | 288 | 293 | 2B2 | 2E2 | 304 | 300 | 37B | 363 | 386 |
| 02 | 001 | 02B | 213 | 2CF | 2B9 | 2D8 | 306 | 32F | 328 | 3DA | 3AE | 3C3 |
| 03 | 001 | 02D | 218 | 2F8 | 2F6 | 30H | 32D | 35D | 352 | 038 | 3FD | 001 |
| 04 | 002 | 02F | 229 | 304 | 31B | 341 | 358 | 38E | 380 | 098 | 04C | 03E |
| 05 | 003 | 031 | 229 | 321 | 356 | 37D | 386 | 3C2 | 3H0 | 0FB | 097 | 07B |
| 06 | 005 | 033 | 234 | 340 | 398 | 3BD | 3B6 | 3F7 | 3E1 | 131 | 0DC | 0B3 |
| 07 | 007 | 035 | 242 | 362 | 3DC | 3FF | 3E7 | 02C | 013 | 169 | 118 | OF7 |
| 08 | 00A | 037 | 255 | 384 | 023 | 040 | 018 | 061 | 045 | | | |
| 09 | 00F | 03A | 26B | 3A8 | 068 | 080 | 049 | 093 | 075 | | | |

TABLE VI-continued

| CODE | E | P | K1 | K2 | K3 | K4 | K5 | K6 | K7 | K8 | K9 | K10 |
|---|---|---|---|---|---|---|---|---|---|---|---|---|
| | DECODED PARAMETERS | | | | | | | | | | | |
| 0A | 015 | 03C | 286 | 3CD | 0A9 | 0BC | 079 | 002 | 0A3 | | | |
| 0B | 01A | 03F | 2A8 | 3F2 | 0F4 | 0F3 | 0A7 | 0EE | 0CE | | | |
| 0C | 02B | 042 | 20B | 017 | 119 | 123 | 0D2 | 116 | 0F6 | | | |
| 0D | 03D | 046 | 2FD | 03C | 146 | 14C | 0F9 | 139 | 118 | | | |
| 0E | 056 | 049 | 332 | 061 | 160 | 16F | 11D | 158 | 13C | | | |
| OF | 000 | 04C | 36C | 085 | 18C | 18D | 13E | 173 | 159 | | | |
| 10 | | 04F | 3AA | 0A7 | | | | | | | | |
| 11 | | 053 | 3F8 | 0D7 | | | | | | | | |
| 12 | | 057 | 02D | 0E6 | | | | | | | | |
| 13 | | 05A | 06E | 103 | | | | | | | | |
| 14 | | 05E | 0A8 | 11E | | | | | | | | |
| 15 | | 063 | 083 | 136 | | | | | | | | |
| 16 | | 067 | 115 | 14D | | | | | | | | |
| 17 | | 068 | 140 | 162 | | | | | | | | |
| 18 | | 070 | 165 | 174 | | | | | | | | |
| 19 | | 076 | 184 | 185 | | | | | | | | |
| 1A | | 078 | 19D | 194 | | | | | | | | |
| 1B | | 081 | 1B2 | 1A1 | | | | | | | | |
| 1C | | 086 | 1C3 | 1AD | | | | | | | | |
| 1D | | 08C | 1D0 | 1B7 | | | | | | | | |
| 1E | | 093 | 1DA | 1C1 | | | | | | | | |
| 1F | | 099 | 1E2 | 1FA | | | | | | | | |

TABLE VII

| K-STACk OUTPUT BIT LINE | T8 | T9 | T10 | T11 | T12 | T13 | T14 | T15 | T16 | T17 | T18 | T19 | T20 | T21 | T22 | T23 | T24 | T25 | T26 | T27 |
|---|---|---|---|---|---|---|---|---|---|---|---|---|---|---|---|---|---|---|---|---|
| | DATA OUTPUTTED FROM K-STACK 302 TO RECODING LOGIC 301 BY TIME PERIODS TIME PERIODS | | | | | | | | | | | | | | | | | | | |
| LSB 32-1 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| 32-2 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| 32-3 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| 32-4 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| 32-5 | $K_3$ | $K_2$ | $K_1$ | *A* | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| 32-6 | $K_3$ | $K_2$ | $K_1$ | *A* | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| 32-7 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| 32-8 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| 32-9 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |
| MSB 32-10 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |

TABLE VIII

| ADDRESS | CHIRP FUNCTION VALUE | STORED VALUE (COMPLEMENTED) |
|---|---|---|
| | CHIRP ROM CONTENTS | |
| 00 | 00 | FF |
| 01 | 2A | D5 |
| 02 | D4 | 2B |
| 03 | 32 | CD |
| 04 | B2 | 4D |
| 05 | 12 | ED |
| 06 | 25 | DA |
| 07 | 14 | EB |
| 08 | 02 | FD |
| 09 | E1 | IE |
| 10 | C5 | 3A |
| 11 | 02 | FD |
| 12 | 5F | A0 |
| 13 | 5A | A5 |
| 14 | 05 | FA |
| 15 | OF | FO |
| 16 | 26 | D9 |
| 17 | FC | 03 |
| 18 | A5 | 5A |
| 19 | A5 | 5A |
| 20 | D6 | 29 |

TABLE VIII-continued

| ADDRESS | CHIRP FUNCTION VALUE | STORED VALUE (COMPLEMENTED) |
|---|---|---|
| | CHIRP ROM CONTENTS | |
| 21 | DD | 22 |
| 22 | DC | 23 |
| 23 | FC | 03 |
| 24 | 25 | DA |
| 25 | 2B | D4 |
| 26 | 22 | DD |
| 27 | 21 | DE |
| 28 | 0F | F0 |
| 29 | FF | 00 |
| 30 | F8 | 07 |
| 31 | EE | 11 |
| 32 | ED | 12 |
| 33 | EF | 10 |
| 34 | F7 | 08 |
| 35 | F6 | 09 |
| 36 | FA | 05 |
| 37 | 00 | FF |
| 38 | 03 | FC |
| 39 | 02 | FD |
| 40 | 01 | FE |

TABLE IX-0 LEARNING AID INSTRUCTION SET

| Address | Instruction | Branch Line | Line | Name | Title | | Comments |
|---|---|---|---|---|---|---|---|
| 0000 | 000101110 | | 0055 | KD3 | TAMZA | | ADD 5 TO KEY |
| 0001 | 001111010 | | 0056 | | ACACC | 5 | CODE EACH TIME |
| 0003 | 001000111 | | 0057 | | TCY | 14 | R-LINE POINTER IS DECREMENTED |
| 0007 | 111011000 | 0112 | 0058 | | CALL | ADDCARRY | |
| 000F | 101010111 | 0080 | 0059 | | BRANCH | KD2 | |
| 001F | 001100000 | | 0060 | KEYDOWN | TCMIY | 0 | RESET DEBOUNCE COUNTER |
| 003F | 010011000 | | 0061 | | LDX | 1 | |
| 007F | 001000111 | | 0062 | | TCY | 14 | |
| 007E | 000001010 | | 0063 | | TKM | | |
| 007D | 000111011 | | 0064 | | MNEZ | | DOUBLE CHECK KEY DOWN |
| 007B | 101011111 | 0068 | 0065 | | BRANCH | KD1 | |
| 0077 | 010010000 | | 0066 | | LDX | 0 | |
| 006F | 100110110 | 0133 | 0067 | | BRANCH | CAR3 | KEY NOT DOWN |
| 005F | 010010000 | | 0068 | KD1 | LDX | 0 | |
| 003F | 001100001 | | 0069 | | TCMIY | 6 | |
| 007C | 001100000 | | 0070 | | TCMIY | 0 | |
| 0079 | 001001011 | | 0071 | | TCY | 13 | |
| 0073 | 000101010 | | 0072 | | TMY | | |
| 0067 | 000110110 | | 0073 | | RSTR | | RESET PRESENT R-LINE |
| [illegible] | [illegible]01011 | | 0074 | | TCY | 13 | |
| 001E | 000000110 | | 0075 | | CLA | | |
| 003D | 001110110 | | 0076 | | ACACC | 6 | PUT 6 IN ACC |
| 007A | 000001110 | | 0077 | | KNEZ | | SEE IF KEY IS ON VSS |
| 0075 | 101010111 | 0080 | 0078 | | BRANCH | KD2 | VSS |
| 006B | 000101001 | | 0079 | | TMA | | |
| 0057 | 000101111 | | 0080 | KD2 | TAY | | * STORE 6 IF K=VSS |
| 002F | 001001011 | | 0081 | | TCY | 13 | |
| 005C | 000000111 | | 0082 | | DMAN | | |
| 0038 | 100000000 | 0055 | 0083 | | BRANCH | KD3 | |
| 0070 | 010011000 | | 0084 | SUMSIT | LDX | ONE | * BUMP ROUTINE TO CALCUL VALUE OF KP |
| 0061 | 001000111 | | 0085 | | TCY | VALUE | ** |
| 0043 | 000101001 | | 0086 | | TMA | | ** |
| 0006 | 011100100 | | 0087 | | ALEC | 2 | |
| 000D | 101010011 | 0096 | 0088 | | BRANCH | ARND+5 | |
| 001B | 001111111 | | 0089 | | ACACC | 15 | |
| 0037 | 011101100 | | 0090 | | ALEC | 3 | |
| 006E | 101010011 | 0096 | 0091 | | BRANCH | ARND+5 | |

TABLE IX-0 (Continued)

```
005D  001111011        0092             ACACC    13
003A  011100010        0093             ALEC     4
0074  101010011  0096  0094             BRANCH   ARND+5
0069  001110101        0095             ACACC    10
0053  001111111        0096  ARND+5     ACACC    MINUS$1          **
0026  010010000        0097             LDX      ZERO             **
004C  001000111        0098             TCY      VALUE            **
0018  111011000  0112  0099             CALL     ADDCARRY
0031  010001111        0100  EVL$OUT    BL       KEY$EVL
0062  100001100  2282  0101
                       0102  * THIS ROUTINE USES ,CARRY, TO INCREMENT THE RANDOM NUMBER/TIMEOUT COUNTER
0045  001000011        0103  TIMEUP     TCY      12
000A  000001110        0104             KNEZ
0015  100011101  0128  0105             BRANCH   CAR2
002A  010011100        0106  TIMEUP1    LDX      3
0056  001000001        0107             TCY      8
002C  100000010  0116  0108             BRANCH   CARRYON
                       0109  *
                       0110  *  CARRY:  FOR ADDITION IN ROM ADDR SECTION OF RAM
                       0111  *
0056  000010101        0112  ADDCARRY   AMAAC
0030  101000001  0115  0113             BRANCH   CARRY
0060  100001011  0118  0114             BRANCH   NOCARRY
0041  000101101        0115  CARRY      TAMIYC                    CARRY
[illegible] [illegible]11010    0116  CARRYON    IMAC                      INCREMENT MEM IF CARRY
0005  101000001  0115  0117             BRANCH   CARRY
0008  000101111        0118  NOCARRY    TAM
0017  010111111        0119             RETN
002F  001000011        0120             TCY      12
005E  000101001        0121             TMA
003C  011101100        0122             ALEC     3                CHECK TIMEOUT COUNTER
0078  101000111  0126  0123             BRANCH   CAR1
0071  001001011        0124  OFF        TCY      13
0063  000111110        0125             RSTR                      TURNS OFF CALCULATOR
0047  010010000        0126  CAR1       LDX      0
000E  100110110  0133  0127             BRANCH   CAR3
0010  000101011        0128  CAR2       TMA
003A  001000101        0129  CAR4       TCY      10
0076  000100011        0130             TBIT     3                TEST DEBOUNCE COUNTER
006D  101011001  0135  0131             BRANCH   CAR5             ACCEPT KEY IF COUNTER>7
```

TABLE IX-0 (Continued)

```
0058  001100000         0132              TCMIY     0           RESET DEBOUNCE COUNTER
0036  010001111         0133  CAR3        BL        DISP/KB1
006C  100110010   2245  0134
0059  011101011         0135  CAR5        ALEC      13          *TEST TO SEE IF SPEECH IS
0032  100110110   0133  0136              BRANCH    CAR3        *FINISHED (TEST TALK COUNTER=14)
0064  100011111   0060  0137              BRANCH    KEYDOWN
                        0138  *
                        0139  *
                        0140  *
                        0141  *
0049  010010001         0142  GAME#3      LDX       8
0012  001001110         0143              TCY       7
0025  000101001         0144              TMA
004A  011100110         0145              ALEC      6
0014  101010010   0148  0146              BRANCH    FIRST
0029  100100001   0152  0147              BRANCH    GM3A
0052  001101110         0148  FIRST       TCMIY     7
0024  010100010         0149              SBIT      1
0048  010001000         0150              CALLL     CLEAR
0010  110111010   0236  0151
0021  010001010         0152  GM3A        CALLL     CURLEVL
0042  111101111   0769  0153
0004  001100000         0154              TCMIY     0
0009  001100001         0155              TCMIY     8           * TO 008C; 008C-008D
                        0156  *                                 * CONTAIN ADDRESS FOR
                        0157  *                                 * RANDOM LETTER TABLE
0013  010000101         0158              CALLL     MEMADDR     ADDRESS 0350
0027  111011000   1501  0159
004F  010001110         0160              CALLL     LOADRESS    * LOAD DATA FROM 0350 INTO
[illegible] [illegible]1000010   1121  0161
                        0162  *                                 * ROM ADDRESS LOCATION
0039  010011100         0163              LDX       3
0072  001001001         0164              TCY       9
0065  010100111         0165              RBIT      3
004B  000101001         0166              TMA
0016  010011000         0167              LDX       1           * ADD
0020  001001101         0168              TCY       11          * TO
005A  111011000   0112  0169              CALL      ADDCARRY    * ROM ADDRESS
0034  010011100         0170              LDX       3           GET LSD OF RANDOM NUMBER
0068  001100001         0171              TCY       8           GET MSD OF RANDOM NUMBER
```

TABLE IX-0 (Continued)

```
0051 000101001        0172            TMA
0022 010011000        0173            LDX     1
0044 001000101        0174            TCY     10
0008 111011000  0112  0175            CALL    ADDCARRY     * ADD TO ROM ADDRESS
0011 010000101        0176            CALLL   MEMADDR      LOAD ADDRESS TO 0350
0023 111011000  1501  0177
0046 010001110        0178            CALLL   OUTADDR2     GET LSD OF RANDOM LETTER
000C 111000001  1083  0179
0019 010010000        0180            LDX     0
0033 001000111        0181            TCY     14
0066 000101111        0182            TAM
004D 010001110        0183            CALLL   OUTADDR2     GET MSD OF RANDOM LETTER
001A 111000001  1083  0184
0035 010010000        0185            LDX     0            * STORE
006A 001001111        0186            TCY     15           * LIKE A
0055 000101111        0187            TAM                  * KEYPRESS
002A 010010100        0188            LDX     2
0054 001100000        0189            TCMIY   0
0028 010001011        0190            BL      TRANSFER     ** SAYS LETTER AND
0050 101111111  1875  0191
                      0192  *                              ** PUTS IT IS DISPLAY
```

TABLE IX-1

```
                      0193            ORGPG   1
0000 000101101        0194  NOTFULL   TAMIYC
0001 001101000        0195            TCMIY   1
0003 001000111        0196            TCY     14
0007 000101001        0197            TMA
000F 001001101        0198            TCY     11
001F 000101010        0199            TMY
003F 010011000        0200            LDX     1
007F 000101101        0201            TAMIYC
007E 001100011        0202            TCMIY   12
007D 010010000        0203            LDX     0
```

TABLE IX-1 (Continued)

```
0078 001001101        0204             TCY      NXT$DSP          **
0077 000110010        0205             IMAC                      **
006F 000101111        0206             TAM                       **
005F 010000010        0207             BL       NO$TRANS         **
003E 100101100  0680  0208
                      0209   *
                      0210   *  GO ROUTINE==> DECIDES WHICH MODE YOUR IN AND BRANCHES
                      0211   *     TO THAT MODE, ELSE GOES TO DISP/KB.
                      0212   *
007C 010001010        0213   GO        BL       RANDOM
0079 100000000  0753  0214
0073 010010001        0215   RANRTN    LDX      8                DAM
0067 001000110        0216             TCY      6
004F 010100110        0217             RBIT     1
001E 001000001        0218             TCY      8                SET GO MODE FLAG
003D 010100010        0219             SBIT     1                *
007A 001001110        0220             TCY      7                TEST WHICH MODE
0075 000101001        0221             TMA
006B 010011010        0222             LDX      5
0057 001001011        0223             TCY      13
002E 001100000        0224             TCMIY    0
005C 010001101        0225             CALLL    CORR$SPL
0038 110000000  1582  0226
0070 010000100        0227             LDP      2
0061 011101000        0228             ALEC     1                SPELL?
0043 100000000  0342  0229             BRANCH   USPELL           *
0006 010000001        0230             LDP      8                *
000D 011101100        0231             ALEC     3                LEARN?
001B 100110001  1209  0232             BRANCH   ULRN+1
0037 010001101        0233             LDP      11
006E 011101010        0234             ALEC     5                GAME#1?
005D 101111110  1590  0235             BRANCH   CORR+1
003A 001000000        0236   CLEAR     TCY      0
0074 010010000        0237   HERE      LDX      0
0069 001101000        0238             TCMIY    1
0053 000000100        0239             TYA
0026 010011000        0240             LDX      1
004C 001101101        0241             TCMIY    11
0018 001010001        0242             YNEC     8
0031 101110100  0237  0243             BRANCH   HERE
```

TABLE IX-1 (Continued)

```
0062 001000000                TCY       0
0045 001100011                TCMIY     12
000A 010010000                LDX       0
0015 001001101                TCY       11
0028 001100000                TCMIY     0
0056 010111111                RETN
002C 101110011  0215  REPLAY  BRANCH    RANRTN
                      *
                      *  ENTER=  ROUTINE TO PROCESS ENTER KEY DEPRESS
                      *
0058 010010001        ENTER   LDX       6                 DAM
0030 001001110                TCY       7                 FLAG
0069 000110011                MNEZ                        SPELL MODE?
0041 100000101  0259          BRANCH    TST4A3            NO
0002 101100011  0273          BRANCH    SPACE=3
0005 000101010        TST4A3  TMY
0008 001011100                YNEC      3                 SPELL IT MODE?
0017 101011110  0263          BRANCH    TST4A6            NO
002F 101100011  0273          BRANCH    SPACE=3
005E 001010110        TST4A6  YNEC      6                 GAME 2 MODE?
003C 101100011  0273          BRANCH    SPACE=3
0078 010000110                BL        CRYPTO
0071 100000000  0894
                      *
                      *  TEST FOR CURSER POSITION
                      *  FIRST POSITION? ---RETURN
                      *  ELSE, REPLACE CURSER WITH SPACE
                      *
                      *  TEST FOR POSITION OF CURSER AND REPLACE WITH SPACE
0063 001001110        SPACE=3 TCY       7                 LAST CHAR
0047 010011000                LDX       1
000E 000000110        SPACE=2 CLA                         ACC=R
001D 001111101                ACACC     11                1R=SPACE
003B 000001001                MNEA                        MEM=11?
0076 101011001  0283          BRANCH    CHAROR+           NO
006D 010010000                LDX       0                 YES
005B 000110011                MNEZ                        BLANK?
0036 100100001  0296          BRANCH    SPACE=1           YES, GO TO SPACE=1
006C 100100100  0293          BRANCH    CHAR              ELSE, CHAR
0059 010011000        CHAROR+ LDX       1
```

TABLE IX-1 (Continued)

```
0032  00111000          0284              ACACC     1             ACC=12 FOR CURSER
0064  00000101          0285              MNEA
0049  10010100    0293  0286              BRANCH    CHAR          CHAR
0012  01001000          0287              LDX       0             TEST MSW
0025  00110011          0288              MNEZ                    CURSER
004A  10010001    0291  0289              BRANCH    CUR-1         YES
0014  10010100    0293  0290              BRANCH    CHAR          NO, THEN CHAR
0029  01001100          0291  CUR-1       LDX       1             LSW
0052  00110101          0292              TCMIY     11
0024  01011111          0293  CHAR        RETN
0048  01000100          0294              BL        SPLENTER      GO TO SPELL ROUTINE
0010  10101111    0373  0295  SPACE-1     DYN                     SEARCH FOR CURSER
0021  00000100          0296              LDX       1             *
0042  01001100          0297              BRANCH    SPACE-2       *
0004  10000110    0275  0298
                        0299  *
                        0300  *
                        0301  *  NOPHRASE LOADS ROM ADDR WITH SECOND WRONG RESPONSE
                        0302  *     THEN CONTINUES TO NEXT WORD
                        0303  *
0009  01011100          0304  NOPHRASE    LDX       3             FLAG
0013  00100101          0305              TCY       13            *
0027  00111100          0306              TCMIY     3
004E  01000101          0307              CALLL     CURLEVL
001C  11101111    0769  0308
0039  00110100          0309              TCMIY     2
0072  00110110          0310              TCMIY     6
0065  01000101          0311  SPK4        CALLL     MEMADDR
004B  11101100    1501  0312
0016  01001110          0313              CALLL     LOADRESS
002D  11100010    1121  0314
005A  01000101          0315              CALLL     MEMADDR
0034  11101100    1501  0316
0065  01000011          0317              BL        LNK$ET        ALWAYS BRANCH
0051  10111000    1751  0318
0022  01001100          0319  F-SCORE     LDX       2             RETN$BCH FLAG
0044  00100111          0320              TCY       14
0008  00110100          0321              TCMIY     1
0011  00110000          0322              TCMIY     0             *
0023  01000110          0323              CALLL     CURLEVL       ZERO ROM ADDR
```

TABLE IX-1 (Continued)

```
0046  111101111  0769  0324
000C  010000110        0325          LDP      6
0019  011101001        0326          ALEC     9                        10 CORRECT?????
0033  100101111  0955  0327          BRANCH   F2                       NO,
0066  010010000        0328          LDX      0
0040  001000100        0329          TCY      2
001A  001100110        0330          TCMIY    2
0035  010011000        0331          LDX      1                        ELCE---------
006A  001001000        0332          TCY      1
0055  001101000        0333          TCMIY    1
002A  001100000        0334          TCMIY    0
0054  010010100        0335          LDX      2
0028  001000111        0336          TCY      14
0050  000110010        0337          IMAC
0020  010001101        0338          BL       TONE22
0040  101100011  1556  0339
```

TABLE IX-2

```
                       0340          ORGPG    2
                       0341  *
0000  010110010        0342  USPELL    COMX8                           ADDRESS DAM
0001  001000010        0343            TCY      4
0003  001100000        0344            TCMIY    0
0007  010001000        0345  USPELL+1  CALLL    CLEAR                  * BLANK DISPLAY - INPUT CURSER
000F  110111010  0236  0346
                       0347  *  LOAD PHRASE INTO ROM ADDRESS REG
001F  010001010        0348  DISSPELL  CALLL    CURLEVL
003F  111101111  0769  0349
007F  001100010        0350            TCMIY    4
007E  001100110        0351            TCMIY    6
007D  010110010        0352  ADDCTR    COMXA                           ADDRESS DAM
007B  001000010        0353            TCY      4                      PHRASE COUNTER-->ACC
0077  000101001        0354            TMA                             *
006F  010011000        0355            LDX      1
005F  001000101        0356            TCY      10
003E  010111111        0357            RETN
007C  010000000        0358            CALLL    ADDCARRY
```

TABLE IX-2 (Continued)

```
0079  111011000  0112  0359
                       0360   *  SET UP WORD ADDRESS IN LNK/EDT
0073  010010100        0361              LDX       2
0067  001001111        0362              TCY       15
004F  001101001        0363              TCMIY     9
001F  010000101        0364              CALLL     MEMADDR
0030  111011000  1501  0365
0074  010001110        0366              CALLL     LOADRESS
0075  111000010  1121  0367
0063  101011011  0423  0368              BRANCH    NBIT3
                       0369   *
                       0370   *  SPLENTER- BEGINS BY COMPARING CORRECT SPELLING BUFFER
                       0371   *      TO DISPLAY BUFFER
                       0372   *
0057  001000000        0373   SPLENTER   TCY       0                   FIRST LETTER--LSW
002F  010011100        0374   SPLNTR+1   LDX       3                   *
005C  000101001        0375              TMA
0038  010011000        0376              LDX       1                   DISPLAY BUFFER
0070  000001001        0377              MNEA                          SAME?
0061  101101100  0425  0378              BRANCH    MISS1
0043  010010100        0379              LDX       2                   YES, TEST MSW
0006  000000110        0380              CLA
000D  000100000        0381              TBIT      0
001B  101101110  0384  0382              BRANCH    CONXT1
0037  101011101  0385  0383              BRANCH    CONXT2
006E  001111000        0384   CONXT1     ACACC     1
005D  010010000        0385   CONXT2     LDX       0
003A  000001001        0386              MNEA                          SAME?
0074  101101100  0425  0387              BRANCH    MISS1
0069  000000110        0388              CLA
0053  010111111        0389              RETN
0026  000000101        0390              IYC                           NEXT LETTER
004C  001010001        0391              YNEC      8
0018  100101110  0374  0392              BRANCH    SPLNTR+1            NO
                       0393   *  SPELLING IS CORRECT
0031  010110010        0394              COMX8                         ADDRESS DAM
0062  001000110        0395              TCY       6                   FLAG
0045  000100000        0396              TBIT      0                   BIT 0-->0=FIRST TRY
000A  100101011  0406  0397              BRANCH    NBIT                *        1-->MORE IN ONE
0015  010100000        0398              SBIT      0
```

TABLE IX-2 (Continued)

| | | | | | | | |
|---|---|---|---|---|---|---|---|
| | | | 0399 | * | BEGIN LOADING PRAISE PHRASE | | |
| 0028 | 010011100 | | 0400 | NBIT | LDX | 3 | |
| 0056 | 001001011 | | 0401 | | TCY | 13 | FLAG |
| 002C | 001101000 | | 0402 | | TCMIY | 1 | |
| 005A | 010110010 | | 0403 | | COMX8 | | |
| 0030 | 001001000 | | 0404 | | TCY | 1 | |
| 0060 | 001100000 | | 0405 | | TCMIY | 0 | |
| 0041 | 010010100 | | 0406 | | LDX | 2 | |
| 0002 | 001001111 | | 0407 | | TCY | 15 | |
| 0005 | 001101100 | | 0408 | | TCMIY | 3 | |
| 0003 | 010001010 | | 0409 | | CALLL | CURLEVL | |
| 0017 | 111101111 | 0769 | 0410 | | | | |
| 002F | 001100001 | | 0411 | | TCMIY | 8 | |
| 005F | 001101010 | | 0412 | | TCMIY | 5 | |
| 003C | 111111101 | 0352 | 0413 | | CALL | ADDCTR | |
| 0078 | 011100110 | | 0414 | | ALEC | 6 | |
| 0071 | 101110110 | 0421 | 0415 | | BRANCH | NBIT2 | |
| 0063 | 010110010 | | 0416 | | COMX8 | | |
| 0047 | 001000010 | | 0417 | | TCY | 4 | |
| 000E | 001100000 | | 0418 | | TCMIY | 0 | |
| 001D | 000000110 | | 0419 | | CLA | | |
| 003B | 010110010 | | 0420 | | COMX8 | | |
| 0076 | 010000000 | | 0421 | NBIT2 | LDP | 0 | |
| 006D | 111011000 | 0112 | 0422 | | CALL | ADDCARRY | |
| 005B | 010000010 | | 0423 | NBIT3 | BL | ADDCTR6 | |
| 0036 | 101011001 | 0704 | 0424 | | | | |
| 006C | 000000110 | | 0425 | MISS1 | CLA | | |
| 0059 | 001110011 | | 0426 | | ACACC | 12 | |
| 0032 | 010010000 | | 0427 | | LDX | 0 | |
| 0064 | 010111111 | | 0428 | | RETN | | |
| 0049 | 010000101 | | 0429 | | BL | MISSPELL | |
| 0012 | 100111001 | 1546 | 0430 | | | | |
| 0025 | 010001000 | | 0431 | F3 | CALLL | CLEAR | CLEAR DISPLAY |
| 004A | 110111010 | 0236 | 0432 | | | | |
| 0014 | 010010001 | | 0433 | | LDX | 8 | |
| 0029 | 001000001 | | 0434 | | TCY | 8 | |
| 0052 | 010100001 | | 0435 | | SBIT | 2 | |
| 0024 | 010100110 | | 0436 | | RBIT | 1 | |
| 0048 | 001001000 | | 0437 | | TCY | 1 | |
| 0010 | 010010000 | | 0438 | | LDX | 0 | |
| 0021 | 001100100 | | 0439 | | TCMIY | 2 | |

TABLE IX-2 (Continued)

| | | | | | | |
|---|---|---|---|---|---|---|
| 0042 | 001001110 | | 0440 | | TCY | 7 |
| 0001 | 001100100 | | 0441 | | TCMIY | 2 |
| 0009 | 010011000 | | 0442 | | LDX | 1 |
| 0013 | 001000000 | | 0443 | | TCY | 0 |
| 0027 | 001101011 | | 0444 | | TCMIY | 13 |
| 004F | 001000110 | | 0445 | | TCY | 6 |
| 001C | 001101111 | | 0446 | | TCMIY | 14 |
| 0039 | 010011010 | | 0447 | | LDX | 5 |
| 0072 | 001001011 | | 0448 | | TCY | 13 |
| 0065 | 001010001 | | 0449 | | TMA | |
| 0045 | 010011000 | | 0450 | | LDX | 1 |
| 0016 | 001001110 | | 0451 | | TCY | 7 |
| 0020 | 000101111 | | 0452 | | TAM | |
| 005A | 010001110 | | 0453 | | CALLL | FL2 |
| 0034 | 110001100 | 1145 | 0454 | | | |
| 006E | 010011000 | | 0455 | | LDX | 1 |
| 0051 | 001001000 | | 0456 | | TCY | 1 |
| 0022 | 000101111 | | 0457 | | TAM | |
| 0044 | 010001000 | | 0458 | | BL | F-SCORE |
| 0008 | 100100010 | 0319 | 0459 | | | |
| | | | 0460 | * LEARN MODE BEGINS HERE | | |
| | | | 0461 | * | | |
| 0011 | 010010001 | | 0462 | SPELL | LDX | 8 |
| 0023 | 001001110 | | 0463 | | TCY | 7 |
| 0046 | 001101000 | | 0464 | | TCMIY | 0 |
| 000C | 101001101 | 0469 | 0465 | | BRANCH | SPELL9 |
| 0019 | 010010001 | | 0466 | LEARN | LDX | 8 |
| 0033 | 001001110 | | 0467 | | TCY | 7 |
| 0066 | 001100100 | | 0468 | | TCMIY | 2 |
| 0040 | 010001111 | | 0469 | SPELL9 | BL | DSP7 |
| 001A | 101110000 | 2188 | 0470 | | | |
| 0035 | 001111100 | | 0471 | MISS3 | ACACC | 3 |
| 006A | 000101111 | | 0472 | | TAM | |
| 0055 | 010000010 | | 0473 | | LDP | 4 |
| 002A | 011100110 | | 0474 | | ALEC | 6 |
| 0054 | 100101100 | 0680 | 0475 | | BRANCH | NOSTRANS |
| 0028 | 010001100 | | 0476 | | BL | TWIN |
| 0050 | 100101100 | 0541 | 0477 | | | |

TABLE IX-3

```
                              0478                ORGPG     3
0000 010010100                0479    GAME#1      LDX       2
0001 000000110                0480                CLA
0003 001001011                0481                TCY       13
0007 000101111                0482                TAM                   CLEAR GUESS COUNTER
000F 010011100                0483                LDX       3
001F 001100111                0484                TCMIY     14          HANGMAN FLAG
003F 001000101                0485                TCY       10
007F 000100000                0486                TBIT      0           * TEST RANDOM COUNTER
007F 101111011      0489      0487                BRANCH    HANG2       * BIT AND PUT 2 OR 3
0070 001111000                0488                ACACC     1           * IN ACC
0078 001110100                0489    HANG2       ACACC     2           *
0077 010011000                0490                LDX       1
006F 001001111                0491                TCY       15          * STORE 2 OR 3 IN LEVEL
005F 000101111                0492                TAM                   * OF DIFFICULTY
003F 010010001                0493                LDX       8           DAM
007C 001001110                0494                TCY       7
0079 001101010                0495                TCMIY     5           SET HANGMAN MODE
0073 010001010                0496                BL        CURLEVL
0067 101101111      0769      0497
                              0498    * 'RANDOM' GENERATES A RANDOM WORD,
                              0499    * PUTS IT IN THE CORRECT SPELLING
                              0500    * BUFFER AND RETURNS TO 'HANG'
004F 010001000                0501    HANG        CALLL     CLEAR       PUT BLANKS IN DISPLAY
001F 110111010      0236      0502
0030 001000001                0503                TCY       8
007A 000000100                0504    HANG3       DYN
0075 010000100                0505                CALLL     SPLNTR+1    * COMPARE DISPLAY DIGIT TO
006B 110101110      0374      0506
0057 011100000                0507                ALEC      0           * DIGIT IN CORRECT
002F 101111010      0504      0508                BRANCH    HANG3       * SPELLING BUFFER
                              0509    * FINDS THE FIRST DIGIT THAT IS NOT A
                              0510    * BLANK, STARTING FROM THE RIGHT SIDE;
                              0511    * THE ROUTINE BELOW THEN PUTS CURSORS IN
                              0512    * THE DIGITS CORRESPONDING TO LETTERS
005C 010011000                0513                LDX       1
0038 000101100                0514    HANG4       TAMDYN
0070 100111000      0514      0515                BRANCH    HANG4
0061 010001101                0516    SONG        BL        TONES
```

TABLE IX-3 (Continued)

```
0043 101000111  1657  0517
                      0518   * IF THE HANGMAN FLAGS ARE SET UP, LETTER
                      0519   * KEYS GO TO 'HANG1' AFTER SPEAKING THE LETTER
                      0520   ** THIS ROUTINE COMPARES LETTER ENTERED TO CORRECT SPELLING
0006 001001011        0521   HANG1    TCY     13
000D 010010000        0522            LDX     0                    * BIT 1= WORD NOT COMPLETE
0018 001100000        0523            TCMIY   0                    * BIT 0=CORRECT LETTER
0037 001000001        0524            TCY     8
006E 010100011        0525   HANG5    SBIT    3                    BIT IS SET AFTER EACH DIGIT IS COMPARE
0053 000000100        0526            DYN
003A 101011011  0562  0527            BRANCH  HANG6
0074 001000001        0528            TCY     8                    COMPARISONS ARE COMPLETE
0069 010100111        0529   HANG10   RBIT    3                    RESET BIT 3 IN EACH DIGIT
0053 000000100        0530            DYN
0026 101101001  0529  0531            BRANCH  HANG10
004C 001001011        0532            TCY     13
0013 000100000        0533            TBIT    0                    WAS THE LETTER CORRECT?
0031 101100011  0555  0534            BRANCH  HANG11
0062 010010100        0535            LDX     2                    NO
0045 000110010        0536            IMAC                         * ADD 1 TO INCORRECT
000A 000101111        0537            TAM                          * GUESS COUNTER
0015 010001111        0538            LDP     15
002B 011100110        0539            ALEC    6
0056 100101100  2219  0540            BRANCH  DISP/KB
002C 010011000        0541   IWIN     LDX     1
0058 001000101        0542            TCY     10
0030 001100000        0543            TCMIY   0
0060 001101110        0544            TCMIY   7
0041 001100000        0545   IWIN1    TCMIY   0
0002 001100000        0546            TCMIY   0
0005 001001111        0547            TCY     15
0008 010010100        0548            LDX     2
0017 001100000        0549            TCMIY   0
002F 010010001        0550            LDX     8                    CLEAR HANGMAN
005F 001000001        0551            TCY     8
003C 010100110        0552            RBIT    1
0078 010000101        0553            BL      LOADDISP
0071 101111001  1456  0554
0063 000100010        0555   HANG11   TBIT    1
0047 101100001  0516  0556            BRANCH  SONG
000E 001000101        0557   YOUWIN   TCY     10                   YES
001D 010011000        0558            LDX     1
003B 001100100        0559            TCMIY   2
```

TABLE IX-3 (Continued)

```
0076  001101110        0560           TCMIY    7             * 'YOU WIN'
006D  101000001  0545  0561           BRANCH   IWIN1
0058  010000100        0562  HANG6    CALLL    SPLNTR+1      *CHECK IF CORRECT
0036  110101110  0374  0563
006C  011100000        0564           ALEC     0             *LETTER HAS ALREADY
0059  101101110  0525  0565           BRANCH HANG5           *BEEN ENTERED IN EACH DIGIT
0032  001001111        0566           TCY      15            NO
0064  000101001        0567  FINDIT   TMA                    PUT LETTER CODE IN ACC
0049  001000001        0568           TCY      8             * FIND THE FIRST LETTER
0012  000000100        0569  HANG7    DYN                    * THAT HASN,T YET
0025  000100011        0570           TBIT     3             * BEEN ENTERED
004A  100010010  0569  0571           BRANCH   HANG7         * CORRECTLY
0014  010111111        0572           RETN                   *
0029  000101111        0573           TAM                    STORE LETTER CODE
0052  001000111        0574           TCY      14            *GET OTHER HALF OF
0024  010001100        0575           CALLL    FINDIT        *LETTER CODE AND STORE IT
0048  111100100  0567  0576
0010  010011000        0577           LDX      1             *
0021  000101111        0578           TAM                    *
0042  010000100        0579           CALLL    SPLNTR+1      CHECK TO SEE IF
0004  110101110  0374  0580
0009  011100000        0581           ALEC     0             NEW LETTER MATCHES
0013  100101101  0591  0582           BRANCH   HANG8
0027  010011000        0583           LDX      1             * DOES NOT MATCH
004F  000101011        0584           TYA                    * PUT BLANK BACK
001C  001100011        0585           TCMIY    12            * IN DISPLAY
0039  010010000        0586           LDX      0
0072  001001011        0587           TCY      13
0065  010100010        0588           SBIT     1             SET FLAG FOR WORD NOT COMPLETE
0048  000101000        0589           TAY
0016  100110100  0593  0590           BRANCH   HANG9         BET
002D  000101011        0591  HANG8    TYA                    CORRECT LETTER GUESS
005A  001001011        0592           TCY      13            *
0034  010100000        0593  HANG9    SBIT     0             * CORRECT LETTER FLAG IF Y=13
0068  000101000        0594           TAY
0051  101101110  0525  0595           BRANCH   HANG5
                       0596  *
                       0597  *  NXTWORD--RESETS FLAGS, INCREMENTS COUNTERS AND POINTERS
                       0598  *
```

TABLE IX-3 (Continued)

```
0022  010110010          0599  NXTWORD  CUMX8                *
0044  001000010          0600           TCY      4           INCREMENT PHRASE COUNTER
0008  000101001          0601           TMA
0011  001110100          0602           ACACC    2
0023  011100001          0603           ALEC     8
0046  100011001   0606   0604           BRANCH   NXT2
000C  000000110          0605           CLA
0019  000101111          0606  NXT2     TAM
0033  001000110          0607           TCY      6           RESET BITS FLAG6
0066  010100100          0608           RBIT     0
004D  010100110          0609           RBIT     1
001A  001000000          0610           TCY      0           INCREMENT RWE POINTER
0035  000110010          0611           IMAC                 *
006A  000101111          0612           TAM                  *
0055  000101010          0613           TMY                  *
002A  010000100          0614           LDP      2
0054  001010101          0615           YNEC     10          *
0028  100000111   0345   0616           BRANCH   USPELL+1
0050  010000100          0617           BL       F3
0020  100100101   0431   0618
```

TABLE IX-4

```
                         0619           ORGPG    4
0000  010001000          0620  GAME#2   CALLL    CLEAR       PUTS BLANKS AND CURSOR IN DISPLAY
0001  110111010   0236   0621
0003  010010001          0622           LDX      8           DAM
0007  001001110          0623           TCY      7
000F  001100110          0624           TCMIY    6           SET MODE FOR CODE BREAKER
001F  010100010          0625           SBIT     1           SET GO FLAG
003F  010001101          0626           BL       TONES
007F  101000111   1657   0627
                         0628  *
007E  010010001          0629  DIFFSLV  LDX      8
007D  001001110          0630           TCY      SEVEN       **
007B  000101001          0631           TMA
0077  010010000          0632           LDX      0
006F  001000000          0633           TCY      0
005F  001101000          0634  BLANKM   TCMIY    1
003F  001010001          0635           YNEC     8
007C  101011111   0634   0636           BRANCH   BLANKM
0079  001001000          0637           TCY      1
```

TABLE IX-4 (Continued)

```
0073 011100000        0638           ALEC     0
0067 101000011  0656  0639           BRANCH   LZEROS
                      0640    *
004F 001100000        0641           TCMIY    0           A
001E 001000010        0642           TCY      4
0030 001100000        0643           TCMIY    0           I
                      0644    *
007A 010011000        0645           LDX      ONE         **
0075 001000000        0646           TCY      DISPLAY     **
0068 001100100        0647           TCMIY    2           S
0057 001100000        0648           TCMIY    0           A
002E 001100001        0649           TCMIY    8           Y
005C 001101101        0650           TCMIY    11
0038 001100001        0651           TCMIY    8           I
0070 001101100        0652           TCMIY    3           T
0061 101110100  0665  0653           BRANCH   BLANK
                      0654    *
                      0655    *
0043 001100000        0656    LZEROS TCMIY    0           PUT ,SPELL, IN DISPLAY
0006 001011010        0657           YNEC     5
0000 101000011  0656  0658           BRANCH   LZEROS
                      0659    *
001B 010011000        0660           LDX      ONE         **
0037 001000000        0661           TCY      DISPLAY     **
006F 001100100        0662           TCMIY    LSW$S       **
0050 001101111        0663           TCMIY    LSW$P       **
003A 001100010        0664           TCMIY    LSW$E       **
0074 001101101        0665    BLANK  TCMIY    11
0069 001010001        0666           YNEC     8
0053 101110100  0665  0667           BRANCH   BLANK
0026 001001111        0668  PUT$LVL  TCY      LEVEL       * PUT LEVEL IN DISPLAY
004C 000101001        0669           TMA                  **
0018 001001110        0670           TCY      7
0031 000101111        0671           TAM                  **
                      0672    *
0062 010010000        0673           LDX      ZERO        **
0045 001100000        0674           TCMIY    0
                      0675    *
000A 010110010        0676           CDMX8                * CLEAR GO FLAG
```

TABLE IX-4 (Continued)

| | | | | | | | |
|---|---|---|---|---|---|---|---|
| 0015 | 001000001 | | 0677 | | TCY | FLAG2 | ** |
| 0028 | 001100000 | | 0678 | | TCMIY | 0 | |
| 0056 | 010111111 | | 0679 | | RETN | | ** |
| 002C | 010010000 | | 0680 | NU$TRANS | LDX | 0 | CALCULATE LETTER ADDRESS |
| 0058 | 001001111 | | 0681 | | TCY | 15 | |
| 0030 | 000101001 | | 0682 | | TMA | | |
| 0060 | 010011000 | | 0683 | | LDX | 1 | |
| 0041 | 001000011 | | 0684 | | TCY | 12 | |
| 0002 | 001100000 | | 0685 | | TCMIY | 0 | |
| 0035 | 001100000 | | 0686 | | TCMIY | 0 | |
| 0006 | 001001101 | | 0687 | | TCY | 11 | |
| 0017 | 000101111 | | 0688 | | TAM | | |
| 002F | 010000000 | | 0689 | | CALLL | ADDCARRY | |
| 005F | 111011000 | 0112 | 0690 | | | | |
| 003C | 010010000 | | 0691 | | LDX | 0 | |
| 0078 | 001000111 | | 0692 | | TCY | 14 | |
| 0071 | 000101001 | | 0693 | | TMA | | |
| 0063 | 010011000 | | 0694 | | LDX | 1 | |
| 0047 | 001000101 | | 0695 | | TCY | 10 | |
| 009F | 000101111 | | 0696 | | TAM | | |
| 001D | 010000000 | | 0697 | | CALLL | ADDCARRY | |
| 0038 | 111011000 | 0112 | 0698 | | | | |
| 0076 | 000000110 | | 0699 | | CLA | | |
| 006D | 001110011 | | 0700 | | ACACC | 12 | |
| 0058 | 001000101 | | 0701 | | TCY | 10 | |
| 0036 | 010000000 | | 0702 | | CALLL | ADDCARRY | |
| 006C | 111011000 | 0112 | 0703 | | | | |
| 0059 | 010000101 | | 0704 | ADDCTR6 | CALLL | MEMADDR | |
| 0032 | 111011000 | 1501 | 0705 | | | | |
| 0064 | 010001110 | | 0706 | | CALLL | LOADRESS | |
| 0049 | 111000010 | 1121 | 0707 | | | | |
| 0012 | 010000111 | | 0708 | | BL | ADDWDS2 | |
| 0025 | 100001010 | 2057 | 0709 | | | | |
| 004A | 010010100 | | 0710 | RETN$RCH | LDX | 2 | RETN$RCH FLAG=ACC |
| 0014 | 001001111 | | 0711 | | TCY | 15 | * |
| 0029 | 000101001 | | 0712 | | TMA | | |
| 0052 | 010001111 | | 0713 | | LDP | 15 | |
| 0024 | 011101000 | | 0714 | | ALEC | 1 | SPELL? |
| 0048 | 100101100 | 2219 | 0715 | | BRANCH | DISP/KB | |
| 0010 | 010001101 | | 0716 | | LDP | 11 | |

TABLE IX-4 (Continued)

| | | | | | | | |
|---|---|---|---|---|---|---|---|
| 0021 | 011100100 | | 0717 | | ALEC | 2 | |
| 0042 | 101000010 | 1680 | 0718 | | BRANCH | NXTTONE | |
| 0004 | 010001100 | | 0719 | | LDP | 3 | |
| 0009 | 011101100 | | 0720 | | ALEC | 3 | NXTWORD? |
| 0013 | 100100010 | 0599 | 0721 | | BRANCH | NXTWORD | |
| 0027 | 010000101 | | 0722 | | LDP | 10 | |
| 004E | 011100010 | | 0723 | | ALEC | 4 | NEG? |
| 001C | 100001001 | 1540 | 0724 | | BRANCH | MSPEL3 | |
| 0039 | 010000001 | | 0725 | | LDP | 8 | |
| 0072 | 011101010 | | 0726 | | ALEC | 5 | SAY IT? |
| 0065 | 101100011 | 1232 | 0727 | | BRANCH | DISLP=5 | |
| 0048 | 010001001 | | 0728 | | LDP | 9 | |
| 0016 | 011100110 | | 0729 | | ALEC | 6 | SPEAK LETTER? |
| 002D | 101110110 | 1372 | 0730 | | BRANCH | LET+4 | |
| 0054 | 010001100 | | 0731 | | LDP | 3 | |
| 0034 | 011101110 | | 0732 | | ALEC | 7 | |
| 0068 | 100000110 | 0521 | 0733 | | BRANCH | HANG1 | |
| 0051 | 011100001 | | 0734 | | ALEC | 8 | |
| 0022 | 100000000 | 0479 | 0735 | | BRANCH | GAME#1 | |
| 0044 | 010000101 | | 0736 | | LDP | 10 | |
| 0008 | 011101001 | | 0737 | | ALEC | 9 | |
| 0011 | 101101010 | 1570 | 0738 | | BRANCH | ADDCTR2 | |
| 0023 | 010000001 | | 0739 | | LDP | 8 | |
| 0046 | 011100101 | | 0740 | | ALEC | 10 | |
| 000C | 101100011 | 1232 | 0741 | | BRANCH | DISLP=5 | |
| | | | 0742 | * | TSTBIT2==>USED IN LOADING LNK/EDT TO TEST FOR 3 WORDS OF ZERO | | |
| | | | 0743 | * | 1 WORD OF 0001 | | |
| | | | 0744 | * | | | |
| 0019 | 010110010 | | 0745 | TSTBIT2 | COMXB | | DAM REG |
| 0033 | 001000100 | | 0746 | | TCY | 2 | |
| 0066 | 010100110 | | 0747 | | RBIT | 1 | |
| 004D | 010100101 | | 0748 | | RBIT | 2 | |
| 001A | 010110010 | | 0749 | | COMXB | | |
| 0035 | 010111111 | | 0750 | | RETN | | |

TABLE IX-5

```
                              0751               ORGPG      5                     **
                              0752   *  STORE  SEED NUMBER
0000  010010010               0753   RANDOM    LDX        4
0001  001000101               0754             TCY        10
0003  000000110               0755             CLA
0007  010001111               0756             CALLL      FIL$LOOP
000F  110101110        2183   0757
001F  001001110               0758             TCY        7
003F  010010001               0759             LDX        8
007F  010001110               0760             LDP        7
007E  000100000               0761             TBIT       0
007D  101110011        1039   0762             BRANCH     LDPREV
007B  010100000               0763             SBIT       0
0077  010001010               0764             LDP        5
                              0765   *  CURLEVL==>
                              0766   *  STORES NUMBER OF ENTRIES IN CURRENT LEVEL
                              0767   *  INTO RAM
                              0768   *
006F  001000101               0769   CURLEVL   TCY        10
005F  010011000               0770             LDX        1
                              0771   *   ZERO OUT ROM ADDR
003E  001100000               0772             TCMIY      0
007C  001100000               0773             TCMIY      0
0079  001100000               0774             TCMIY      0
0073  001100000               0775             TCMIY      0
0067  001000101               0776             TCY        10
004F  010111111               0777             RETN
                              0778   *  FIND DIFFICULTY LEVEL
001E  001001111               0779             TCY        15
003D  000101001               0780             TMA
007A  001000101               0781             TCY        10
0075  000101111               0782             TAM
006B  010000111               0783             CALLL      ADD8
0057  110001100        2139   0784
002E  010000101               0785             CALLL      MEMADDR
005C  111011000        1501   0786
                              0787   *  OUTPUT # OF ENTRIES IN THIS LEVEL
```

TABLE IX-5 (Continued)

| | | | | | | |
|---|---|---|---|---|---|---|
| 0038 | 010001110 | | 0788 | | CALLL | OUTADDR2 |
| 0070 | 111000001 | 1083 | 0789 | | | |
| 0061 | 001001111 | | 0790 | | TCY | 15 |
| 0043 | 010011010 | | 0791 | | LDX | 5 |
| 0006 | 000101111 | | 0792 | | TAM | |
| 000D | 010001110 | | 0793 | | CALLL | OUTADDR2 |
| 001B | 111000001 | 1083 | 0794 | | | |
| 0037 | 001001111 | | 0795 | | TCY | 15 |
| 006E | 010010010 | | 0796 | | LDX | 4 |
| 005D | 000101111 | | 0797 | | TAM | |
| 003A | 010011010 | | 0798 | | LDX | 5 |
| 0074 | 000000111 | | 0799 | | DMAN | |
| 0069 | 100011000 | 0804 | 0800 | | BRANCH | DECMEM |
| 0053 | 000101111 | | 0801 | | TAM | |
| 0026 | 010010010 | | 0802 | | LDX | 4 |
| 004C | 000000111 | | 0803 | | DMAN | |
| 0018 | 000101111 | | 0804 | DECMEM | TAM | |
| 0031 | 010011100 | | 0805 | | LDX | 3 |
| 0062 | 001000001 | | 0806 | | TCY | 8 |
| 0045 | 000101001 | | 0807 | | TMA | |
| 000A | 010011010 | | 0808 | | LDX | 5 |
| 0015 | 001000000 | | 0809 | | TCY | 0 |
| 002B | 000101111 | | 0810 | | TAM | |
| 0056 | 010011100 | | 0811 | | LDX | 3 |
| 002C | 001001001 | | 0812 | | TCY | 9 |
| 0058 | 000101001 | | 0813 | | TMA | |
| 0030 | 010010010 | | 0814 | | LDX | 4 |
| 0060 | 001000000 | | 0815 | | TCY | 0 |
| 0041 | 000101111 | | 0816 | | TAM | |
| | | | 0817 | * DETERMINE IF SEED IS '>' NUMBER OF ENTRIES | | |
| 0002 | 001001111 | | 0818 | DECLOOP | TCY | 15 |
| 0005 | 000000001 | | 0819 | | ALEM | |
| 000B | 101111000 | 0825 | 0820 | | BRANCH | RANOK |
| 0017 | 001000000 | | 0821 | | TCY | 0 |
| 002F | 001111100 | | 0822 | | ACACC | 3 |
| 005E | 000101111 | | 0823 | | TAM | |
| 003C | 100000010 | 0818 | 0824 | | BRANCH | DECLOOP |
| 0078 | 000001001 | | 0825 | RANOK | MNEA | |
| 0071 | 101011001 | 0837 | 0826 | | BRANCH | RANOK2 |
| 0063 | 001000000 | | 0827 | | TCY | 0 |

TABLE IX-5 (Continued)

| | | | | | | |
|---|---|---|---|---|---|---|
| 0047 | 010011010 | | 0828 | | LDX | 5 |
| 000F | 000101001 | | 0829 | | TMA | |
| 0010 | 001001111 | | 0830 | DECLOOP3 | TCY | 15 |
| 003B | 000000001 | | 0831 | | ALEM | |
| 0076 | 101011001 | 0837 | 0832 | | BRANCH | RANOK2 |
| 0060 | 001000000 | | 0833 | | TCY | 0 |
| 0058 | 001111100 | | 0834 | | ACACC | 3 |
| 0036 | 000101111 | | 0835 | | TAM | |
| 006C | 100011101 | 0830 | 0836 | | BRANCH | DECLOOP3 |
| 0059 | 010110010 | | 0837 | RANOK2 | COMX8 | |
| | | | 0838 | * ZERO RWE POINTER | | |
| 0032 | 001000000 | | 0839 | | TCY | 0 |
| 0064 | 001100000 | | 0840 | | TCMIY | 0 |
| 0049 | 010011010 | | 0841 | RPLOOP | LDX | 5 |
| 0012 | 010001101 | | 0842 | | CALLL | RCOMX8 |
| 0025 | 111001100 | 1631 | 0843 | | | |
| 004A | 000101001 | | 0844 | | TMA | |
| 0014 | 000000101 | | 0845 | | IYC | |
| 0029 | 001111000 | | 0846 | | ACACC | 1 |
| 0052 | 110101000 | 0888 | 0847 | | CALL | INCARRY |
| 0024 | 000101100 | | 0848 | | TAMDYN | |
| 0048 | 010010010 | | 0849 | | LDX | 4 |
| 0010 | 000101001 | | 0850 | | TMA | |
| 0021 | 000000101 | | 0851 | | IYC | |
| 0042 | 000010101 | | 0852 | | AMAAC | |
| 0004 | 000101111 | | 0853 | | TAM | |
| 0009 | 010001101 | | 0854 | RANARND | CALLL | RCOMX8 |
| 0013 | 111001100 | 1631 | 0855 | | | |
| 0027 | 000101001 | | 0856 | | TMA | |
| 004E | 001001111 | | 0857 | | TCY | 15 |
| 001C | 000000001 | | 0858 | | ALEM | |
| 0039 | 101100101 | 0861 | 0859 | | BRANCH | RANCNT |
| 0072 | 101000100 | 0870 | 0860 | | BRANCH | ZRORAND |
| 0065 | 000001001 | | 0861 | RANCNT | MNEA | |
| 004B | 101100110 | 0878 | 0862 | | BRANCH | RANCOMP |
| 0016 | 010011010 | | 0863 | | LDX | 5 |
| 002D | 010001101 | | 0864 | | CALLL | RCOMX8 |
| 0054 | 111001100 | 1631 | 0865 | | | |
| 0034 | 000101001 | | 0866 | | TMA | |
| 0068 | 001001111 | | 0867 | | TCY | 15 |

TABLE IX-5 (Continued)

```
0051  000000001          0868             ALEM
0022  101100110   0878   0869             BRANCH    RANCOMP
0044  010001101          0870  ZRORAND    CALLL     RCOMX8
0008  111001100   1631   0871
0011  001100000          0872             TCMIY     0
0023  000000100          0873             DYN
0046  010010010          0874             LDX       4
000C  001100000          0875             TCMIY     0
0019  001100000          0876             TCMIY     0
0033  101001001   0841   0877             BRANCH    RPLOOP
0066  001000000          0878  RANCOMP    TCY       0
                         0879  *  COMPARE RANDOM # TO # OF ENTRIES
0040  010110010          0880             COMX8
001A  000110010          0881             IMAC
0035  000101111          0882             TAM
006A  011101001          0883             ALEC      9
0055  101001001   0841   0884             BRANCH    RPLOOP
002A  010001110          0885             BL        RANSTOP
0054  100000000   1021   0886
                         0887  *
0028  000101111          0888  INCARRY    TAM
0050  010010010          0889             LDX       4
0020  000110010          0890             IMAC
0040  010111111          0891             RETN
```

TABLE IX-6

```
                         0892             ORGPG     6           **
                         0893  ****       CODE      BREAKER     ******
0000  010001000          0894  CRYPTO     CALLL     SPACE-3     ELIMINATE CURSOR FROM DISPLAY
0001  111100011   0273   0895
0003  001000000          0896             TCY       0
0007  010010000          0897  CRY1       LDX       0
000F  000110011          0898             MNEZ                  TEST MSB OF DISPLAY CHARACTER
001F  100111101   0915   0899             BRANCH    CRY2        BRANCH IF MSB=1
003F  010011000          0900  COMPL      LDX       1
007F  000110010          0901             IMAC                  * COMPLEMENT THE LSD OF
007E  000110001          0902             CPAIZ                 * THE DISPLAYED LETTER
```

```
0070 010111111        0903               REIN
007B 011101001        0904               ALEC       9          * IF A CHARACTER CODE
0077 100111110  0908  0905               BRANCH     CRY3       * PAST 'Z' HAS BEEN
006F 001110110        0906               ACACC      6          * CREATED, ADD 6 TO GET A LETTER
005F 101010111  0919  0907               BRANCH     CRY6       RET
003E 000101111        0908   CRY3        TAM                   STORE COMPLEMENT OF LSD
007C 010010000        0909   CRY5        LDX        0
0079 001101000        0910               TCMIY      1          SET MSB TO 1
0073 001010001        0911   CRY4        YNEC       8          ARE ALL LETTERS FINISHED?
0067 100000111  0897  0912               BRANCH CRY1           NO, CONTINUE
004F 010001101        0913   CRY12       BL         TONES
001E 101000111  1657  0914
0030 010000110        0915   CRY2        CALLL      COMPL
007A 110111111  0900  0916
0075 011101010        0917               ALEC       5          * TEST FOR CODES OTHER
0064 101111100  0909  0918               BRANCH     CRY5       * THAN LETTERS AND SKIP THEM
0057 000101111        0919   CRY6        TAM
002E 010010000        0920               LDX        0
005C 001100000        0921               TCMIY      0          SET MSB TO ZERO
0038 101110011  0911  0922               BRANCH     CRY4       RET
0070 010011100        0923   CLUE        LDX        3
0061 001000001        0924               TCY        8
0043 000101001        0925               TMA                   GET HEX RANDOM NUMBER
0006 011101110        0926               ALEC       7          * IF NUMBER IS GREATER
0000 100110111  0929  0927               BRANCH     CLUE1      * THAN 7, ADD 8
001B 001110001        0928               ACACC      8          *
0037 000101000        0929   CLUE1       TAY                   SET Y RANDOMLY 0- 7
006E 000000100        0930   CLUE2       DYN                   * LOOK FOR FIRST
005D 101110100  0933  0931               BRANCH     YOK
003A 001001110        0932               TCY        7
0074 010000100        0933   YOK         CALLL      SPLNTR+1   * LETTER THAT HASN'T
0069 110101110  0374  0934
0053 011100000        0935               ALEC       0          * BEEN CORRECTLY ENTERED
0026 101101110  0930  0936               BRANCH     CLUE2
004C 010010100        0937               LDX        2
0018 000100000        0938               TBIT       0          MSB IS A ONE?
0031 100000101  0952  0939               BRANCH     CLUE3      YES
0062 010011100        0940   GETTT       LDX        3          NO
0045 000101001        0941               TMA                   * GET LSD OF LETTER
000A 010010000        0942               LDX        0          * FROM CORRECT SPELLING
```

TABLE IX-6 (Continued)

| | | | | | | | |
|---|---|---|---|---|---|---|---|
| 0015 | 001000111 | | 0943 | | TCY | 14 | * BUFFER AND PUT IT IN |
| 0028 | 000101101 | | 0944 | | TAMIYC | | * KEY CODE |
| 0056 | 010111111 | | 0945 | | RETN | | |
| 002C | 001100000 | | 0946 | | TCMIY | 0 | SET MSB=0 |
| 0058 | 001001011 | | 0947 | CLUE4 | TCY | 13 | |
| 0030 | 010010100 | | 0948 | | LDX | 2 | |
| 0060 | 000101001 | | 0949 | | TMA | | |
| 0041 | 010000100 | | 0950 | | BL | MISS3 | |
| 0002 | 100110101 | 0471 | 0951 | | | | |
| 0005 | 111100010 | 0940 | 0952 | CLUE3 | CALL | GETIT | |
| 000B | 001101000 | | 0953 | | TCMIY | 1 | SET MSB=1 |
| 0017 | 101011000 | 0947 | 0954 | | BRANCH | CLUE4 | BET |
| 002F | 000101000 | | 0955 | F2 | TAY | | |
| 005E | 001010000 | | 0956 | | YNEC | 0 | |
| 003C | 101001111 | 0913 | 0957 | | BRANCH | CRY12 | |
| 0078 | 010010000 | | 0958 | | LDX | 0 | 10 |
| 0071 | 001001010 | | 0959 | | TCY | 5 | |
| 0063 | 001101000 | | 0960 | | TCMIY | 1 | |
| 0047 | 001100100 | | 0961 | | TCMIY | 2 | |
| 000E | 001100100 | | 0962 | | TCMIY | 2 | |
| 001D | 010011000 | | 0963 | | LDX | 1 | |
| 003A | 001001010 | | 0964 | | TCY | 5 | |
| 0076 | 001100111 | | 0965 | | TCMIY | 14 | |
| 006D | 001101000 | | 0966 | | TCMIY | 1 | |
| 005A | 001100000 | | 0967 | | TCMIY | 0 | |
| 0034 | 101001111 | 0913 | 0968 | | BRANCH | CRY12 | |
| 006C | 010011100 | | 0969 | F5 | LDX | 3 | |
| 0059 | 001001011 | | 0970 | | TCY | 13 | LNK/EDT VALUE |
| 0032 | 001100000 | | 0971 | | TCMIY | 0 | |
| 0064 | 010011000 | | 0972 | F2LOOP | LDX | 1 | |
| 0049 | 001000101 | | 0973 | | TCY | 10 | |
| 0012 | 001100100 | | 0974 | | TCMIY | 2 | |
| 0025 | 001100010 | | 0975 | | TCMIY | 4 | |
| 004A | 001100000 | | 0976 | | TCMIY | 0 | |
| 0014 | 001100000 | | 0977 | | TCMIY | 0 | |
| 0029 | 010011010 | | 0978 | | LDX | 5 | |
| 0052 | 001001011 | | 0979 | | TCY | 13 | # OF CORRECT SCORES |
| 0024 | 000101001 | | 0980 | | TMA | | |
| 0048 | 000010101 | | 0981 | | AMAAC | | CORRY? |
| 0010 | 101001101 | 1012 | 0982 | | BRANCH | NOF2 | |

TABLE IX-6 (Continued)

| | | | | | | | |
|---|---|---|---|---|---|---|---|
| 0021 | 010011000 | | 0983 | | LDX | 1 | |
| 0042 | 001000101 | | 0984 | | TCY | 10 | |
| 0004 | 000010101 | | 0985 | | AMAAC | | |
| 0009 | 101101010 | 1015 | 0986 | | BRANCH | NOF3 | |
| 0013 | 000101111 | | 0987 | | TAM | | |
| 0027 | 010111111 | | 0988 | FINL2 | RETN | | |
| 004E | 010000101 | | 0989 | | CALLL | MEMADDR | |
| 001C | 111011000 | 1501 | 0990 | | | | |
| 0039 | 010001110 | | 0991 | | CALLL | LOADRESS | LOAD ADDRESS |
| 0072 | 111000010 | 1121 | 0992 | | | | |
| 0065 | 010011000 | | 0993 | | LDX | 1 | |
| 004B | 010000011 | | 0994 | | CALLL | TRANS-1 | STORE N DAM |
| 0016 | 110101011 | 1856 | 0995 | | | | |
| 0020 | 010001001 | | 0996 | | BL | F4 | |
| 005A | 101001101 | 1422 | 0997 | | | | |
| 0034 | 001000101 | | 0998 | FINL3 | TCY | 10 | |
| 0068 | 010011000 | | 0999 | FINL6 | LDX | 1 | |
| 0051 | 000101001 | | 1000 | | TMA | | |
| 0022 | 010010010 | | 1001 | | LDX | 4 | |
| 0044 | 000101101 | | 1002 | | TAMIYC | | |
| 0008 | 001010111 | | 1003 | | YNEC | 14 | |
| 0011 | 101101000 | 0999 | 1004 | | BRANCH | FINL6 | |
| 0025 | 010001010 | | 1005 | | CALLL | CURLEVL | |
| 0046 | 111101111 | 0769 | 1006 | | | | |
| 000C | 001100010 | | 1007 | | TCMIY | 4 | |
| 0019 | 001101110 | | 1008 | | TCMIY | 7 | |
| 0033 | 010001000 | | 1009 | | BL | SPK4 | |
| 006D | 101100101 | 0311 | 1010 | | | | |
| | | | 1011 | * | | | |
| 004D | 010011000 | | 1012 | NOF2 | LDX | 1 | |
| 001A | 001000101 | | 1013 | | TCY | 10 | |
| 0035 | 000010101 | | 1014 | | AMAAC | | |
| 006A | 000101101 | | 1015 | NOF3 | TAMIYC | | |
| 0055 | 000110010 | | 1016 | | IMAC | | |
| 002A | 000101111 | | 1017 | | TAM | | |
| 0054 | 100100111 | 0988 | 1018 | | BRANCH | FINL2 | |

TABLE IX-7

```
                          1019          ORGPG     7                        **
                          1020    *  LOADED 10 VALUES =STORE LAST VALUE
0000 001100000            1021    RANSTOP  TCMTY     0
0001 001000101            1022             TCY       10
0003 010011010            1023             LDX       5
0007 000101001            1024             TMA
000F 001000111            1025             TCY       14
001F 000101111            1026             TAM
003F 010010010            1027             LDX       4
007F 001000101            1028             TCY       10
007E 000101001            1029             TMA
007D 001000111            1030             TCY       14
007B 000101111            1031             TAM
0077 010011010            1032    RSCRAM2  LDX       5
006F 111110000      1052  1033             CALL      RSCRAM
005F 010010010            1034             LDX       4
003E 111110000      1052  1035             CALL      RSCRAM
007C 010001000            1036             BL        RANRTN
0079 101110011      0215  1037
                          1038    *  LDPREV==> LOADS NEXT VALUE NTO RWE
0073 001000111            1039    LDPREV   TCY       14
0067 010010010            1040             LDX       4
004F 000101001            1041             TMA
001E 001000000            1042             TCY       0
003D 000101111            1043             TAM
007A 001000111            1044             TCY       14
0075 010011010            1045             LDX       5
006B 000101001            1046             TMA
0057 001000000            1047             TCY       0
002E 000101111            1048             TAM
005C 010001010            1049             LDP       5
0038 101011001      0837  1050             BRANCH    RANOK2
                          1051    *  SCRAMBLES RWE WORDS
0070 001000000            1052    RSCRAM   TCY       0
0061 000101001            1053             TMA
0043 001000110            1054             TCY       6
0006 000000011            1055             XMA
000D 001000000            1056             TCY       0
001B 000101101            1057             TAMIYC
0037 000101001            1058             TMA
```

IX-7 (Continued)

```
006F  001001110      TCY     7
0056  000000011      XMA
003A  001001000      TCY     1
0074  000101101      TAMIYC
0069  000101001      TMA
0053  001001010      TCY     5
0026  000000011      XMA
004C  001000100      TCY     2
0018  000101101      TAMIYC
0031  000101001      TMA
0062  001000001      TCY     8
0045  000000011      XMA
000A  001001100      TCY     3
0015  000101101      TAMIYC
002B  000101001      TMA
0056  001001001      TCY     9
002C  000000011      XMA
0059  001000010      TCY     4
0030  000000011      XMA
0060  010111111      RETN
                *
                *  OUTADDR2:
                *  LOADS 4 BITS INTO K-LINES USING PDC AND OUTPUT 4 BITS
                *
0041  001000011 OUTADDR2 TCY  12              ** CHIP SELECT
0002  000001101      SETR                     **
0005  001001101      TCY     11               L/R = 0
0008  000001101      SETR
0017  001000101      TCY     10
002F  000000110      CLA                      ACC=OUTPUT 4 BITS COMMAND
005F  001110001      ACACC   EIGHT            **
003C  000001101      SETR                     **
0078  000110110      RSTR                     **
0071  000001101      SETR                     **
0063  000110110      RSTR                     **
0047  000001101      SETR                     **
000E  000110110      RSTR                     **
001D  000001101      SETR                     **
0036  000110110      RSTR                     **
0076  000000110      CLA                      **
```

TABLE IX-7 (Continued)

```
006D  001110010         1099            ACACC    FOUR          **
0058  000001101         1100            SETR                   1ST PDC LOADS COMMAND
0036  000110110         1101            RSTR                   *
006C  001001101         1102            TCY      11
0059  000110110         1103            RSTR
0032  001000101         1104            TCY      10
0064  000001101         1105            SETR                   2ND PDC APPLIES SR TO K=LINES
0049  000110110         1106            RSTR                   *
0012  001110000         1107            ACACC    0
0025  000001000         1108            TKA                    LOAD INTO ACC
004A  000001101         1109            SETR                   3RD PDC DISCONNECTS SR
0014  000110110         1110            RSTR                   *
0029  001001101         1111            TCY      11
0052  000001101         1112            SETR
0024  010010100         1113            LDX      2
0048  000100011         1114            TBIT     3
0010  101001011   1131  1115            BRANCH   LSHIFT=1
0021  010111111         1116            RETN
                        1117  *
                        1118  *  END OF OUTADDR2 SUBROUTINE
                        1119  *
                        1120  *
0042  001001101         1121  LOADRESS  TCY      11
0004  010010100         1122            LDX      2
0009  010100011         1123            SBIT     3             *
0013  001000101         1124            TCY      10
0027  000000110         1125            CLA
004E  001111100         1126            ACACC    3
001C  010010100         1127            LDX      2             MEMORY FOR LOOP
0039  000101110         1128  LOADR+1   TAMZA
0072  010011000         1129            LDX      1
0065  101000001   1083  1130            BRANCH   OUTADDR2
004B  001001011         1131  LSHIFT=1  TCY      13
0016  010011000         1132            LDX      1
002D  000000011         1133  LSHIFT    XMA                    SHIFT ROUTINE
005A  000000100         1134            DYN                    *
0034  001011001         1135            YNEC     9             *
0068  100101101   1133  1136            BRANCH   LSHIFT        *
0051  001000101         1137            TCY      10            TEST LOOP COUNT
0022  010010100         1138            LDX      2             *
```

TABLE IX-7 (Continued)

```
0044  000000111          1139            DMAN                             *
0008  100111001   1128   1140            BRANCH   LOADR+1                 *
0011  001001101          1141            TCY      11
0023  010100111          1142            RBIT     3
0046  010111111          1143            RETN
                         1144  *
000C  010011010          1145  FL2       LDX      5
0019  001001011          1146            TCY      13
0033  000000110          1147            CLA
0066  001110101          1148            ACACC    10
004D  000000011          1149            XMA
001A  000110000          1150            SAMAN
0035  000101111          1151            TAM
006A  010111111          1152            RETN
0055  001000110          1153  ROM       TCY      6
002A  010010001          1154            LDX      8
0054  000101001          1155            TMA
0028  001110001          1156            ACACC    8
0050  000101111          1157            TAM
0020  010001111          1158            BL       DISP/KB
0040  100101100   2219   1159
```

TABLE IX-8

```
                         1160            ORGPG    8
                         1161  *
                         1162  *  CALADDR--> STICKS ADDRESS WANTED INTO LNK/FDT
                         1163  *
0000  001000111          1164  CALADDR   TCY      14
0001  001100101          1165            TCMIY    10
0003  001001001          1166            TCY      9
0007  010011000          1167            LDX      1
000F  000101001          1168            TMA
001F  001111111          1169            ACACC    15
003F  010110010          1170            COMXB                  ADDRESS DAM
007F  000101111          1171            TAM
007E  001000101          1172            TCY      10
007D  000101001          1173  TMAA      TMA
007B  010011000          1174            LDX      1
0077  000101101          1175            TAMIYC
006F  010110010          1176            COMXB                  ADDRESS DAM
005F  001010111          1177            YNEC     14
```

TABLE IX-8 (Continued)

```
003E  101111101  1173  1178             BRANCH   TMAA
007C  111001111  1183  1179  CALL+2     CALL     CAL+1
0079  010011110        1180             LDX      7
0073  000101111        1181             TAM                 STORE WORD
0067  010110010        1182             COMX8               ADDRESS DAM
004F  001000111        1183  CAL+1      TCY      14         GET Y POINTER
001E  000110010        1184             IMAC                *
003D  000101111        1185             TAM                 *
007A  000101010        1186             TMY                 *
0075  000000100        1187             DYN
006B  000101001        1188             TMA
0057  001001001        1189  OUT$RTN    TCY      9          GET LNK/EDT POINTER
002E  000101010        1190             TMY                 *
005C  010110010        1191             COMX8               EXIT DAM
0038  010111111        1192             RETN
0070  010010110        1193             LDX      6          STORE WORD
0061  000101111        1194             TAM                 *
0043  010110010        1195             COMX8               ADDRESS DAM
0006  001001001        1196             TCY      9
000D  000110010        1197             IMAC
001B  000101111        1198             TAM
0037  001000111        1199             TCY      14
006F  000101010        1200             TMY
005D  001010111        1201             YNEC     14         Y=14? IF YES,
003A  101111100  1179  1202             BRANCH   CALL+2     LOAD 2 MSW
0074  001000100        1203             TCY      2
0069  010100101        1204             RBIT     2
0053  010011000        1205             LDX      1
0026  001001001        1206             TCY      9
004C  010000011        1207             BL       LNKCNT2
0018  101101100  1798  1208
0031  010011100        1209  ULRN+1     LDX      3
0062  001001011        1210             TCY      13
0045  001101010        1211             TCMIY    5
000A  010001101        1212  ULRN+2     BL       CORR+1
0015  101111110  1590  1213
                       1214  *                              * CALCULATES ADDRESS
                       1215  *                              * LOADS CSB
002B  001100000        1216  DISLP=1    TCMIY    0
0056  010000101        1217             BL       LOADDISP
```

TABLE IX-8 (Continued)

| | | | | | | | |
|---|---|---|---|---|---|---|---|
| 002C | 101111001 | 1456 | 1218 | | | | |
| 0058 | 010000111 | | 1219 | DISLP7 | CALLL | SPEAK+1 | |
| 0030 | 110000001 | 2010 | 1220 | | | | |
| 0060 | 010000011 | | 1221 | | CALLL | TRANS-1 | |
| 0041 | 110100011 | 1836 | 1222 | | | | |
| 0002 | 010010100 | | 1223 | DISLP+2 | LDX | 2 | |
| 0005 | 001001111 | | 1224 | | TCY | 15 | * |
| 0008 | 001101010 | | 1225 | | TCMIY | 5 | |
| 0017 | 010001010 | | 1226 | | CALLL | CURLEVL | |
| 002F | 111101111 | 0769 | 1227 | | | | |
| 005E | 001100111 | | 1228 | | TCMIY | 14 | |
| 003C | 001100110 | | 1229 | | TCMIY | 6 | |
| 0078 | 010000010 | | 1230 | | BL | ADDCTR6 | |
| 0071 | 101011001 | 0704 | 1231 | | | | |
| 0063 | 001001111 | | 1232 | DISLP-5 | TCY | 15 | |
| 0047 | 010110010 | | 1233 | | COMX8 | | ADDRESS DAM |
| 000E | 001101111 | | 1234 | | TCMIY | 15 | |
| 0010 | 010110010 | | 1235 | DISPLOOP | COMX8 | | EXIT DAM |
| 0038 | 001000111 | | 1236 | | TCY | 14 | |
| 0076 | 010011100 | | 1237 | | LDX | 3 | |
| 006D | 010100000 | | 1238 | | SBIT | 0 | |
| 0058 | 010001111 | | 1239 | | BL | DISP/KB | |
| 0036 | 100101100 | 2219 | 1240 | | | | |
| 006C | 010110010 | | 1241 | DISLP+1 | COMX8 | | ADDRESS DAM |
| 0059 | 001001111 | | 1242 | | TCY | 15 | LOOP |
| 0032 | 000000111 | | 1243 | | DMAN | | * |
| 0064 | 000101111 | | 1244 | | TAM | | * |
| 0049 | 000110011 | | 1245 | | MNEZ | | * |
| 0012 | 100011101 | 1235 | 1246 | | BRANCH | DISPLOOP | * ELSE |
| 0025 | 001000111 | | 1247 | | TCY | 14 | |
| 004A | 010011100 | | 1248 | | LDX | 3 | |
| 0014 | 010100100 | | 1249 | | RBIT | 0 | |
| 0029 | 010010001 | | 1250 | | LDX | 8 | |
| 0052 | 010001001 | | 1251 | | LDP | 9 | |
| 0024 | 001000100 | | 1252 | | TCY | 2 | |
| 0048 | 000100011 | | 1253 | | TBIT | 3 | |
| 0010 | 101010011 | 1341 | 1254 | | BRANCH | LET4 | |
| 0021 | 000100001 | | 1255 | | TBIT | 2 | |
| 0042 | 101001010 | 1385 | 1256 | | BRANCH | RESTO2 | |
| 0004 | 010000001 | | 1257 | | LDP | 8 | |

TABLE IX-8 (Continued)

```
0009 010010100        1258         LDX     2
0013 001001111        1259         TCY     15
0027 000101001        1260         TMA
004E 011101001        1261         ALEC    9
001C 101110010  1264  1262         BRANCH  DISP8
0039 101101000  1271  1263         BRANCH  DISP5
0072 001100101        1264  DISP8  TCMIY   10
0065 010011000        1265         LDX     1
0048 010110010        1266         COMXR                    ADDRESS DAM
0016 010000011        1267  DISP9  CALLL   TRANS-1
002D 110100011  1836  1268
0054 010000111        1269         BL      ADDWDS2
0034 100001010  2057  1270
0068 010001001        1271  DISP5  CALLL   DELAY2
0051 110100111  1398  1272
0022 010110010        1273         COMX8
0044 001000000        1274         TCY     0                INCREMENT RWE POINTER
0008 000110010        1275         IMAC                     *
0011 000101101        1276         TAMIYC
0023 001100000        1277         TCMIY   0
0046 011101001        1278         ALEC    9
000C 101010000  1291  1279         BRANCH  DISP6
0017 001000000        1280         TCY     0
0033 001100000        1281         TCMIY   0
0066 001100000        1282         TCMIY   0
004D 010011010        1283         LDX     5
001A 010001110        1284         CALLL   RSCRAM
0035 111110000  1052  1285
006A 010010010        1286         LDX     4
0055 010001110        1287         CALLL   RSCRAM
002A 111110000  1052  1288
0054 010000100        1289         BL      USPELL+1
0028 100000111  0345  1290
0050 010001001        1291  DISP6  CALLL   DELAY2
0020 110100111  1398  1292
0040 100110001  1209  1293         BRANCH  ULRN+1
```

TABLE IX-9

```
                                 ORGPG    9
                         *
                         *  LETTER-->TRANSFERS LETTERS TO BE SPOKEN, FROM THE CSB
                         *    INTO THE LINK/EDIT AND THEN CALCULATES THE ADDRESS FOR L/E.
                         *
0000  001001111          LETTER   TCY      15
0001  000000110                   CLA
0003  010000111                   CALLL    RETURN4
0007  110000100  2113
000F  010001000                   CALLL    CLEAR
001F  110111010  0236
003F  001001000                   TCY      1
007F  010110010                   COMX8                      *
007E  001100000                   TCMIY    0                 *
007D  001001111                   TCY      15
007B  001101000                   TCMIY    1
0077  010011100          LETTER+1 LDX      3                 LOAD LSW -->ACC
006F  001001000                   TCY      1                 *
005F  010001101                   CALLL    COMX8             *
003E  110011000  1632
007C  000101001                   TMA                        *
0079  010011110                   LDX      7                 STORE IN LNK/EDT
0073  001000000                   TCY      0                 *
0067  000101111                   TAM                        *
004F  010010100                   LDX      2                 MSW
001E  001001000                   TCY      1                 GET Y POINTER
003D  010001101                   CALLL    COMX8             *
007A  110011000  1632
0075  000101001                   TMA                        LOAD MSW
006B  010000101                   LDP      10
0057  000100001                   TBIT     2                 LAST LETTER?
002E  111010011  1485             CALL     SETBIT2           YES, SETBIT2
005C  010001111                   LDP      15
0038  000100011                   TBIT     3                 SYLLABLE?
0070  111010101  2291             CALL     SETBIT3           SET SYLLABLE FLAG
0061  001000000                   TCY      0                 *
0043  010010110                   LDX      6                 *
0006  000101111                   TAM                        *
000D  010100101                   RBIT     2
001B  010100111                   RBIT     3
```

TABLE IX-9 (Continued)

```
                              1334   *    CALCULATE ADDRESS OF LETTER
0037  001000100               1335             TCY      2            FLAG WORD
006E  010010001               1336             LDX      8
0050  010000001               1337             LDP      8
003A  000100011               1338             TBIT     3            SYLLABLE?
0074  100011101     1235      1339             BRANCH   DISPLDOP
0069  010001001               1340             LDP      9
0053  001000000               1341   LET4      TCY      0
0026  010010110               1342             LDX      6
004C  000101001               1343             TMA
0018  000010101               1344             AMAAC                 MULTIPLY BY 2
0031  000101111               1345             TAM
0062  010011110               1346             LDX      7            *
0045  000101001               1347             TMA
000A  000010101               1348             AMAAC
0015  111000010     1394      1349             CALL     TLETTER      CARRY, GO TO TLETTER
0026  000101111               1350             TAM
0056  010011110               1351             LDX      7
002C  000101001               1352             TMA
0058  001110011               1353             ACACC    12
0030  111000010     1394      1354             CALL     TLETTER
0060  000101111               1355             TAM
                              1356   *    LOADS LETTER ADDRESS INTO FOM ADDR AREA (RAM)
0041  010000111               1357             CALLL    SPEAK+1
0002  110000001     2010      1358
0005  010011100               1359             LDX      3            FLAG
0008  001001011               1360             TCY      13           *
0017  001100011               1361             TCMIY    12
002F  010010100               1362             LDX      2            FLAG
005E  001001111               1363             TCY      15           *
003C  001100110               1364             TCMIY    6
0078  001001000               1365             TCY      1
0071  010001101               1366             CALLL    COMX8
0063  110011000     1632      1367
0047  010000101               1368             CALLL    DPLOAD
000E  111110011     1457      1369
001D  010000010               1370             BL       ADDCTR6
003B  101011001     0704      1371
0076  001000100               1372   LET+4     TCY      2
                              1373   *    SPEAKS LETTER
```

TABLE IX-9 (Continued)

```
0060  010110010         1374            COMXB                    *
005B  010100111         1375            RBIT     3
0036  000100001         1376            TBIT     2               *
006C  100010010  1383   1377            BRANCH   RESTO
0059  001001000         1378            TCY      1
0032  000110010         1379            IMAC                     BUMP POINTER FOR CSB
0064  000101111         1380            TAM                      *
0049  101110111  1310   1381            BRANCH   LETTER+1        GET NEXT LETTER--ALWAYS B.
                        1382   *   RESTORE LNK/EDT POINTER AND RETURN TO CONTINUE SPEAKING
0012  010000001         1383   RESTO    BL       DISLP-5
0025  101100011  1232   1384
004A  010100101         1385   RESTO2   RBIT     2
0014  010010100         1386            LDX      2
0029  001001111         1387            TCY      15
0052  001101100         1388            TCMIY    3
0024  001001000         1389            TCY      1
0048  010110010         1390            COMXB
0010  010000101         1391            BL       REPT2
0021  100000011  1439   1392
                        1393   *   INCREMENT WHEN OVERFLOW OCCURS
0042  000101111         1394   TLETTER  TAM
0004  010010110         1395            LDX      6
0009  000110010         1396            IMAC
0013  010111111         1397            RETN
0027  000000110         1398   DELAY2   CLA
004E  010010100         1399            LDX      2               DELAY BUFFER--RAM
001C  001000001         1400            TCY      8               *
0039  001100000         1401            TCMIY    0               CLEAR
0072  001100000         1402            TCMIY    0               *
0065  001100000         1403            TCMIY    0
004B  001000001         1404            TCY      8
0016  000101111         1405   DELAY2+1 TAM
002D  000110010         1406            IMAC
005A  101101000  1409   1407            BRANCH   PLUSONE
0034  100010110  1405   1408            BRANCH   DELAY2+1
0068  000101101         1409   PLUSONE  TAMIYC
0051  000110010         1410            IMAC
0022  100010001  1414   1411            BRANCH   WORD3
0044  000101100         1412            TAMDYN
0008  100010110  1405   1413            BRANCH   DELAY2+1
```

TABLE IX-9 (Continued)

```
0011  000101101         1414  WORD3   TAMIYC
0023  000110010         1415          IMAC
0046  101100110   1420  1416          BRANCH   QUIT
000C  000101100         1417          TAMDYN
0019  000000100         1418          DYN
0033  100010110   1405  1419          BRANCH   DELAY2+1
0066  010111111         1420  QUIT    RETN
                        1421  *
0040  010001110         1422  F4      CALLL    FL2          STORE # OF WRONG RESPONSES
001A  110001100   1145  1423
0035  010000110         1424          CALLL    F21.OOP
006A  111100100   0972  1425
0055  010000101         1426          CALLL    MEMADDR
002A  111011000   1501  1427
0054  010001110         1428          CALLL    LOADRESS
002B  111000010   1121  1429
0050  010000110         1430          BL       FINL3
0020  100110100   0998  1431
```

TABLE IX-10

```
                        1432          ORGPG    10
                        1433  *
                        1434  *  REPEAT ROUTINE-->REPEATS PHRASE PREVIOUSLY SPOKEN
                        1435  *      TWO REPEATS OR MORE CAUSES PHRASE TO BE SPOKEN SLOWER
                        1436  *
0000  010010100         1437  REPEAT  LDX      2
0001  001001111         1438          TCY      15
0003  001100000         1439  REPT2   TCMIY    0
0007  010011000         1440          LDX      1
000F  001000101         1441          TCY      10
001F  010110010         1442  RPT+1   COMX8                 DAM REG
003F  000101001         1443          TMA                   STORE WORD-->ACC
007F  010110010         1444          COMX8                 EXIT DAM
007E  000101101         1445          TAMIYC
007D  001010111         1446          YNEC     14           *
007B  100011111   1442  1447          BRANCH   RPT+1        *
0077  010110010         1448          COMX8
006F  001001000         1449          TCY      1
005F  001100000         1450          TCMIY    0
```

TABLE IX-10 (Continued)

```
003E  010000111                        BL        ADDWDS2
007C  100001010  2057
                         *  LOADDISP-->
                         *  SUBROUTINE TO DISPLAY WORD BEING USED IN LEARN MODE
                         *
0079  001000000          LOADDISP TCY    0                INITIALIZE Y/POINTER
0073  010011100          DPLOAD   LDX    3                TRANSFER LSW'S
0067  000101001                   TMA                     *
004F  010011000                   LDX    1                *
001E  000101111                   TAM                     *
003D  010010100                   LDX    2                TRANSFER MSW'S
007A  000101001                   TMA                     *
0075  010010000                   LDX    0                *
006B  000101111                   TAM
0057  010111111                   RETN
002E  000100000                   TBIT   0
005C  101100001  1470             BRANCH LDONE
0038  001100000                   TCMIY  0
0070  101000011  1471             BRANCH LDONE+1
0061  001101000          LDONE    TCMIY  1
0043  001010001          LDONE+1  YNEC   8
0006  101110011  1457             BRANCH DPLOAD           NO, LOOP--ELSE,
000D  010010001                   LDX    8
001B  001001110                   TCY    7
0037  000101010                   TMY
006E  010000001                   LDP    8
005D  001011010                   YNEC   5
003A  101011000  1219             BRANCH DISLP7
0074  010000010                   BL     ADDCTR6
0069  101011001  0704
                         *
                         *
                         *  SETBIT2  -  SUBROUTINE TO USE DAM REG FOR FLAG PURPOSES
                         *
0053  010110010          SETBIT2  COMX8                   DAM REG
0026  001000100                   TCY    2
004C  010100001                   SBIT   2                TEST BIT 2
0018  001001000                   TCY    1
0031  000101010                   TMY
0062  010110010                   COMX8                   EXIT DAM
```

TABLE IX-10 (Continued)

```
0045  010111111          1491            RETN
                         1492      *
000A  010110010          1493      SETBIT1   COMXB
0015  001000100          1494                TCY        2
002B  010100010          1495                SBIT       1
0056  010110010          1496                COMXB
002C  010111111          1497                RETN
                         1498      *
                         1499      * MEMLOOP= LOADS ADDRESS INTO ROM ADDRESS, 4 BITS AT A TIME
                         1500      *
005B  001000011          1501      MEMADDR   TCY        12              CHIP SELECT
0030  000001101          1502                SETR
0060  001001101          1503                TCY        11              L/R = 1 (INPUT)
0041  000001101          1504                SETR                       R11 = 1
0002  001000101          1505                TCY        10
0005  000000110          1506                CLA
000B  001111100          1507                ACACC      3               FOR LOOP COUNT, ACC = 3
0017  010010100          1508                LDX        2               MEMORY FOR LOOP (SAVE ADDR)
002F  000101110          1509      MEMLOOP   TAMZA
005E  010011000          1510                LDX        1
003C  001110100          1511                ACACC      TWO
0078  000001101          1512                SETR                       LOADS COMMAND
0071  000110110          1513                RSTR                       *
0063  000101001          1514                TMA                        4 BITS OF ADDR ==>ACC
0047  001110000          1515                ACACC      0
000E  000001101          1516                SETR                       LOADS DATA
0010  000110110          1517                RSTR                       *
003B  001001011          1518                TCY        13
0076  000000011          1519      SHIFTUP   XMA                        SHIFT ROUTINE        *
006D  000000100          1520                DYN                        *    SHIFT UP IN     *
005B  001011001          1521                YNEC       9               *    SAME REGISTER   *
0036  101110110    1519  1522                BRANCH     SHIFTUP         * * * * * * * * * * *
006C  001000101          1523                TCY        10              ORIGINAL WORD
0059  010010100          1524                LDX        2               REG=6
0032  000000111          1525                DMAN                       MEM=1,==> ACC  LOOP
0064  100101111    1509  1526                BRANCH     MEMLOOP
0049  000101111          1527                TAM
0012  001111100          1528                ACACC      3
0025  000001101          1529                SETR
004A  000110110          1530                RSTR
```

TABLE IX-10 (Continued)

```
0014  000000110        1531            CLA
0029  000001101        1532            SETR
0052  000110110        1533            RSTR
0024  010011000        1534  MEMDRED   LDX      ONE        * DUMMY READ TO SETUP MEMORY ADDRESS
0048  001000101        1535            TCY      TEN                  **
0010  001110001        1536            ACACC    EIGHT                **
0021  000001101        1537            SETR                          **
0042  000110110        1538            RSTR                          **
0004  010111111        1539            RETN
0009  010001000        1540  MSPEL3    CALLL    CLEAR
0013  110111010  0236  1541
0027  010001001        1542            CALLL    DELAY2
004E  110100111  1398  1543
001C  100000000  1437  1544            BRANCH   REPEAT
                       1545  *  SPELLING IS INCORRECT
0039  010111111        1546  MISSPELL  RETN
0072  010110010        1547            COMX8
0065  001000110        1548            TCY      6                    FLAG
004B  010001000        1549            LDP      1
0016  000100010        1550            TBIT     1                    BIT 1-->0=FIRST TRY
0020  100001001  0304  1551            BRANCH   NOPHRASE             BIT 1-->1=SECOND TRY
005A  010100010        1552            SBIT     1                    *
                       1553  *  LOAD NEGATIVE RESPONSE INTO L/E
0034  010011010        1554  SCORE     LDX      5
0068  001001011        1555            TCY      13
0051  000110010        1556            IMAC
0022  000101111        1557            TAM
0044  010011100        1558            LDX      3
0008  001001011        1559            TCY      13                   FLAG
0011  001100100        1560            TCMIY    2
0023  010001010        1561            CALLL    CURLEVL
0046  111101111  0769  1562
000C  000000101        1563            IYC
0019  001100110        1564            TCMIY    6
0033  010010100        1565            LDX      2                    FLAG
0066  001001111        1566            TCY      15                   *
004D  001100010        1567            TCMIY    4
001A  010001000        1568            BL       SPK4
0035  101100101  0311  1569
006A  001100000        1570  ADDCTR2   TCMIY    0                    FOR RETN$BCH
```

TABLE IX-10 (Continued)

```
0055 010011100        1571          LDX      3
002A 001001011        1572          TCY      13
0054 001100010        1573          TCMIY    4
0028 010001101        1574          BL       CORR+1
0050 101111110   1590 1575
                      1576  *
```

TABLE IX-11

```
                      1577            ORGPG     11
                      1578  *
                      1579  *  POINTERS DAM=WORD 0==> RANDOM WORD ENTRY POINTER
                      1580  *  POINTER DAM=WORD 1 ==> CORRECR SPELLING BUFFER POINTER
                      1581  *
0000 010110010        1582  CORR$SPL CONXB                   DAM REG=POINTER
0001 001000000        1583          TCY      0
0003 001100000        1584          TCMIY    0               ZEROS OUT POINTER
0007 001100000        1585          TCMIY    0
000F 001100000        1586          TCMIY    0
001F 001100000        1587          TCMIY    0
003F 010110010        1588          COMXB                    OUT OF DAM REG
007F 010111111        1589          RETN
007E 010001010        1590  CORR+1  CALLL    CURLEVL
007D 111101111   0769 1591
007B 001001111        1592          TCY      15
0077 000101001        1593          TMA
006F 000010101        1594          AMAAC
005F 001110010        1595          ACACC    4
003E 001000101        1596          TCY      10
007C 000101111        1597          TAM
0079 010000111        1598          CALLL    ADDB
0073 110001100   2139 1599
0067 010000101        1600          CALLL    MEMADDR
004F 111011000   1501 1601
001E 010001110        1602          CALLL    LOADRESS
003D 111000010   1121 1603
```

TABLE IX-11 (Continued)

```
                              1604  *
                              1605  *  RESIDENT:
                              1606  *    LOOP TO TRANSFER ADDRESS FROM RESIDENT (RAM) TO ADDRESS
                              1607  *    REGION (RAM)
                              1608  *
007A  001001110               1609  RESIDENT TCY      7          OLD BLKCSB ROUTINE
0075  000000110               1610  CSB2     CLA
006B  001111000               1611           ACACC    1
0057  010010100               1612           LDX      2
002E  000101111               1613           TAM
005C  010011100               1614           LDX      3
0038  001110101               1615           ACACC    10
0070  000101100               1616           TAMDYN
0061  101110101    1610       1617           BRANCH   CSB2
0043  010011000               1618           LDX      1
0006  001000001               1619           TCY      8
000D  001100100               1620           TCMIY    2
0018  010011010               1621  ADR$CALC LDX      5          LSW
0037  111001100    1631       1622           CALL     RCOMX8
006F  000101001               1623  ADD2ROM  TMA                 READY FOR ADDITION
0050  010011000               1624           LDX      1          LSW OF ROM ADDR REGION
003A  001000101               1625           TCY      10
0074  010000000               1626           CALLL    ADDCARRY
0069  111011000    0112       1627
0053  010010010               1628           LDX      4
0026  001000000               1629           TCY      0          *
                              1630  *
004C  001000000               1631  RCOMX8   TCY      0
0014  010110010               1632  COMX8    COMX8
0031  000101010               1633           TMY
0062  010110010               1634           COMX8
0045  010111111               1635           RETN
000A  000101001               1636           TMA
0015  010011000               1637           LDX      1          ROM ADDR REGION
002B  001001101               1638           TCY      11         *
0056  010000000               1639           CALLL    ADDCARRY
002C  111011000    0112       1640
0058  001000001               1641           TCY      8          *
0030  000000111               1642           DMAN                ADD2ROM TO BE EXECUTED TWICE
0060  000101111               1643           TAM                 *
```

TABLE IX-11 (Continued)

| | | | | | | |
|---|---|---|---|---|---|---|
| 0041 | 000110011 | | 1644 | | MNEZ | |
| 0002 | 100011011 | 1621 | 1645 | | BRANCH | ADR$CALC |
| 0005 | 010000101 | | 1646 | | CALLL | MEMADDR |
| 0008 | 111011000 | 1501 | 1647 | | | |
| 0017 | 010001110 | | 1648 | | CALLL | LOADRESS |
| 002F | 111000010 | 1121 | 1649 | | | |
| 005E | 010000101 | | 1650 | | CALLL | MEMADDR |
| 003C | 111011000 | 1501 | 1651 | | | |
| | | | 1652 | * | | |
| 0078 | 010000011 | | 1653 | | BL | OUTADDR |
| 0071 | 100000000 | 1723 | 1654 | | | |
| | | | 1655 | * | | |
| 0063 | 000101111 | | 1656 | TONE22 | TAM | |
| 0047 | 010001010 | | 1657 | TONES | CALLL | CURLEVL |
| 000E | 111101111 | 0769 | 1658 | | | |
| 0010 | 001100001 | | 1659 | | TCMIY | 8 |
| 003B | 001101110 | | 1660 | | TCMIY | 7 |
| 0076 | 010011100 | | 1661 | | LDX | 3 |
| 006D | 001000001 | | 1662 | | TCY | 8 |
| 0058 | 010100100 | | 1663 | | RBIT | 0 |
| 0036 | 010100111 | | 1664 | | RBIT | 3 |
| 006C | 001010001 | | 1665 | | TMA | |
| 0059 | 010011000 | | 1666 | | LDX | 1 |
| 0032 | 001000101 | | 1667 | | TCY | 10 |
| 0064 | 000010101 | | 1668 | | AMAAC | |
| 0049 | 100100100 | 1676 | 1669 | | BRANCH | TONCARRY |
| 0012 | 000101111 | | 1670 | TONE3 | TAM | |
| 0025 | 010010100 | | 1671 | | LDX | 2 |
| 004A | 001001111 | | 1672 | | TCY | 15 |
| 0019 | 001100100 | | 1673 | | TCMIY | 2 |
| 0029 | 010000010 | | 1674 | | BL | ADDCTR6 |
| 0052 | 101011001 | 0704 | 1675 | | | |
| 0024 | 000101101 | | 1676 | TONCARRY | TAMIYC | |
| 0048 | 000110010 | | 1677 | | IMAC | |
| 0010 | 000101111 | | 1678 | | TAM | |
| 0021 | 100010010 | 1670 | 1679 | | BRANCH | TONE3 |
| 0042 | 001001110 | | 1680 | NXTTONE | TCY | 7 |
| 0004 | 010010001 | | 1681 | | LDX | 8 |
| 0009 | 000101010 | | 1682 | | TMY | |
| 0013 | 001011010 | | 1683 | | YNEC | 5 |

TABLE IX-11 (Continued)

| | | | | | | |
|---|---|---|---|---|---|---|
| 0027 | 101100101 | 1669 | 1684 | | BRANCH | CRY24 |
| 004E | 010010100 | | 1685 | | LDX | 2 |
| 001C | 001001111 | | 1686 | | TCY | 15 |
| 0039 | 001101110 | | 1687 | | TCMIY | 7 |
| 0072 | 101001011 | 1692 | 1688 | | BRANCH | TONESCOR |
| 0065 | 001100000 | | 1689 | CRY24 | TCMIY | 0 |
| | | | 1690 | * RETURN TO ROUTINE | | |
| | | | 1691 | * | | |
| 0048 | 010010001 | | 1692 | TONESCOR | LDX | 8 |
| 0016 | 001000001 | | 1693 | | TCY | 8 |
| 002D | 000100001 | | 1694 | | TBIT | 2 |
| 005A | 101010001 | 1698 | 1695 | | BRANCH | TON12 |
| 0034 | 010001111 | | 1696 | | BL | DISP/KB |
| 0068 | 100101100 | 2219 | 1697 | | | |
| 0051 | 010010100 | | 1698 | TON12 | LDX | 2 |
| 0022 | 001000111 | | 1699 | | TCY | 14 |
| 0044 | 000000111 | | 1700 | | DMAN | |
| 0008 | 101100011 | 1656 | 1701 | | BRANCH | TONE22 |
| 0011 | 010010001 | | 1702 | | LDX | 8 |
| 0023 | 001000001 | | 1703 | | TCY | 8 |
| 0046 | 010100101 | | 1704 | | RBIT | 2 |
| 000C | 010011010 | | 1705 | | LDX | 5 |
| 0019 | 001001011 | | 1706 | | TCY | 13 |
| 0033 | 000101001 | | 1707 | | TMA | |
| 0066 | 010011000 | | 1708 | | LDX | 1 |
| 0040 | 010000110 | | 1709 | | LDP | 6 |
| 001A | 011101001 | | 1710 | | ALEC | 9 |
| 0035 | 101101100 | 0969 | 1711 | | BRANCH | F5 |
| 006A | 010001010 | | 1712 | | CALLL | CURLEVL |
| 0055 | 111101111 | 0769 | 1713 | | | |
| 002A | 001100110 | | 1714 | | TCMIY | 6 |
| 0054 | 001101110 | | 1715 | | TCMIY | 7 |
| 0028 | 010000010 | | 1716 | | BL | ADDCTR6 |
| 0050 | 101011001 | 0704 | 1717 | | | |

TABLE IX-12

```
                               1718              ORGPG     12
                               1719     *
                               1720     *   OUTADDR.
                               1721     *      LOADS CORRECT SPELLING BUFFER WITH ACTUAL SPELLING CODE
                               1722     *
0000  010001110                1723     OUTADDR  CALLL     OUTADDR2
0001  111000001       1083     1724
0003  010011100                1725              LDX       3
0007  001001000                1726              TCY       1                 *
000F  010001101                1727              CALLL     COMX8
001F  110011000       1632     1728
003F  000101111                1729              TAM
007F  010001110                1730              CALLL     OUTADDR2          PDC FOR OUTPUT COMMAND
007E  111000001       1083     1731
007D  010010100                1732              LDX       2
007B  001001000                1733              TCY       1
0077  010001101                1734              CALLL     COMX8
006F  110011000       1632     1735
005F  010000101                1736              LDP       10
003F  000101111                1737              TAM
007C  000100001                1738              TBIT      2                 END OF SPELLING?
0079  110001010       1493     1739              CALL      SETBIT1
0073  010000011                1740              LDP       12
0067  010110010                1741              COMX8
004F  001001000                1742              TCY       1
001E  000110010                1743              IMAC                        INCREMENT COR SPEL POINTER
003D  000101111                1744              TAM
007A  001000100                1745              TCY       2
0075  000100010                1746              TBIT      1                 TEST FLAG
006B  100111000       1751     1747              BRANCH    LNK$ET
0057  100101110       1749     1748              BRANCH    EXDAM2
002E  010110010                1749     EXDAM2   COMX8
005C  100000000       1723     1750              BRANCH    OUTADDR           ADDR==> ALWAYS BRANCH
0038  000000110                1751     LNK$ET   CLA
0070  001001001                1752              TCY       9
0061  010011000                1753              LDX       1
0043  000101111                1754     LNK$ET+1 TAM
0006  010001110                1755              CALLL     OUTADDR2          PDC FOR OUTPUT 4 BITS
0000  111000001       1083     1756
```

TABLE IX-12 (Continued)

| | | | | | | | |
|---|---|---|---|---|---|---|---|
| 0018 | 01000101 | | 1757 | | LDP | 10 | |
| 0037 | 01110000 | | 1758 | | ALEC | 0 | |
| 006E | 11101011 | 1485 | 1759 | | CALL | SETBIT2 | |
| 005D | 01000011 | | 1760 | | LDP | 12 | |
| 003A | 01110000 | | 1761 | | ALEC | 0 | |
| 0074 | 10100110 | 1766 | 1762 | | BRANCH | LNKON | |
| 0069 | 01000101 | | 1763 | | LDP | 10 | |
| 0053 | 01110100 | | 1764 | | ALEC | 1 | |
| 0026 | 11000101 | 1493 | 1765 | | CALL | SETBIT1 | |
| 004C | 01000011 | | 1766 | LNKON | CALLL | LNKPTR2 | |
| 0018 | 11101110 | 1785 | 1767 | | | | |
| 0031 | 01000111 | | 1768 | | CALLL | OUTADDR2 | PDC |
| 0062 | 11100001 | 1083 | 1769 | | | | |
| 0045 | 01000010 | | 1770 | | LDP | 4 | |
| 000A | 00111111 | | 1771 | | ACACC | 15 | |
| 0015 | 11001001 | 0745 | 1772 | | CALL | TSTBIT2 | |
| 002B | 00111000 | | 1773 | | ACACC | 1 | |
| 0056 | 01000111 | | 1774 | | CALLL | LNKPTR | |
| 002C | 11110100 | 2130 | 1775 | | | | |
| 0058 | 00011010 | | 1776 | | IMAC | | |
| 0030 | 00101111 | | 1777 | | TAM | | * |
| 006D | 01000111 | | 1778 | | CALLL | OUTADDR2 | PDC'S |
| 0041 | 11100001 | 1083 | 1779 | | | | |
| 0002 | 01000010 | | 1780 | | LDP | 4 | |
| 0005 | 00111111 | | 1781 | | ACACC | 15 | |
| 0009 | 11001001 | 0745 | 1782 | | CALL | TSTBIT2 | |
| 0017 | 01000011 | | 1783 | | LDP | 12 | |
| 002F | 00111000 | | 1784 | | ACACC | 1 | |
| 005E | 01011000 | | 1785 | LNKPTR2 | LDX | 1 | |
| 003C | 00100100 | | 1786 | | TCY | 9 | * |
| 007A | 00101010 | | 1787 | | TMY | | * |
| 0071 | 01001110 | | 1788 | | LDX | 7 | |
| 0063 | 00101111 | | 1789 | | TAM | | STORE WORD |
| 0047 | 00100101 | | 1790 | | TCY | 10 | R10 |
| 000E | 01011111 | | 1791 | | RETN | | |
| 0010 | 01000111 | | 1792 | | CALLL | OUTADDR2 | |
| 003F | 11100001 | 1083 | 1793 | | | | |
| 0076 | 01110000 | | 1794 | | ALEC | 0 | |
| 006D | 10110010 | 1801 | 1795 | | BRANCH | LNKEND | |

TABLE IX-12 (Continued)

```
0058  010000111          1796  LNKCNT    CALLL     LNKPTR
0036  111101000   2130   1797
006C  000110010          1798  LNKCNT2   IMAC
0059  101000010   1813   1799            BRANCH    ENDSPEL                  GO TO ENDSPEL
0032  101000011   1754   1800            BRANCH    LNK$ET+1               ELSE
0064  010110010          1801  LNKEND    COMX8
0049  001000100          1802            TCY       2
0012  000100010          1803            TBIT      1
0025  100000100   1814   1804            BRANCH    ENDSPEL1
004A  000100001          1805            TBIT      2
0014  101010010   1808   1806            BRANCH    LNK4
0029  101011011   1796   1807            BRANCH    LNKCNT
0052  000100000          1808  LNK4      TBIT      0
0024  100010001   1833   1809            BRANCH    F9
0048  010100000          1810            SBIT      0
0010  010000001          1811            BL        CALADDR
0021  100000000   1164   1812
0042  010110010          1813  ENDSPEL   COMX8                            ADDRESS DAM
0004  001000100          1814  ENDSPEL1  TCY       2
0009  001100000          1815            TCMIY     0
0013  010011100          1816            LDX       3
0027  001001011          1817            TCY       13
004E  000101001          1818            TMA
001C  010000111          1819            LDP       14
0039  011101100          1820            ALEC      3
0072  100000000   2009   1821            BRANCH    SPEAK
0065  010000011          1822            LDP       12
004B  011100010          1823            ALEC      4                      'SPELL'
0016  100101010   1847   1824            BRANCH    USPELL3
0020  010000001          1825            LDP       8
0054  011101010          1826            ALEC      5                      'SAY IT'
0034  100101011   1216   1827            BRANCH    DISLP-1
0068  010001100          1828            LDP       3
0051  011100111          1829            ALEC      14
0022  101001111   0501   1830            BRANCH    HANG
0044  010001111          1831            BL        DISP/KB
0008  100101100   2219   1832
0011  010010010          1833  F9        LDX       4
                         1834  *   TRANS==>STORES CALCULATED ADDRESS IN DAM FOR USE IN LINK/EDIT
                         1835  *
```

TABLE IX-12 (Continued)

| | | | | | | | |
|---|---|---|---|---|---|---|---|
| 0023 | 001000101 | | 1836 | TRANS-1 | TCY | 10 | |
| 0046 | 000101001 | | 1837 | TRANS | TMA | | LOAD ACC |
| 000C | 010110010 | | 1838 | | COMX8 | | |
| 0019 | 000101101 | | 1839 | | TAMIYC | | |
| 0033 | 010110010 | | 1840 | | COMX8 | | |
| 0066 | 001010111 | | 1841 | | YNEC | 14 | |
| 004D | 101000110 | 1837 | 1842 | | BRANCH | TRANS | |
| 001A | 010111111 | | 1843 | | RETN | | |
| 0035 | 010110010 | | 1844 | | COMX8 | | |
| 006A | 010000001 | | 1845 | | BL | CALADDR | |
| 0055 | 100000000 | 1164 | 1846 | | | | |
| 002A | 010000111 | | 1847 | USPELL3 | CALLL | SPEAK+1 | |
| 0054 | 110000001 | 2010 | 1848 | | | | |
| 0028 | 010000011 | | 1849 | | CALLL | TRANS-1 | |
| 0050 | 110100011 | 1836 | 1850 | | | | |
| 0020 | 010000111 | | 1851 | | BL | SPEAK | |
| 0040 | 100000000 | 2009 | 1852 | | | | |

TABLE IX-13

| | | | | | | | |
|---|---|---|---|---|---|---|---|
| | | | 1853 | | ORGPG | 13 | |
| | | | 1854 | * | | | |
| | | | 1855 | * | | | |
| | | | 1856 | * | | | |
| | | | 1857 | * | THE FOLLOWING ROUTINE DIRECTS THE PROGRAM FLOW ACCORDING | | |
| | | | 1858 | * | TO THE KEY PRESSED. | | |
| | | | 1859 | * | | | |
| 0000 | 000100010 | | 1860 | KEY00 | TBIT | 1 | |
| 0001 | 100111011 | 1933 | 1861 | | BRANCH | KEY2 | |
| 0003 | 010010001 | | 1862 | KEY0 | LDX | 8 | * LETTER KEYS |
| 0007 | 001000001 | | 1863 | | TCY | 8 | |
| 000F | 000100010 | | 1864 | | TBIT | 1 | TEST GO FLAG |
| 001F | 101011111 | 1875 | 1865 | | BRANCH | TRANSFER | |
| 003F | 001001110 | | 1866 | | TCY | 7 | |
| 007F | 000100001 | | 1867 | | TBIT | 2 | TEST FOR MODE OTHER THAN SPELL |
| | | | 1868 | * | | | * OR LEARN |
| 007E | 101011111 | 1875 | 1869 | | BRANCH | TRANSFER | |

TABLE IX-13 (Continued)

| | | | | | | | |
|---|---|---|---|---|---|---|---|
| 0070 | 011101100 | | 1870 | | ALEC | 3 | A,B,C,D? |
| 007B | 101100001 | 1892 | 1871 | | BRANCH | KEY12 | |
| 0077 | 010000010 | | 1872 | KEY13 | BL | DIFF$LV | CHANGE LEVL IN DISPLAY |
| 006F | 101111110 | 0629 | 1873 | | | | |
| | | | 1874 | * | | | |
| 005F | 001001110 | | 1875 | TRANSFER | TCY | 7 | |
| 003E | 010010001 | | 1876 | | LDX | 8 | |
| 007C | 000101010 | | 1877 | | TMY | | |
| 0079 | 001011010 | | 1878 | | YNEC | 5 | |
| 0073 | 100011110 | 1882 | 1879 | | BRANCH | TRANS3 | |
| 0067 | 010000010 | | 1880 | | BL | NOSTRANS | |
| 004F | 100101100 | 0680 | 1881 | | | | |
| 001E | 001001111 | | 1882 | TRANS3 | TCY | 15 | |
| 003D | 010010000 | | 1883 | | LDX | 0 | |
| 007A | 000101001 | | 1884 | | TMA | | |
| 0075 | 001001101 | | 1885 | | TCY | 11 | |
| 006B | 000101010 | | 1886 | | TMY | | |
| 0057 | 010001000 | | 1887 | | LDP | 1 | |
| 002E | 001010001 | | 1888 | | YNEC | 8 | |
| 005C | 100000000 | 0194 | 1889 | | BRANCH | NOTFULL | |
| 0038 | 010001011 | | 1890 | | LDP | 13 | |
| 0070 | 100010100 | 1946 | 1891 | | BRANCH | NOP | |
| 0061 | 001001111 | | 1892 | KEY12 | TCY | 15 | * STORE |
| 0043 | 010011000 | | 1893 | | LDX | 1 | * NEW |
| 0006 | 000101111 | | 1894 | | TAM | | * DIFFICULTY LEVEL |
| 000D | 101110111 | 1872 | 1895 | | BRANCH | KEY13 | |
| 001B | 011100101 | | 1896 | KEY1 | ALEC | 10 | * MSD=1 |
| 0037 | 101000111 | 1930 | 1897 | | BRANCH | KEY15 | |
| 006E | 011100111 | | 1898 | | ALEC | 14 | |
| 005D | 101101001 | 1902 | 1899 | | BRANCH | KEY7 | |
| 003A | 010000010 | | 1900 | | BL | GAME#2 | KEY=1F * CODEBREAKER |
| 0074 | 100000000 | 0620 | 1901 | | | | |
| 0069 | 011101011 | | 1902 | KEY7 | ALEC | 13 | |
| 0053 | 100011000 | 1906 | 1903 | | BRANCH | KEY8 | |
| 0026 | 010001100 | | 1904 | | BL | GAME#1 | KEY=1E * HANGMAN |
| 004C | 100000000 | 0479 | 1905 | | | | |
| 0018 | 010010001 | | 1906 | KEY8 | LDX | 8 | |
| 0031 | 001001110 | | 1907 | | TCY | 7 | |
| 0062 | 000101010 | | 1908 | | TMY | | PUT MODE # IN Y |
| 0045 | 011101101 | | 1909 | | ALEC | 11 | |

TABLE IX-13 (Continued)

| | | | | | | | |
|---|---|---|---|---|---|---|---|
| 000A | 101000001 | 1918 | 1910 | | BRANCH | KEY14 | |
| 0015 | 001011010 | | 1911 | | YNEC | 5 | * CHECK MODE ** |
| 002B | 100101100 | 1914 | 1912 | | BRANCH | K10A | * IGNORE ERASE AND |
| 0056 | 100010100 | 1946 | 1913 | | BRANCH | NOP | |
| 002C | 001000001 | | 1914 | K10A | TCY | 8 | |
| 0058 | 000100010 | | 1915 | | TBIT | 1 | TEST GO FLAG |
| 0030 | 100000101 | 1921 | 1916 | | BRANCH | KEY10 | |
| 0060 | 100010100 | 1946 | 1917 | | BRANCH | NOP | |
| 0041 | 010001110 | | 1918 | KEY14 | BL | ROM | |
| 0002 | 101010101 | 1153 | 1919 | | | | |
| | | | 1920 | * | | | * HANGMAN MODE |
| 0005 | 011100011 | | 1921 | KEY10 | ALEC | 12 | |
| 0005 | 100010001 | 1974 | 1922 | | BRANCH | ERASE | KEY=1C * ERASE |
| 0017 | 001001110 | | 1923 | | TCY | 7 | |
| 002F | 000101010 | | 1924 | | TMY | | |
| 005F | 001011110 | | 1925 | | YNEC | 7 | * IGNORE ENTER |
| 003C | 101110001 | 1928 | 1926 | | BRANCH | KEY9 | * IN RANDOM LETTER |
| 0078 | 100010100 | 1946 | 1927 | | BRANCH | NOP | * MODE |
| 0071 | 010001000 | | 1928 | KEY9 | BL | ENTER | KEY=1D * ENTFR |
| 0063 | 101011000 | 0254 | 1929 | | | | |
| 0047 | 000101011 | | 1930 | KEY15 | TYA | | PUT 15 IN ACC |
| 000E | 010001011 | | 1931 | | BL | KEY0 | * LETTERS Q=Z |
| 0010 | 100000011 | 1862 | 1932 | | | | |
| 003B | 010010001 | | 1933 | KEY2 | LDX | 8 | MSD=2 |
| 0076 | 001001110 | | 1934 | | TCY | 7 | |
| 006D | 011101100 | | 1935 | | ALEC | 3 | |
| 005B | 101010010 | 1949 | 1936 | | BRANCH | KEY3 | |
| 0036 | 011100110 | | 1937 | | ALEC | 6 | |
| 006C | 101110010 | 1962 | 1938 | | BRANCH | KEY6 | |
| 0059 | 000101010 | | 1939 | | TMY | | PUT MODE IN Y |
| 0032 | 001011010 | | 1940 | | YNEC | 5 | * IGNORE CLUE |
| 0064 | 100010100 | 1946 | 1941 | | BRANCH | NOP | * KEY UNLESS |
| 0049 | 010000110 | | 1942 | | LDP | 6 | |
| 0012 | 001000001 | | 1943 | | TCY | 8 | * IN HANGMAN MODE |
| 0025 | 000100010 | | 1944 | | TBIT | 1 | * AND GO FLAG |
| 004A | 101110000 | 0923 | 1945 | | BRANCH | CLUE | |
| 0014 | 010001111 | | 1946 | NOP | BL | DISP/KB | * ENTER KEYS IN |
| 0029 | 100101100 | 2219 | 1947 | | | | |
| | | | 1948 | * | | | KEY=27 * CLUE |
| 0052 | 011100100 | | 1949 | KEY3 | ALEC | 2 | |
| 0024 | 100100001 | 1953 | 1950 | | BRANCH | KEY4 | |

TABLE IX-13 (Continued)

| | | | | | | | |
|---|---|---|---|---|---|---|---|
| 0048 | 010000000 | | 1951 | | BL | OFF | KEY=23 * OFF |
| 0010 | 101110001 | 0124 | 1952 | | | | |
| 0021 | 011101000 | | 1953 | KEY4 | ALEC | 1 | |
| 0042 | 100010011 | 1957 | 1954 | | BRANCH | KEY5 | |
| 0004 | 010000100 | | 1955 | | BL | SPELL | |
| 0009 | 100010001 | 0462 | 1956 | | | | |
| 0013 | 010000000 | | 1957 | KEY5 | LDP | 0 | |
| 0027 | 011100000 | | 1958 | | ALEC | 0 | |
| 004E | 101001001 | 0142 | 1959 | | BRANCH | GAME#3 | KEY=20 * RANDOM LETTER |
| 001C | 010000100 | | 1960 | | BL | LEARN | KEY=21 * LEARN |
| 0039 | 100011001 | 0466 | 1961 | | | | |
| 0072 | 000100001 | | 1962 | KEY6 | TBIT | 2 | * TEST FOR MODES OTHER |
| 0065 | 100010100 | 1946 | 1963 | | BRANCH | NOP | * THAN SPELL OR LEARN |
| 004B | 011100010 | | 1964 | K16 | ALEC | 4 | |
| 0016 | 101000100 | 1972 | 1965 | | BRANCH | K17 | |
| 002D | 001000001 | | 1966 | | TCY | 8 | |
| 005A | 000100010 | | 1967 | | TBIT | 1 | GO FLAG |
| 0034 | 100001100 | 1977 | 1968 | | BRANCH | K19 | |
| 0068 | 011101010 | | 1969 | | ALEC | 5 | REPLAY? |
| 0051 | 101001101 | 1981 | 1970 | | BRANCH | K23 | |
| 0022 | 100010100 | 1946 | 1971 | | BRANCH | NOP | |
| 0044 | 010001000 | | 1972 | K17 | BL | GO | KEY=24 * GO |
| 0008 | 101111100 | 0213 | 1973 | | | | |
| 0011 | 010001000 | | 1974 | ERASE | CALLL | CLEAR | |
| 0023 | 110111010 | 0236 | 1975 | | | | |
| 0046 | 100010100 | 1946 | 1976 | | BRANCH | NOP | |
| 000C | 011101010 | | 1977 | K19 | ALEC | 5 | |
| 0019 | 100100000 | 1990 | 1978 | | BRANCH | K21 | |
| 0033 | 010000101 | | 1979 | | BL | REPEAT | |
| 0066 | 100000000 | 1437 | 1980 | | | | |
| 004D | 010010000 | | 1981 | K23 | LDX | 0 | |
| 001A | 001000000 | | 1982 | | TCY | 0 | |
| 0035 | 000110011 | | 1983 | | MNEZ | | |
| 006A | 100101010 | 1986 | 1984 | | BRANCH | K20 | |
| 0055 | 100010100 | 1946 | 1985 | | BRANCH | NOP | |
| 002A | 010011000 | | 1986 | K20 | LDX | 1 | |
| 0054 | 001110001 | | 1987 | | ACACC | 8 | ACC=13 AFTER THIS INSTRUCTION |
| 0028 | 000001001 | | 1988 | | MNEA | | |
| 0050 | 100010100 | 1946 | 1989 | | BRANCH | NOP | |
| 0020 | 010001000 | | 1990 | K21 | BL | REPLAY | |
| 0040 | 100101100 | 0250 | 1991 | | | | |

TABLE IX-14

```
                          ORGPG     14
                    ****************************************************************
                    * SPEAK                                                        *
                    * ROUTINE TO CONTROL SPEECH TO AND FROM SYNTHESIZER            *
                    *                                                              *
                    * IF SS==SET, SPEAK WAS CALLED                                 *
                    * IF SS==RESET, MEMADDR WAS CALLED                             *
                    *                                                              *
                    * IF SS=1, ADDRESSES ARE TRANSFERED FROM FILES 6 AND 7 TO FILE *
                    * 1, WORDS 10-13, ELSE IF SS=0, ADDRESS IS IN FILE 1 PRIOR TO CALL *
                    *                                                              *
                    * 2 POINTERS USED                                              *
                    *    1) LINK/EDIT POINTER FOR WORDS IN FILES 6 AND 7           *
                    *    2) ROM ADDR POINTER FOR WORDS IN FILE 1.                  *
                    *                                                              *
                    ****************************************************************
                    *                                                              *
0000  010110101     SPEAK     SEAC
0001  010011000     SPEAK+1   LDX     1
0003  001000001               TCY     8
0007  001100101               TCMIY   10         INITIALIZE ROM ADDR POINTER
000F  001100000               TCMIY   0          INITIALIZE LNK/EDT POINTER
001F  001001001     SPKLOP-1  TCY     9
003F  000101010     SPKLOOP   TMY
007F  010011110               LDX     7          GET WORD FROM LNK/EDT
007E  000101001               TMA                LOAD WORD IN ACC
007D  010011000               LDX     1          POINTER
007B  001000001               TCY     8          *
0077  000101010               TMY                *
006F  000101111               TAM                STORE WORD
005F  001000001               TCY     8          BUMP POINTER
003E  000110010               IMAC               *
007C  000101111               TAM                *
0079  001001001               TCY     9          GET FILE FOR NEXT WORD
0073  000101010               TMY
0067  000000000               COMX               FILE 6
004F  000101001               TMA                WORD==ACC
001F  000000000               COMX               FILE 1
0030  001000001               TCY     8          POINTER
007A  000101010               TMY                *
```

TABLE IX-14 (Continued)

```
0075  000101111         2032           TAM                   STORE WORD
0068  001001001         2033           TCY      9            BUMP LNK/EDT POINTER
0057  000110010         2034           IMAC                  IF > 15, RETURN
002E  100100001   2111  2035           BRANCH   RETURN
005C  000101111         2036           TAM                   STORE INCREMENT
0038  001000001         2037           TCY      8            BUMP ROM AREA POINTER
0070  000110010         2038           IMAC                  *
0061  000101110         2039           TAMZA
0043  000101010         2040           TMY                   *
0006  001010111         2041           YNEC     14           IS Y = 14?
0000  100011111   2014  2042           BRANCH   SPKLOP-1
0018  010111111         2043           RETN                  YES, CONTINUE
0037  001000101         2044           TCY      10
006E  010000111         2045  ADDWDS   LDP      14
005D  000010101         2046           AMAAC
003A  100001010   2057  2047           BRANCH   ADDWDS2
0074  010000111         2048           LDP      14
0069  000000101         2049           IYC                   LOOP COUNT
0053  001010111         2050           YNEC     14           *
0026  101101110   2045  2051           BRANCH   ADDWDS       *
004C  011101000         2052           ALEC     1
0018  100100001   2111  2053           BRANCH   RETURN       IF YES, RETURN
0031  010001001         2054           LDP      9
0062  011100100         2055           ALEC     2            ACC==>2?
0045  100000000   1299  2056           BRANCH   LETTER
000A  010000101         2057  ADDWDS2  CALLL    MEMADDR
0015  111011000   1501  2058
                        2059  *        ROM ADDRESSING SUBROUTINE:                            *
                        2060  *        ASSUMES X AND Y HAVE BEEN DEFINED PRIOR TO CALLING    *
                        2061  *                                                              *
                        2062  *                                                              *
                        2063  *        LOADS ADDRESS INTO ROM ADDRESS AREA                   *
                        2064  *        ALL R LINES, ETC.... REMAIN THE SAME AS WHEN          *
                        2065  *        ENTERING SUBROUTINE.                                  *
                        2066  *                                                              *
                        2067  ****************************************************************
                        2068  *                                                              *
                        2069  *                                                              *
                        2070  *        END OF ROUTINE
                        2071  *
```

TABLE IX-14 (Continued)

```
0028  001000011         2072  MEMADDR2 TCY     12         CS , GIVING SYN, COMMANDS
0056  000001101         2073           SETR               R12 = 1
002C  000000110         2074           CLA
005A  001110101         2075  SPKREG   ACACC   TEN
0030  001000101         2076           TCY     10
0060  000001101         2077           SETR
0041  000110110         2078           RSTR               *
0002  000000110         2079  SPKREG+1 CLA
0005  001000011         2080           TCY     12
0008  000001101         2081           SETR
0017  001000101         2082           TCY     10
002F  001110111         2083           ACACC   14
005E  000001101         2084           SETR               1ST PDC LOADS COMMAND
003C  000110110         2085           RSTR               *
0078  001001101         2086           TCY     11
0071  000110110         2087           RSTR
0063  001000101         2088           TCY     10
0047  000001101         2089           SETR               2ND PDC APPLIES TALK TO CTL8
000E  000110110         2090           RSTR               *
001D  001110000         2091           ACACC   0
003B  000001000         2092           TKA
0076  000001101         2093           SETR               3RD PDC RELEASES OUTPUT
006D  000110110         2094           RSTR               *
005B  001001101         2095           TCY     11
0036  000001101         2096           SETR
006C  010011100         2097           LDX     3
0059  001001111         2098           TCY     15
0032  000101111         2099           TAM
0064  000100000         2100           TBIT    0
0049  101011010   2125  2101           BRANCH  BITSET0
0012  010011000         2102           LDX     1
0025  001000001         2103           TCY     8
004A  001100101         2104           TCMIY   10
0014  000010010         2105           CCLA
0029  011100000         2106           ALEC    ZERO
0052  101001000   2109  2107           BRANCH  RETS
0024  100011111   2014  2108           BRANCH  SPKLUP-1
0048  010011000         2109  RETS     LDX     1
0010  001000001         2110           TCY     8
0021  000101110         2111  RETURN   TAMZA              ACC = ZERO
```

TABLE IX-14 (Continued)

| | | | | | | | |
|---|---|---|---|---|---|---|---|
| 0042 | 001001111 | | 2112 | | TCY | 15 | |
| 0004 | 010010110 | | 2113 | RETURN4 | LDX | SIX | |
| 0009 | 000101111 | | 2114 | | TAM | | |
| 0013 | 010011110 | | 2115 | | LDX | SEVEN | |
| 0027 | 000101100 | | 2116 | | TAMDYN | | |
| 004E | 100000100 | 2113 | 2117 | | BRANCH | RETURN4 | |
| 001C | 010111111 | | 2118 | | RETN | | |
| 0039 | 010110100 | | 2119 | RETURN+1 | REAC | | |
| 0072 | 001001111 | | 2120 | RETURN+2 | TCY | 15 | TALK BIT |
| 0065 | 010011100 | | 2121 | | LDX | 3 | * |
| 004B | 010100100 | | 2122 | | RBIT | 0 | * |
| 0016 | 010000010 | | 2123 | | BL | RETN$BCH | |
| 002D | 101001010 | 0710 | 2124 | | | | |
| 005A | 010001111 | | 2125 | BITSET0 | LDP | 15 | |
| 0034 | 100101100 | 2219 | 2126 | | BRANCH | DISP/KB | |
| | | | 2127 | * | | | |
| | | | 2128 | * | END OF SPEECH CONTROL SUBROUTINE | | |
| | | | 2129 | * | | | |
| 0068 | 010011000 | | 2130 | LNKPTR | LDX | 1 | POINTER FOR LNK/EDT |
| 0051 | 001001001 | | 2131 | | TCY | 9 | * |
| 0022 | 000101010 | | 2132 | | TMY | | * |
| 0044 | 010010110 | | 2133 | | LDX | 6 | |
| 0008 | 000101111 | | 2134 | | TAM | | STORE WORD |
| 0011 | 010011000 | | 2135 | | LDX | 1 | POINTER |
| 0023 | 001001001 | | 2136 | | TCY | 9 | * |
| 0046 | 010111111 | | 2137 | | RETN | | |
| | | | 2138 | * | | | |
| 000C | 001000110 | | 2139 | ADD8 | TCY | 6 | |
| 0019 | 010010001 | | 2140 | | LDX | 8 | |
| 0033 | 000100011 | | 2141 | | TBIT | 3 | |
| 0066 | 100011010 | 2144 | 2142 | | BRANCH | RADD8 | |
| 004D | 101010101 | 2147 | 2143 | | BRANCH | RADD2 | |
| 001A | 010011000 | | 2144 | RADD8 | LDX | 1 | |
| 0035 | 001001011 | | 2145 | | TCY | 13 | |
| 0064 | 001100001 | | 2146 | | TCMIY | 8 | |
| 0055 | 010111111 | | 2147 | RADD2 | RETN | | |

TABLE IX-15

```
                        2148            ORGPG     15
                        2149   *
                        2150   *                  POWER UP / CLEAR ROUTINE
                        2151   *
                        2152   *        THIS ROUTINE SETS UP INITIAL CONDITIONS IN RAM
                        2153   *
                        2154   *
                        2155   *
0000  001001111         2156   START    TCY       FIFTEEN         * RESET ALL R-LINES
0001  000110110         2157   LOOP$ST  RSTR                      **
0003  000000100         2158            DYN                       **
0007  100000001   2157  2159            BRANCH    LOOP$ST         **
000F  001001011         2160            TCY       13
001F  000001101         2161            SETR
003F  001001111         2162            TCY       15
007F  010111111         2163            RETN                      **
007E  000000110         2164            CLA                       **
007D  010010001         2165            LDX       8
007B  110101110   2183  2166            CALL      FIL$LOOP        **
0077  010011110         2167            LDX       SEVEN           **
006F  110101110   2183  2168            CALL      FIL$LOOP        **
005F  010010110         2169            LDX       SIX             **
003E  110101110   2183  2170            CALL      FIL$LOOP        **
007C  010011010         2171            LDX       FIVE            **
0079  110101110   2183  2172            CALL      FIL$LOOP        **
0073  010010010         2173            LDX       FOUR            **
0067  110101110   2183  2174            CALL      FIL$LOOP        **
004F  010011100         2175            LDX       THREE           **
001E  110101110   2183  2176            CALL      FIL$LOOP        **
003D  010010100         2177            LDX       TWO             **
007A  110101110   2183  2178            CALL      FIL$LOOP        **
0075  010011000         2179            LDX       ONE             **
006B  110101110   2183  2180            CALL      FIL$LOOP        **
0057  010010000         2181            LDX       ZERO            **
                        2182   *
002E  000101100         2183   FIL$LOOP TAMDYN                    * ROUTINE FILLS FILE WITH
005C  100101110   2183  2184            BRANCH    FIL$LOOP        **CONTENTS OF ACC.
003B  010111111         2185            RETN                      **
                        2186   *
                        2187   *
0070  010001000         2188   DSP7     CALLL     CLEAR
```

TABLE IX-15 (Continued)

```
0061  110111010  0236  2189
                       2190   *
0043  010000010        2191            CALLL   DIFFSLV       * DISPLAY DIFF LEVEL A - SPELL
0006  111111110  0629  2192                                    MODE
000D  000000110        2193            CLA
0018  001001101        2194            TCY     11
0037  000110110        2195            RSTR
006E  001000011        2196            TCY     12
005D  000001101        2197            SETR
0034  001000101        2198            TCY     10
0074  000001101        2199            SETR
0069  000110110        2200            RSTR
0053  000001101        2201            SETR
0026  000110110        2202            RSTR
004C  001001101        2203            TCY     11
0018  000001101        2204            SETR
0031  001000101        2205            TCY     10
0062  000001101        2206            SETR
0045  000110110        2207            RSTR
0004  010000101        2208            CALLL   MEMORED
0015  110100100  1534  2209
0028  010001101        2210            BL      TONES
0056  101000111  1657  2211
                       2212   *
                       2213   *
                       2214   *                KEYBOARD SCAN / DISPLAY ROUTINE
                       2215   *
                       2216   *        THIS ROUTINE DISPLAYS THE CONTENTS OF 'DISPLAY BUFFER' AND
                       2217   *        CHECKS FOR A KEYPRESS.
                       2218   *
002C  010011100        2219   DISP/KB  LDX     3
0058  001001101        2220            TCY     11
0030  001100000        2221            TCMIY   0             RESET TIMEOUT COUNTER
0060  000110110        2222            RSTR                  RESET R12 TO ENABLE DISPLAY
0041  001100000        2223            TCMIY   0
0002  000000110        2224            CLA
0005  001000011        2225   DSP1     TCY     12
0008  010010000        2226            LDX     0
0017  000101101        2227            TAMIYC                STORE DEBOUNCE COUNTER; SET Y=0
002F  001100000        2228            TCMIY   0             RESET R-LINE POINTER
```

TABLE IX-15 (Continued)

```
005E  001001111        2229             TCY      15
003C  000001101        2230             SETR               R=15, TURN ON FILAMENT
0078  001000000        2231             TCY      0
0071  010011000        2232  DSP2       LDX      1         *
0063  000101001        2233             TMA                *
0047  010110000        2234             TDO                * LOAD SEGMENT PLA
000E  010010000        2235             LDX      0         *
001D  000101001        2236             TMA                *
003B  000001001        2237             MNEA               *
0076  010110000        2238             TDO                *
0060  000001101        2239             SETR               TURN ON NEW R=LINE
005B  001001111        2240             TCY      15
0036  000110110        2241             RSTR               R=15, TURN OFF FILAMENT
006C  010000000        2242             BL       TIMEUP    * INCREMENT RANDOM NUMBER
0059  101000101  0103  2243                                  GENERATOR/
                       2244  *                             * TIMEOUT COUNTER
0032  001001011        2245  DISP/KB1   TCY      13
0064  000110010        2246             IMAC               INCREMENT R=LINE POINTER
0049  000101111        2247             TAM
0012  001001111        2248             TCY      15
0025  000001101        2249             SETR               TURN ON FILAMENT
004A  000101000        2250             TAY
0014  000000100        2251             DYN
0029  000110110        2252             RSTR               RESET LAST R=LINE
0052  000000101        2253             TYC
0024  001010001        2254             YNEC     8         SCAN COMPLETE?
004B  101110001  2232  2255             BRANCH   DSP2      NO
0010  001001111        2256             TCY      15        YES
0021  000110110        2257             RSTR               RESET FILAMENT
0042  010000000        2258             CALLL    TIMEUP1   INCREMENT RANDOM NUMBER/TIMEOUT
0004  110101011  0106  2259                                COUNTER
                       2260  *                             ONE EXTRA TIME. TOTAL=9 PER
0009  010010000        2261             LDX      0         DISPLAY SCAN
0013  001000101        2262             TCY      10
0027  000110010        2263             IMAC               INCREMENT DEBOUNCE COUNTER
004E  100111001  2266  2264             BRANCH   DSP3
001C  000101111        2265             TAM
0039  001000011        2266  DSP3       TCY      12
0072  000110010        2267             IMAC
```

TABLE IX-15 (Continued)

| | | | | | | | |
|---|---|---|---|---|---|---|---|
| 0065 | 011100101 | | 2268 | | ALEC | 10 | |
| 004B | 100000101 | 2225 | 2269 | | BRANCH | DSP1 | CONTINUE DISPLAY IF<8 |
| 0016 | 010000111 | | 2270 | | LDP | 14 | |
| 002D | 001001111 | | 2271 | | TCY | 15 | |
| 005A | 010011100 | | 2272 | | LDX | 3 | |
| 0034 | 000100000 | | 2273 | | TBIT | 0 | |
| 0068 | 101011000 | 2075 | 2274 | | BRANCH | SPKREG + 1 | TEST TALK |
| 0051 | 010000001 | | 2275 | | LDP | A | |
| 0022 | 001000111 | | 2276 | | TCY | 14 | |
| 0044 | 000101011 | | 2277 | | TYA | | SET ACC=14 |
| 0008 | 000100000 | | 2278 | | TBIT | 0 | |
| 0011 | 101101100 | 1241 | 2279 | | BRANCH | DISLP+1 | |
| 0023 | 010001111 | | 2280 | | LDP | 15 | |
| 0046 | 100000101 | 2225 | 2281 | | BRANCH | DSP1 | RET |
| 000C | 010010000 | | 2282 | KEYSEVL | LDX | 0 | |
| 0019 | 001000111 | | 2283 | | TCY | 14 | * PUT LSD OF KEY CODE |
| 0033 | 000101001 | | 2284 | | TMA | | * IN ACC |
| 0066 | 001001111 | | 2285 | | TCY | 15 | |
| 004D | 010001011 | | 2286 | | LDP | 13 | |
| 001A | 000100000 | | 2287 | | TBIT | 0 | |
| 0035 | 100011011 | 1896 | 2288 | | BRANCH | KEY1 | |
| 006A | 100000000 | 1860 | 2289 | | BRANCH | KEY00 | |
| | | | 2290 | * | | | |
| 0055 | 010010001 | | 2291 | SETBIT3 | LDX | 8 | |
| 002A | 001000100 | | 2292 | | TCY | 2 | |
| 0054 | 010100011 | | 2293 | | SBIT | 3 | SET BIT 3 |
| 002B | 010111111 | | 2294 | | RETN | | |
| | | | 2295 | * | | | |
| | | | 2296 | | END | | |

TABLE X

| I₀/I₁ COMMANDS | | |
|---|---|---|
| $I_0$ | $I_1$ | |
| 0 | 0 | No Operation |
| 0 | 1 | Load Address (LA) |
| 1 | 0 | Transfer Bit (TB) |
| 1 | 1 | Read and Branch (RB) |

TABLE XI

Counter 619/PLA 620 Timing Sequence

| STEP | COUNTER CONTENTS (HEX) | SIGNALS GENERATED |
|---|---|---|
| 1 | 0 | $\overline{LA1}$, TB8 |
| 2 | 8 | $\overline{LA2}$ |
| 3 | C | $\overline{LA3}$ |
| 4 | E | $\overline{LA4}$ |
| 5 | F | |
| 6 | 7 | |
| 7 | 3 | |
| 8 | 1 | |

TABLE XII

TB8 READ SEQUENCE

| STEP | COUNTER 623 CONTENTS (BINARY) | COUNTER 624 CONTENTS (HEX) | SIGNALS GENERATED |
|---|---|---|---|
| 1 | 10 | F | SAD, INC |
| 2 | 10 | E | DC, INC |
| 3 | 10 | C | DC, INC |
| 4 | 10 | 8 | DC, INC |
| 5 | 10 | 0 | DC, INC |
| 6 | 10 | 1 | DC, INC |
| 7 | 10 | 3 | SAM, DC, INC |
| 8 | 10 | 7 | PC, $\overline{ZERO}$ |

TABLE XIII

TB8 READ SEQUENCE

| STEP | COUNTER 623 CONTENTS (BINARY) | COUNTER 624 CONTENTS (HEX) | SIGNALS GENERATED |
|---|---|---|---|
| 1 | 11 | F | SAD, INC |
| 2 | 11 | E | DC, INC |
| 3 | 11 | C | DC, INC |
| 4 | 11 | 8 | DC, INC |
| 5 | 11 | 0 | DC, INC |
| 6 | 11 | 1 | DC, INC |
| 7 | 11 | 3 | SAM, DC, INC |
| 8 | 11 | 7 | PC |
| 9 | 01 | F | SAD, TF |
| 10 | 01 | E | BR, PC |
| 11 | 01 | C | BR, DC |
| 12 | 01 | 8 | BR, DC |
| 13 | 01 | 0 | BR, DC |
| 14 | 01 | 1 | DC |
| 15 | 01 | 3 | SAM, DC |
| 16 | 01 | 7 | PC |
| 17 | 00 | F | SAD, TF |
| 18 | 00 | E | BR |
| 19 | 00 | C | BR |
| 20 | 00 | 8 | BR |
| 21 | 00 | 0 | |
| 22 | 00 | 1 | |

TABLE XIII-continued

TB8 READ SEQUENCE

| STEP | COUNTER 623 CONTENTS (BINARY) | COUNTER 624 CONTENTS (HEX) | SIGNALS GENERATED |
|---|---|---|---|
| 23 | 00 | 3 | |
| 24 | 00 | 7 | PC |
| 25 | 10 | F | SAD, INC |
| 26 | 10 | E | DC, INC |
| 27 | 10 | C | DC, INC |
| 28 | 10 | 8 | DC, INC |
| 29 | 10 | 0 | DC, INC |
| 30 | 10 | 1 | DC, INC |
| 31 | 10 | 3 | SAM, DC, INC |
| 32 | 10 | 7 | PC, $\overline{ZERO}$ |

What is claimed is:

1. An digital-to-analog converter for converting a digital input, including a sign bit and a plurality of magnitude bits, to an analog signal representative of human speech, said converter being integrateable on a monocrystalline semiconductor substrate and comprising:

(a) first plurality of scaled field effect semiconductor devices each of which has a control electrode and two current carrying electrodes, the width to length ratio of the active area of a first of said devices being approximately twice that of a second of said devices, the width to length ratio of said second devices being approximately twice that of a third of said devices and correspondingly for the remainder of said devices;

(b) second plurality of switching field effect semiconductor devices, each of which has a control electrode and two current carrying electrodes;

(c) first means, coupling one of the current carrying electrodes of each of said first plurality of devices to one of the current carrying electrodes of each of said second plurality of devices;

(d) second means, coupling each of the remaining current carrying electrodes and each of the control electrodes of each of said first plurality of devices to a first common node;

(e) third means, coupling each of the remaining current carrying electrodes of each of said second plurality of devices to a second common node;

(f) control means, coupling said plurality of magnitude bits to a respective control electrode of one of said second plurality of devices; and (g) output means for coupling said second common node to a speaker means having a center-tapped component therein, and responsive to said sign bit for determining the direction of current flow through a voice coil therein.

2. The digital-to-analog converter according to claim 1, wherein said center-tapped component comprises a transformer.

3. The digital-to-analog converter according to claim 1, wherein said center tapped component comprises a voice coil.

4. The digital-to-analog converter according to claim 1 wherein said output means further includes two field effect devices responsive to the state of said sign bits for determining the direction of current flow through said voice coil.

* * * * *